US012069890B2

(12) United States Patent
Choi et al.

(10) Patent No.: US 12,069,890 B2
(45) Date of Patent: Aug. 20, 2024

(54) LIGHT-EMITTING DEVICE AND AN ELECTRONIC DEVICE INCLUDING THE SAME

(71) Applicant: Samsung Display Co., Ltd., Yongin-si (KR)

(72) Inventors: Hyewon Choi, Yongin-si (KR); Soungwook Kim, Yongin-si (KR); Seulong Kim, Yongin-si (KR); Sungsoo Bae, Yongin-si (KR); Hyein Jeong, Yongin-si (KR); Jaeweon Hur, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 421 days.

(21) Appl. No.: 17/551,016

(22) Filed: Dec. 14, 2021

(65) Prior Publication Data

US 2022/0190296 A1 Jun. 16, 2022

(30) Foreign Application Priority Data

Dec. 16, 2020 (KR) ........................ 10-2020-0176599

(51) Int. Cl.

*H10K 85/60* (2023.01)
*H10K 50/858* (2023.01)

(Continued)

(52) U.S. Cl.

CPC ......... *H10K 50/858* (2023.02); *H10K 85/633* (2023.02); *H10K 85/636* (2023.02); *H10K 85/6572* (2023.02); *H10K 50/82* (2023.02); *H10K 59/122* (2023.02); *H10K 85/626* (2023.02)

(58) Field of Classification Search

CPC ......... H10K 50/844–8445; H10K 59/87–8731
See application file for complete search history.

(56) References Cited

U.S. PATENT DOCUMENTS

| | | | | |
|---|---|---|---|---|
| 10,326,111 | B2 | 6/2019 | Yoo et al. | |
| 2018/0069187 | A1* | 3/2018 | Ito | H10K 50/11 |
| 2019/0067628 | A1 | 2/2019 | Cho et al. | |

FOREIGN PATENT DOCUMENTS

| | | | |
|---|---|---|---|
| CN | 110903159 | A | 3/2020 |
| KR | 20160124285 | A | 10/2016 |

(Continued)

OTHER PUBLICATIONS

Huang, Qiang, et al. "Performance Improvement of Top-Emitting Organic Light-Emitting Diodes by an Organic Capping Layer: An Experimental Study." Journal of Applied Physics, vol. 100, No. 6, 2006, p. 064507.

*Primary Examiner* — Daniel P Shook

(74) *Attorney, Agent, or Firm* — Lewis Roca Rothgerber Christie LLP

(57) ABSTRACT

A light-emitting device includes: a first electrode; a second electrode facing the first electrode; an interlayer between the first electrode and the second electrode and including an emission layer; and a first capping layer and a second capping layer outside the second electrode, wherein the first capping layer includes at least one compound selected from compounds represented by Formulae 1-1 to 1-3, as defined herein, and the second capping layer includes at least one compound selected from compounds represented by Formulae 2-1 to 2-6, as defined herein.

20 Claims, 3 Drawing Sheets

(51) Int. Cl.
*H10K 50/82* (2023.01)
*H10K 59/122* (2023.01)

(56) References Cited

FOREIGN PATENT DOCUMENTS

| | | | |
|---|---|---|---|
| KR | 101788366 | B1 | 10/2017 |
| KR | 20170116927 | A | 10/2017 |
| KR | 20180131115 | A | 12/2018 |
| KR | 20200061903 | A | 6/2020 |

* cited by examiner

LIGHT-EMITTING DEVICE AND AN ELECTRONIC DEVICE INCLUDING THE SAME

CROSS-REFERENCE TO RELATED APPLICATION

This application claims priority from and the benefit of Korean Patent Application No. 10-2020-0176599, filed on Dec. 16, 2020, which is hereby incorporated by reference for all purposes as if fully set forth herein.

BACKGROUND

Field

Embodiments of the invention relate generally to display devices, and, more particularly, to a light-emitting device including a dual capping layer, and an electronic apparatus including the light-emitting device.

Discussion of the Background

Light-emitting devices are self-emissive devices that have wide viewing angles, high contrast ratios, short response times, and exhibit excellent characteristics in terms of luminance, driving voltage, and response speed, compared to devices in the art.

In light-emitting devices, a first electrode is located on a substrate, and a hole transport region, an emission layer, an electron transport region, and a second electrode are sequentially formed on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition from an excited state to a ground state to thereby generate light.

The above information disclosed in this Background section is only for understanding of the background of the inventive concepts, and, therefore, it may contain information that does not constitute prior art.

SUMMARY

Light-emitting devices and electronic devices constructed according to the principles and illustrative implementations of the invention include a heterocyclic compound having a novel structure and light-emitting devices including the heterocyclic compound have high efficiency and excellent color purity. In addition, lifespan characteristics and optical characteristics of the light-emitting device may be improved.

Additional features of the inventive concepts will be set forth in the description which follows, and in part will be apparent from the description, or may be learned by practice of the inventive concepts.

According to one aspect of the invention, a light-emitting device includes: a first electrode; a second electrode facing the first electrode; an interlayer between the first electrode and the second electrode and including an emission layer; and a first capping layer and a second capping layer outside the second electrode, wherein the first capping layer includes at least one compound selected from compounds represented by Formulae 1-1 to 1-3, as defined herein, and the second capping layer includes at least one compound selected from compounds represented by Formulae 2-1 to 2-6, as defined herein.

The first capping layer may be between the second electrode and the second capping layer.

The first capping layer may contact the second electrode.

The first capping layer may have a thickness of about 5 nm to about 50 nm, and the second capping layer may have a thickness of about 50 nm to about 100 nm.

The ratio of a thickness of the second capping layer to a thickness of the first capping layer may be from about 2:1 to about 15:1.

The second electrode may include silver.

The silver may be present in the second electrode in an amount of about 95 wt % or more with respect to the total weight of the second electrode.

The first electrode may include an anode, the second electrode may include a cathode, the interlayer may further include a hole transport region between the emission layer and the first electrode, and an electron transport region between the emission layer and the second electrode, the hole transport region may include a hole injection layer, a hole transport layer, an emission auxiliary layer, an electron blocking layer, or any combination thereof, and the electron transport region may include a hole blocking layer, an electron transport layer, an electron injection layer, or any combination thereof.

The electron transport region may include a metal-containing compound and a metal-free compound, and the metal-containing compound may be present in an amount of about 5 wt % or less with respect to the total weight of the metal-free compound and the metal-containing compound.

The variables $L_1$ to $L_8$, $L_{1a}$ to $L_{8a}$, $L_{11}$ to $L_{13}$, $L_{21}$ to $L_{25}$, $L_{31}$ to $L_{33}$, $L_{41}$ to $L_{44}$, $L_{51}$ to $L_{52}$, $L_{61}$, $L_{66}$, $L_{67}$, $L_{71}$, $L_{85}$, and $L_{86}$ are defined herein.

The variables $R_1$ to $R_8$, $R_{1a}$ to $R_{7a}$, $R_{10}$, $R_{20}$, $R_{11}$ to $R_{13}$, $R_{21}$ to $R_{24}$, $R_{31}$ to $R_{33}$, $R_{41}$ to $R_{44}$, $R_{45a}$, $R_{45b}$, $R_{51}$ to $R_{54}$, $R_{61}$ to $R_{66}$, $R_{71}$ to $R_{73}$, $R_{74a}$, $R_{74b}$, $R_{81a}$, $R_{81b}$, $R_{2a}$, $R_{83a}$, $R_{83b}$, $R_{84a}$, $R_{87}$, $R_{88}$, $R_{89a}$, and $R_{89b}$ are defined herein.

The Formula 1-1 may be one of Formulae 1-1(a) to 1-1(e), as defined herein.

The Formula 1-1 may be one of Formulae 1-1-1 to 1-1-18, as defined herein.

The Formula 2-1 may be Formula 2-1(a); Formula 2-2 may be one of Formulae 2-2(a) and 2-2(b); Formula 2-3 may be Formula 2-3(a); Formula 2-4 may be one of Formulae 2-4(a) to 2-4(b); Formula 2-5 may be one of Formulae 2-5(a) to 2-5(b); and Formula 2-6 may be one of Formulae 2-6(a) to 2-6(d).

The Formula 2-1 may be one of Formulae 2-1-1 to 2-1-18, Formula 2-2 may be one of Formulae 2-2-1 to 2-2-9, Formula 2-3 may be one of Formulae 2-3-1 to 2-3-15, Formula 2-4 may be one of Formulae 2-4-1 to 2-4-33, Formula 2-5 may be one of Formulae 2-5-1 to 2-5-16, and Formula 2-6 may be one of Formulae 2-6-1 to 2-6-18, as defined herein.

An electronic apparatus may include the light-emitting device, as described above.

The electronic apparatus may further include a thin-film transistor, wherein the thin-film transistor may include a source electrode and a drain electrode, and the first electrode of the light-emitting device may be electrically connected to the source electrode or the drain electrode.

The electronic apparatus may further include a color filter, a color conversion layer, a touch screen layer, a polarizing layer, or any combination thereof.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
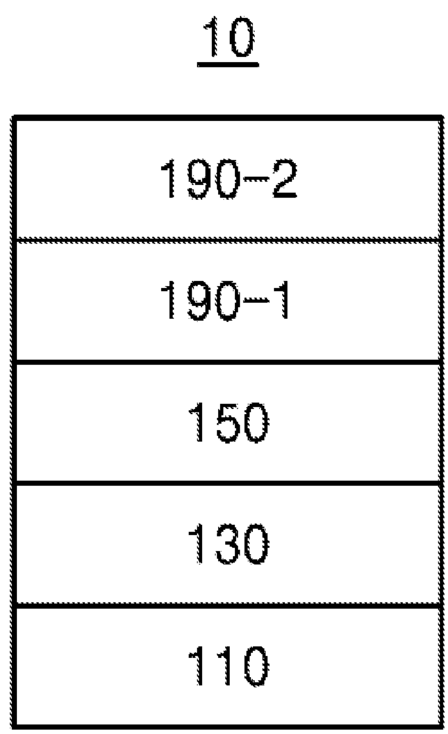
FIG. 1 is a schematic cross-sectional view of a light-emitting device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

According to an aspect, a light-emitting device includes: a first electrode; a second electrode facing the first electrode; an interlayer located between the first electrode and the second electrode and including an emission layer; and a first capping layer and a second capping layer located outside the second electrode, wherein the first capping layer includes at least one compound selected from compounds represented by Formulae 1-1 to 1-3, and the second capping layer includes at least one compound selected from compounds represented by Formulae 2-1 to 2-6.

Formula 1-1

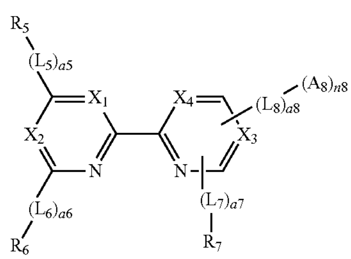

Formula 1-2

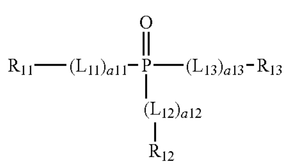

Formula 1-3

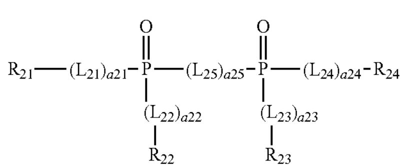

Formula 2-1

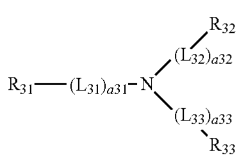

-continued

Formula 2-2

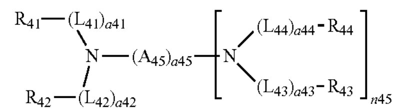

Formula 2-3

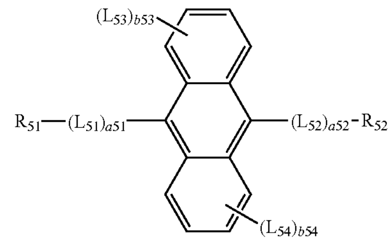

Formula 2-4

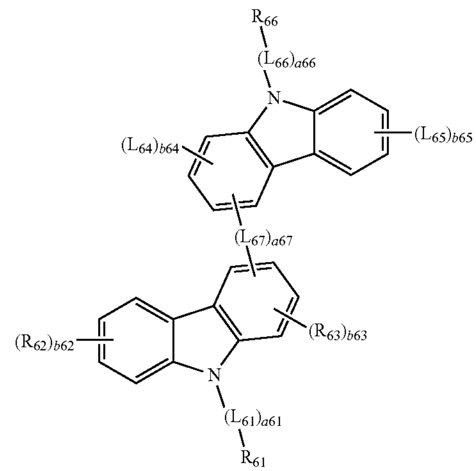

Formula 2-5

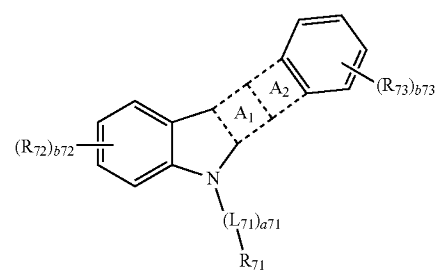

Formula 2-6

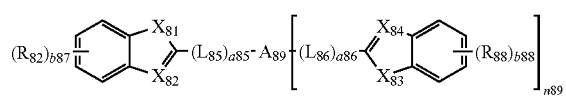

In Formulae 1-1, 2-2, and 2-6, n8 may be 0 or 1, when n8 is 0, $(A_8)_{n8}$ may be represented by *—$R_8$, when n8 is 1, $(A_8)_{n8}$ may be represented by Formula 1A, and Formula 1A

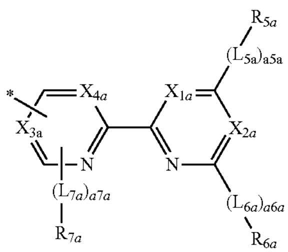

n45 may be 1 or 2.

When n45 is 1, $A_{45}$ may be selected from: *—O—*'; *—S—*'; *—Se—*'; *—N($R_{45a}$)—*'; *—C($R_{45a}$)($R_{45b}$)—*'; *—Si($R_{45a}$)($R_{45b}$)—*'; *—S(═O)$_2$—*'; *—P(═O)($R_{45a}$)—*'; a $C_3$-$C_{60}$ carbocyclic group unsubstituted or substituted with at least one $R_{10a}$, and a $C_1$-$C_{60}$ heterocyclic group unsubstituted or substituted with at least one $R_{10a}$.

In an embodiment, when n45 is 1, $A_{45}$ may be selected from: *—O—*'; *—S—*'; *—Se—*'; *—N($R_{45a}$)—*'; *—C($R_{45a}$)($R_{45b}$)—*'; *—Si($R_{45a}$)($R_{45b}$)—*'; *—S(═O)$_2$—*'; *—P(═O)($R_{45a}$)—*'; a phenylene group, a naphthylene group, an anthracenylene group, a phenanthrenylene group, a pyrenylene group; and a phenylene group, a naphthylene group, an anthracenylene group, a phenanthrenylene group, and a pyrenylene group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, an anthracenyl group, a phenanthrenyl group, or a pyrenyl group, but embodiments of the invention are not limited thereto.

When n45 is 2, $A_{45}$ may be selected from a $C_3$-$C_{60}$ carbocyclic group unsubstituted or substituted with at least one $R_{10a}$ and a $C_1$-$C_{60}$ heterocyclic group unsubstituted or substituted with at least one $R_{10a}$.

n89 may be 0 or 1.

When n89 is 0, $A_{89}$ may be selected from *—N($R_{89a}$)($R_{89b}$); a $C_3$-$C_{60}$ carbocyclic group unsubstituted or substituted with at least one $R_{10a}$, and a $C_1$-$C_{60}$ heterocyclic group unsubstituted or substituted with at least one $R_{10a}$.

In an embodiment, when n89 is 0, $A_{89}$ may be selected from: *—N($R_{89a}$)($R_{89b}$); a phenyl group, a naphthyl group, an anthracenyl group, a phenanthrenyl group, a triazole group, a fluorenyl group, a carbazolyl group, a dibenzofuranyl group, a dibenzothiophenyl group, and a benzocarbazolyl group, each unsubstituted or substituted with a $C_1$-$C_{20}$ alkyl group, a $C_1$-$C_{20}$ alkoxy group, a phenyl group, a naphthyl group, an anthracenyl group, a phenanthrenyl group, a triazole group, a fluorenyl group, a carbazolyl group, a dibenzofuranyl group, a dibenzothiophenyl group, a benzocarbazolyl group, or any combination thereof, but embodiments of the invention are not limited thereto.

When n89 is 1, $A_{89}$ may be selected from: *—O—*'; *—S—*'; *—Se—*'; *—N($R_{89a}$)—*'; *—C($R_{89a}$)($R_{89b}$)—*'; *—Si($R_{89a}$)($R_{89b}$)—*'; *—S(═O)$_2$—*'; *—P(═O)($R_{89a}$)—*'; a $C_3$-$C_{60}$ carbocyclic group unsubstituted or substituted with at least one $R_{10a}$, and a $C_1$-$C_{60}$ heterocyclic group unsubstituted or substituted with at least one $R_{10a}$.

In an embodiment, when n89 is 1, $A_{89}$ may be selected from: *—O—*'; *—S—*';

*—Se—*'; *—N($R_{89a}$)—*'; *—C($R_{89a}$)($R_{89b}$)—*'; *—Si($R_{89a}$)($R_{89b}$)—*'; *—S(═O)$_2$—*'; *—P(═O)($R_{9a}$)—*'; a phenylene group, a naphthylene group, an anthracenylene group, a phenanthrenylene group, a triazolene group, a fluorenylene group, a carbazolylene group, a dibenzofuranylene group, a dibenzothiophenylene group, a benzocarbazolylene group; and a phenylene group, a naphthylene group, an anthracenylene group, a phenanthrenylene group, a triazolene group, a fluorenylene group, a carbazolylene group, a dibenzofuranylene group, a dibenzothiophenylene group, and a benzocarbazolylene group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, an anthracenyl group, a phenanthrenyl group, a triazole group, a fluorenyl group, a carbazolyl group, a dibenzofuranyl group, a dibenzothiophenyl group, and a benzocarbazolyl group, but embodiments of the invention are not limited thereto.

In Formula 1-1, $X_1$ may be C-$(L_1)_{a1}$-$R_1$ or N, $X_2$ may be C-$(L_2)_{a2}$-$R_2$ or N, $X_3$ may be C-$(L_3)_{a3}$-$R_3$ or N, and $X_4$ may be C-$(L_4)_{a4}$-$R_4$ or N. $X_{1a}$ may be C-$(L_{1a})_{a1a}$-$R_{1a}$ or N, $X_{2a}$ may be C-$(L_{2a})_{a2a}$-$R_{2a}$ or N, $X_{3a}$ may be C-$(L_{3a})_{a3a}$-$R_{3a}$ or N, and $X_{4a}$ may be C-$(L_{4a})_{a4a}$-$R_{4a}$ or N.

In an embodiment, $X_1$ may be C-$(L_1)_{a1}$-$R_1$, $X_2$ may be C-$(L_2)_{a2}$-$R_2$, $X_3$ may be C-$(L_3)_{a3}$-$R_3$, and $X_4$ may be C-$(L_4)_{a4}$-$R_4$. For example, $X_1$ may be N, $X_2$ may be C-$(L_2)_{a2}$-$R_2$, $X_3$ may be C-$(L_3)_{a3}$-$R_3$, and $X_4$ may be C-$(L_4)_{a4}$-$R_4$. For example, $X_2$ may be N, $X_1$ may be C-$(L_1)_{a1}$-$R_1$, $X_3$ may be C-$(L_3)_{a3}$-$R_3$, and $X_4$ may be C-$(L_4)_{a4}$-$R_4$. $X_4$ may be N, $X_1$ may be C-$(L_1)_{a1}$-$R_2$, $X_2$ may be C-$(L_2)_{a2}$-$R_2$, and $X_4$ may be C-$(L_4)_{a4}$-$R_4$. For example, $X_1$ may be N, $X_2$ may be N, $X_3$ may be C-$(L_3)_{a3}$-$R_3$, and $X_4$ may be C-$(L_4)_{a4}$-$R_4$. For example, $X_2$ may be N, $X_3$ may be N, $X_1$ may be C-$(L_1)_{a1}$-$R_1$, and $X_4$ may be C-$(L_4)_{a4}$-$R_4$.

In an embodiment, $X_{1a}$ may be C-$(L_{1a})_{a1a}$-$R_{1a}$, $X_{2a}$ may be C-$(L_{2a})_{a2a}$-$R_{2a}$, $X_{3a}$ may be C-$(L_{3a})_{a3a}$-$R_{3a}$, and $X_{4a}$ may be C-$(L_{4a})_{a4a}$-$R_{4a}$. For example, $X_{1a}$ may be N, $X_{2a}$ may be C-$(L_{2a})$aza-$R_{2a}$, $X_{3a}$ may be C-$(L_{3a})_{a3a}$-$R_{3a}$, and $X_{4a}$ may be C-$(L_{4a})_{a4a}$-$R_{4a}$. For example, $X_{2a}$ may be N, $X_{1a}$ may be C-$(L_{1a})_{a1a}$-$R_{1a}$, $X_{3a}$ may be C-$(L_{3a})_{a3a}$-$R_{3a}$, and $X_{4a}$ may be C-$(L_{4a})_{a4a}$-$R_{4a}$. $X_{4a}$ may be N, $X_{1a}$ may be C-$(L_{1a})_{a1a}$-$R_{2a}$, $X_{2a}$ may be C-$(L_{2a})_{a2a}$-$R_{2a}$, and $X_4$ may be C-$(L_{4a})_{a4a}$-$R_{4a}$. For example, $X_{1a}$ may be N, $X_{2a}$ may be N, $X_{3a}$ may be C-$(L_{3a})_{a3a}$-$R_{3a}$, and $X_{4a}$ may be C-$(L_{4a})_{a4a}$-$R_{4a}$. For example, $X_2a$ may be N, $X_{3a}$ may be N, $X_{1a}$ may be C-$(L_{1a})_{a1a}$-$R_{1a}$, and $X_{4a}$ may be C-$(L_{4a})_{a4a}$-$R_{4a}$.

In an embodiment, $X_1$ and $X_{1a}$ may be identical to or different from each other, $X_2$ and $X_{2a}$ may be identical to or different from each other, $X_3$ and $X_3$a may be identical to or different from each other, and $X_4$ and $X_4$a may be identical to or different from each other. In an embodiment, $X_1$ and $X_{1a}$ may be identical to each other, $X_2$ and $X_{2a}$ may be identical to each other, $X_3$ and $X_{3a}$ may be identical to each other, and $X_4$ and $X_{4a}$ may be identical to each other. In Formula 2-6, $X_{81}$ may be selected from C($R_{81a}$)($R_{81b}$), Si($R_{81a}$)($R_{81b}$), N($R_{81a}$), O, S, and Se, $X_{82}$ may be C($R_{82a}$) or N, $X_{83}$ may be selected from C($R_{83a}$)($R_{83b}$), Si($R_{83a}$)($R_{83b}$), N($R_{83a}$), O, S, and Se, and $X_{84}$ may be C($R_{84a}$) or N. In an embodiment, $X_{81}$ may be O, $X_{82}$ may be N, $X_{83}$ may be O, and $X_{84}$ may be N. For example, $X_{81}$ may be S, $X_{82}$ may be N, $X_{83}$ may be O, and $X_{84}$ may be N. For example, $X_{81}$ may be O, $X_{82}$ may be N, $X_{83}$ may be S, and $X_{84}$ may be N. For example, $X_{81}$ may be S, $X_{82}$ may be N, $X_{83}$ may be S, and $X_{84}$ may be N. In Formula 2-5, ring $A_1$ may be a substituted or unsubstituted benzene ring, and ring $A_2$ may be a 5-membered ring represented by Formula 2A.

Formula 2A

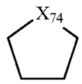

In an embodiment, ring $A_1$ may be a benzene ring unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, or any combination thereof. In an embodiment, ring $A_1$ may be an unsubstituted benzene ring. In Formula 2A, $X_{74}$ may be selected from $C(R_{74a})(R_{74b})$, $Si(R_{74a})(R_{74b})$, $N(R_{74a})$, O, S, and Se. In an embodiment, $X_{74}$ may be selected from $C(R_{74a})(R_{74b})$ and $N(R_{74a})$.

In Formulae 1-1 to 1-3, 2-1 to 2-6, and 1A, $L_1$ to $L_8$, $L_{1a}$ to $L_{7a}$, $L_{11}$ to $L_{13}$, $L_{21}$ to $L_{25}$, $L_{31}$ to $L_{33}$, $L_{41}$ to $L_{44}$, $L_{51}$ to $L_{52}$, $L_{61}$, $L_{66}$, $L_{67}$, $L_{71}$, $L_{85}$, and $L_{86}$ may each independently be selected from: *—O—*'; *—S—*'; *—Se—*'; *—N($R_{10}$)—*'; *—C($R_{10}$)($R_{20}$)—*'; *—Si($R_{10}$)($R_{20}$)—*'; *—S(═O)$_2$—*'; *—P(═O)($R_{10}$)—*'; a $C_3$-$C_{60}$ carbocyclic group unsubstituted or substituted with at least one $R_{10a}$, and a $C_1$-$C_{60}$ heterocyclic group unsubstituted or substituted with at least one $R_{10a}$.

In an embodiment, $L_1$ to $L_8$, $L_{1a}$ to $L_{7a}$, $L_{11}$ to $L_{13}$, $L_{21}$ to $L_{25}$, $L_{31}$ to $L_{33}$, $L_{41}$ to $L_{44}$, $L_{51}$ to $L_{52}$, $L_{61}$, $L_{66}$, $L_{67}$, $L_{71}$, $L_{85}$, and $L_{86}$ may each independently be selected from: a single bond; *—O—*'; *—S—*'; *—Se—*'; *—N($R_{10}$)—*'; *—C($R_{10}$)($R_{20}$)—*'; *—Si($R_{10}$)($R_{20}$)—*'; *—S(═O)$_2$—*'; *—P(═O)($R_{10}$)—*'; or a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a quinolinylene group, an isoquinolinylene group, a benzoquinolinylene group, a benzoisoquinolinylene group, a dibenzoquinolinylene group, a dibenzoisoquinolinylene group, a 6,9-dihydro-5H-indeno[2,1-b]fluoranthenylene group, a 9,10-dihydrodibenzo[e,l]acephenanthrylene group, a benzo[g]fluoranthenylene group, a benzo[f]tetraphenylene group, a benzo[m]tetraphenylene group, a benzochrysenylene group, a biphenylene group, a phenylpyridinylene group, a phenanthrolene group, a dibenzoquinolinylene group, a bipyridinylene group, and a pyridinylene group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a quinolinyl group, an isoquinolinyl group, a benzoquinolinyl group, a benzoisoquinolinyl group, a dibenzoquinolinyl group, a dibenzoisoquinolinyl group, a 6,9-dihydro-5H-indeno[2,1-b]fluoranthenyl group, a 9,10-dihydrodibenzo[e,l]acephenanthryl group, a benzo[g]fluoranthenyl group, a benzo[f]tetraphenyl group, a benzo[m]tetraphenyl group, a benzochrysenyl group, a biphenyl group, a phenylpyridinyl group, a phenanthrolinyl group, a dibenzoquinol group, a bipyridinyl group, a pyridinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), —P(═O)($Q_{31}$)($Q_{32}$), or a combination thereof, but embodiments of the invention are not limited thereto.

$Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In an embodiment, $L_1$ to $L_8$, $L_{1a}$ to $L_{7a}$, $L_{11}$ to $L_{13}$, $L_{21}$ to $L_{25}$, $L_{31}$ to $L_{33}$, $L_{41}$ to $L_{44}$, $L_{51}$ to $L_{52}$, $L_{61}$, $L_{66}$, $L_{67}$, $L_{71}$, $L_{85}$, and $L_{86}$ may each independently be selected from: a single bond; *—O—*'; *—S—*'; *—Se—*'; *—N($R_{10}$)—*'; *—C($R_{10}$)($R_{20}$)—*'; *—Si($R_{10}$)($R_{20}$)—*'; *—S(═O)$_2$—*'; *—P(═O)($R_{10}$)—*'; or a phenylene group, a naphthylene group, a spiro-anthracenefluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a thiophenylene group, a furanylene group, a carbazolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a quinolinylene group, an isoquinolinylene group, a benzoquinolinylene group, a benzoisoquinolinylene group, a dibenzoquinolinylene group, a dibenzoisoquinolinylene group, a 6,9-dihydro-5H-indeno[2,1-b]fluoranthenylene group, a 9,10-dihydrodibenzo[e,l]acephenanthrylene group, a benzo[g]fluoranthenylene group, a benzo[f]tetraphenylene group, a benzo[m]tetraphenylene group, a benzochrysenylene group, a biphenylene group, a phenylpyridinylene group, a phenanthrolinylene group, a dibenzoquinolinylene group, a bipyridinylene group, and a pyridinylene group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a naphthyl group, a spiro-anthracenefluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a quinolinyl group, an isoquinolinyl group, a benzoquinolinyl group, a benzoisoquinolinyl group, a dibenzoquinolinyl group, a dibenzoisoquinolinyl group, a 6,9-dihydro-5H-indeno[2,1-b]fluoranthenyl group, a 9,10-dihydrodibenzo[e,l]acephenanthryl group, a benzo[g]fluoranthenyl group, a benzo[f]tetraphenyl group, a benzo[m]tetraphenyl group, a benzochrysenyl group, a biphenyl group, a phenylpyridinyl group, a phenanthrolinyl group, a dibenzoquinol group, a bipyridinyl group, a pyridinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), —P(═O)($Q_{31}$)($Q_{32}$), or a combination thereof, but is embodiments of the invention are not limited thereto.

In an embodiment, $L_1$ to $L_8$, $L_{1a}$ to $L_{7a}$, $L_{11}$ to $L_{13}$, $L_{21}$ to $L_{25}$, $L_{31}$ to $L_{33}$, $L_{41}$ to $L_{44}$, $L_{51}$ to $L_{52}$, $L_{61}$, $L_{66}$, $L_{67}$, $L_{71}$, $L_{85}$, and $L_{86}$ may each independently be selected from: a single bond; *—O—*'; *—S—*'; *—Se—*'; *—N($R_{10}$)—*'; *—C($R_{10}$)($R_{20}$)—*'; *—Si($R_{10}$)($R_{20}$)—*'; *—S(═O)$_2$—*'; *—P(═O)($R_{10}$)—*'; and Formulae 3-1 to 3-115, but embodiments of the invention are not limited thereto.

3-1

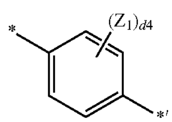

3-2

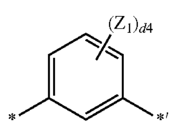

3-3

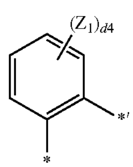

3-4

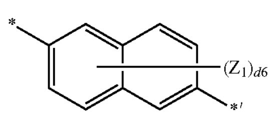

3-5

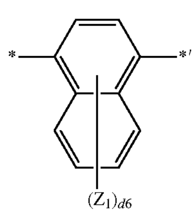

3-6

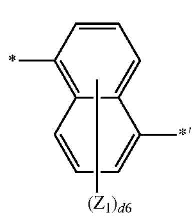

-continued 3-7

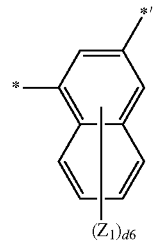

3-8

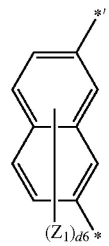

3-9

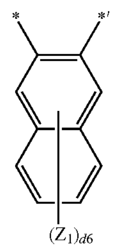

3-10

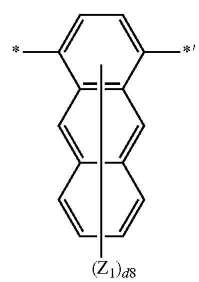

3-11

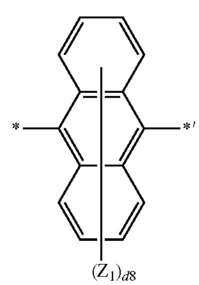

3-12

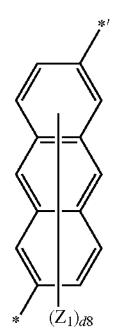

-continued
3-13
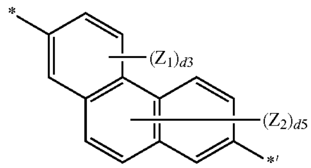
3-14
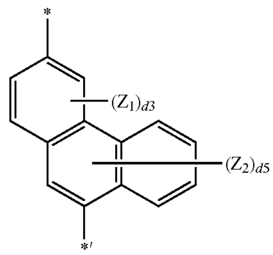
3-15
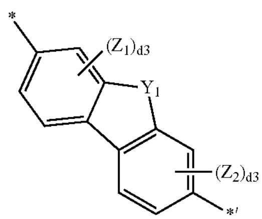
3-16
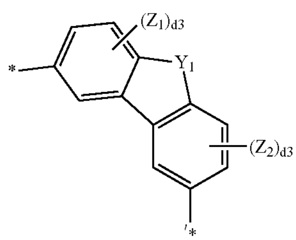
3-17
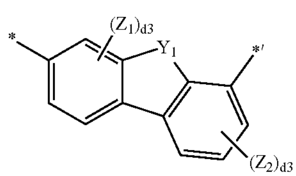
3-18
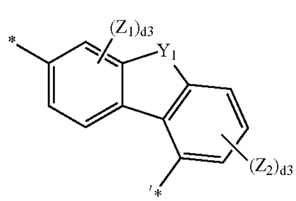
3-19
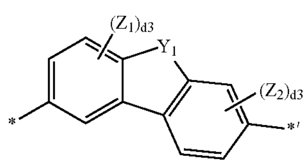
3-20
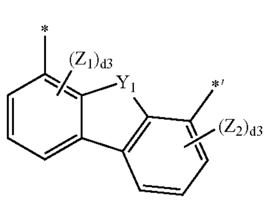
-continued
3-21
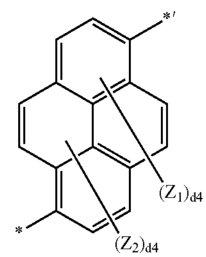
3-22
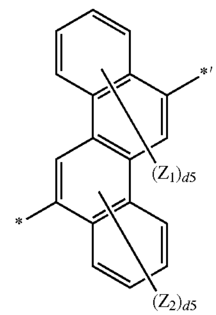
3-23
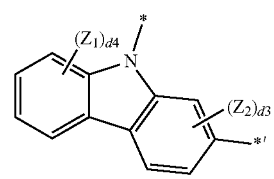
3-24
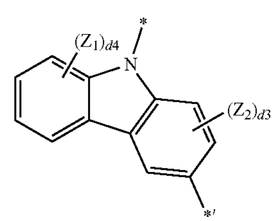
3-25
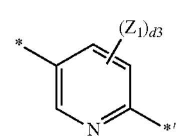
3-26
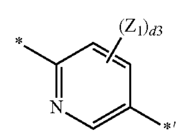
3-27
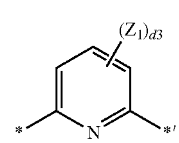
3-28
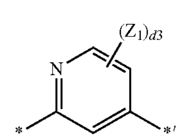

-continued
3-29
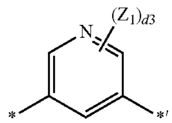
3-30
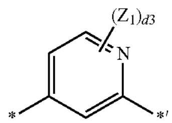
3-31
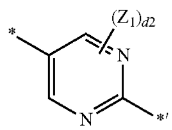
3-32
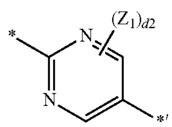
3-33
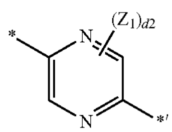
3-34
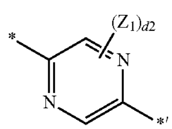
3-35
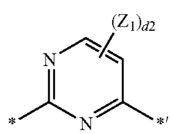
3-36
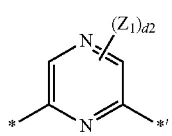
3-37
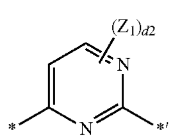
3-38
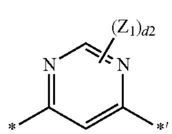
3-39
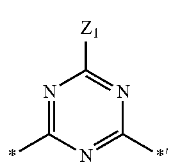
-continued
3-40
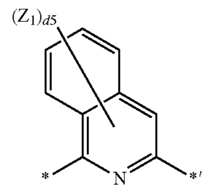
3-41
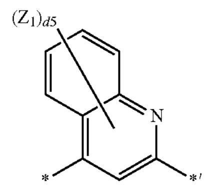
3-42
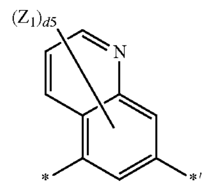
3-43
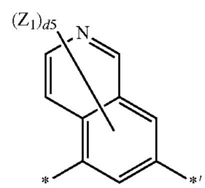
3-44
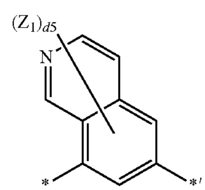
3-45
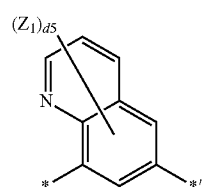
3-46
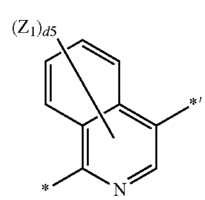
3-47
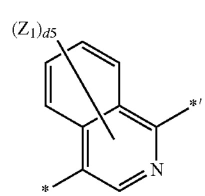

-continued
3-48
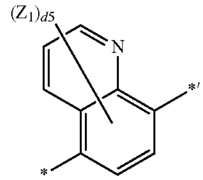
3-49
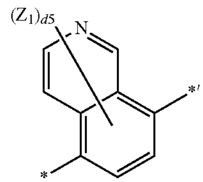
3-50
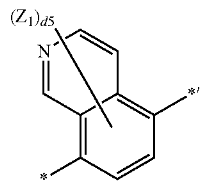
3-51
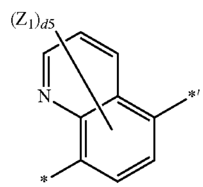
3-52
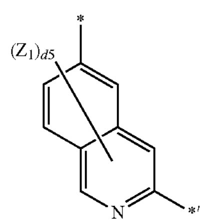
3-53
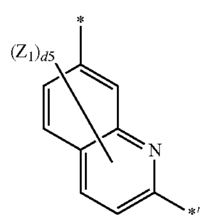
3-54
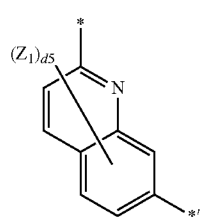
3-55
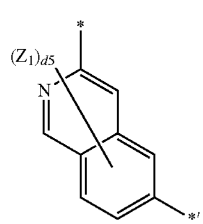
-continued
3-56
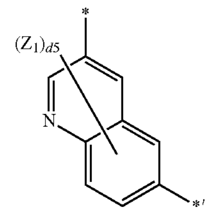
3-57
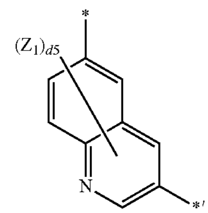
3-58
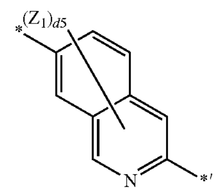
3-59
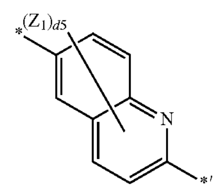
3-60
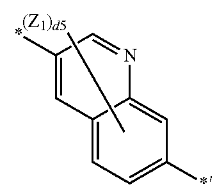
3-61
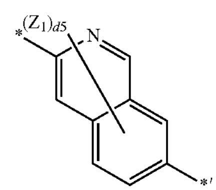
3-62
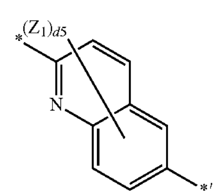
3-63
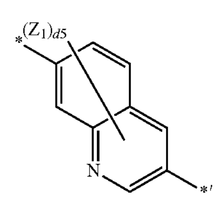

-continued
3-64
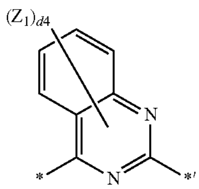
3-65
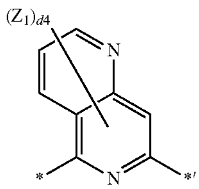
3-66
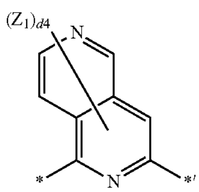
3-67
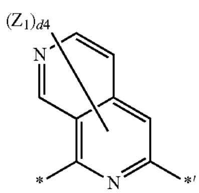
3-68
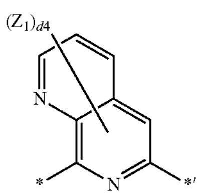
3-69
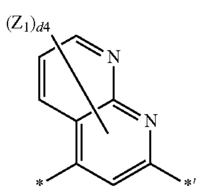
3-70
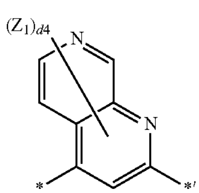
3-71
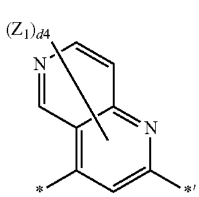
-continued
3-72
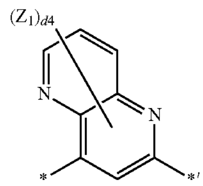
3-73
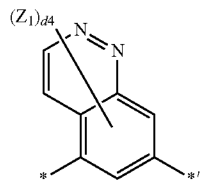
3-74
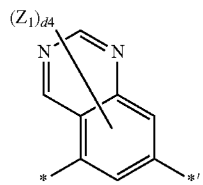
3-75
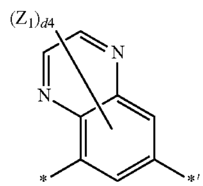
3-76
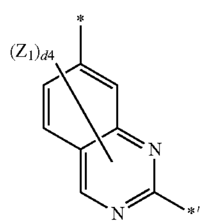
3-77
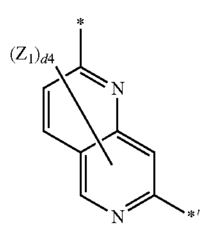
3-78
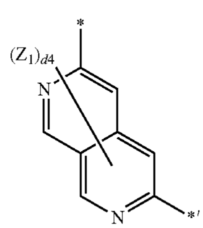

-continued
3-79
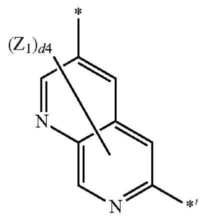
3-80
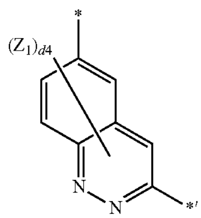
3-81
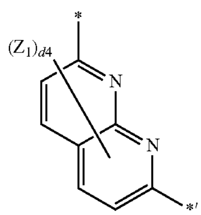
3-82
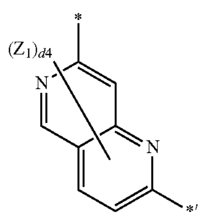
3-83
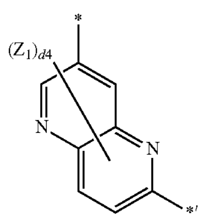
3-84
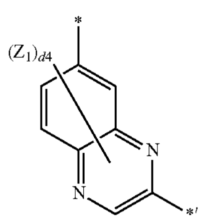
3-85
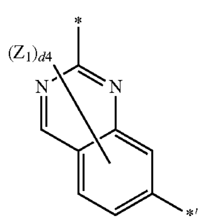
-continued
3-86
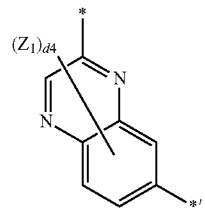
3-87
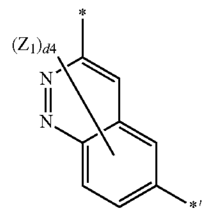
3-88
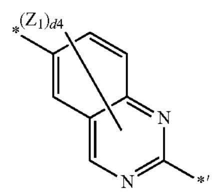
3-89
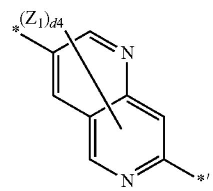
3-90
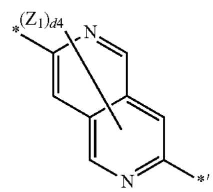
3-91
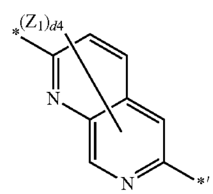
3-92
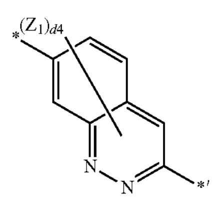
3-93
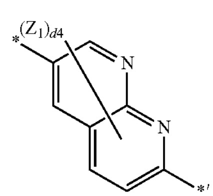

-continued
3-94
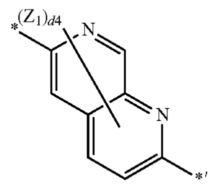
3-95
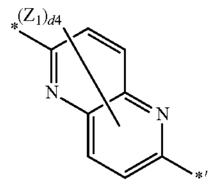
3-96
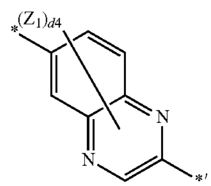
3-97
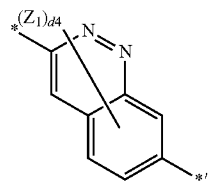
3-98
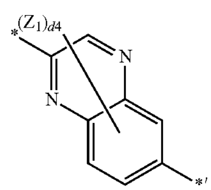
3-99
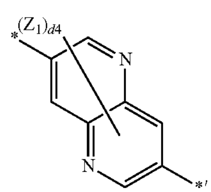
3-100
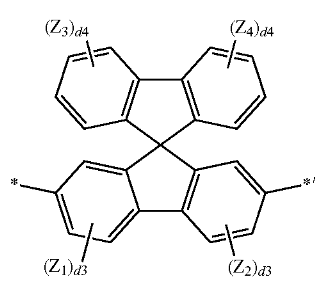
-continued
3-101
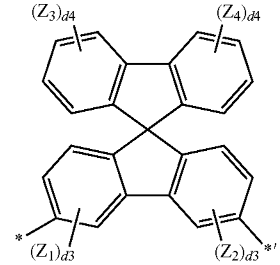
3-102
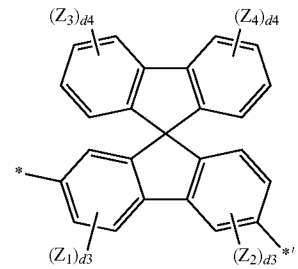
3-103
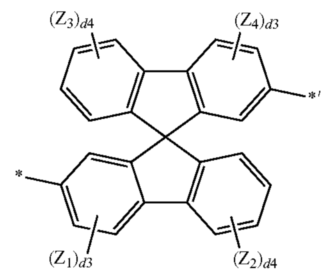
3-104
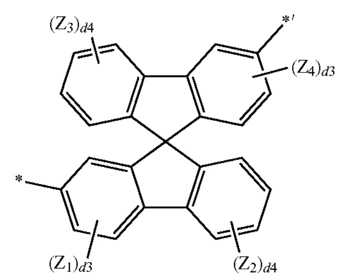
3-105
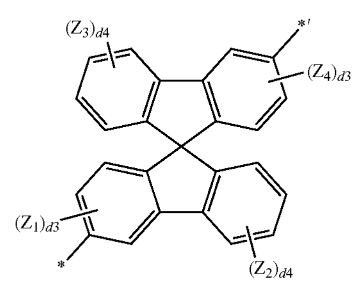
3-106
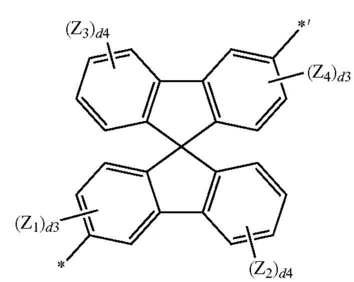

-continued 3-107

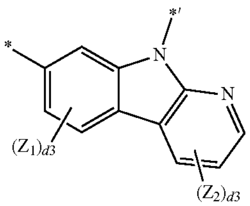

3-108

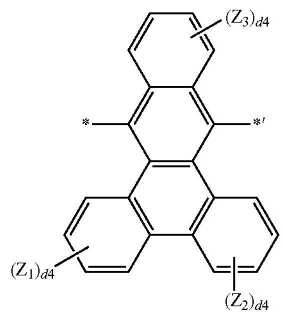

3-109

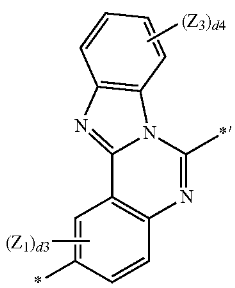

3-110

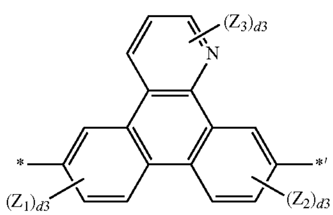

3-111

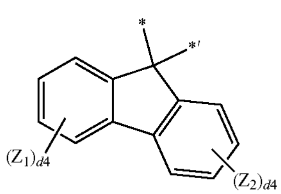

3-112

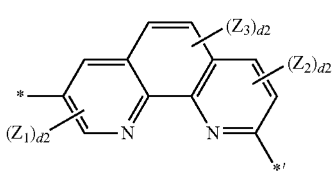

3-113

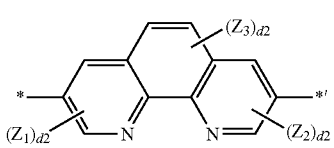

-continued 3-114

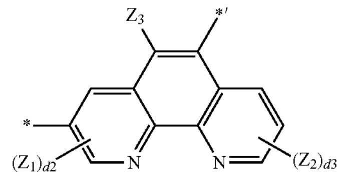

3-115

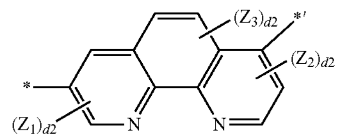

In Formulae 3-1 to 3-115, $Y_1$ may be O, S, $N(Z_5)$, or $C(Z_5)(Z_6)$, $Z_1$ to $Z_6$ may each independently be: hydrogen, deuterium, —F, —Cl, —Br, —I, a hydroxyl group, a cyano group, or a nitro group; a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or any combination thereof; or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, wherein $Q_1$ to $Q_3$, $Q_{11}$ to $Q_{13}$, $Q_{21}$ to $Q_{23}$ and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, d2 may be an integer from 0 to 2, d3 may be an integer from 0 to 3, d4 may be an integer from 0 to 4, d5 may be an integer from 0 to 5, d6 may be an integer from 0 to 6, d8 may be an integer from 0 to 8, and

* and *' may each indicate a binding site to a neighboring atom.

In an embodiment, $L_1$ may be identical to or different from $L_{1a}$, $L_2$ may be identical to or different from $L_{2a}$, $L_3$ may be identical to or different from $L_{3a}$, $L_4$ may be identical to or different from $L_{4a}$, $L_5$ may be identical to or different from $L_{5a}$, $L_6$ may be identical to or different from $L_{6a}$, $L_7$ may be identical to or different from $L_{7a}$, and $L_8$ may be identical to or different from $L_{8a}$.

In an embodiment, $L_1$ may be identical to $L_{1a}$, $L_2$ may be identical to $L_{2a}$, $L_3$ may be identical to $L_{3a}$, $L_4$ may be identical to $L_{4a}$, $L_5$ may be identical to $L_{5a}$, $L_6$ may be identical to $L_{6a}$, $L_7$ may be identical to $L_{7a}$, and $L_8$ may be identical to $L_{8a}$.

In Formulae 1-1 to 1-3, 2-1 to 2-6, and 1A, a1 to a8, ala to a7a, a11 to a13, a21 to a25, a31 to a33, a41 to a45, a51 to a52, a61, a66, a67, a71, a85, and a86 may each independently be an integer from 1 to 5.

In an embodiment, a1 to a8, ala to a7a, a11 to a13, a21 to a25, a31 to a33, a41 to a45, a51 to a52, a61, a66, a67, a71, a85, and a86 may each independently be an integer from 1 to 3.

In an embodiment, when a1 is 2 or more, two or more of $L_1$(s) may be identical to or different from each other. When a2 is 2 or more, two or more of $L_2$(s) may be identical to or different from each other. When a3 is 2 or more, two or more of $L_3$(s) may be identical to or different from each other. When a4 is 2 or more, two or more of $L_4$(s) may be identical to or different from each other. When a5 is 2 or more, two or more of $L_5$(s) may be identical to or different from each other. When a6 is 2 or more, two or more of $L_6$(s) may be identical to or different from each other. When a7 is 2 or more, two or more of $L_7$(s) may be identical to or different from each other. When a8 is 2 or more, two or more of $L_8$(s) may be identical to or different from each other. When ala is 2 or more, two or more of $L_{1a}$(s) may be identical to or different from each other. When a2a is 2 or more, two or more of $L_{2a}$(s) may be identical to or different from each other. When a3a is 2 or more, two or more of $L_{3a}$(s) may be identical to or different from each other. When a4a is 2 or more, two or more of $L_{4a}$(s) may be identical to or different from each other. When a5a is 2 or more, two or more of $L_{5a}$(s) may be identical to or different from each other. When a6a is 2 or more, two or more of $L_{6a}$(s) may be identical to or different from each other. When a7a is 2 or more, two or more of $L_{7a}$(s) may be identical to or different from each other. When a11 is 2 or more, two or more of $L_{11}$(s) may be identical to or different from each other. When a12 is 2 or more, two or more of $L_{12}$(s) may be identical to or different from each other. When a13 is 2 or more, two or more of $L_{13}$(s) may be identical to or different from each other. When a21 is 2 or more, two or more of $L_{21}$(s) may be identical to or different from each other. When a22 is 2 or more, two or more of $L_{22}$(s) may be identical to or different from each other. When a23 is 2 or more, two or more of $L_{23}$(s) may be identical to or different from each other. When a24 is 2 or more, two or more of $L_{24}$(s) may be identical to or different from each other. When a25 is 2 or more, two or more of $L_{25}$(s) may be identical to or different from each other. When a31 is 2 or more, two or more of $L_{31}$(s) may be identical to or different from each other. When a32 is 2 or more, two or more of $L_{32}$(s) may be identical to or different from each other. When a33 is 2 or more, two or more of $L_{33}$(s) may be identical to or different from each other. When a41 is 2 or more, two or more of $L_{41}$(s) may be identical to or different from each other. When a42 is 2 or more, two or more of $L_{42}$(s) may be identical to or different from each other. When a43 is 2 or more, two or more of $L_{43}$(s) may be identical to or different from each other. When a44 is 2 or more, two or more of $L_{44}$(s) may be identical to or different from each other. When a45 is 2 or more, two or more of $L_{45}$(s) may be identical to or different from each other. When a51 is 2 or more, two or more of $L_{51}$(s) may be identical to or different from each other. When a52 is 2 or more, two or more of $L_{52}$(s) may be identical to or different from each other. When a61 is 2 or more, two or more of $L_{61}$(s) may be identical to or different from each other. When a66 is 2 or more, two or more of $L_{66}$(s) may be identical to or different from each other. When a67 is 2 or more, two or more of $L_{67}$(s) may be identical to or different from each other. When a71 is 2 or more, two or more of $L_{71}$(s) may be identical to or different from each other. When a85 is 2 or more, two or more of $L_{85}$(s) may be identical to or different from each other. When a86 is 2 or more, two or more of $L_{86}$(s) may be identical to or different from each other.

In an embodiment, a1 may be identical to or different from ala, a2 may be identical to or different from a2a, a3 may be identical to or different from a3a, a4 may be identical to or different from a4a, a5 may be identical to or different from a5a, a6 may be identical to or different from a6a, and a7 may be identical to or different from a7a.

In an embodiment, a1 may be identical to ala, a2 may be identical to a2a, a3 may be identical to a3a, a4 may be identical to a4a, a5 may be identical to a5a, a6 may be identical to a6a, and a7 may be identical to a7a.

In Formulae 1-1 to 1-3, 2-1 to 2-6, 1A, and 2A, $R_1$ to $R_8$, $R_{1a}$ to $R_{7a}$, $R_{10}$, $R_{20}$, $R_{11}$ to $R_{13}$, $R_{21}$ to $R_{24}$, $R_{31}$ to $R_{33}$, $R_{41}$ to $R_{44}$, $R_{45a}$, $R_{45b}$, $R_{51}$ to $R_{54}$, $R_{61}$ to $R_{66}$, $R_{71}$ to $R_{73}$, $R_{74a}$, $R_{74b}$, $R_{81a}$, $R_{81b}$, $R_{82a}$, $R_{83a}$, $R_{83b}$, $R_{84a}$, $R_{87}$, $R_{88}$, $R_{89a}$, and $R_{89b}$ may each independently be selected from hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), and —P(=O)($Q_1$)($Q_2$).

$Q_1$ to $Q_3$ may be the same as described herein.

In an embodiment, $R_1$ to $R_8$, $R_{1a}$ to $R_{8a}$, $R_{10}$, $R_{20}$, $R_{11}$ to $R_{13}$, $R_{21}$ to $R_{24}$, $R_{31}$ to $R_{33}$, $R_{41}$ to $R_{44}$, $R_{45a}$, $R_{45b}$, $R_{51}$ to $R_{54}$, $R_{61}$ to $R_{66}$, $R_{71}$ to $R_{73}$, $R_{74a}$, $R_{74b}$, $R_{81a}$, $R_{81b}$, $R_{82}$, $R_{3a}$, $R_{83b}$, $R_{84a}$, $R_{87}$, $R_{88}$, $R_{89a}$, and $R_{89b}$ may each independently be: hydrogen, deuterium, —F, —Cl, —Br, —I, a hydroxyl group, a cyano group, a nitro group; a $C_1$-$C_{60}$ alkyl group and a $C_1$-$C_{60}$ alkoxy group, each unsubstituted or substituted with deuterium, —F, —Cl, —Br, —I, a hydroxyl group, a cyano group, a nitro group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof, a cyclopentyl group, a cyclohexyl group, a cycloheptyl group, an adamantanyl group, a norbornanyl group, a norbornenyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-anthracenefluorenyl group, a benzofluoranthenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a dibenzoquinolinyl group, a dibenzoisoquinolinyl group, a benzophenanthrolinyl group, a phthalazinyl group, a naphthyridinyl group, a quinoxalinyl group, a benzoquinoxalinyl group, a quinazolinyl group, a benzoquinazolinyl group, a dibenzoquinazolinyl group, a dibenzoquinoxalinyl group, a cinnolinyl group, a phenanthridinyl group, an acridinyl group, a phenanthrolinyl group, a phenazinyl group, a phenoxazinyl group, a phenothiazinyl group, a phenoxathinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a benzochrysenyl group, a benzotriazole group, a benzodiazole group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphthosilolyl group, a phenanthrobenzofuranyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indenocarbazolyl group, an indolocarbazolyl group, a benzophenanthrenyl group, a tetraphenyl group, a benzotetraphenyl group, a fluoranthenobenzofuranyl group, a 9,9-dimethyl-9H-indeno[2,1-b]fluoranthenyl group, and a dibenzo[e,l]acephenanthrylenyl group, each unsubstituted or substituted with deuterium, —F, —Cl, —Br, —I, a hydroxyl group, a cyano group, a nitro group, a $C_1$-$C_{60}$ alkyl group, a $C_1$-$C_{60}$ alkoxy group, a cyclopentyl group, a cyclohexyl group, a cycloheptyl group, an adamantanyl group, a norbornanyl group, a norbornenyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-anthracenefluorenyl group, a benzofluoranthenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a benzothiazolyl group, a benzoisothiazolyl group, a benzoxazolyl group, a benzoisoxazolyl group, a benzochrysenyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphthosilolyl group, a phenanthrobenzofuranyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indenocarbazolyl group, an indolocarbazolyl group, a benzophenanthrenyl group, a fluoranthenobenzofuranyl group, a tetraphenyl group, a benzotetraphenyl group, a dibenzo[e,l]acephenanthrylenyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, —$P(=O)(Q_{31})(Q_{32})$, or any combination thereof; and —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, and —$P(=O)(Q_1)(Q_2)$, but embodiments of the invention are not limited thereto.

$Q_1$ to $Q_3$ and $Q_{31}$ to $Q_{33}$ may be the same as described herein.

In an embodiment, $R_1$ to $R_8$, $R_{1a}$ to $R_{8a}$, $R_{10}$, $R_{20}$, $R_{11}$ to $R_{13}$, $R_{21}$ to $R_{24}$, $R_{31}$ to $R_{33}$, $R_{41}$ to $R_{44}$, $R_{45a}$, $R_{45b}$, $R_{51}$ to $R_{54}$, $R_{61}$ to $R_{66}$, $R_{71}$ to $R_{73}$, $R_{74a}$, $R_{74b}$, $R_{81a}$, $R_{81b}$, $R_{82}$, $R_{83a}$, $R_{83b}$, $R_{84a}$, $R_{87}$, $R_{88}$, $R_{89a}$, and $R_{89b}$ may each independently be represented by: hydrogen, deuterium, —F, —Cl, —Br, —I, a hydroxyl group, a cyano group, a nitro group; a $C_1$-$C_{60}$ alkyl group and a $C_1$-$C_{60}$ alkoxy group, each unsubstituted or substituted with deuterium, —F, —Cl, —Br, —I, a hydroxyl group, a cyano group, a nitro group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, and —$P(=O)(Q_1)(Q_2)$; and one of Formulae 4-1 to 4-324, but embodiments of the invention are not limited thereto.

4-1

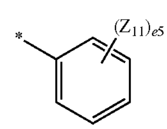

4-2

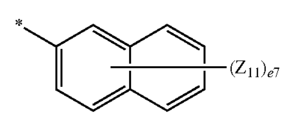

4-3

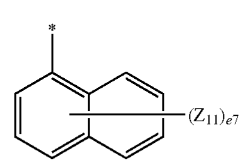

4-4

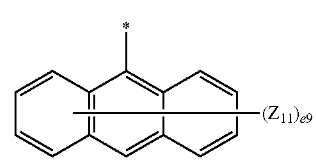

-continued
4-5
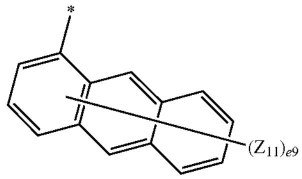
4-6
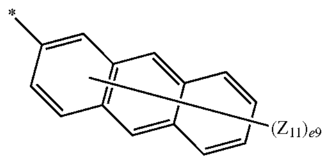
4-7
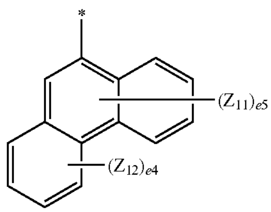
4-8
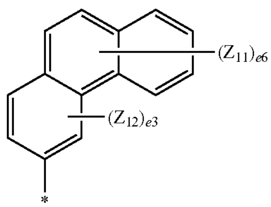
4-9
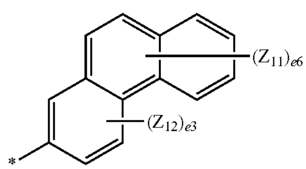
4-10
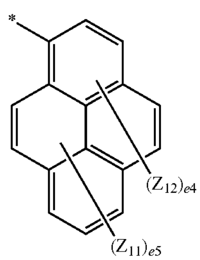
4-11
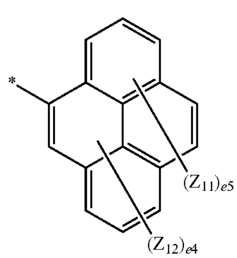
4-12
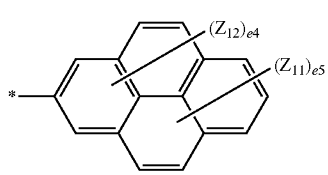
-continued
4-13
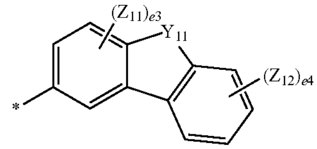
4-14
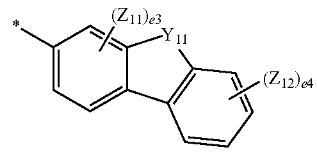
4-15
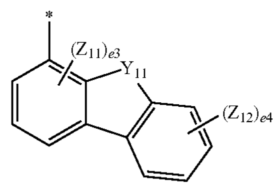
4-16
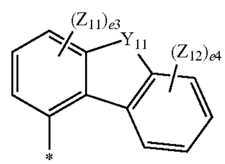
4-17
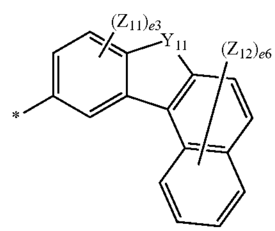
4-18
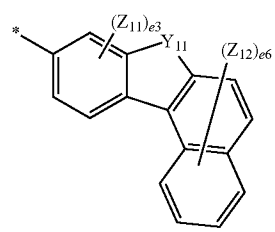
4-19
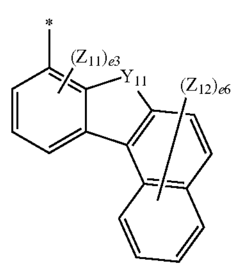
4-20
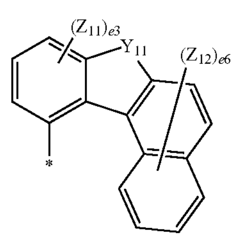

-continued
4-21
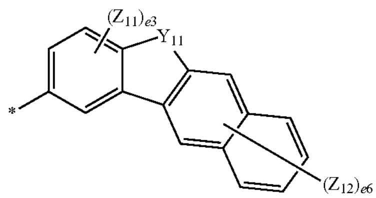
4-22
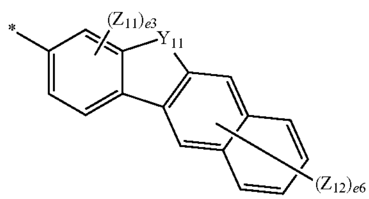
4-23
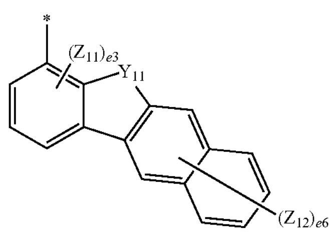
4-24
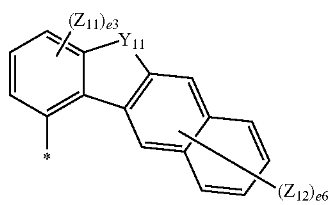
4-25
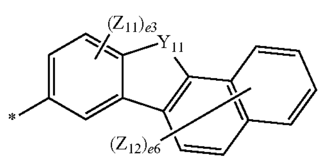
4-26
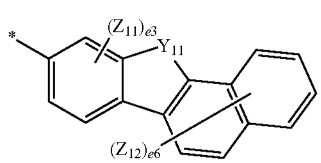
4-27
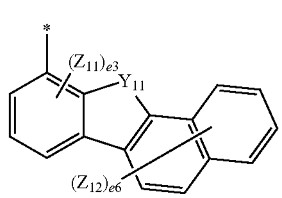
4-28
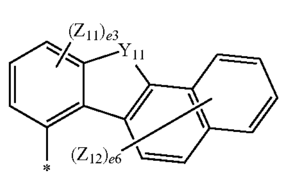
-continued
4-29
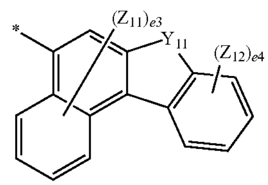
4-30
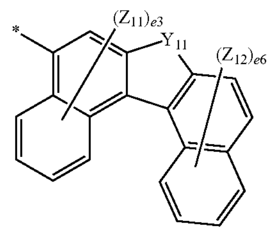
4-31
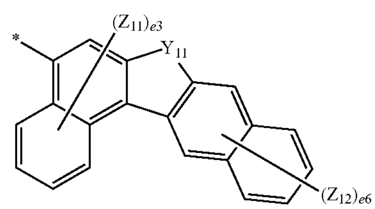
4-32
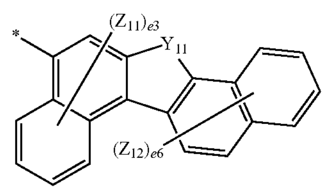
4-33
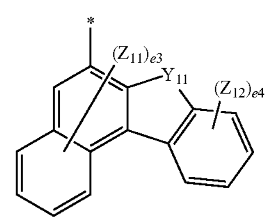
4-34
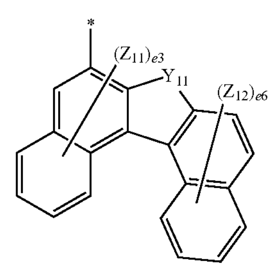
4-35
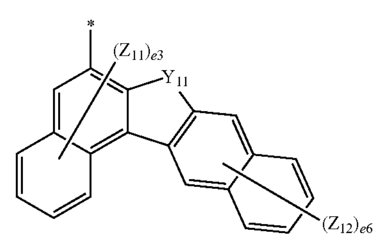

-continued
4-36
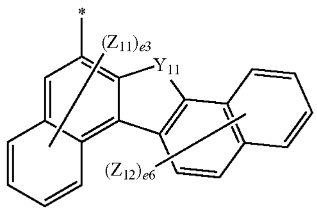
4-37
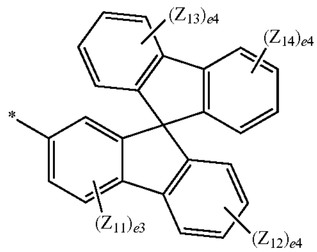
4-38
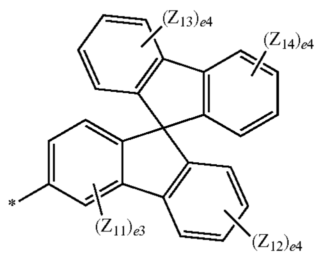
4-39
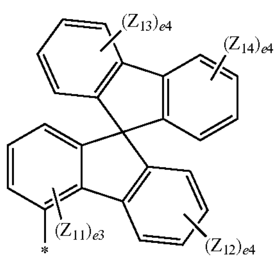
4-40
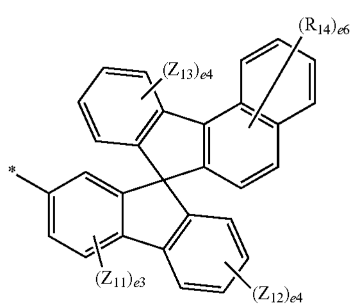
4-41
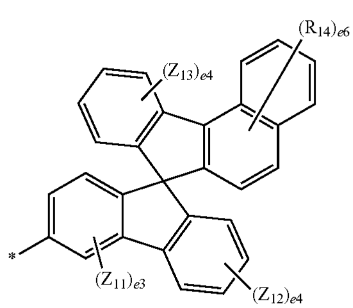
-continued
4-42
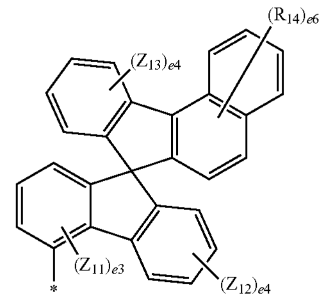
4-43
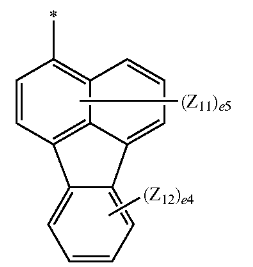
4-44
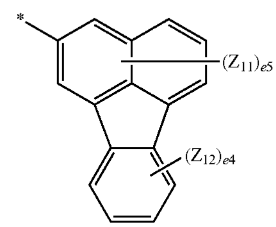
4-45
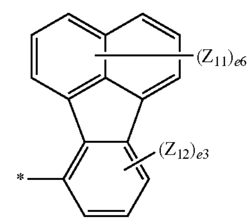
4-46
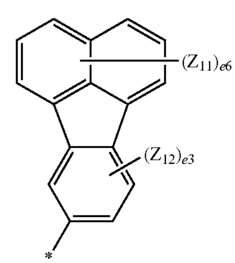
4-47
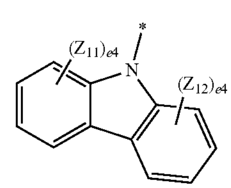

-continued
4-48
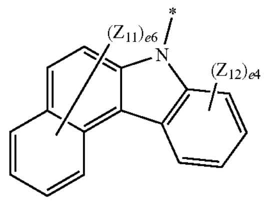
4-49
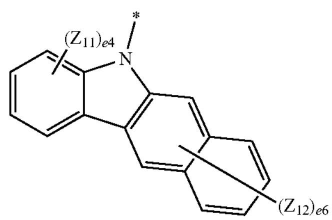
4-50
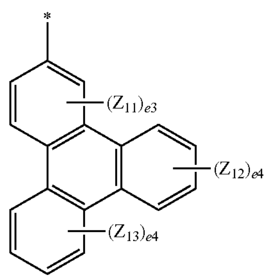
4-51
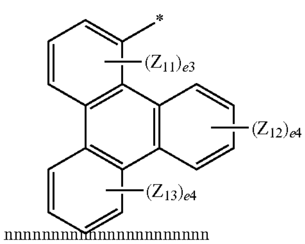
nnnnnnnnnnnnnnnnnnnnnn
4-52
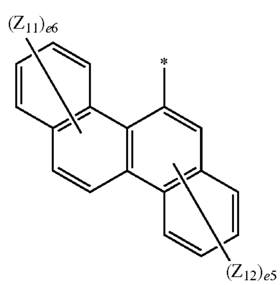
4-53
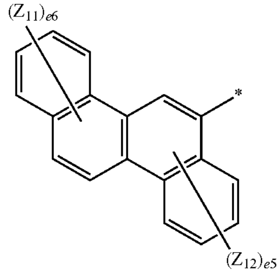
-continued
4-54
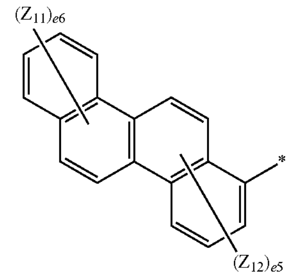
4-55
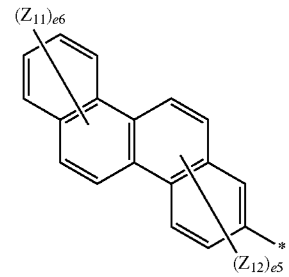
4-56
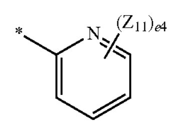
4-57
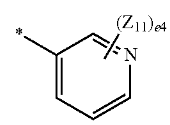
4-58
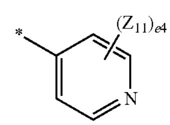
4-59
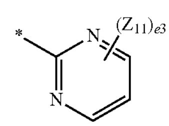
4-60
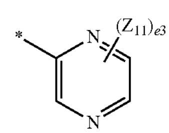
4-61
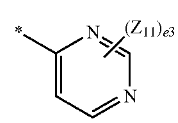
4-62
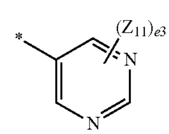
4-63
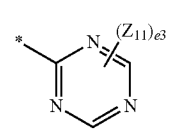

-continued
4-64
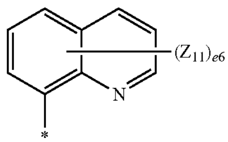
4-65
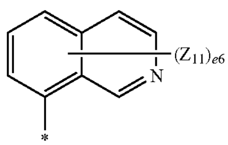
4-66
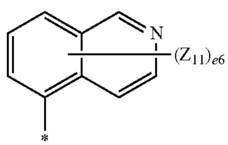
4-67
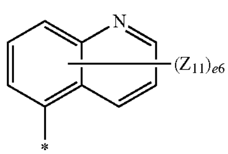
4-68
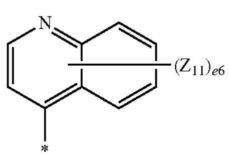
4-69
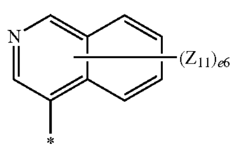
4-70
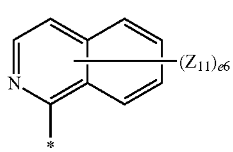
4-71
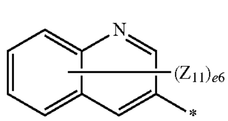
4-72
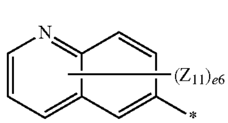
4-73
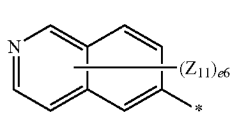
4-74
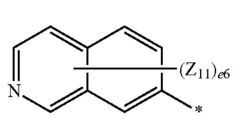
-continued
4-75
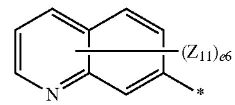
4-76
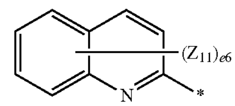
4-77
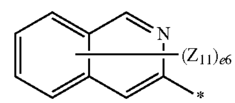
4-78
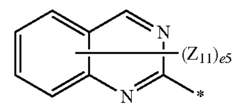
4-79
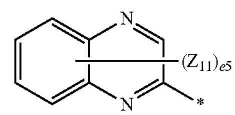
4-80
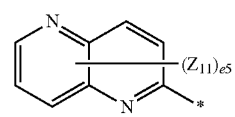
4-81
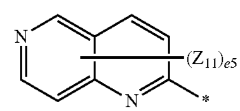
4-82
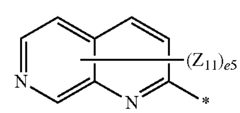
4-83
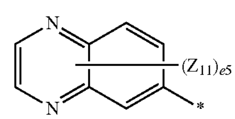
4-84
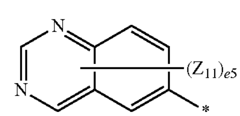
4-85
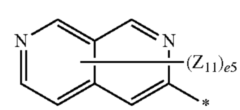
4-86
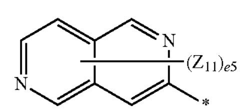
4-87
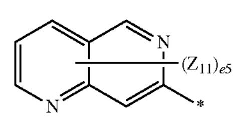
4-88
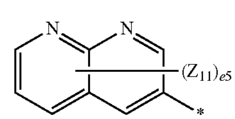

-continued
4-89
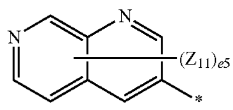
4-90
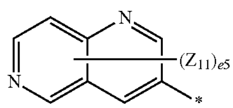
4-91
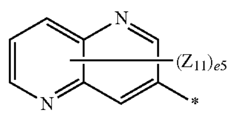
4-92
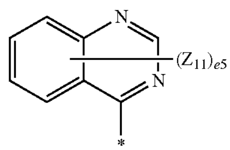
4-93
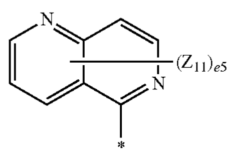
4-94
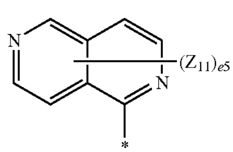
4-95
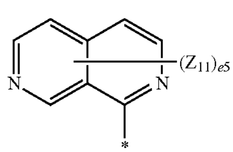
4-96
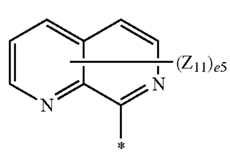
4-97
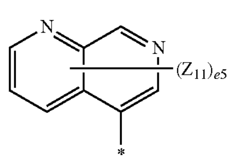
4-98
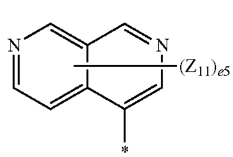
4-99
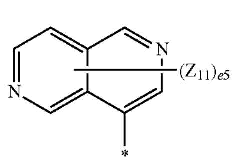
-continued
4-100
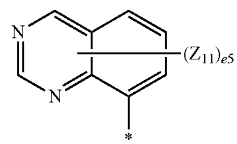
4-101
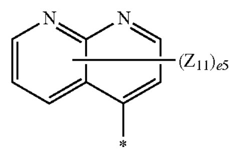
4-102
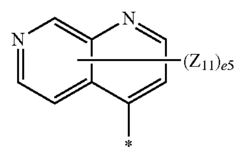
4-103
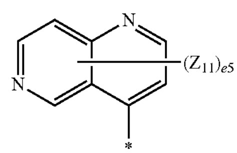
4-104
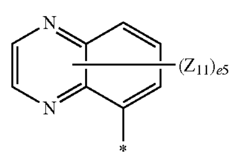
4-105
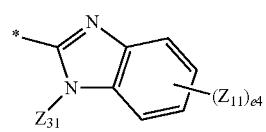
4-106
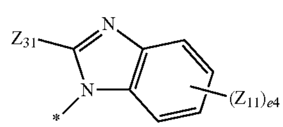
4-107
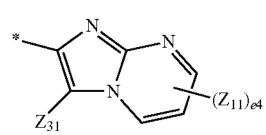
4-108
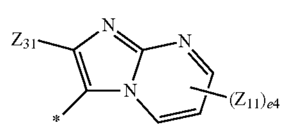
4-109
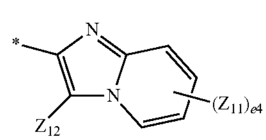
4-110
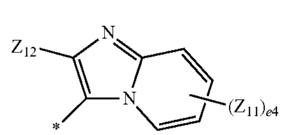

-continued
4-111
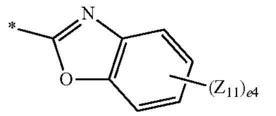
4-112
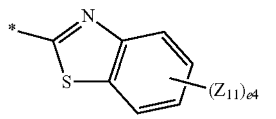
4-113
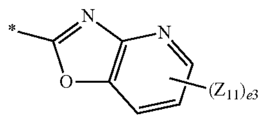
4-114
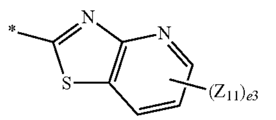
4-115
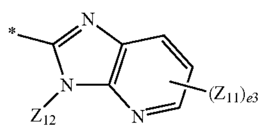
4-116
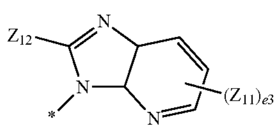
4-117
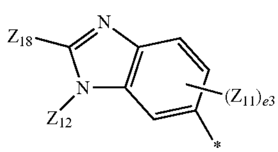
4-118
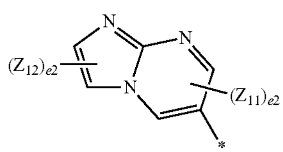
4-119
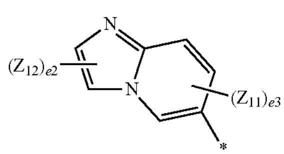
4-120
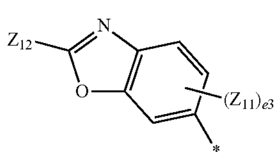
4-121
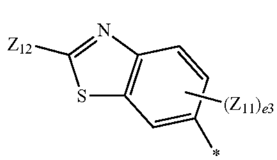
-continued
4-122
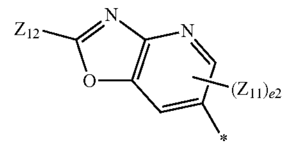
4-123
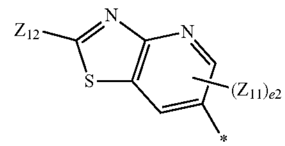
4-124
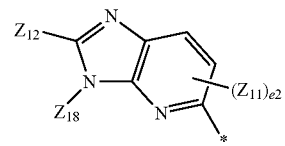
4-125
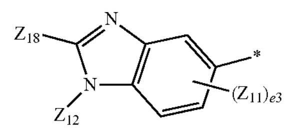
4-126
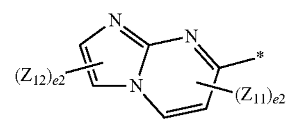
4-127
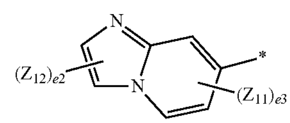
4-128
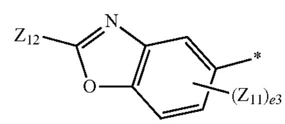
4-129
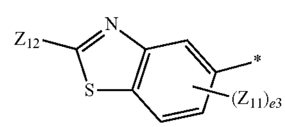
4-130
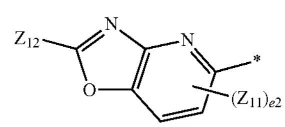
4-131
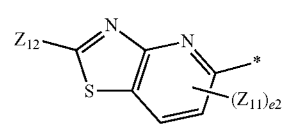
4-132
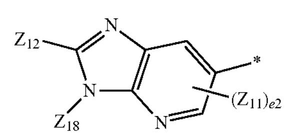

-continued
4-133
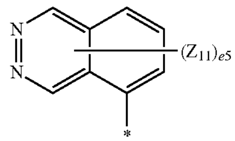
4-134
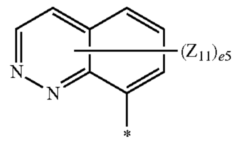
4-135
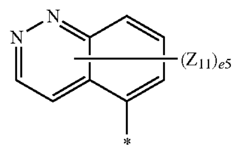
4-136
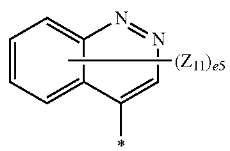
4-137
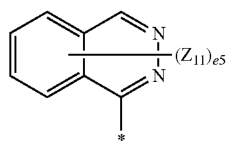
4-138
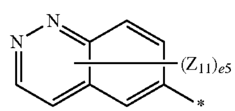
4-139
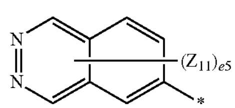
4-140
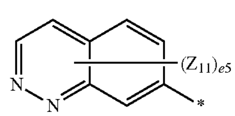
4-141
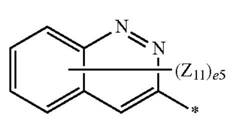
4-142
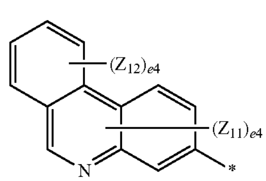
4-143
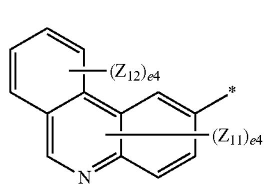
-continued
4-144
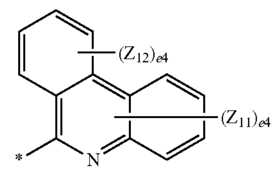
4-145
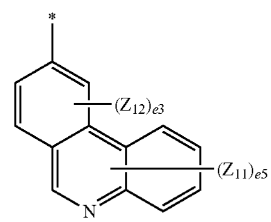
4-146
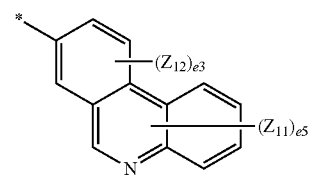
4-147
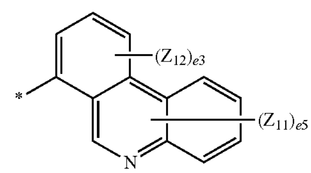
4-148
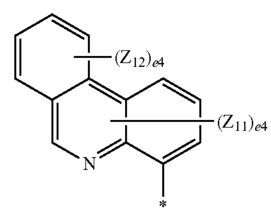
4-149
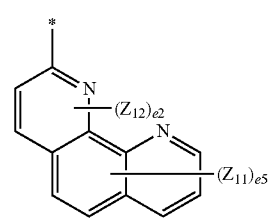
4-150
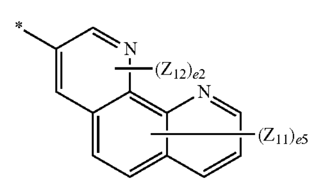
4-151
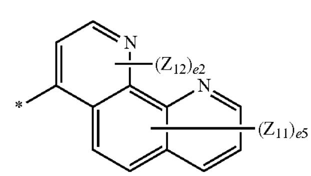

-continued
4-152
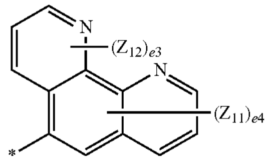
4-153
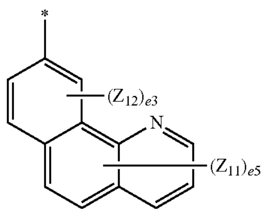
4-154
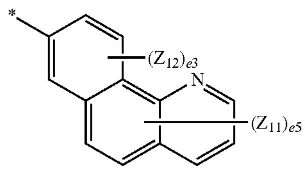
4-155
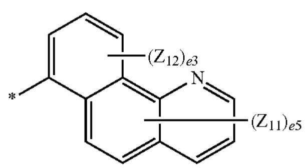
4-156
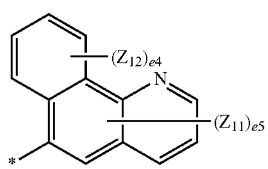
4-157
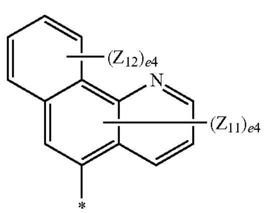
4-158
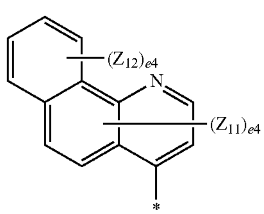
4-159
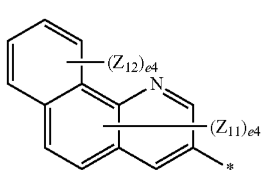
-continued
4-160
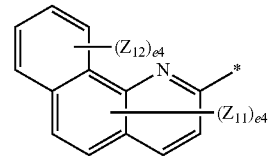
4-161
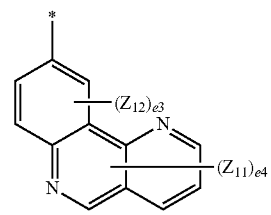
4-162
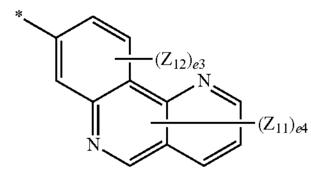
4-163
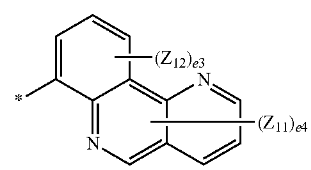
4-164
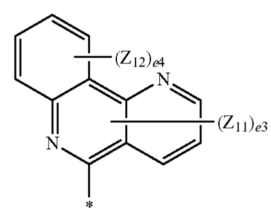
4-165
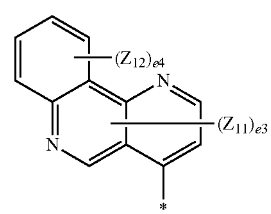
4-166
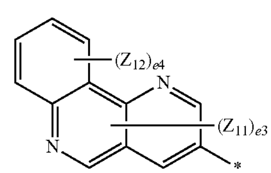
4-167
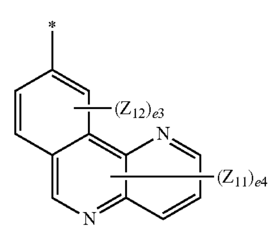

-continued
4-168
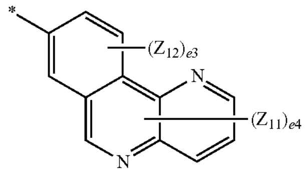
4-169
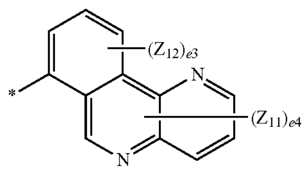
4-170
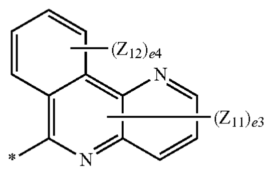
4-171
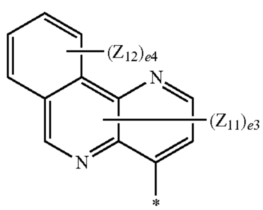
4-172
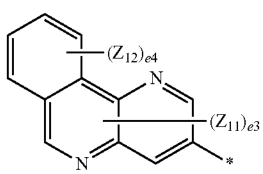
4-173
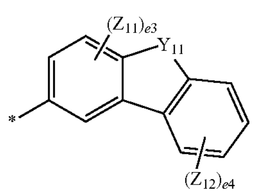
4-174
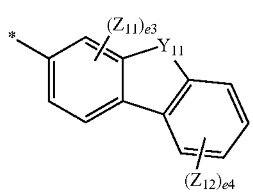
4-175
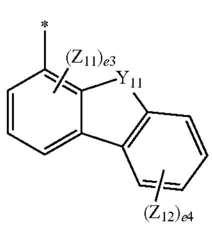
-continued
4-176
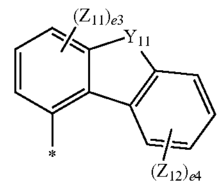
4-177
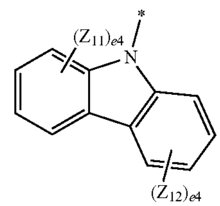
4-178
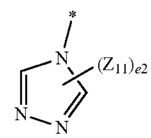
4-179
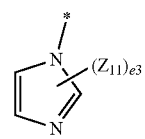
4-180
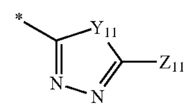
4-181
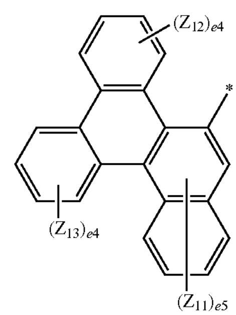
4-182
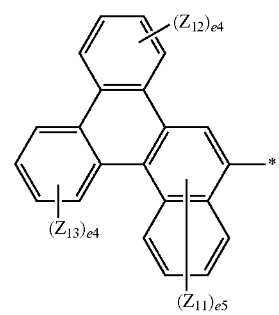

-continued
4-183
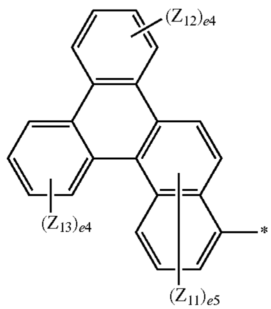
4-184
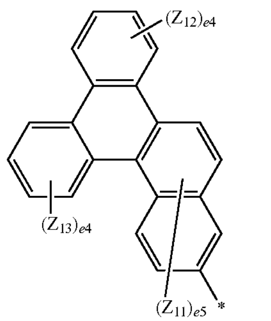
4-185
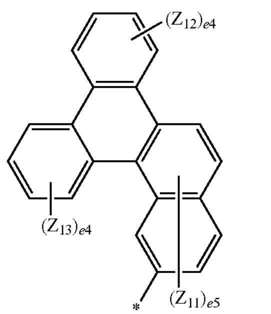
4-186
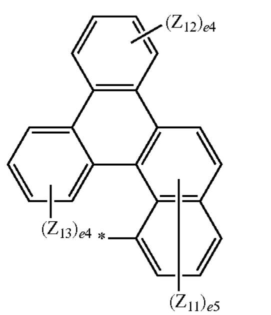
4-187
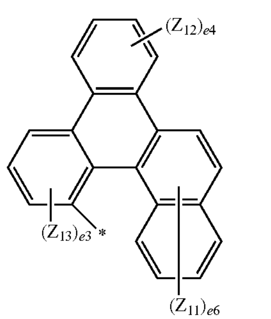
-continued
4-188
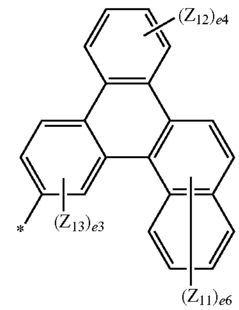
4-189
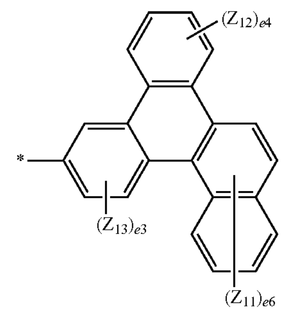
4-190
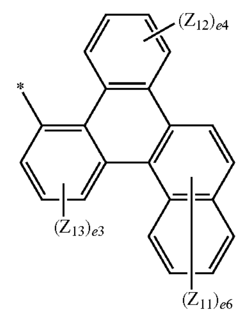
4-191
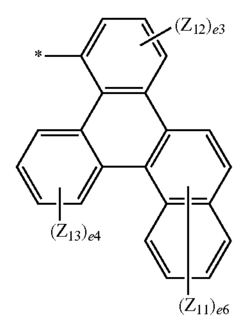
4-192
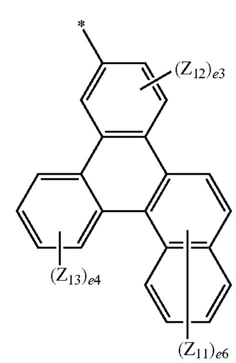

-continued
4-193
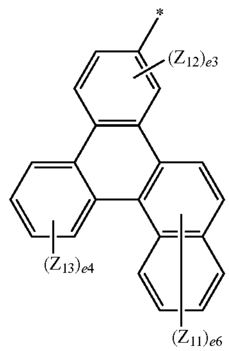
4-194
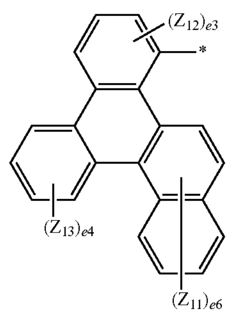
4-195
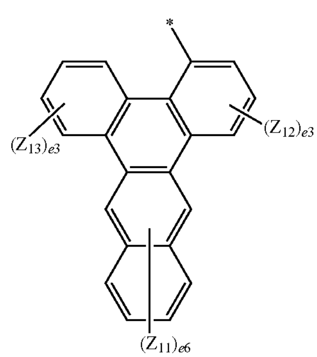
4-196
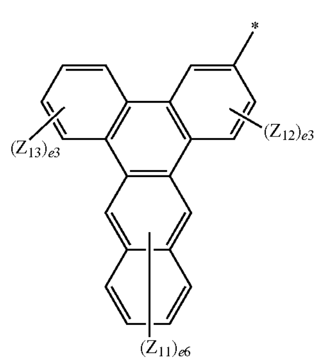
-continued
4-197
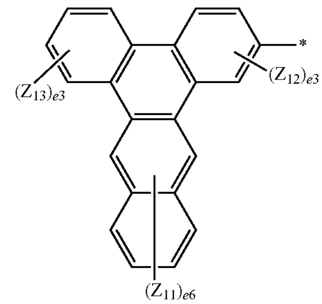
4-198
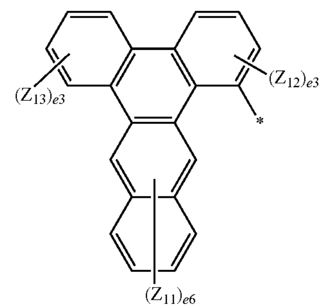
4-199
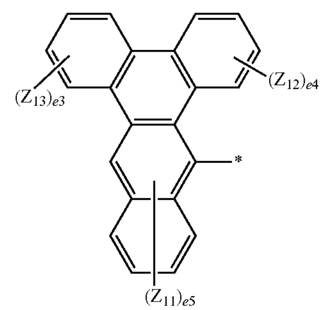
4-200
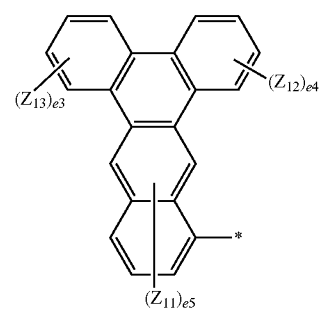
4-201
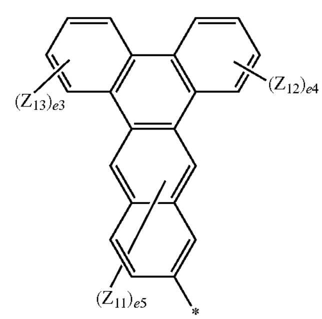

-continued
4-202
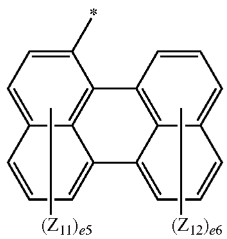
4-203
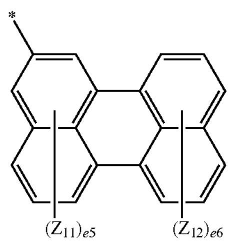
4-204
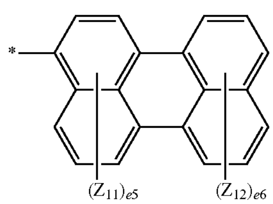
4-205
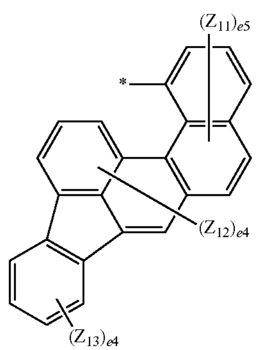
4-206
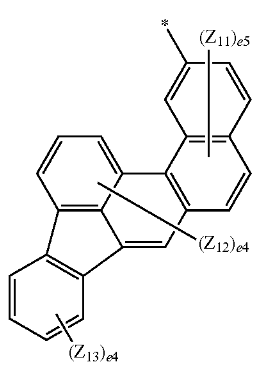
-continued
4-207
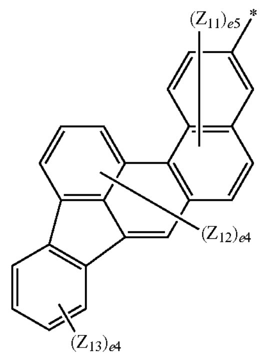
4-208
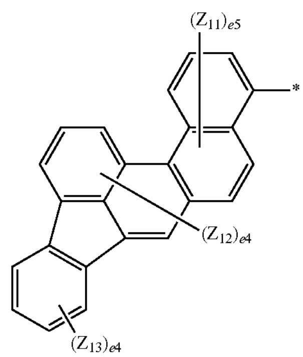
4-209
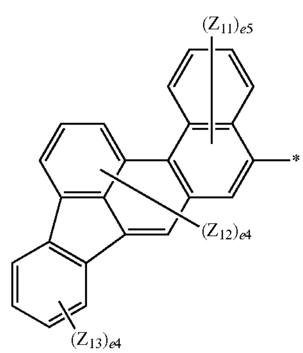
4-210
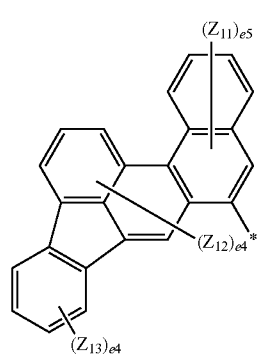

-continued
4-211
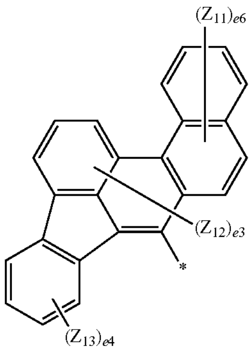
4-212
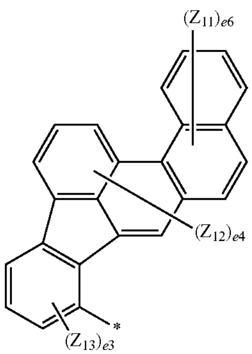
4-213
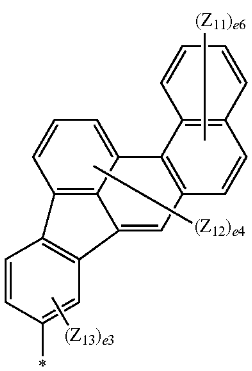
4-214
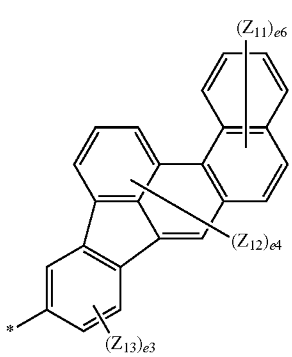
-continued
4-215
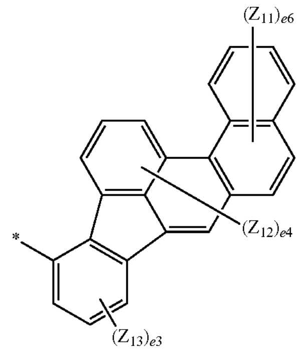
4-216
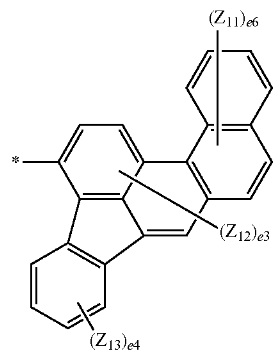
4-217
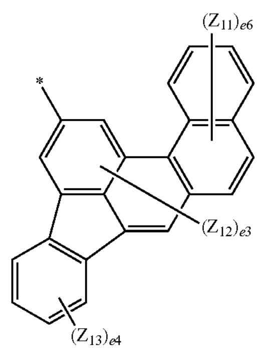
4-218
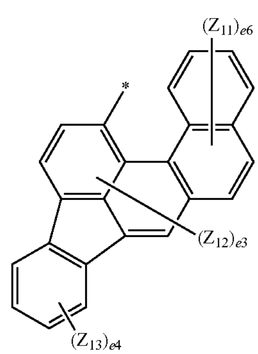

-continued
4-219
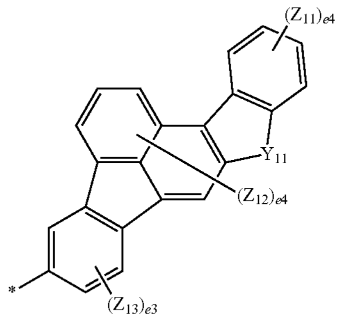
4-220
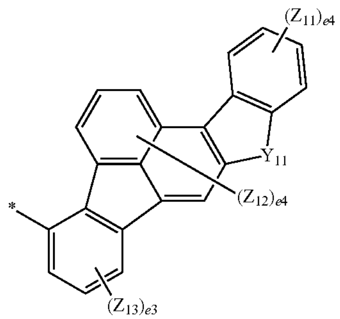
4-221
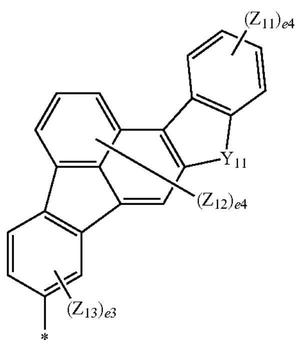
4-222
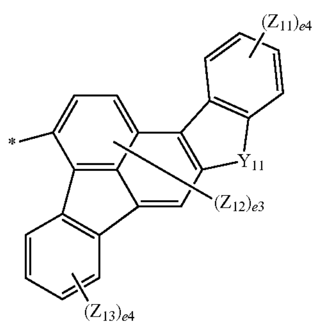
4-223
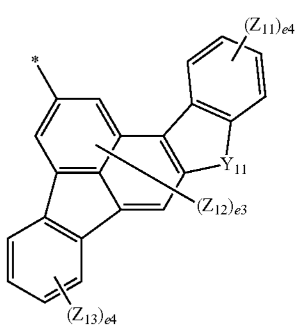
-continued
4-224
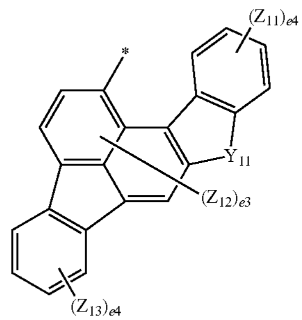
4-225
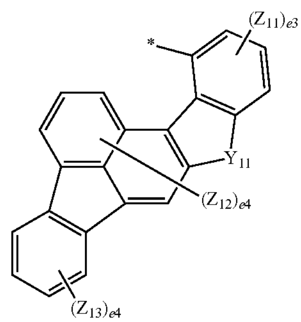
4-226
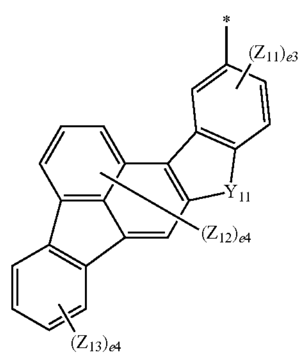
4-227
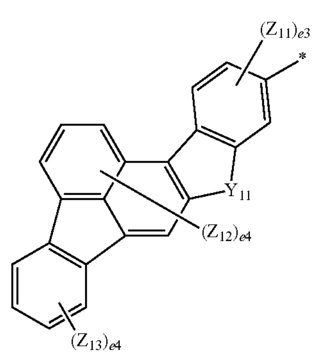

-continued
4-228
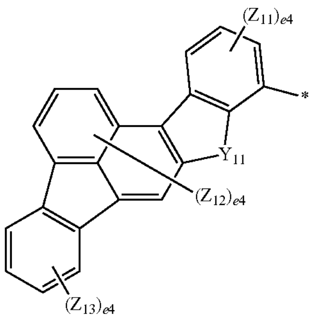
4-229
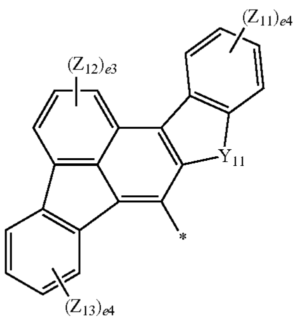
4-230
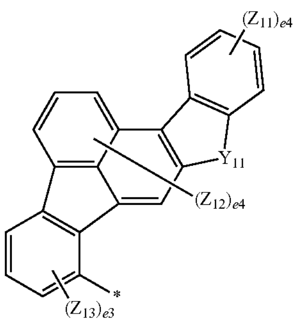
4-231
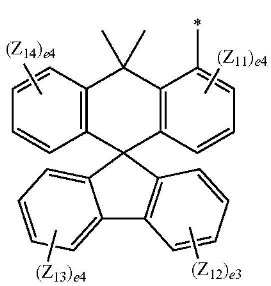
4-232
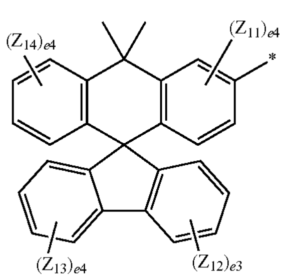
-continued
4-233
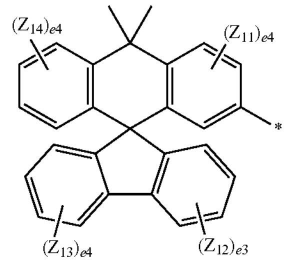
4-234
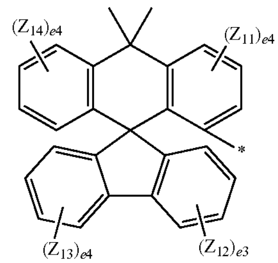
4-235
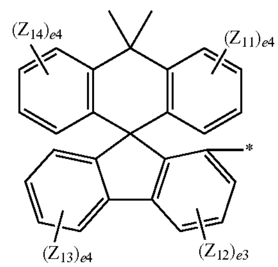
4-236
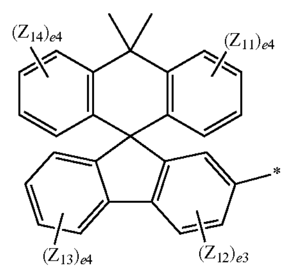
4-237
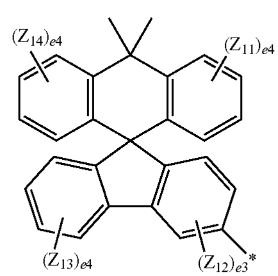
4-238
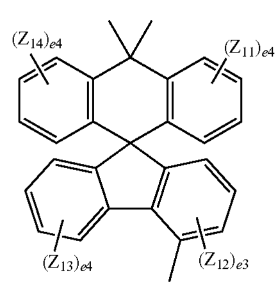

-continued
4-239
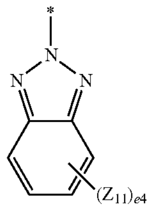
4-240
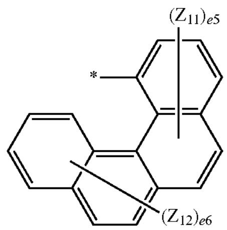
4-241
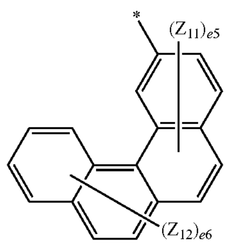
4-242
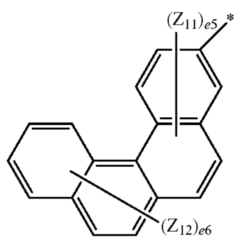
4-243
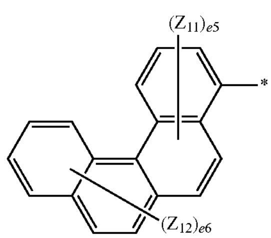
4-244
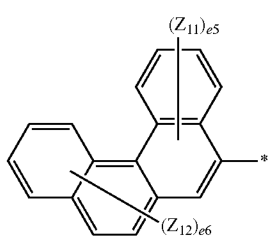
-continued
4-245
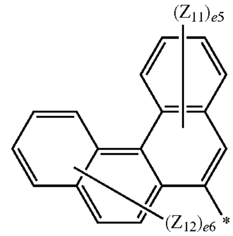
4-246
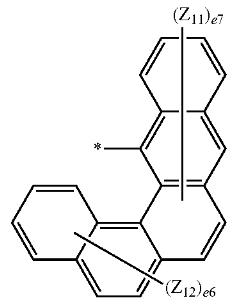
4-247
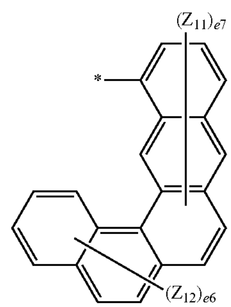
4-248
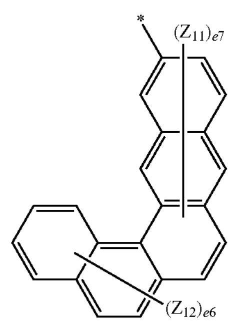
4-249
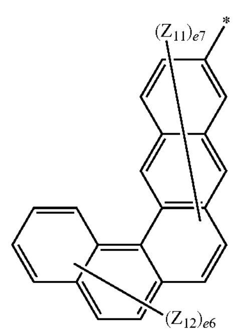

-continued
4-250
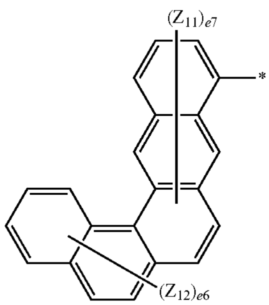
4-251
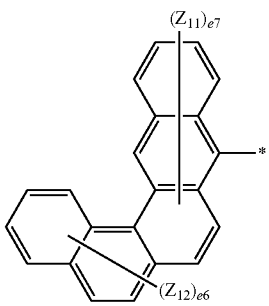
4-252
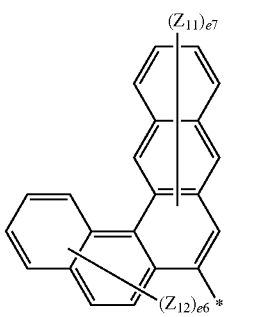
4-253
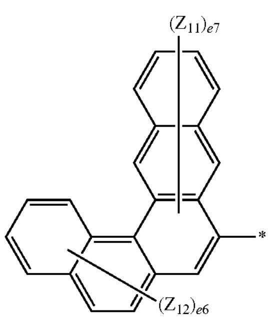
4-254
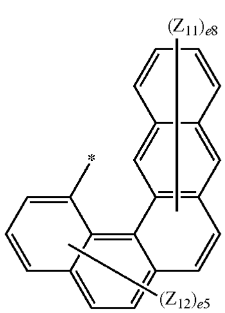
-continued
4-255
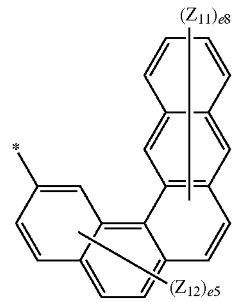
4-256
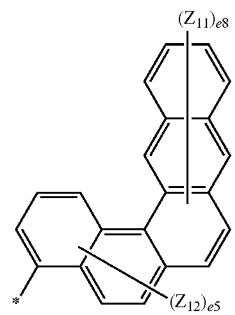
4-257
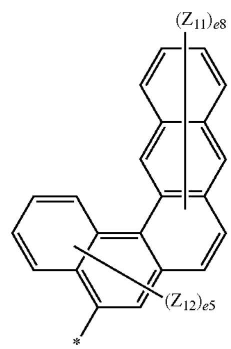
4-258
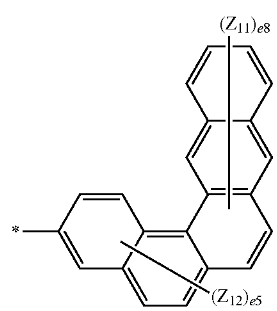
4-259
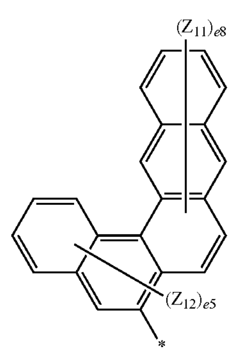

4-260
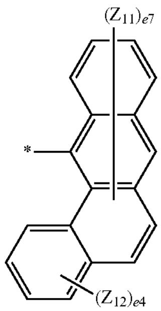
4-261
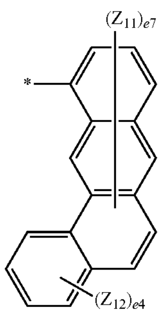
4-262
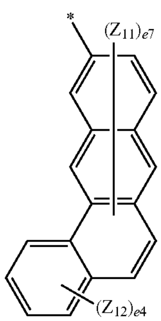
4-263
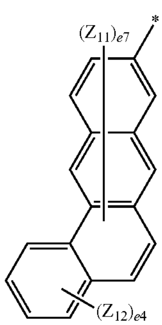
4-264
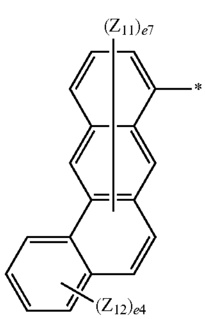
4-265
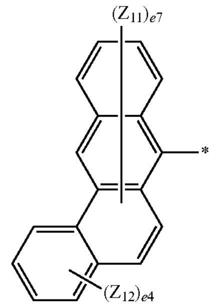
4-266
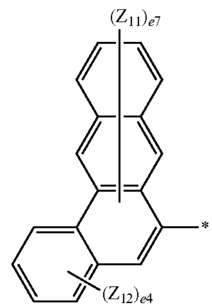
4-267
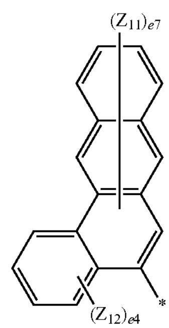
4-268
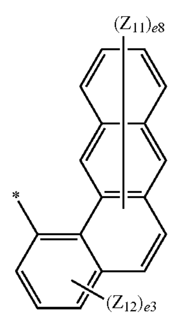
4-269
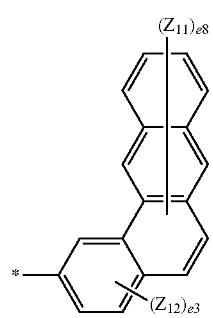

-continued
4-270
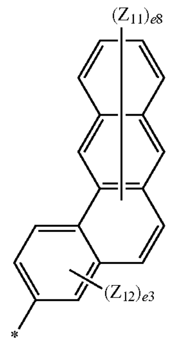
4-271
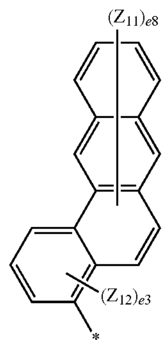
4-272
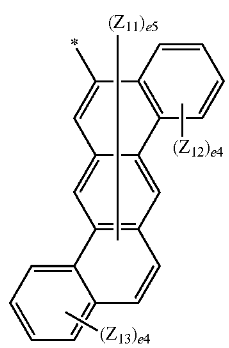
4-273
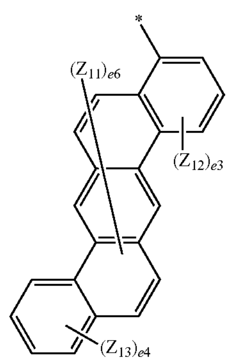
-continued
4-274
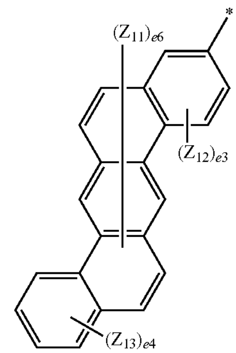
4-275
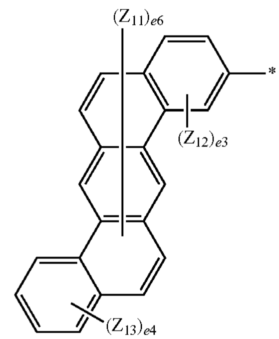
4-276
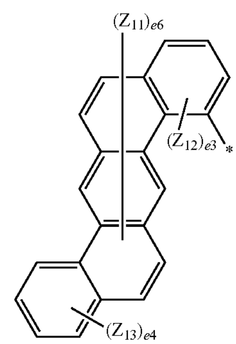
4-277
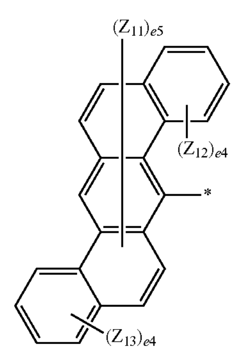

-continued
4-278
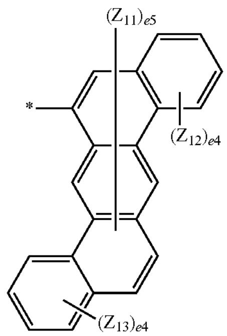
4-279
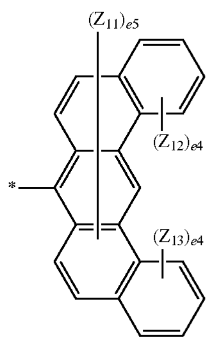
4-280
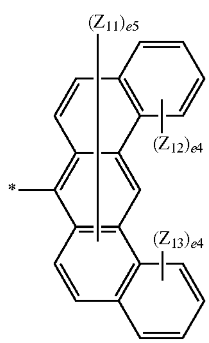
4-281
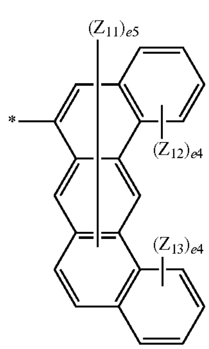
-continued
4-282
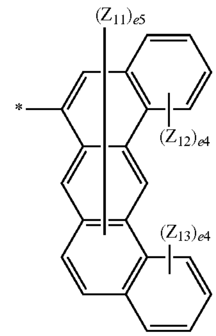
4-283
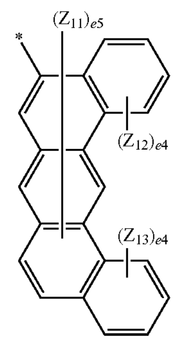
4-284
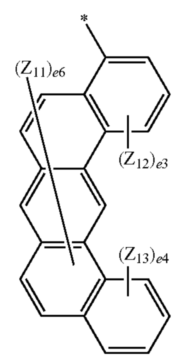
4-285
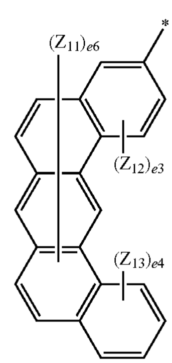

-continued
4-286
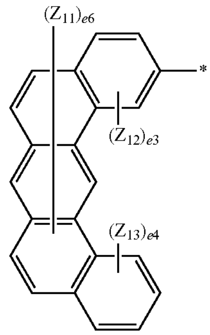
4-287
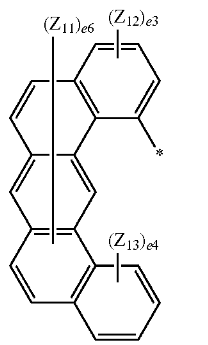
4-288
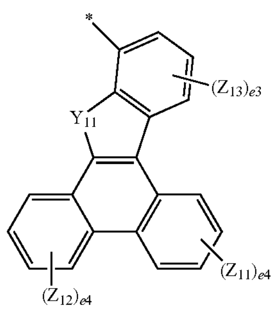
4-289
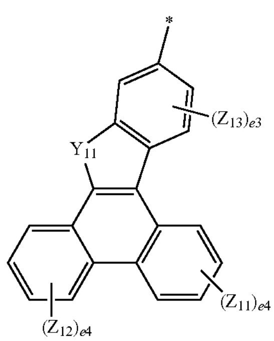
4-290
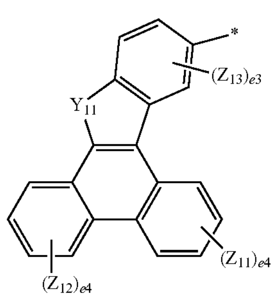
-continued
4-291
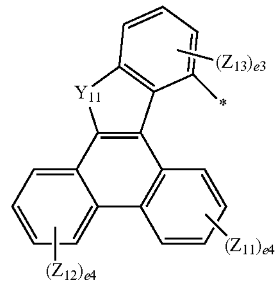
4-292
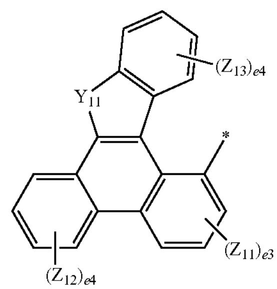
4-293
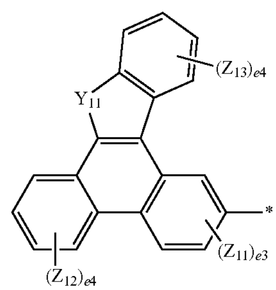
4-294
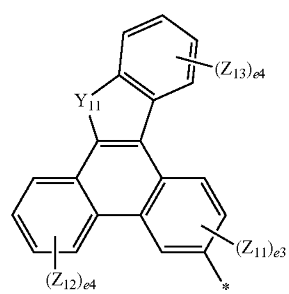
4-295
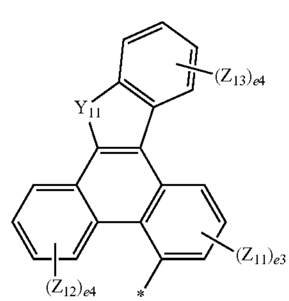

-continued
4-296
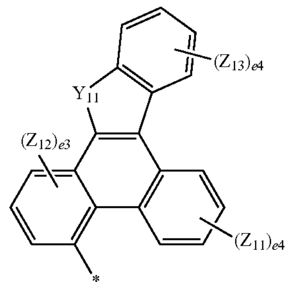
4-297
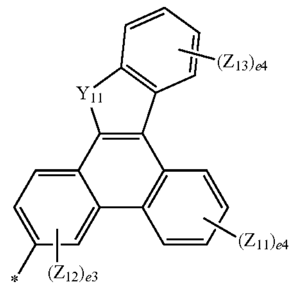
4-298
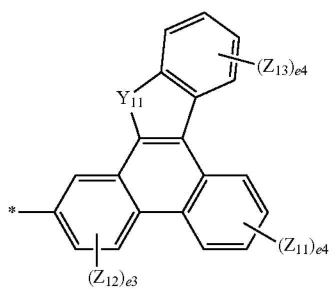
4-299
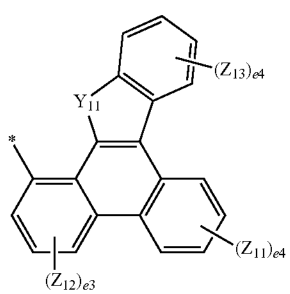
4-300
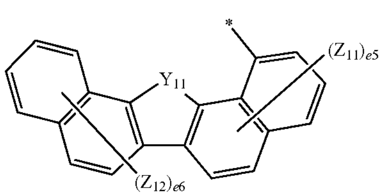
4-301
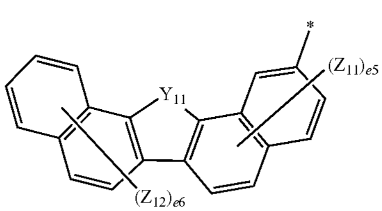
-continued
4-302
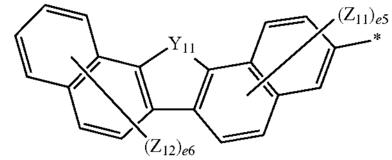
4-303
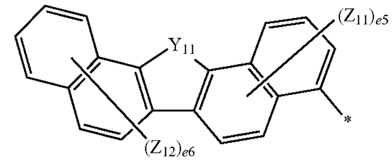
4-304
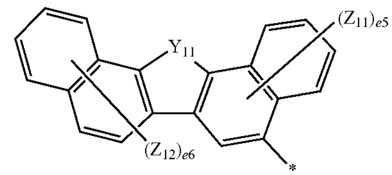
4-305
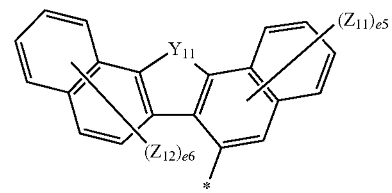
4-306
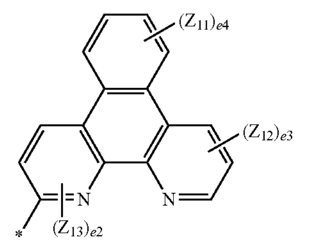
4-307
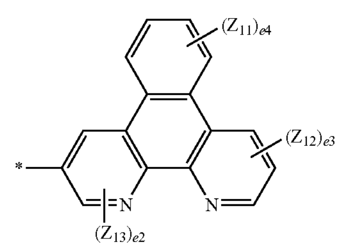
4-308
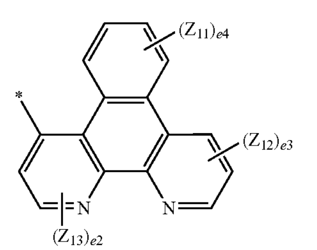

4-309
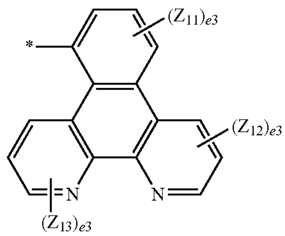
4-310
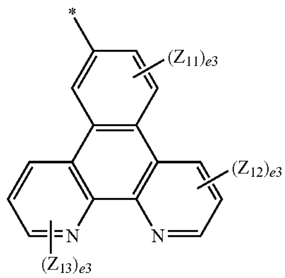
4-311
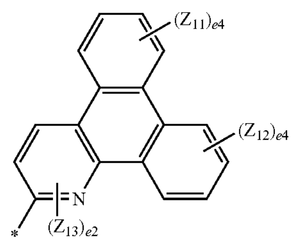
4-312
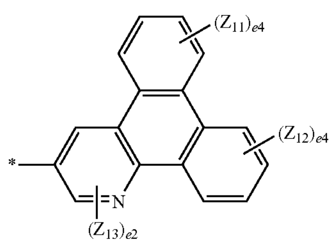
4-313
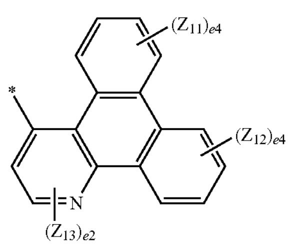
4-314
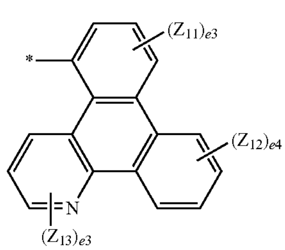
4-315
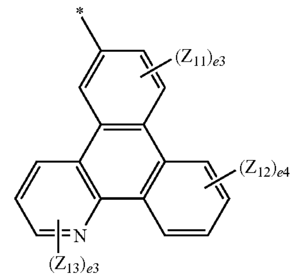
4-316
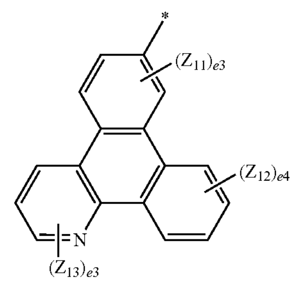
4-317
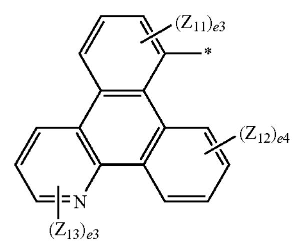
4-318
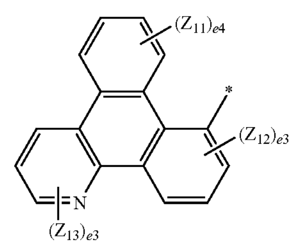
4-319
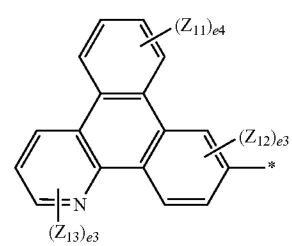
4-320
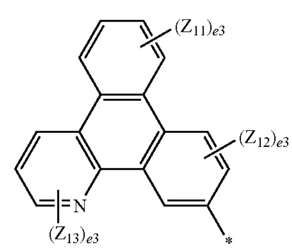

-continued 4-321

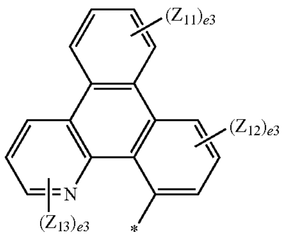

4-322

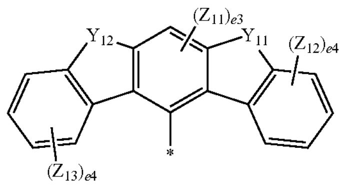

4-323

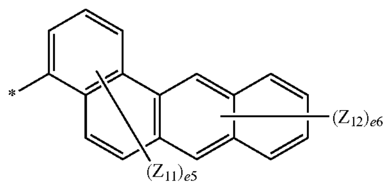

4-324

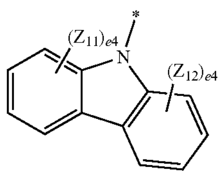

In Formulae 4-1 to 4-324, $Y_{11}$ may be O, S, Se, $N(Z_{18})$, $Si(Z_{18})(Z_{15})$, or $C(Z_{18})(Z_{15})$, and $Y_{12}$ may be O, S, Se, $N(Z_{16})$, $Si(Z_{16})(Z_{17})$, or $C(Z_{16})(Z_{17})$, $Z_{11}$ to $Z_{18}$ may each independently be selected from: hydrogen, deuterium, —F, —Cl, —Br, —I, a hydroxyl group, a cyano group, or a nitro group; a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{12})(Q_{12})(Q_{13})$, —$N(Q_{11})(Q_{12})$, —$B(Q_{11})(Q_{12})$, —$C(=O)(Q_{11})$, —$S(=O)_2(Q_1n)$, —$P(=O)(Q_{11})(Q_{12})$, or any combination thereof; a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$.

$Q_1$ to $Q_3$, $Q_{11}$ to $Q_{13}$, $Q_{21}$ to $Q_{23}$, and $Q_{31}$ to $Q_{33}$ may be the same as described herein.

e2 may be an integer from 0 to 2, e3 may be an integer from 0 to 3, e4 may be an integer from 0 to 4, e5 may be an integer from 0 to 5, e6 may be an integer from 0 to 6, e7 may be an integer from 0 to 7, e8 may be an integer from 0 to 8, and e9 may be an integer from 0 to 9.

* may indicate a binding site to a neighboring group.

Two neighboring groups among $R_1$ to $R_8$, $R_{1a}$ to $R_{7a}$, $R_{10}$, $R_{20}$, $R_{11}$ to $R_{13}$, $R_{21}$ to $R_{24}$, $R_{31}$ to $R_{33}$, $R_{41}$ to $R_{44}$, $R_{45a}$, $R_{45b}$, $R_{51}$ to $R_{54}$, $R_{61}$ to $R_{66}$, $R_{71}$ to $R_{73}$, $R_{74a}$, $R_{74b}$, $R_{81a}$, $R_{81b}$, $R_{82a}$, $R_{83a}$, $R_{83b}$, $R_{84a}$, $R_{87}$, $R_{88}$, $R_{89a}$, and $R_{89b}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, two neighboring groups among $R_1$ to $R_8$, $R_{1a}$ to $R_{7a}$, $R_{10}$, $R_{20}$, $R_{11}$ to $R_{13}$, $R_{21}$ to $R_{24}$, $R_{31}$ to $R_{33}$, $R_{41}$ to $R_{44}$, $R_{45a}$, $R_{45b}$, $R_{51}$ to $R_{54}$, $R_{61}$ to $R_{66}$, $R_{71}$ to $R_{73}$, $R_{74a}$, $R_{74b}$, $R_{81a}$, $R_{81b}$, $R_{82a}$, $R_{83a}$, $R_{83b}$, $R_{84a}$, $R_{87}$, $R_{88}$, $R_{9a}$, and $R_{89b}$ may be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_6$-$C_{60}$ aryl group unsubstituted or substituted with at least one $R_{10a}$ or a $C_3$-$C_{60}$ heteroaryl group unsubstituted or substituted with at least one $R_{10a}$, but embodiments of the invention are not limited thereto.

In Formulae 2-3 to 2-6, b53, b54, b62, b65, b72, b73, b87, and b88 may each independently be an integer from 0 to 4. b63 and b64 may each independently be an integer from 0 to 3. In this regard, b53 may indicate a number of $R_{53}$ groups, and when b53 is an integer of 2 or more, two or more of $R_{53}$(s) may be identical to or different from each other. b54 may indicate a number of $R_{54}$ groups, and when b54 is an integer of 54 or more, two or more of $R_{54}$(s) may be identical to or different from each other. b62 may indicate a number of $R_{62}$ groups, and when b62 is an integer of 2 or more, two or more of $R_{62}$(s) may be identical to or different from each other. b65 may indicate a number of $R_{65}$ groups, and when b65 is an integer of 2 or more, two or more of $R_{65}$(s) may be identical to or different from each other. b72 may indicate a number of $R_{72}$ groups, and when b72 is an integer of 2 or more, two or more of $R_{72}$(s) may be identical to or different from each other. b73 may indicate a number of $R_{73}$ groups, and when b73 is an integer of 2 or more, two or more of $R_{73}$(s) may be identical to or different from each other. b87 may indicate a number of $R_{87}$ groups, and when b87 is an integer of 2 or more, two or more of $R_{87}$(s) may be identical to or different from each other. b88 may indicate a number of $R_{88}$ groups, and when b88 is an integer of 2 or more, two or more of $R_{88}$(s) may be identical to or different from each other.

In an embodiment, Formula 1-1 may be represented by one of Formulae 1-1(a) to 1-1(e).

In an embodiment, Formula 1-2 may be represented by one of Formulae 1-2(a) to 1-2(d).

In an embodiment, Formula 1-3 may be represented by Formula 1-3(a).

Formula 1-1(a)

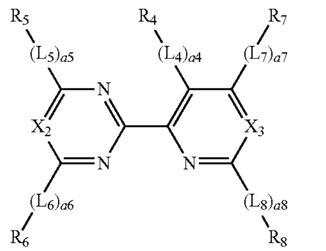

Formula 1-1(b)

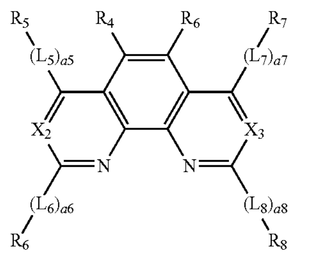

Formula 1-1(c)

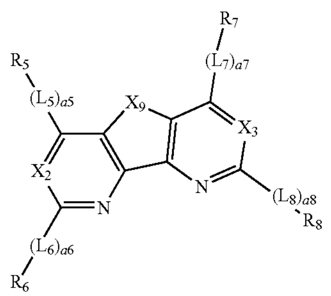

Formula 1-1(d)

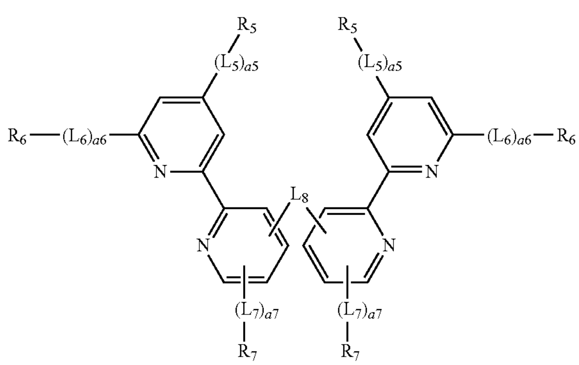

Formula 1-1(e)

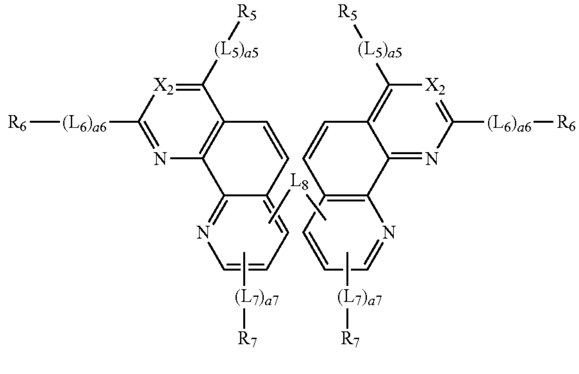

-continued

Formula 1-2(a)

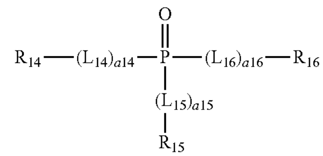

Formula 1-2(b)

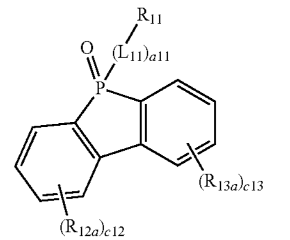

Formula 1-2(c)

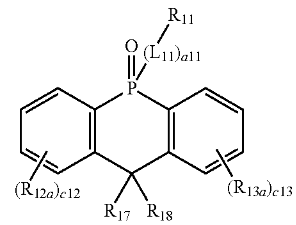

Formula 1-2(d)

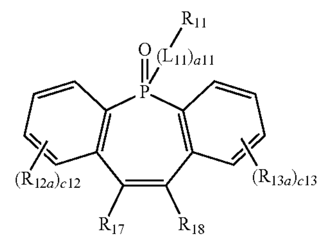

Formula 1-3(a)

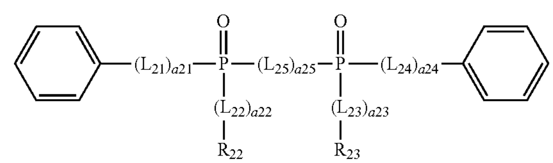

In Formulae 1-1(a) to 1-1(e), 1-2(a) to 1-2(d), and 1-3(a), $X_2$ to $X_3$, $L_2$ to $L_8$, $L_{11}$, $L_{21}$ to $L_{25}$, a2 to a8, a11, a21 to a25, $R_2$ to $R_8$, $R_{10a}$, $R_{11}$, and $R_{22}$ to $R_{23}$ may be the same as described herein.

In Formula 1-1(c), $X_9$ may be O, S, Se, $N(R_{9a})$, $Si(R_{9a})(R_{9b})$, or $C(R_{9a})(R_{9b})$.

In an embodiment, $X_9$ may be $N(R_{9a})$ or $C(R_{9a})(R_{9b})$.

At least one of $R_{14}$ to $R_{16}$ in Formula 1-2(a) may be a group selected from a phenanthrenyl group, an anthracenyl group, a fluoranthenyl group, a triphenylenyl group, a pyrenyl group, a chrysenyl group, a benzo[g]chrysenyl group, a benzo[k]tetraphenyl group, a benzo[m]tetraphenyl group, a benzo[f]tetraphenyl group, a perylenyl group, a benzo[k]fluoranthenyl group, a dibenzo[e,l]acephenanthrenyl group, a 9,9-dimethyl-9H-indeno[2,1-b]fluoranthenyl group, a fluorenyl group, a spiro-bifluorenyl group, a spiro-anthracenefluorenyl group, a benzo[c]phenanthrenyl group, a tetraphenyl group, a dibenzo[b,d]furanyl group, a dibenzo[b,d]thiophenyl group, a carbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphthosilolyl group, a phenanthrobenzofuranyl group, a fluoranthenobenzofuranyl group, a phenanthridinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a phenoxazinyl group, a phenothiazinyl group, a phenoxathinyl group, a benzimidazolyl group, a benzofuranyl group, a benzothiophenyl group, and a benzosilolyl group, each unsubstituted or substituted with a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, a phenanthrenyl group, an anthracenyl group, a fluoranthenyl group, a triphenylenyl group, a pyrenyl group, a chrysenyl group, a benzo[g]chrysenyl group, a benzo[k]tetraphenyl group, a benzo[m]tetraphenyl group, a benzo[f]tetraphenyl group, a perylenyl group, a benzo[k]fluoranthenyl group, a dibenzo[e,l]acephenanthrenyl group, a 9,9-dimethyl-9H-indeno[2,1-b]fluoranthenyl group, a fluorenyl group, a spiro-bifluorenyl group, a spiro-anthracenefluorenyl group, a benzo[c]phenanthrenyl group, a tetraphenyl group, a dibenzo[b,d]furanyl group, a dibenzo[b,d]thiophenyl group, a carbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphthosilolyl group, a phenanthrobenzofuranyl group, a fluoranthenobenzofuranyl group, a phenanthridinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a phenoxazinyl group, a phenothiazinyl group, a phenoxathinyl group, a benzimidazolyl group, a benzofuranyl group, a benzothiophenyl group, a benzosilolyl group, or any combination thereof, and the other group(s) may be the same as described in connection with $R_{11}$ herein, but embodiments of the invention are not limited thereto.

In an embodiment, at least one of $R_{14}$ to $R_{16}$ may be a group selected from a phenanthrenyl group, an anthracenyl group, a fluoranthenyl group, a triphenylenyl group, a pyrenyl group, a chrysenyl group, a benzo[g]chrysenyl group, a benzo[k]tetraphenyl group, a benzo[m]tetraphenyl group, a benzo[f]tetraphenyl group, a perylenyl group, a benzo[k]fluoranthenyl group, a dibenzo[e,l]acephenanthrylenyl group, a 9,9-dimethyl-9H-indeno[2,1-b]fluoranthenyl group, a fluorenyl group, a spiro-bifluorenyl group, a spiro-anthracenefluorenyl group, a benzo[c]phenanthrenyl group, a tetraphenyl group, a dibenzo[b,d]furanyl group, a dibenzo[b,d]thiophenyl group, a carbazolyl group, a naphthobenzofuranyl group, a naphthobenzothiophenyl group, a benzoquinolinyl group, a benzoisoquinolinyl group, a benzonaphthyridinyl group, a benzoquinoxalinyl group, a benzoquinazolinyl group, a phenanthridinyl group, and a phenanthrolinyl group, each unsubstituted or substituted with a phenanthrenyl group, an anthracenyl group, a fluoranthenyl group, a triphenylenyl group, a pyrenyl group, a chrysenyl group, a benzo[g]chrysenyl group, a benzo[k]tetraphenyl group, a benzo[m]tetraphenyl group, a benzo[f]tetraphenyl group, a perylenyl group, a benzo[k]fluoranthenyl group, a dibenzo[e,l]acephenanthrylenyl group, a 9,9-dimethyl-9H-indeno[2,1-b]fluoranthenyl group, a fluorenyl group, a spiro-bifluorenyl group, a spiro-anthracenefluorenyl group, a benzo[c]phenanthrenyl group, a tetraphenyl group, a dibenzo[b,d]furanyl group, a dibenzo[b,d]thiophenyl group, a carbazolyl group, a naphthobenzofuranyl group, a naphthobenzothiophenyl group, a benzoquinolinyl group, a benzoisoquinolinyl group, a benzonaphthyridinyl group, a benzoquinoxalinyl group, a benzoquinazolinyl group, a phenanthridinyl group, a phenanthrolinyl group, or any combination thereof, and the other group(s) may be the same as described in connection with $R_1$ herein, but embodiments of the invention are not limited thereto.

In Formulae 1-1(a) to 1-1(e) and 1-2(a) to 1-2(d), $R_{9a}$, $R_{9b}$, $R_{12a}$, $R_{13a}$, and $R_{14}$ to $R_{18}$ may be the same as described in connection with $R_{10a}$ herein.

In Formulae 1-2(b) to 1-2(d), c12 and c13 may each independently be an integer from 0 to 4. In this regard, c12 may indicate a number of $R_{12a}$ groups, and when c12 is an integer of 2 or more, two or more of $R_{12a}$(s) may be identical to or different from each other. c13 may indicate a number of $R_{13a}$ groups, and when c13 is an integer of 2 or more, two or more of $R_{13a}$(s) may be identical to or different from each other.

In Formulae 1-1(a) to 1-1(e) and 1-2(a) to 1-2(d), two neighboring groups among $R_2$ to $R_8$, $R_{12a}$, $R_{9a}$, $R_{9b}$, $R_{12a}$, $R_{13a}$, and $R_{14}$ to $R_{18}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In Formulae 1-1(a) to 1-1(e) and 1-2(a) to 1-2(d), two neighboring groups among $R_2$ to $R_8$, $R_{12a}$, $R_{9a}$, $R_{9b}$, $R_{12a}$, $R_{13a}$, and $R_{14}$ to $R_{18}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_6$-$C_{60}$ aryl group unsubstituted or substituted with at least one $R_{10a}$ or a $C_3$-$C_{60}$ heteroaryl group unsubstituted or substituted with at least one $R_{10a}$, but embodiments of the invention are not limited thereto.

A compound represented by Formula 1-1 may be selected from Formulae 1-1-1 to 1-1-18, but embodiments of the invention are not limited thereto.

1-1-1

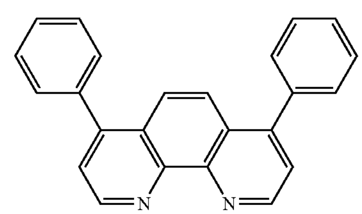

1-1-2

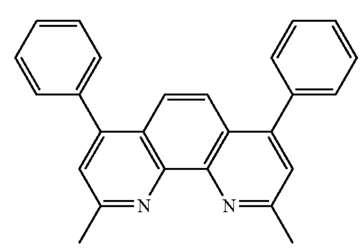

-continued
1-1-3
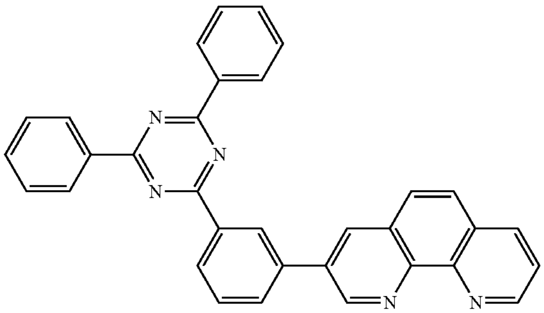
1-1-4
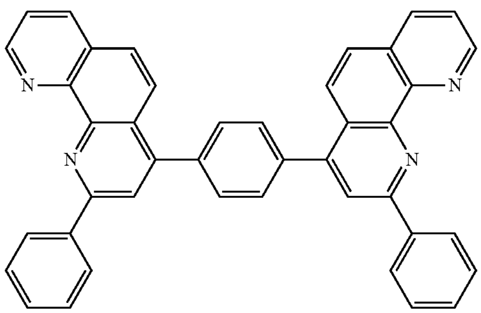
1-1-5
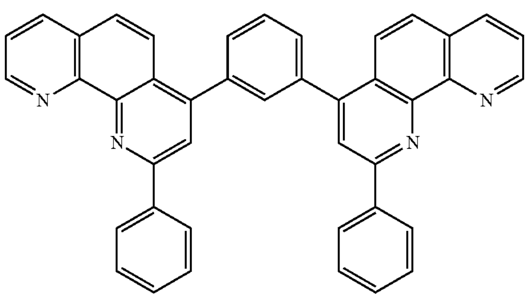
1-1-6
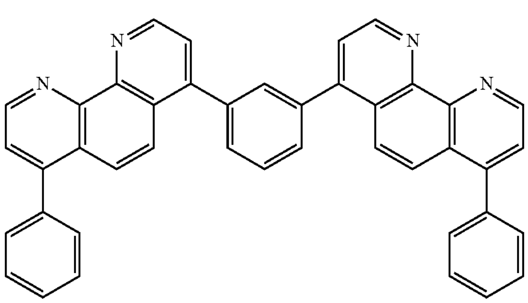
-continued
1-1-7
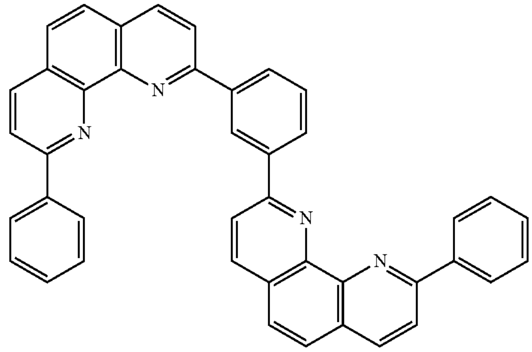
1-1-8
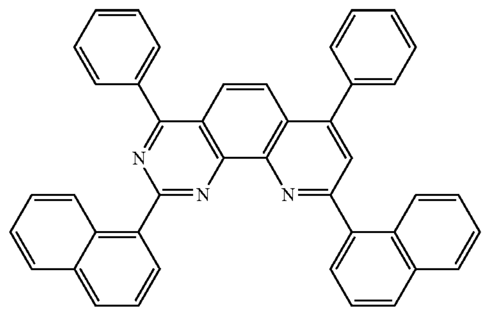
1-1-9
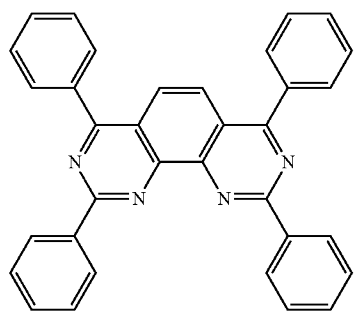
1-1-10
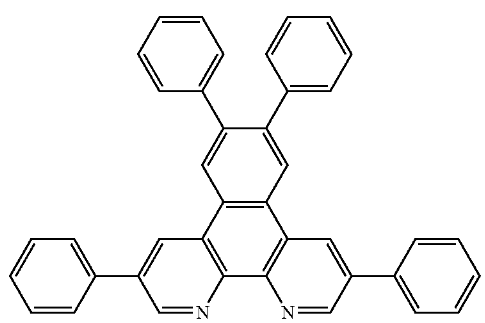

-continued
1-1-11
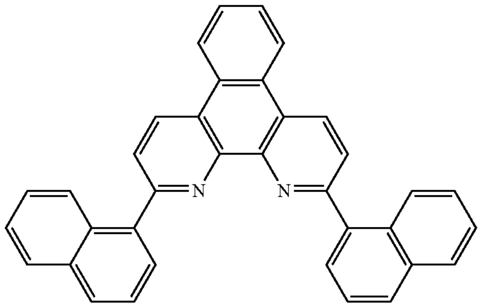
1-1-12
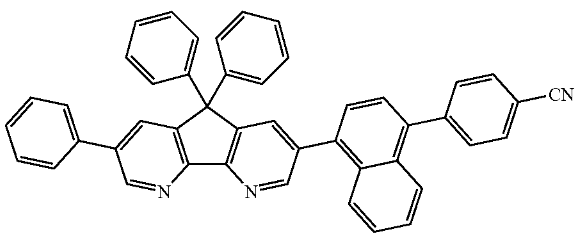
1-1-13
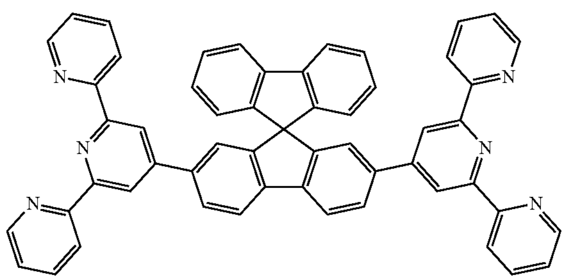
1-1-14
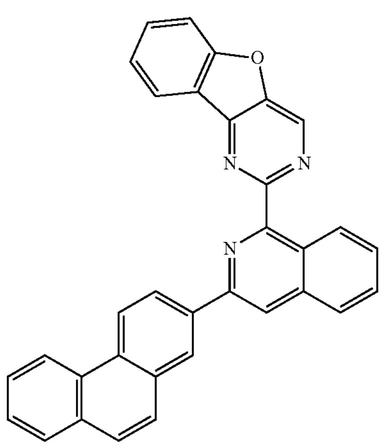
-continued
1-1-15
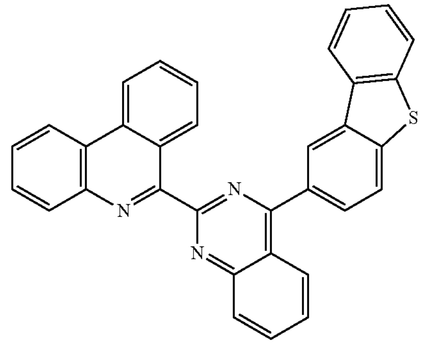
1-1-16
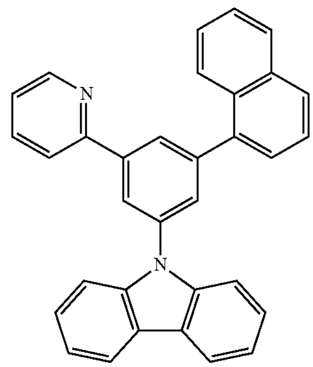
1-1-17
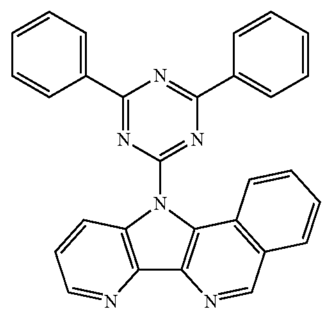
1-1-18
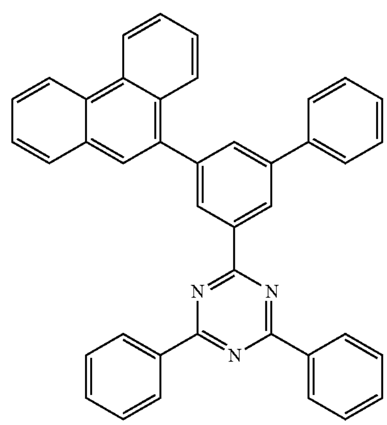
A compound represented by Formula 1-2 may be selected from Formulae 1-2-1 to 1-2-92, but embodiments of the invention are not limited thereto.

1-2-1
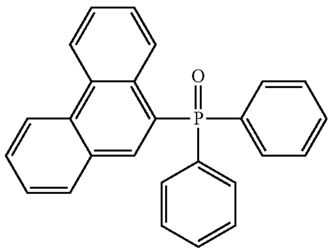
1-2-2
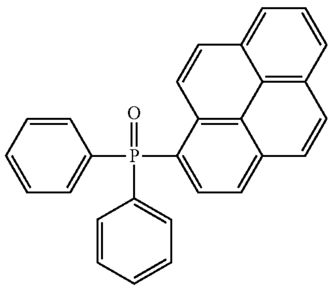
1-2-3
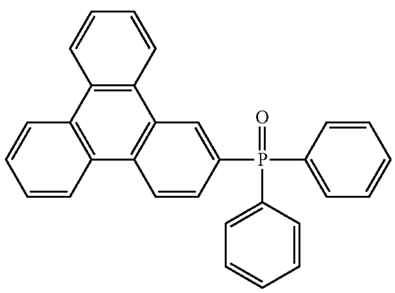
1-2-4
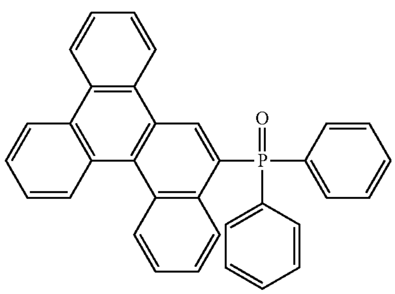
1-2-5
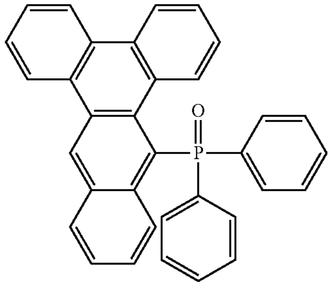
-continued
1-2-6
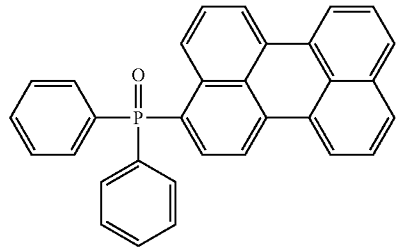
1-2-7
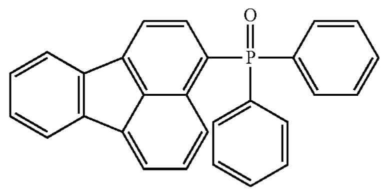
1-2-8
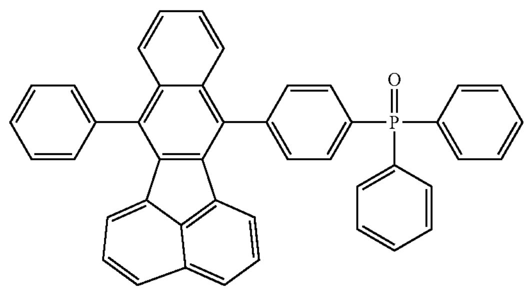
1-2-9
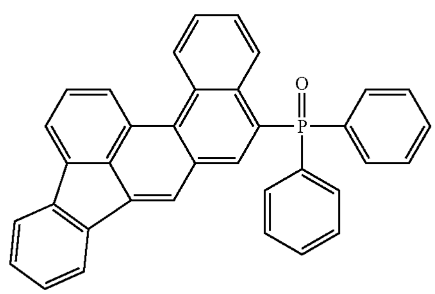
1-2-10
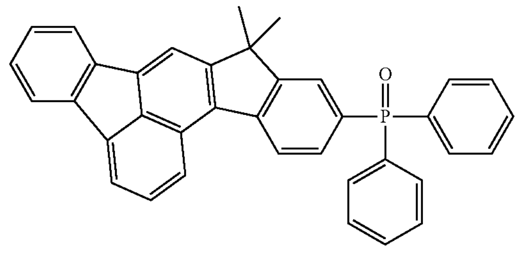

-continued
1-2-11
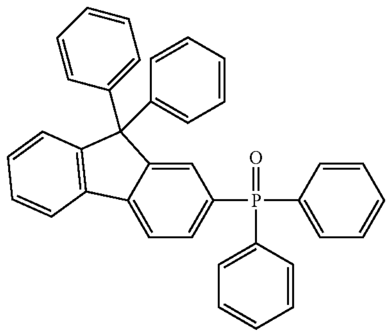
1-2-12
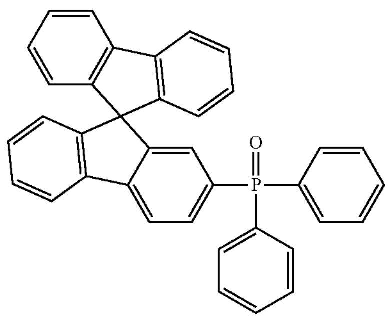
1-2-13
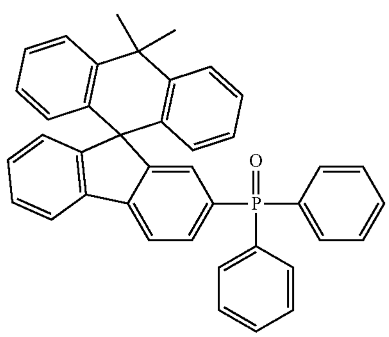
1-2-14
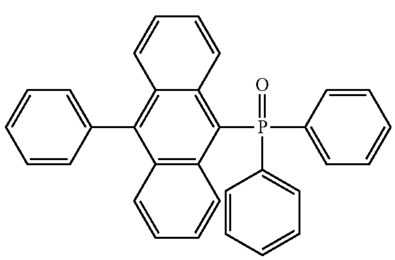
1-2-15
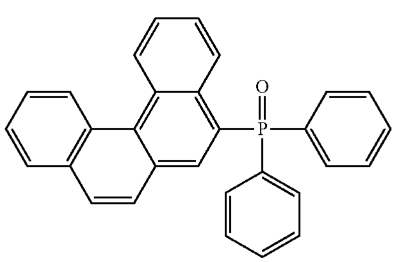
-continued
1-2-16
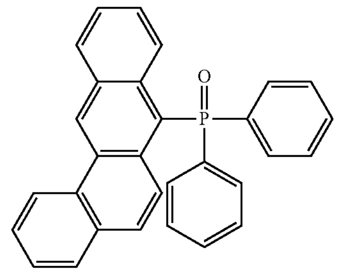
1-2-17
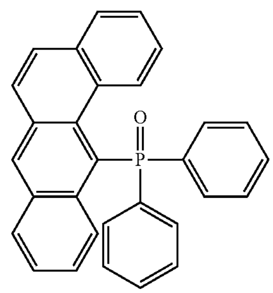
1-2-18
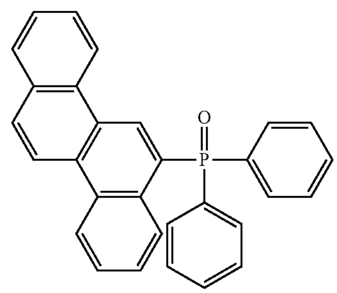
1-2-19
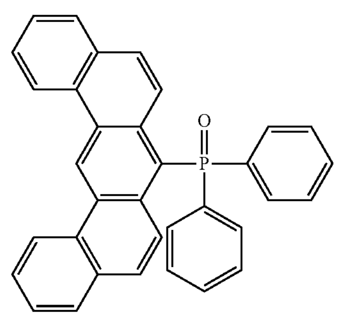
1-2-20
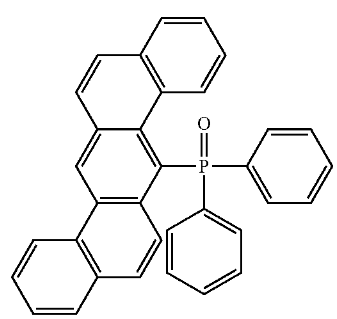

-continued
1-2-21
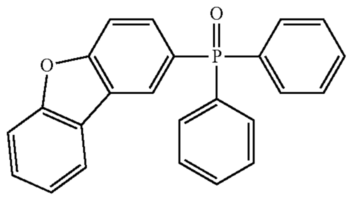
1-2-22
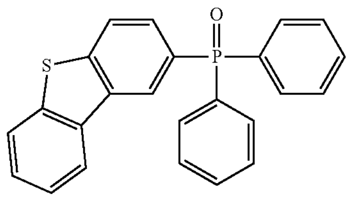
1-2-23
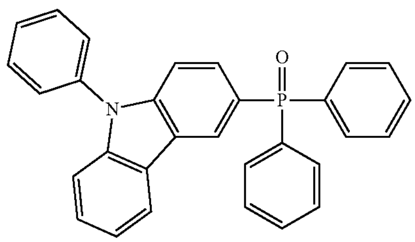
1-2-24
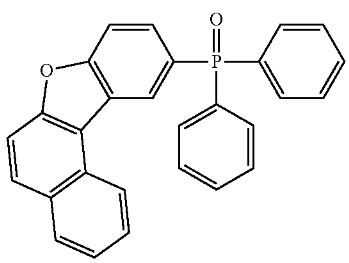
1-2-25
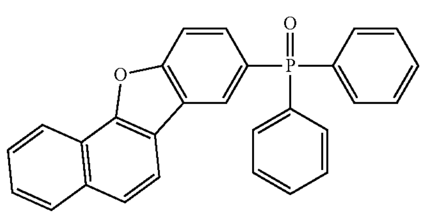
1-2-26
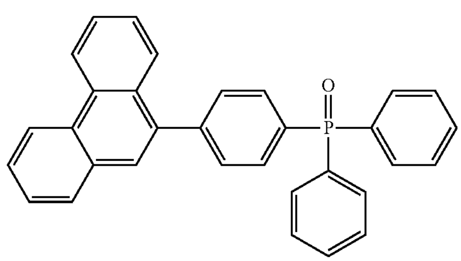
-continued
1-2-27
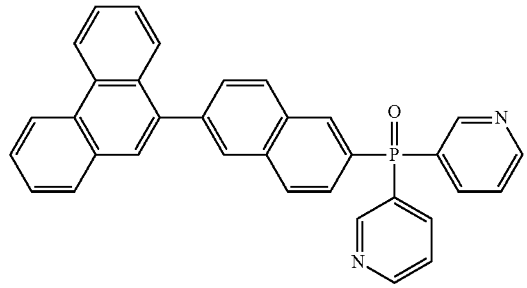
1-2-28
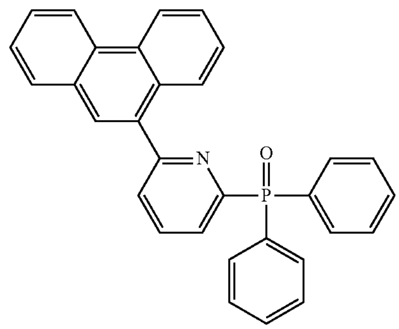
1-2-29
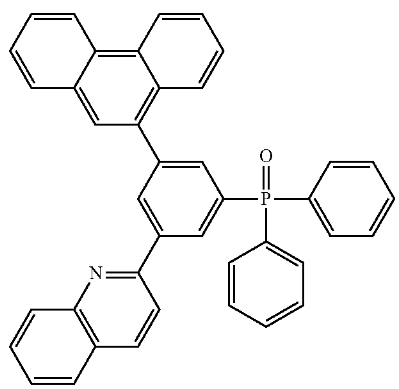
1-2-30
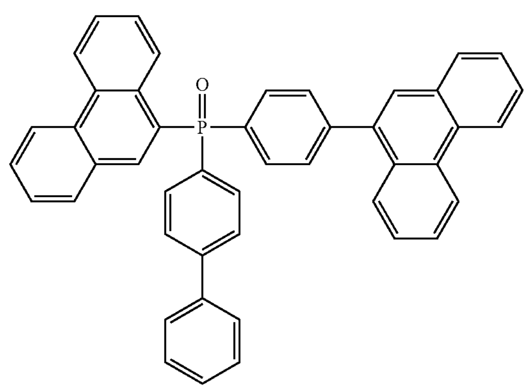

-continued
1-2-31
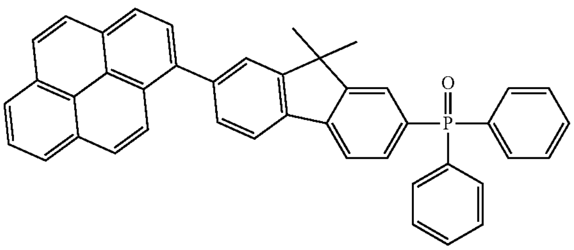
1-2-32
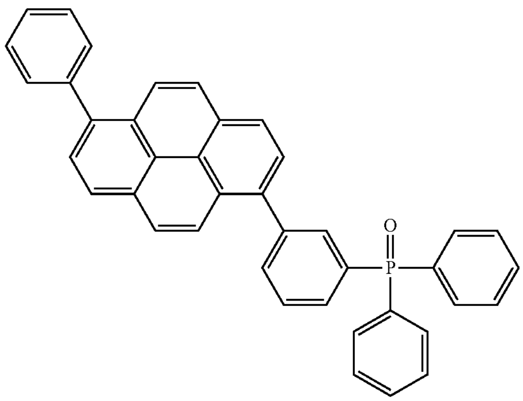
1-2-33
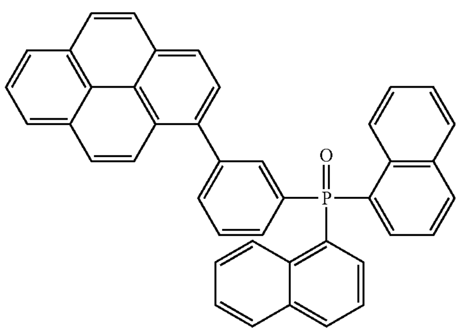
1-2-34
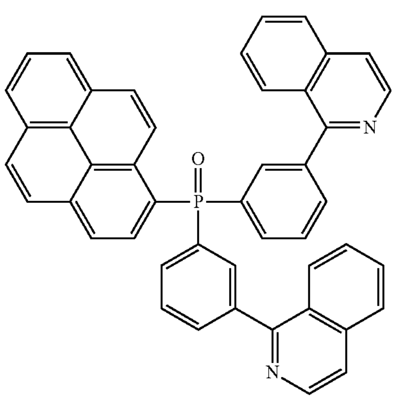
-continued
1-2-35
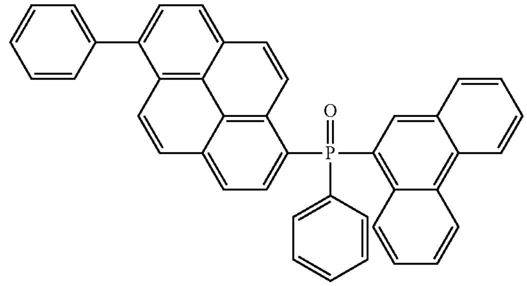
1-2-36
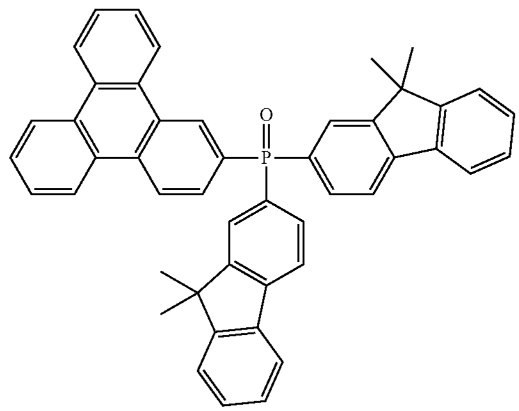
1-2-37
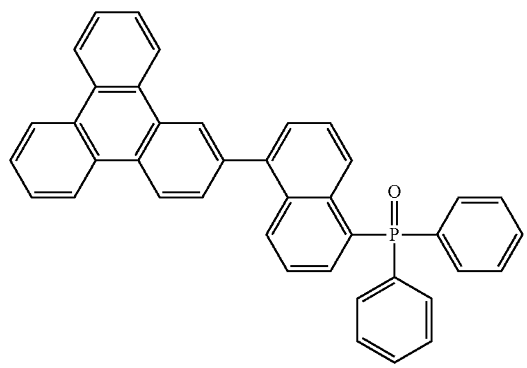
1-2-38
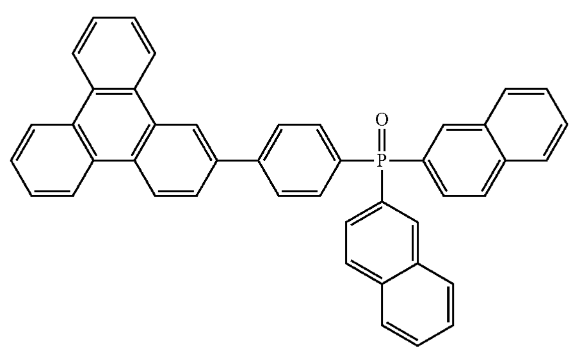

-continued
1-2-39
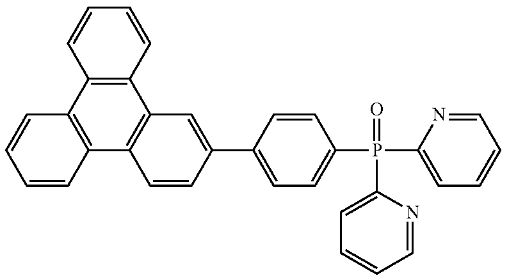
1-2-40
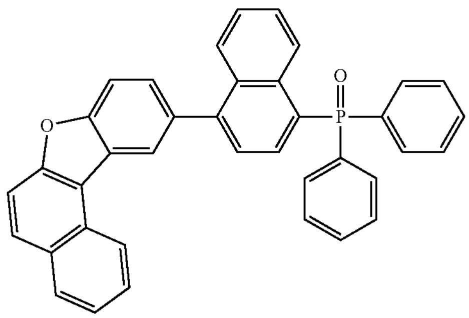
1-2-41
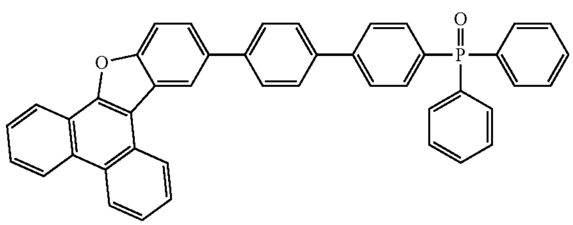
1-2-42
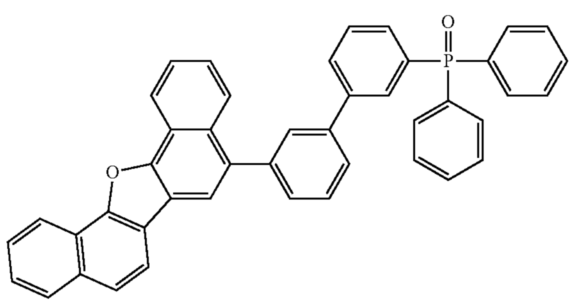
1-2-43
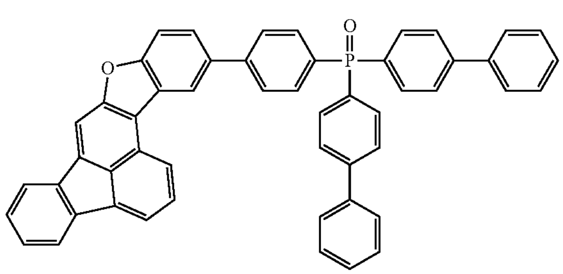
-continued
1-2-44
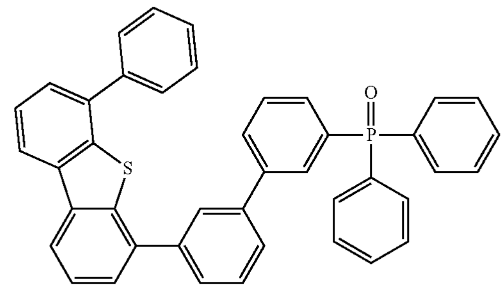
1-2-45
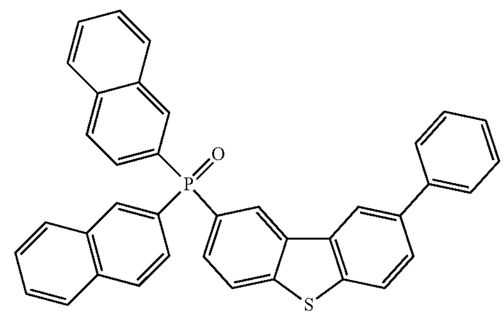
1-2-46
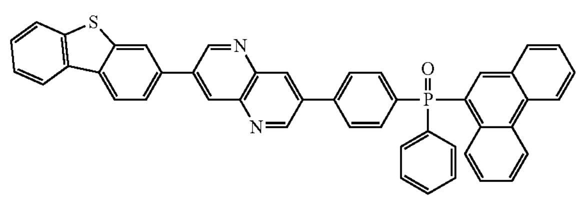
1-2-47
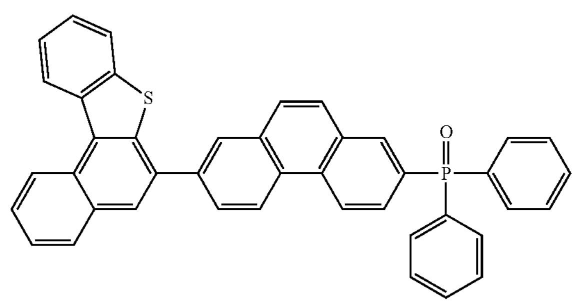
1-2-48
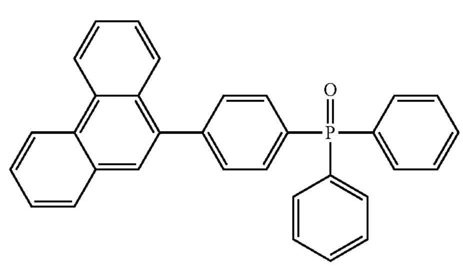

-continued
1-2-49
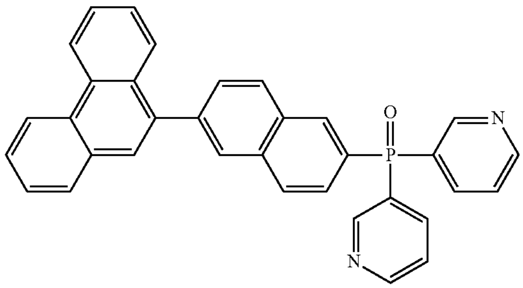
1-2-50
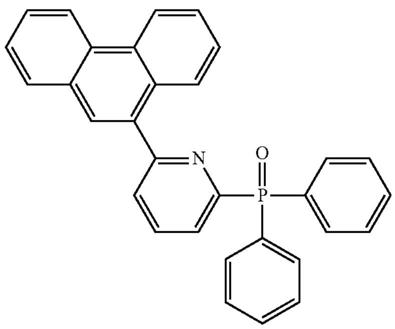
1-2-51
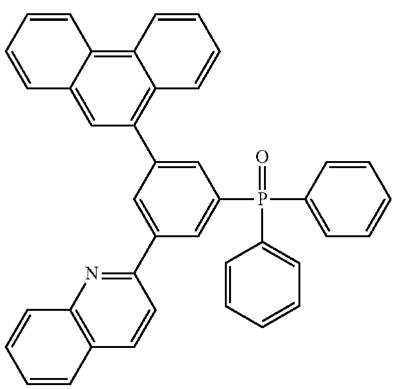
1-2-52
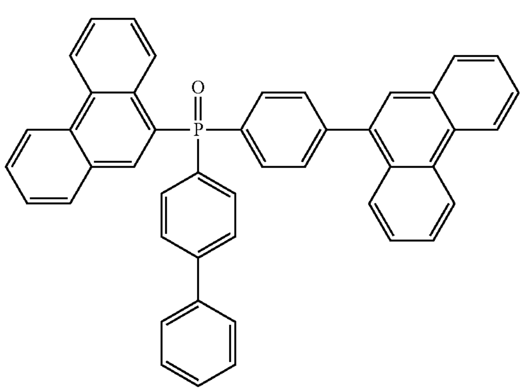
-continued
1-1-53
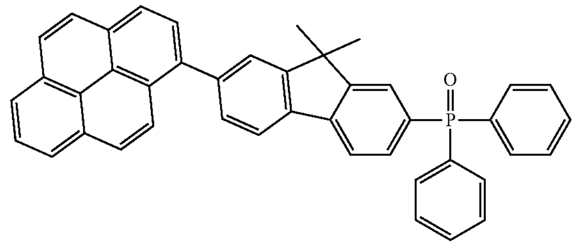
1-1-54
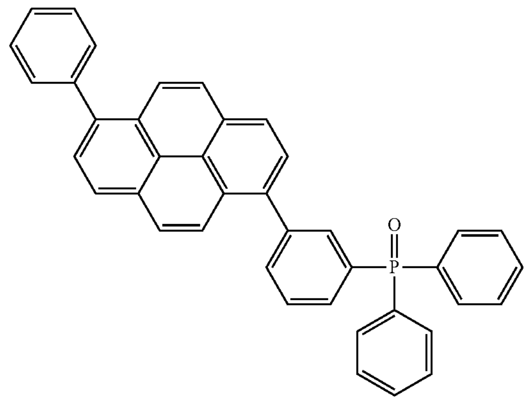
1-1-55
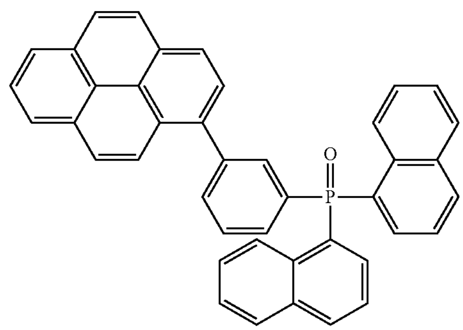
1-1-56
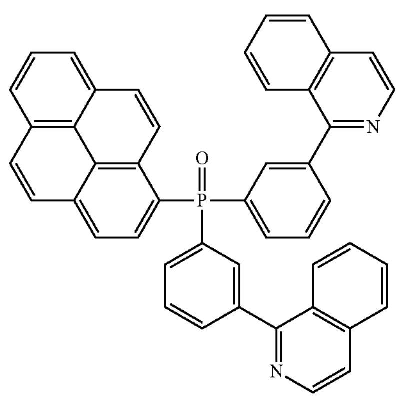

-continued
1-2-57
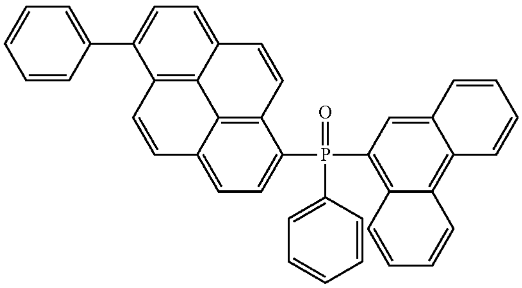
1-2-58
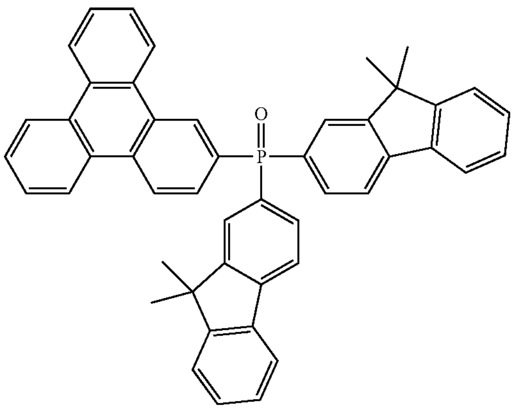
1-2-59
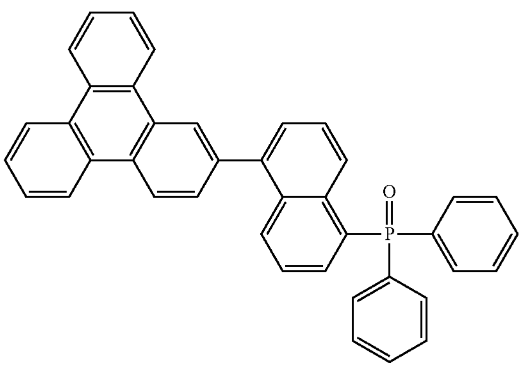
1-2-60
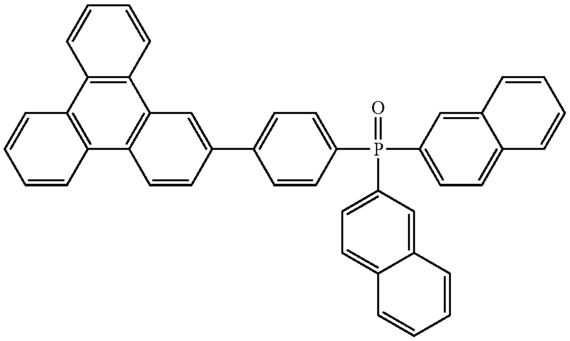
-continued
1-2-61
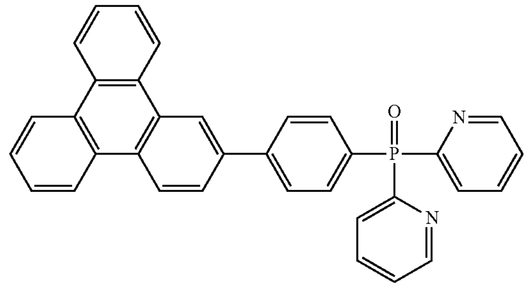
1-2-62
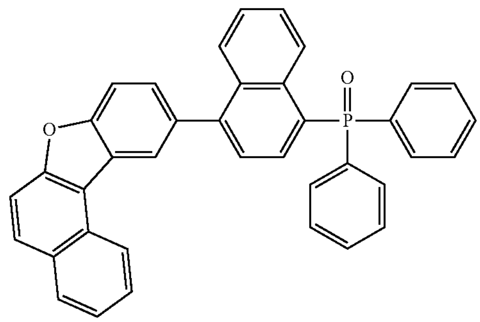
1-2-63
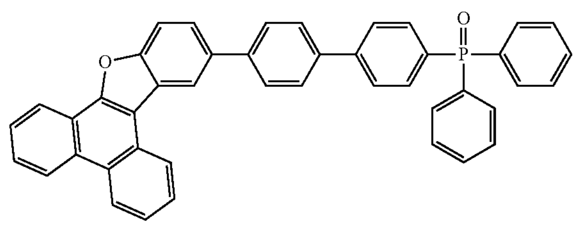
1-2-64
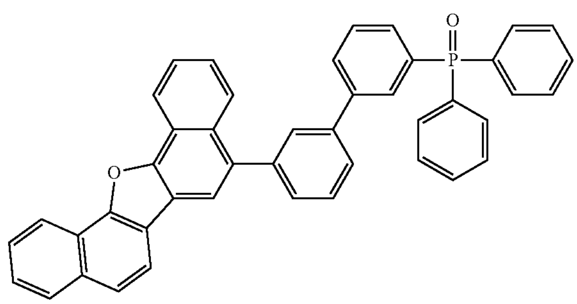
1-2-65
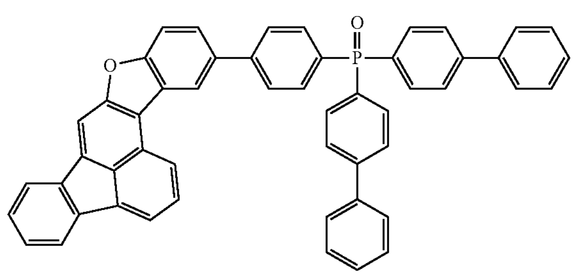

1-2-66
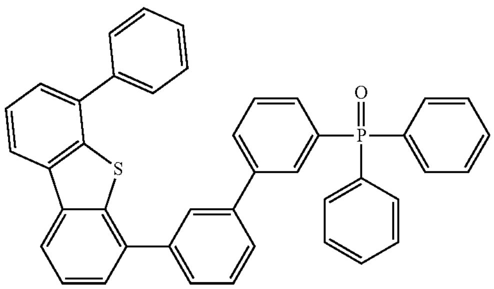
1-2-67
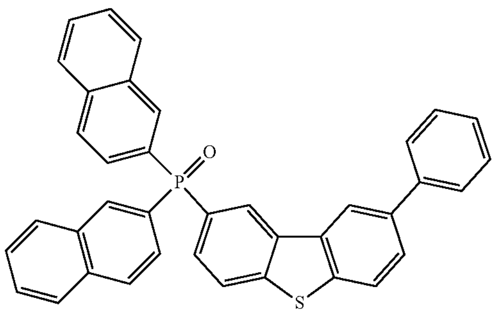
1-2-68
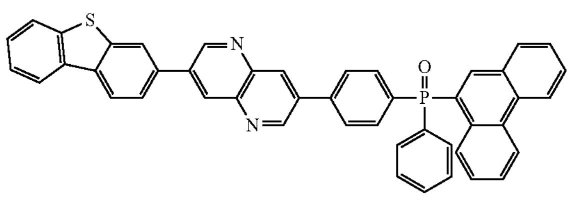
1-2-69
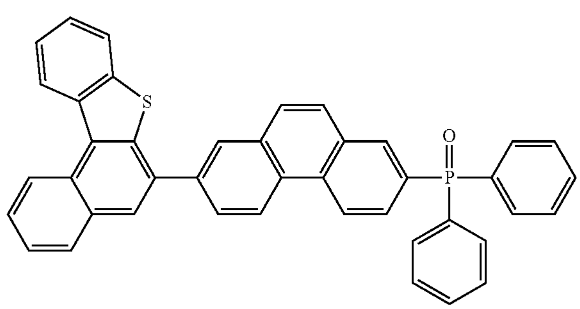
1-2-70
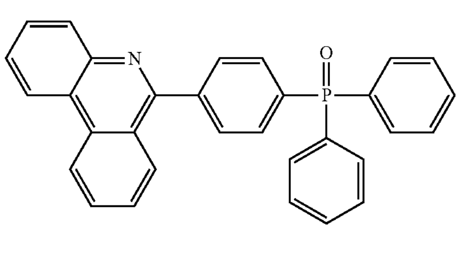
1-2-71
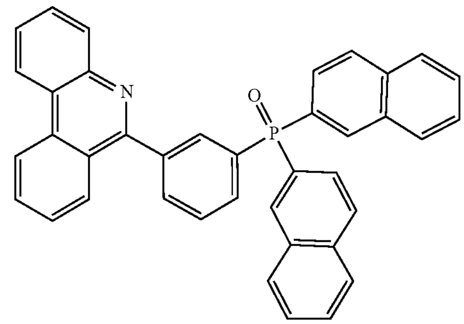
1-2-72
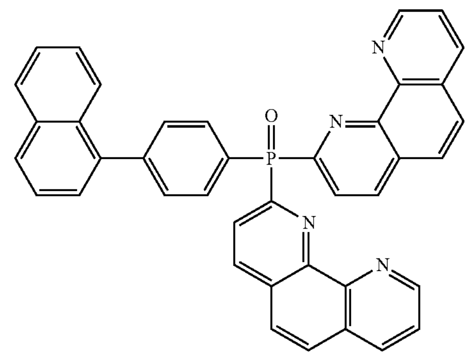
1-2-73
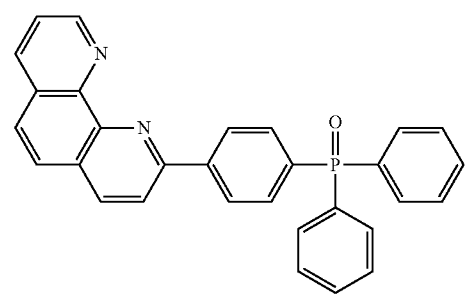
1-2-74
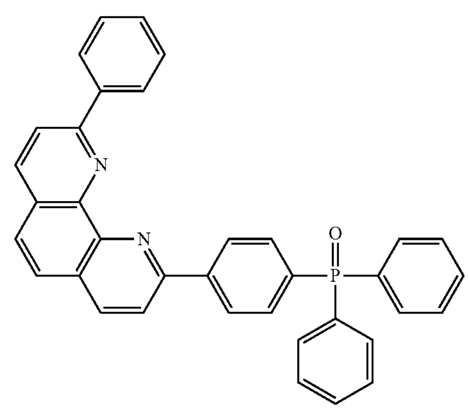

-continued
1-2-75
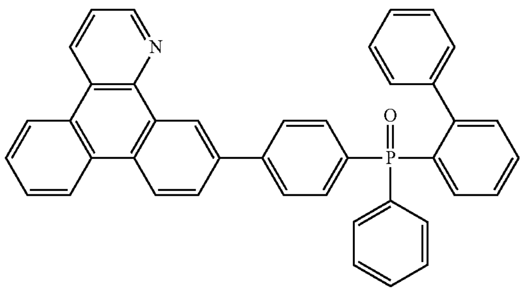
1-2-76
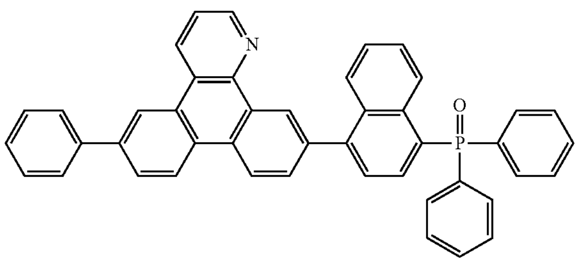
1-2-77
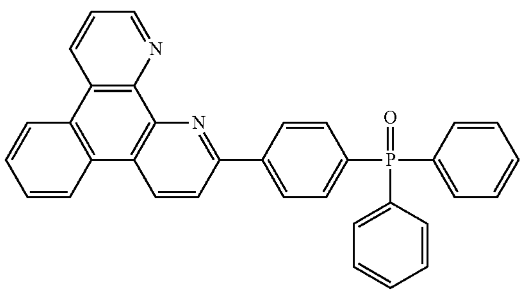
1-2-78
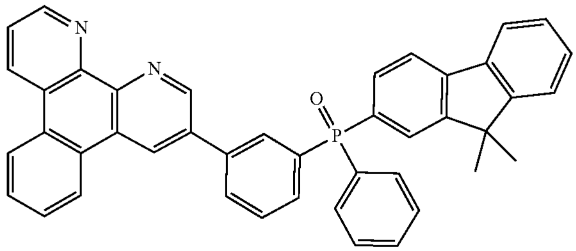
1-2-79
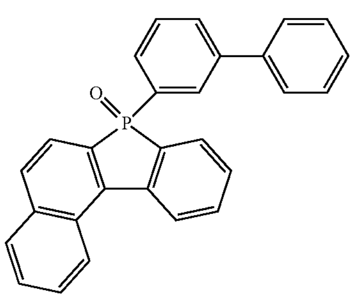
-continued
1-2-80
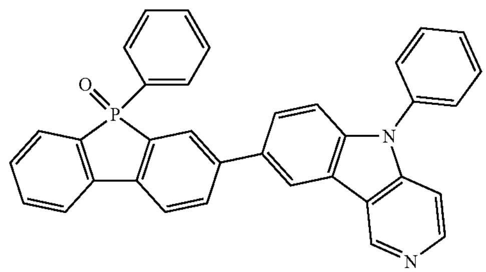
1-2-81
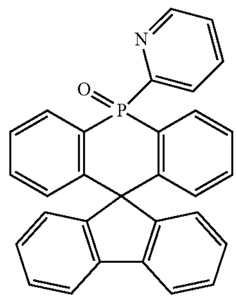
1-2-82
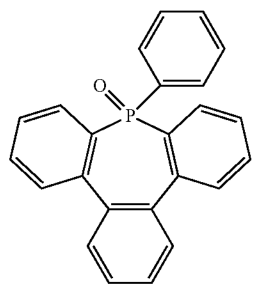
1-2-83
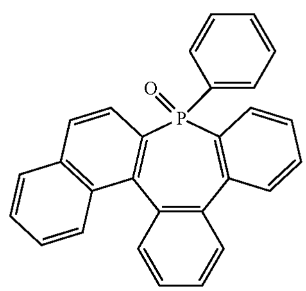
1-2-84
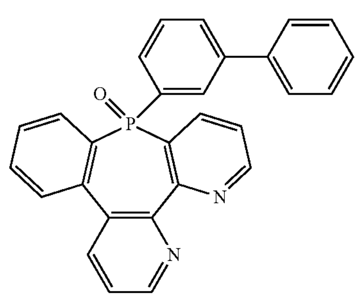

-continued
1-2-85
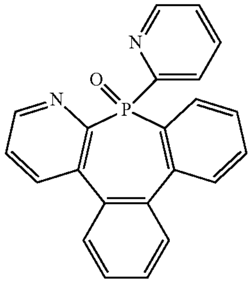
1-2-86
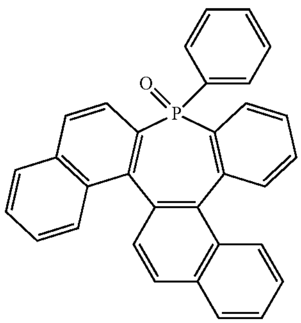
1-2-87
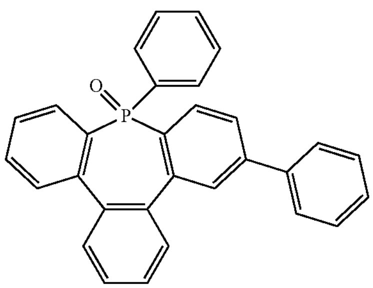
1-2-88
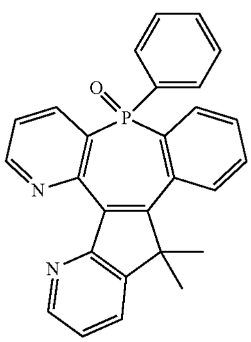
1-2-89
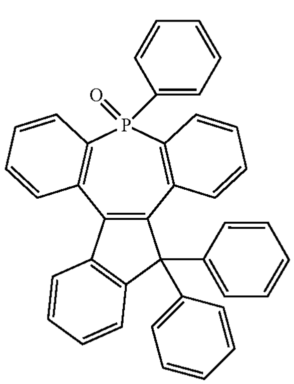
-continued
1-2-90
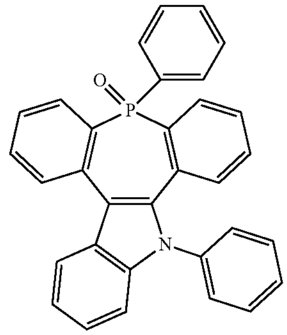
1-2-91
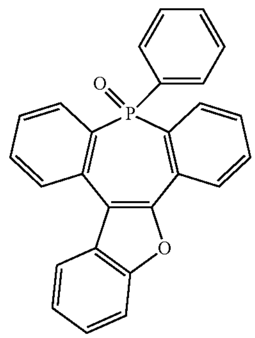
1-2-92
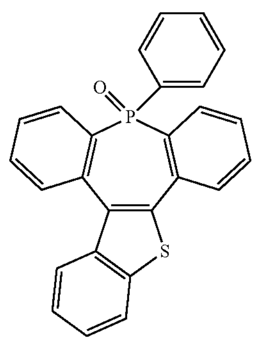
A compound represented by Formula 1-3 may be selected from Formulae 1-3-1 to 1-3-8 but embodiments of the invention are not limited thereto.
1-3-1
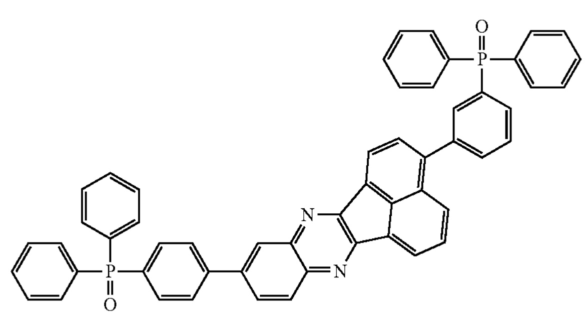

1-3-2
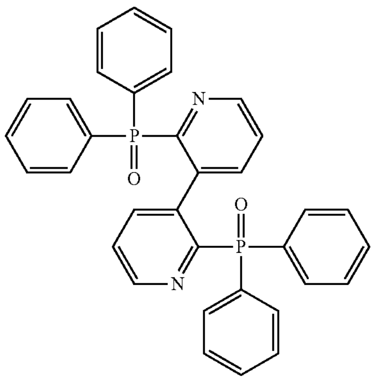
1-3-3
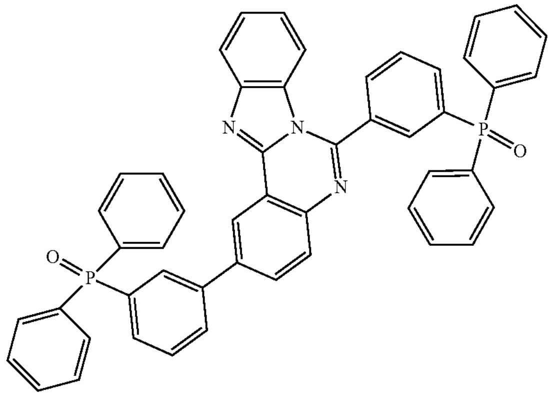
1-3-4
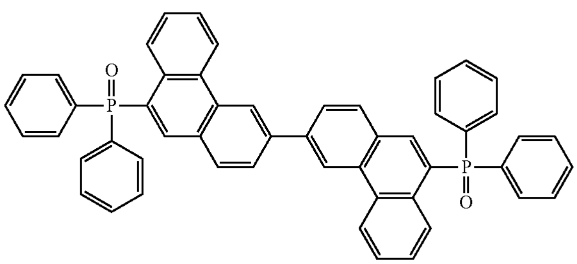
1-3-5
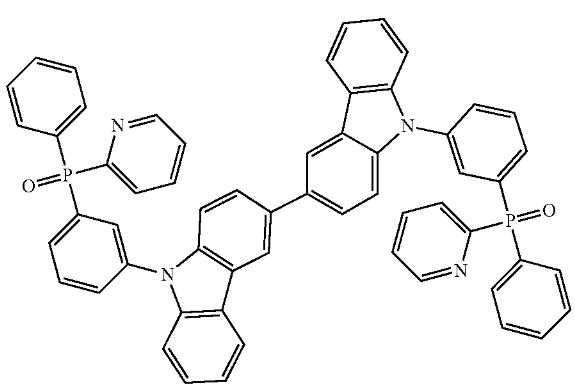
1-3-6
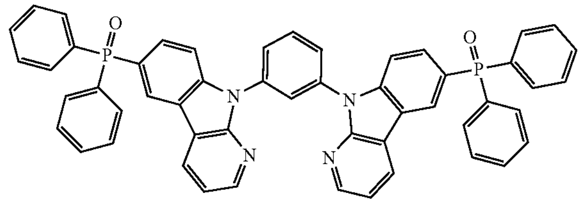
1-3-7
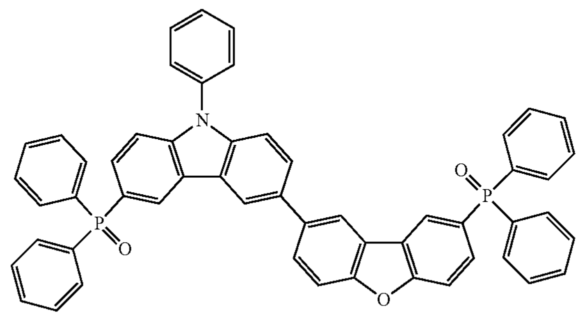
1-3-8
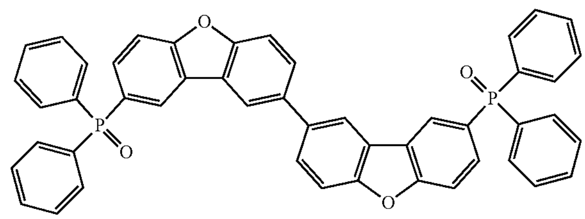
In an embodiment, Formula 2-1 may be represented by Formula 2-1(a). Formula 2-2 may be represented by one of Formulae 2-2(a) and 2-2(b). Formula 2-3 may be represented by Formula 2-3(a). Formula 2-4 may be represented by one of Formulae 2-4(a) and 2-4(b). Formula 2-5 may be represented by one of Formulae 2-5(a) to 2-5(b). Formula 2-6 may be represented by one of Formulae 2-6(a) to 2-6(d).
Formula 2-1(a)
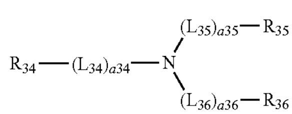
Formula 2-2(a)
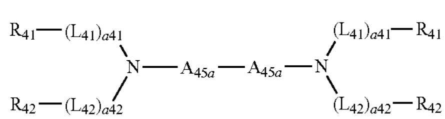
Formula 2-2(b)
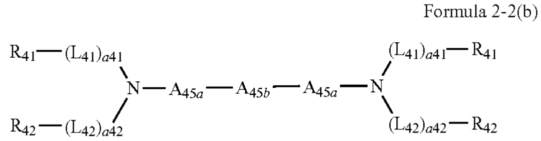

-continued

Formula 2-3(a)

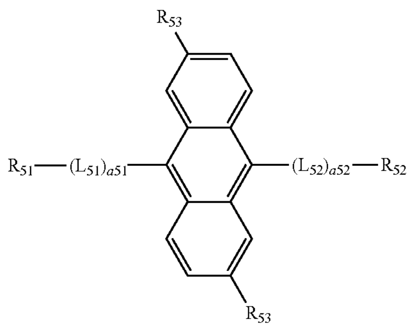

Formula 2-4(a)

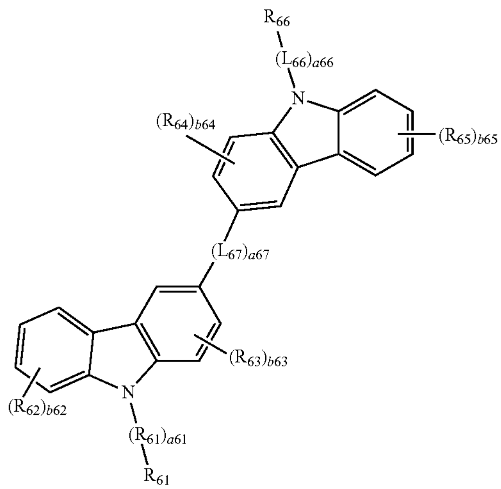

Formula 2-4(b)

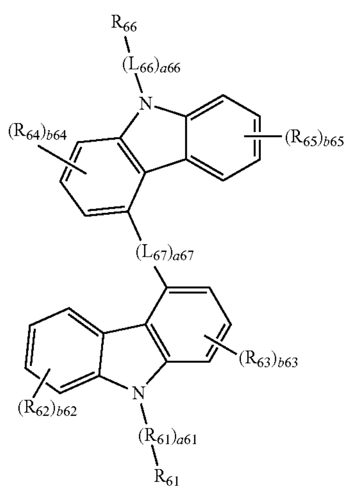

Formula 2-5(a)

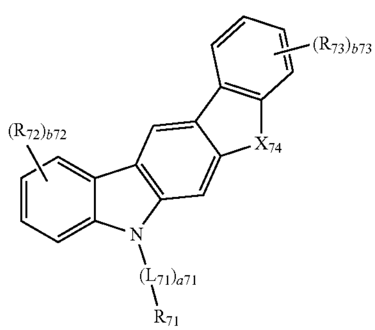

-continued

Formula 2-5(b)

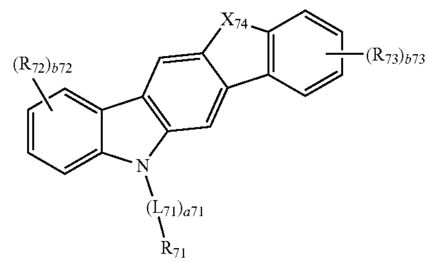

Formula 2-6(a)

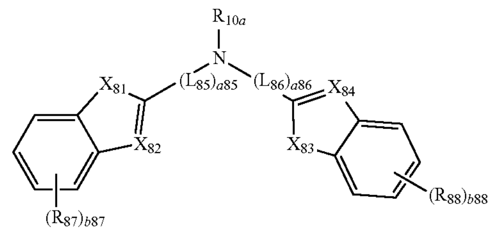

Formula 2-6(b)

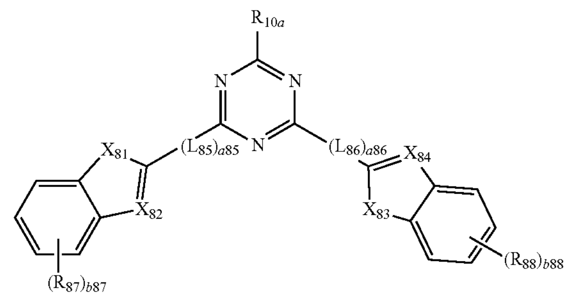

Formula 2-6(c)

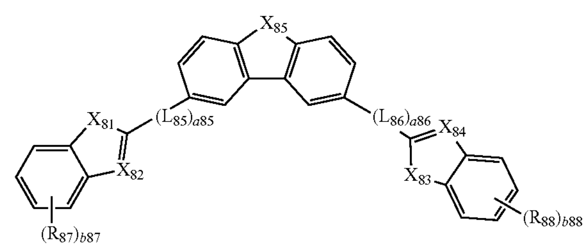

Formula 2-6(d)

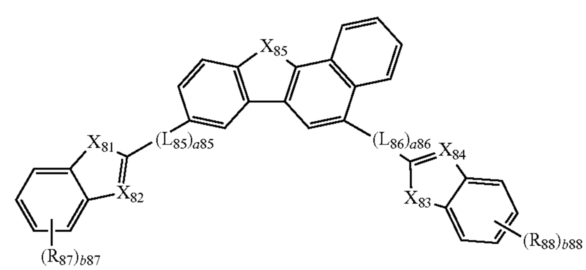

In Formulae 2-1(a), 2-2(a) to 2-2(b), 2-3(a), 2-4(a) to 2-4(b), 2-5(a) to 2-5(b), and 2-6(a) to 2-6(d), $X_{74}$, $X_{81}$ to $X_{84}$, $L_{34}$ to $L_{36}$, $L_{41}$ to $L_{42}$, $L_{51}$ to $L_{52}$, $L_{61}$, $L_{66}$, $L_{67}$, $L_{71}$, $L_{85}$, $L_{86}$, a34 to a36, a41 to a42, a51 to a52, a61, a66, a67, a71, a85, a86, $R_{10a}$, $R_{41}$ to $R_{42}$, $R_{51}$ to $R_{53}$, $R_{61}$ to $R_{66}$, $R_{71}$ to $R_{73}$, $R_{87}$, $R_{88}$, b62 to b65, b72 to b73, and b87 to b88 may be the same as described herein, and $A_{45a}$ and $A_{45b}$, have, independently from one another, the same meaning as $A_{45}$ as described above.

At least two of $R_{34}$ to $R_{36}$ may each be a group selected from a fluorenyl group, a carbazolyl group, and a benzimidazole group, each unsubstituted or substituted with deuterium, —F, —Cl, —Br, —I, a hydroxyl group, a cyano group, a nitro group, a $C_1$-$C_{60}$ alkyl group, a $C_1$-$C_{60}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, a fluorenyl group, a carbazolyl group, a benzimidazole group, or any combination thereof, and the other group may be the same as described in connection with $R_{31}$ herein.

In an embodiment, at least two of $R_{34}$ to $R_{36}$ may each be a group selected from a fluorenyl group, a carbazolyl group, and a benzimidazole group, each unsubstituted or substituted with deuterium, a $C_1$-$C_{60}$ alkyl group, a fluorenyl group, a carbazolyl group, a benzimidazole group, or any combination thereof, and the other group may be the same as described in connection with $R_{31}$ herein, but embodiments of the invention are not limited thereto.

In Formulae 2-6(c) and 2-6(d), $X_{85}$ may be selected from $C(R_{85a})(R_{85b})$, $Si(R_{85a})(R_{85b})$, $N(R_{85a})$, O, S, and Se. In this regard, $R_{85a}$ and $R_{85b}$ may be the same as described in connection with $R_{10a}$ herein.

In an embodiment, $X_{85}$ may be selected from O, S, and $N(R_{85a})$.

A compound represented by Formula 2-1 may be selected from Formulae 2-1-1 to 2-1-18, but embodiments of the invention are not limited thereto.

2-1-1

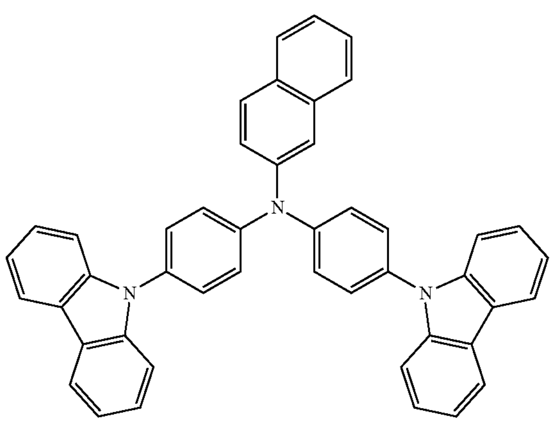

2-1-2

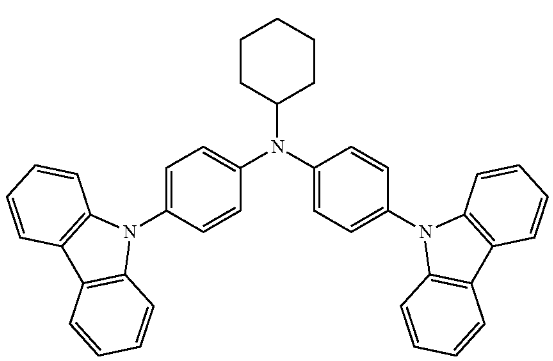

-continued 2-1-3

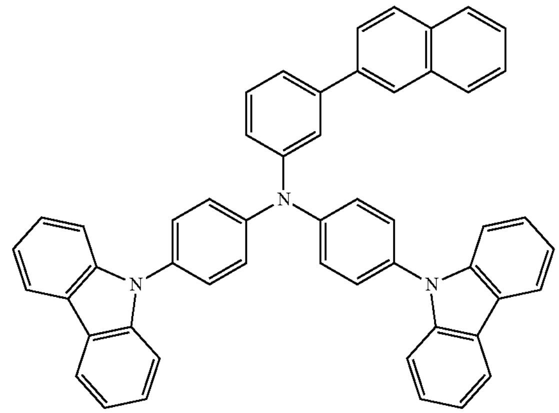

2-1-4

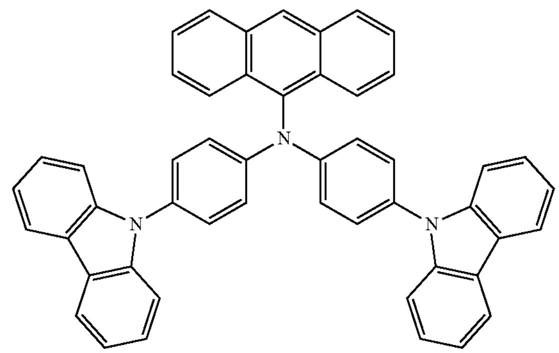

2-1-5

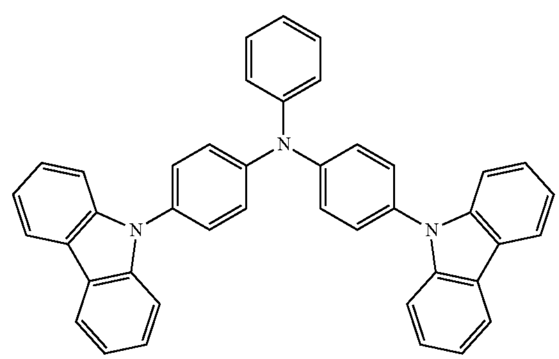

2-1-6

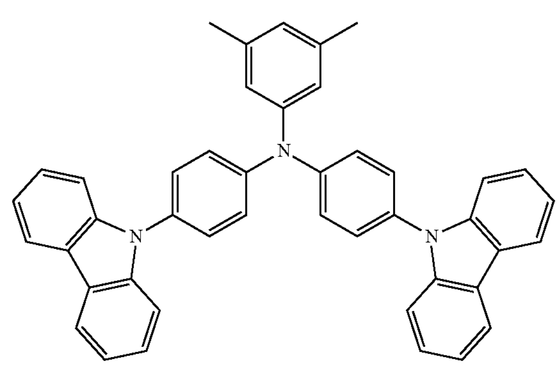

-continued
2-1-7
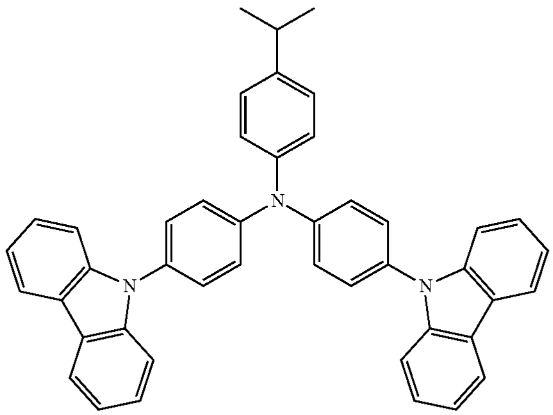
2-1-8
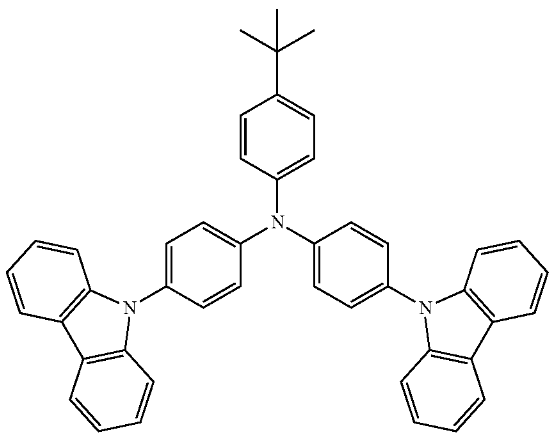
2-1-9
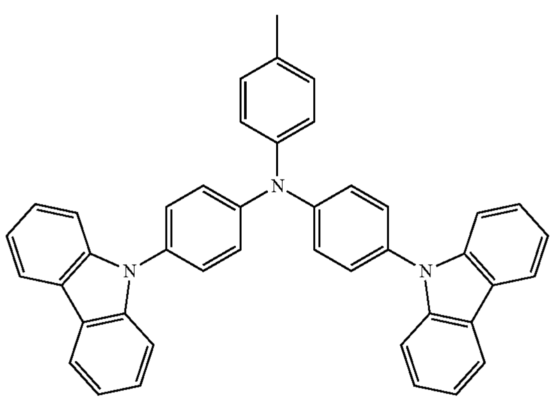
-continued
2-1-10
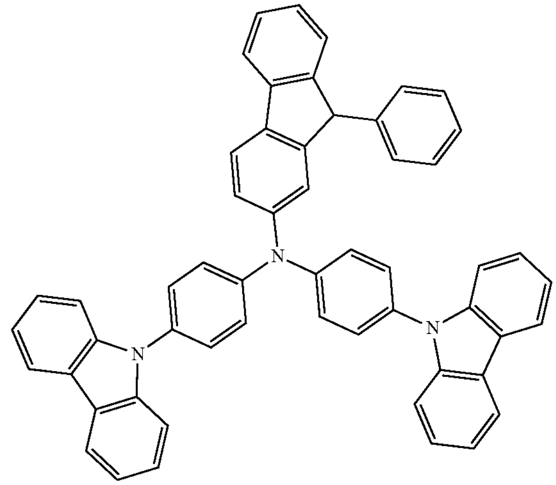
2-1-11
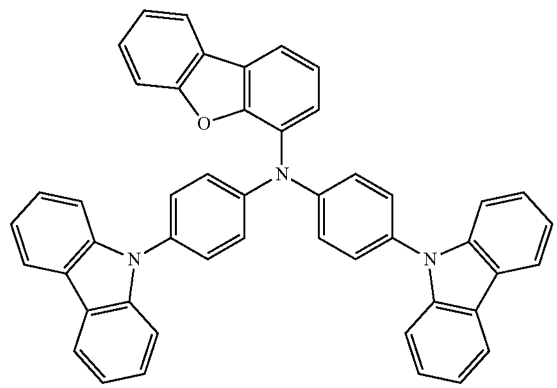
2-1-12
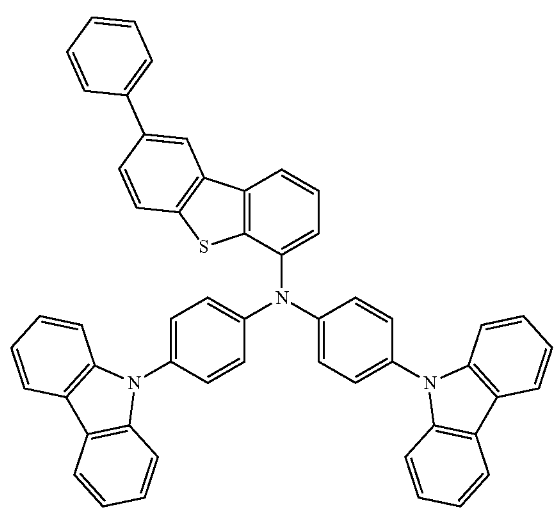

-continued
2-1-13
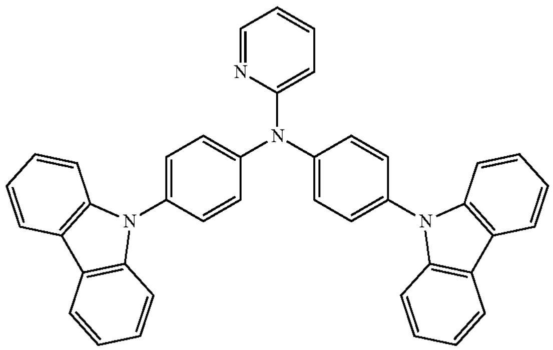
2-1-14
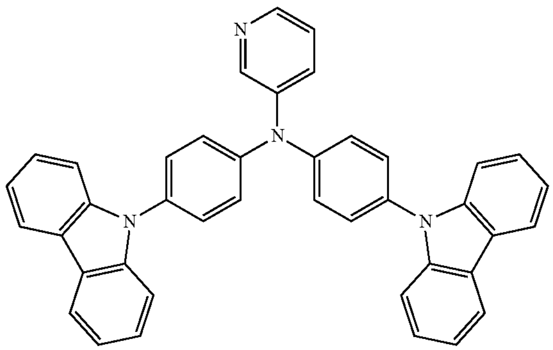
2-1-15
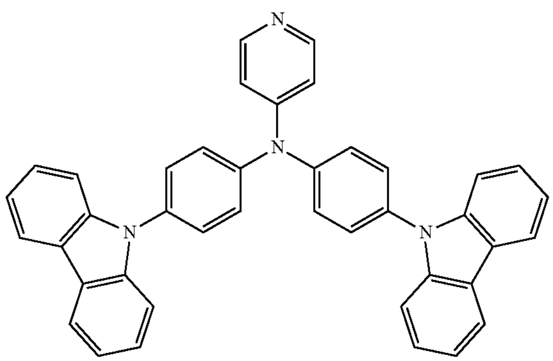
2-1-16
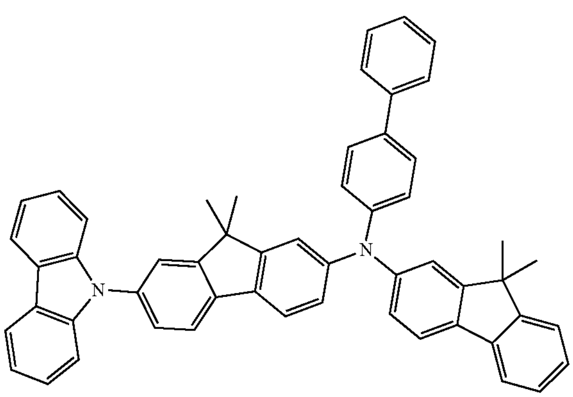
-continued
2-1-17
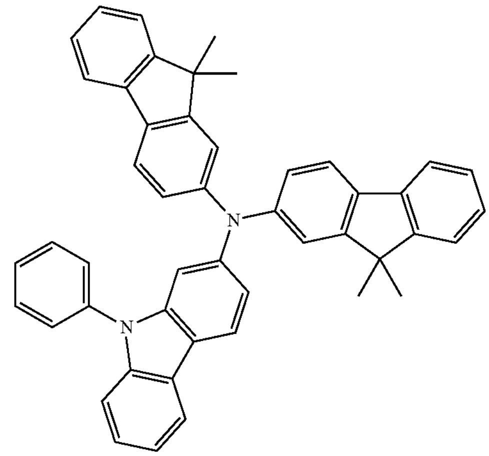
2-1-18
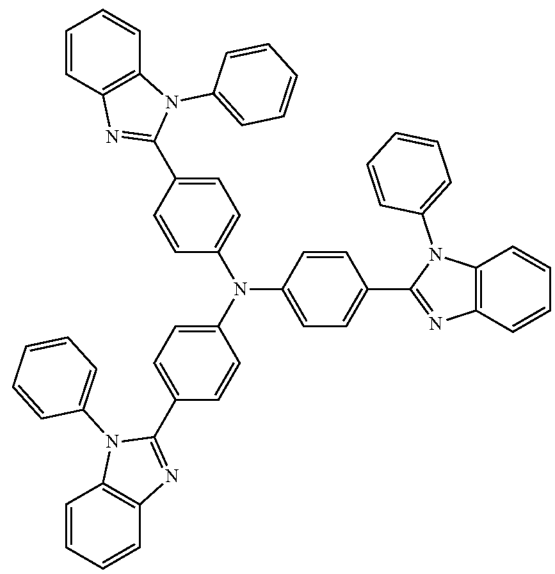
A compound represented by Formula 2-2 may be selected from Formulae 2-2-1 to 2-2-9, but embodiments of the invention are not limited thereto.
2-2-1
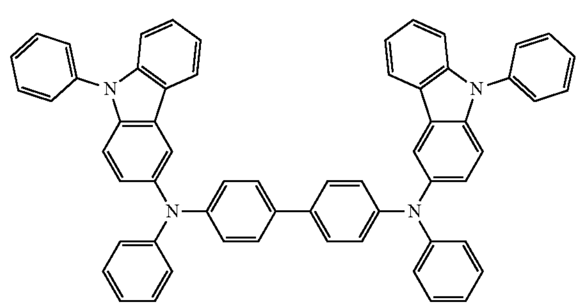

-continued
2-2-2
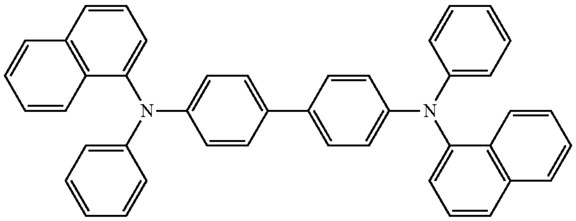
2-2-3
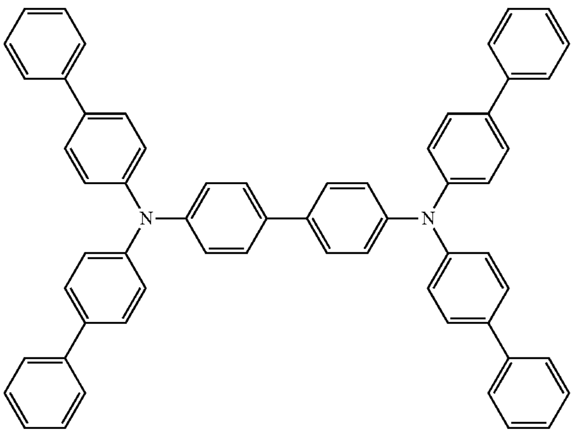
2-2-4
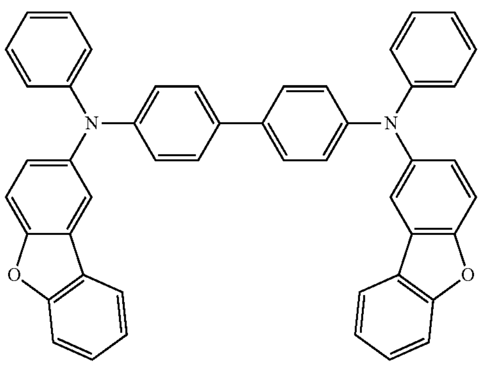
2-2-5
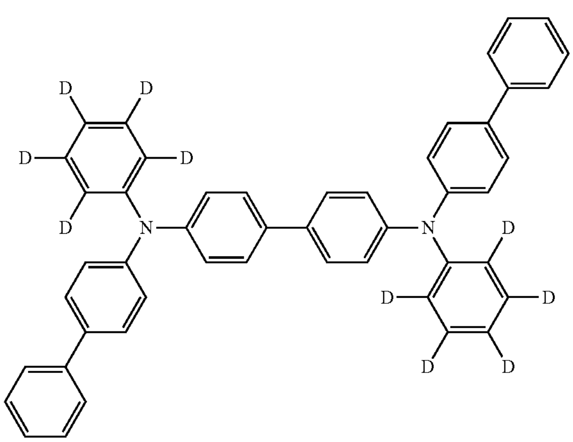
-continued
2-2-6
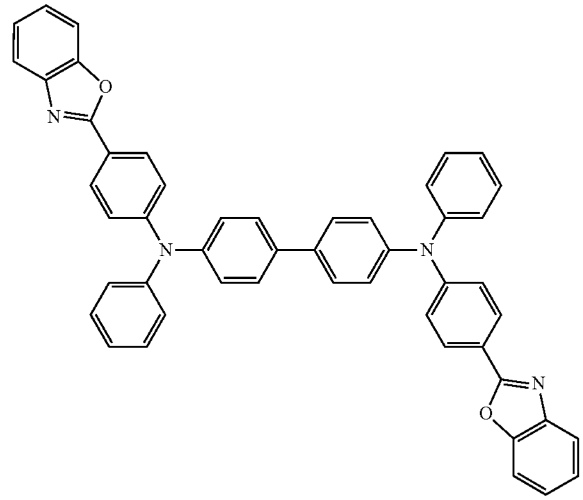
2-2-7
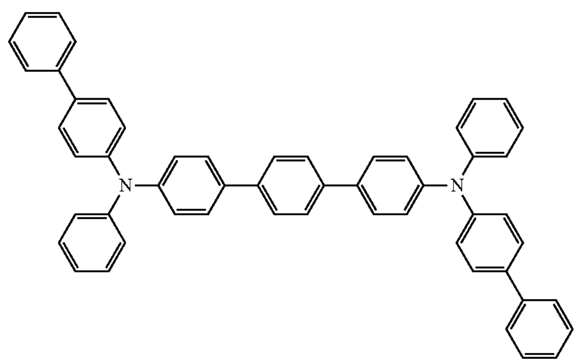
2-2-8
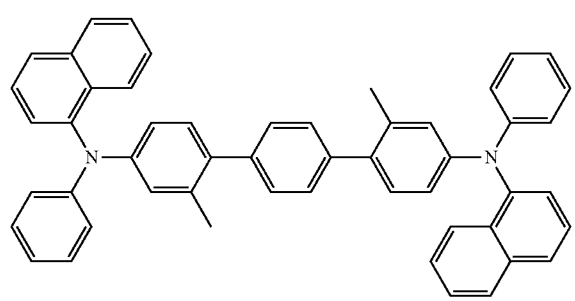

2-2-9
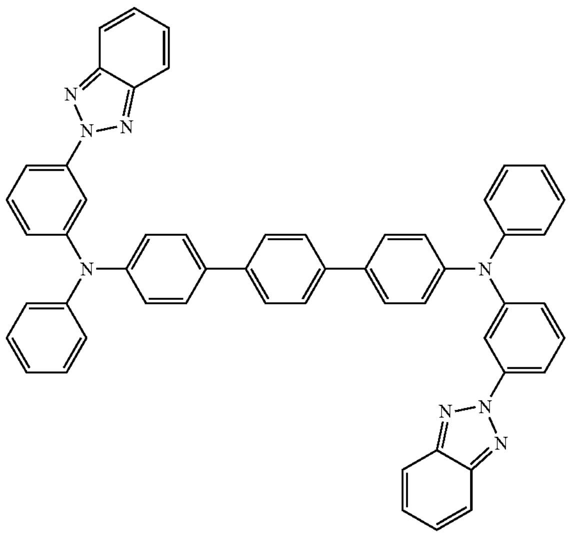
A compound represented by Formula 2-3 may be selected from Formulae 2-3-1 to 2-3-15, but embodiments of the invention are not limited thereto.
2-3-1
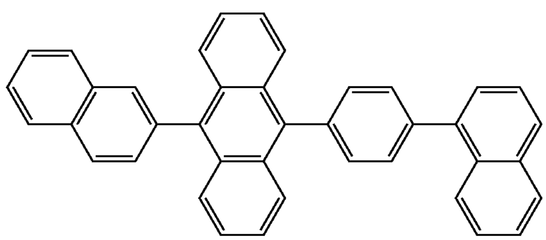
2-3-2
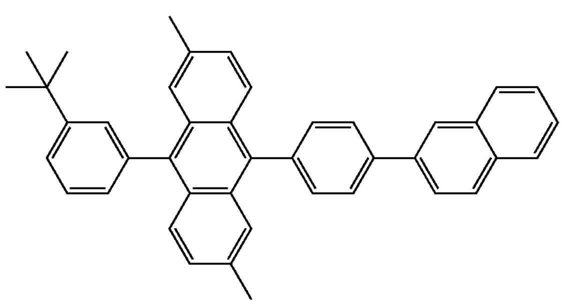
2-3-3
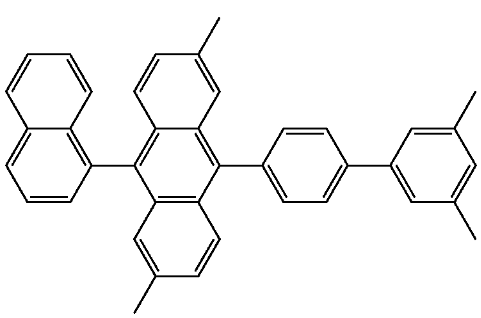
2-3-4
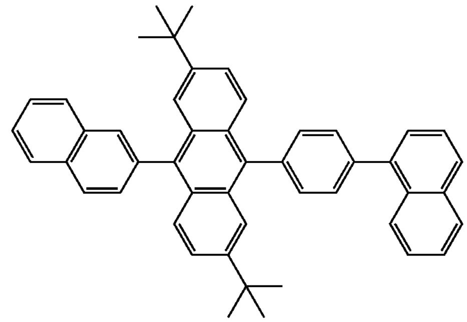
2-3-5
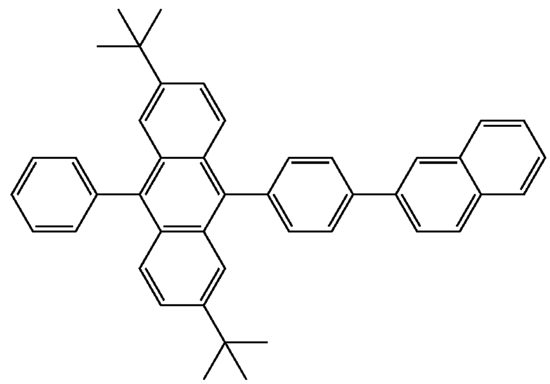
2-3-6
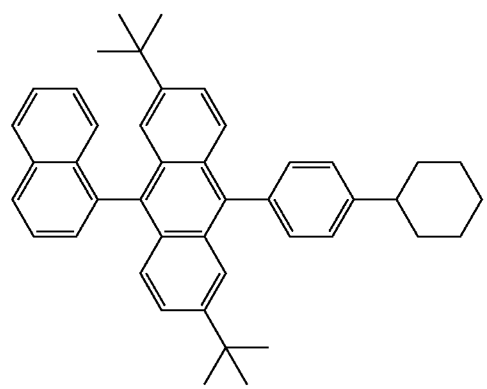
2-3-7
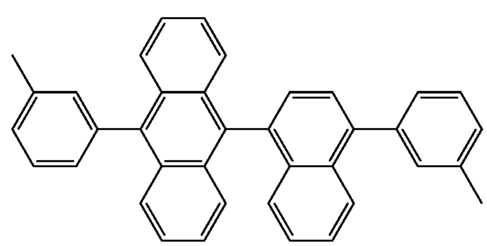

-continued
2-3-8
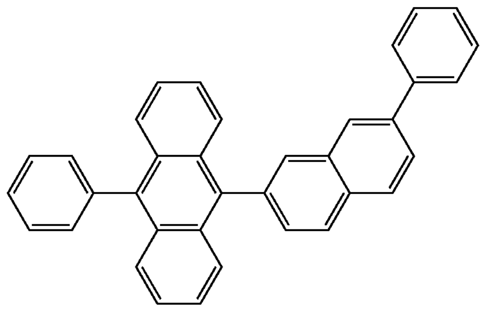
2-3-9
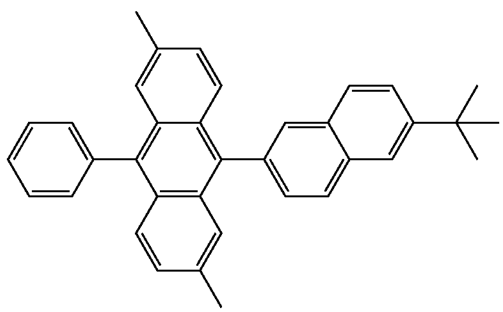
2-3-10
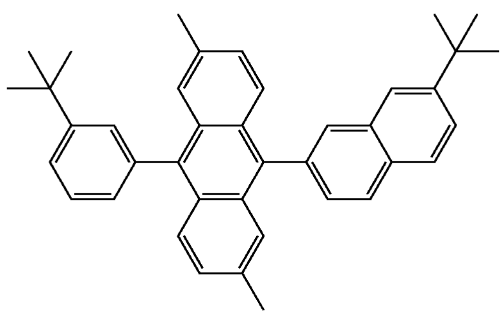
2-3-11
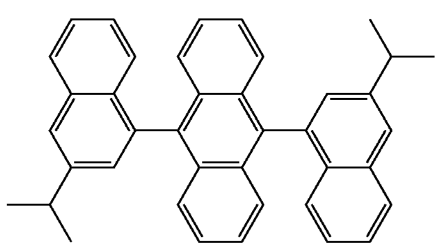
-continued
2-3-12
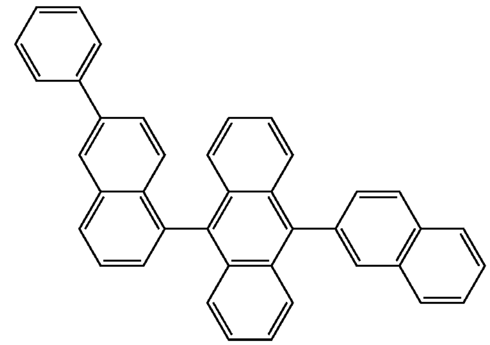
2-3-13
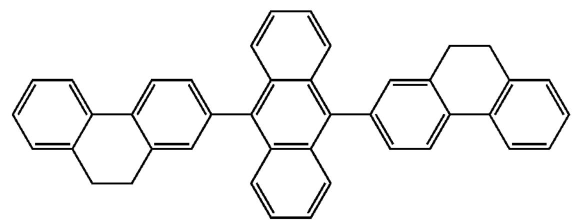
2-3-14
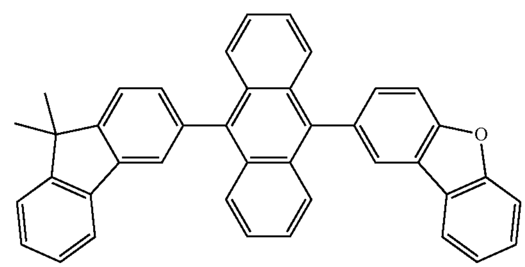
2-3-15
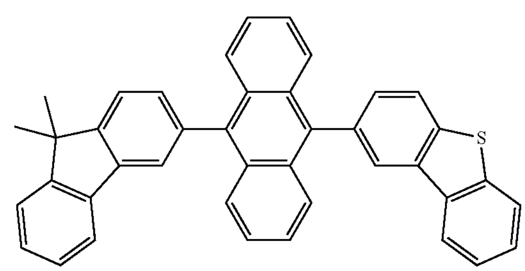
A compound represented by Formula 2-4 may be selected from Formulae 2-4-1 to 2-4-33, but embodiments of the invention are not limited thereto.

2-4-1
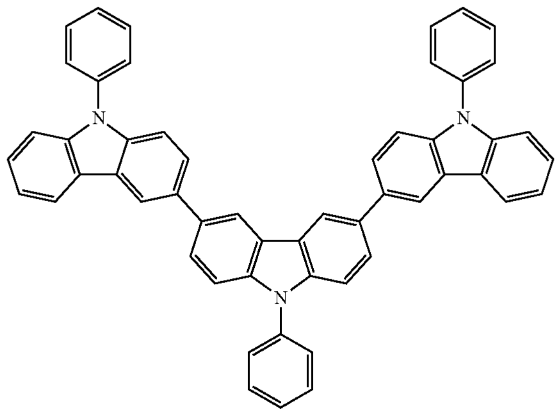
2-4-2
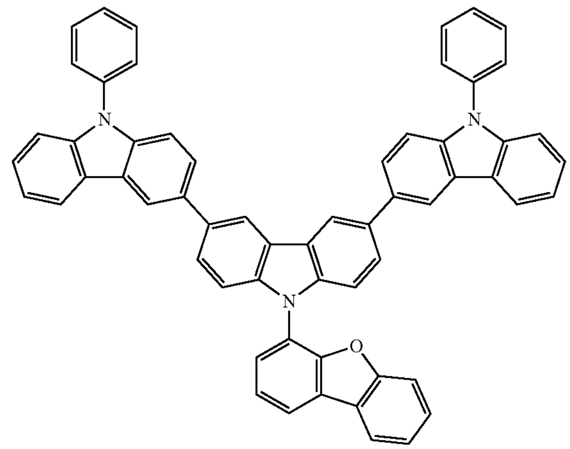
2-4-3
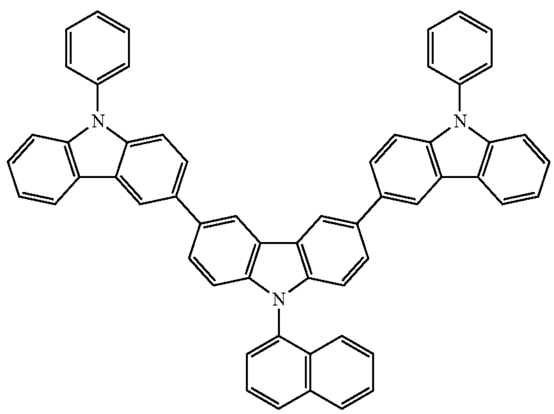
2-4-4
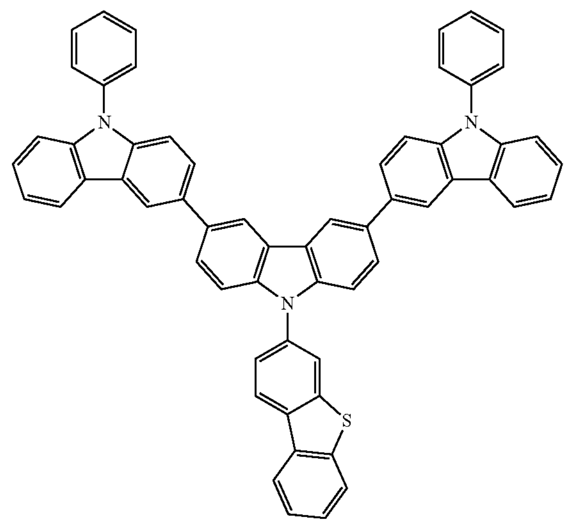
2-4-5
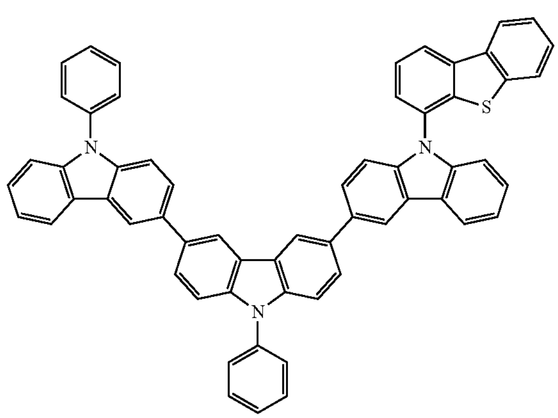
2-4-6
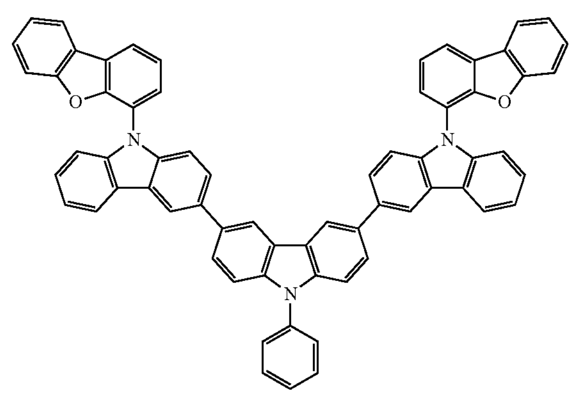

-continued
2-4-7
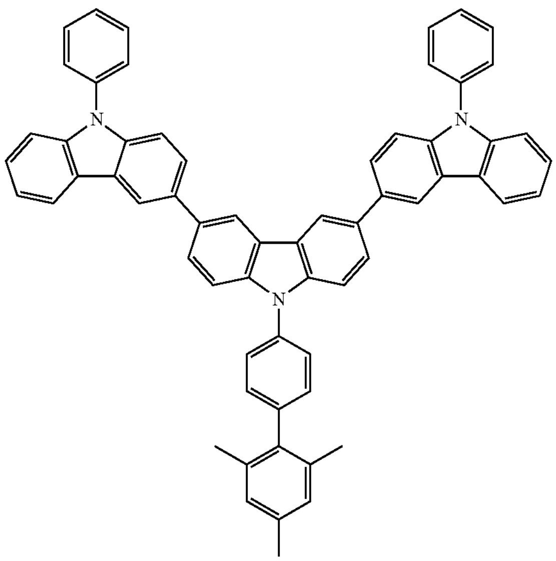
2-4-8
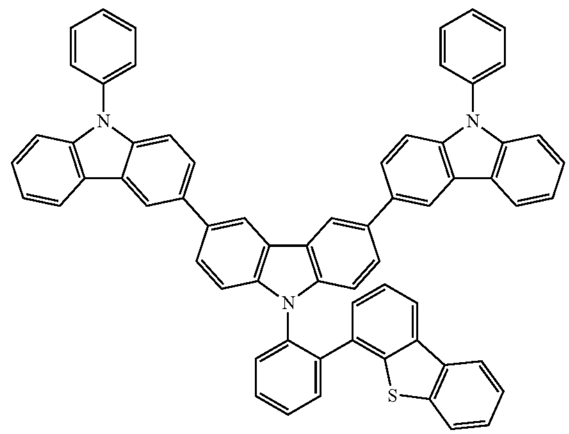
2-4-9
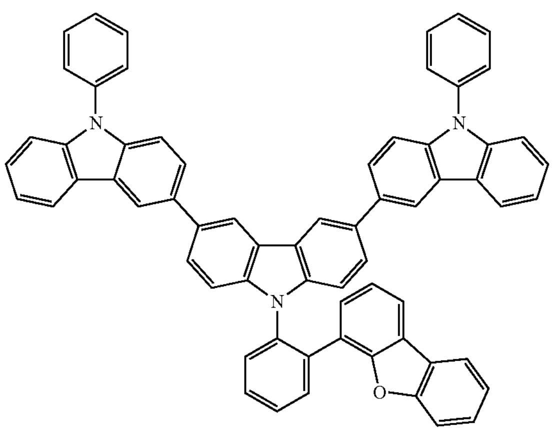
2-4-10
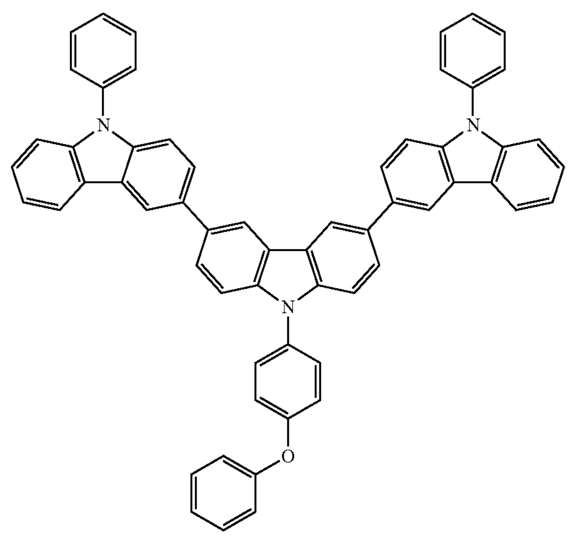
2-4-11
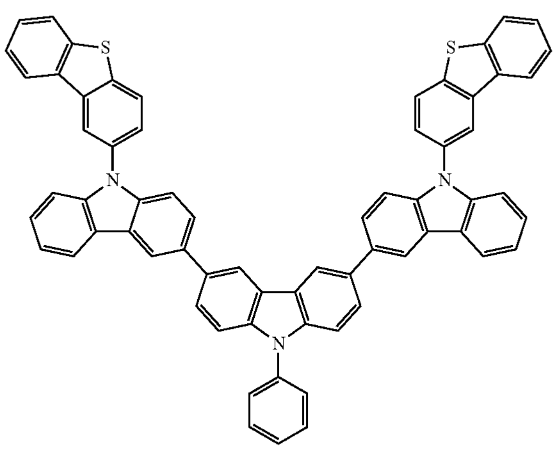
2-4-12
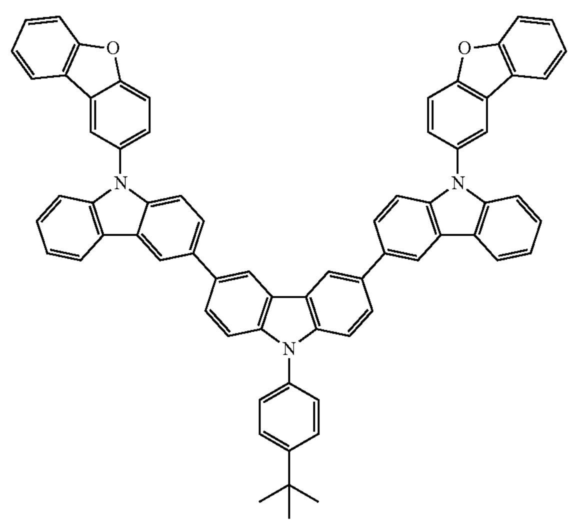

-continued
2-4-13
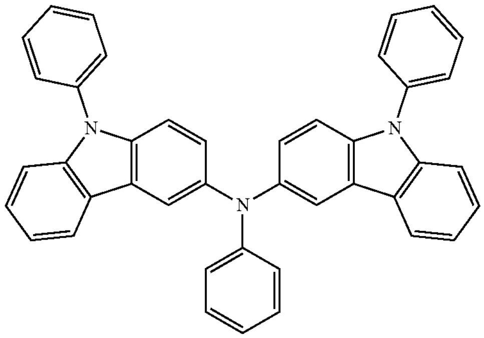
2-4-14
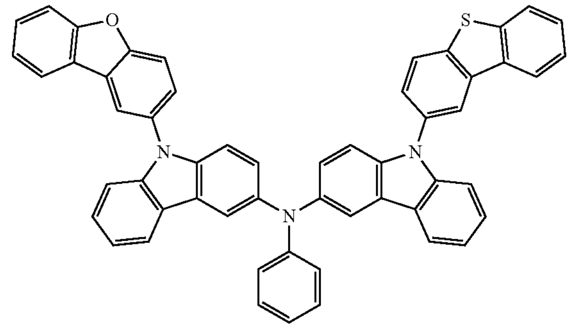
2-4-15
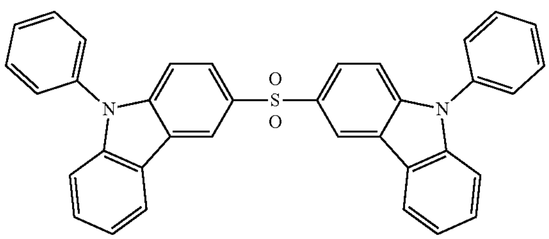
2-4-16
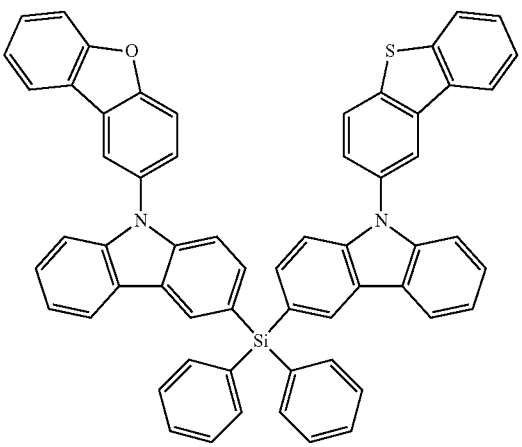
2-4-17
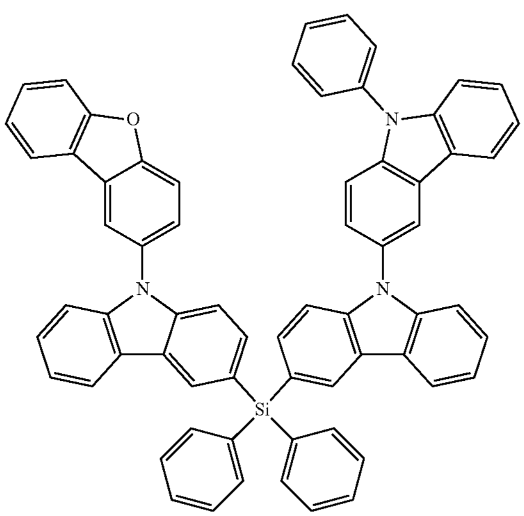
2-4-18
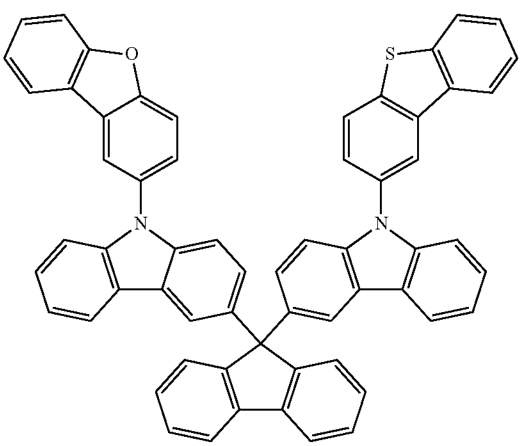

-continued
2-4-19
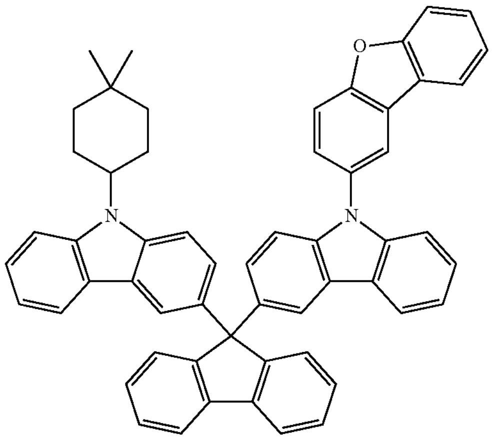
2-4-20
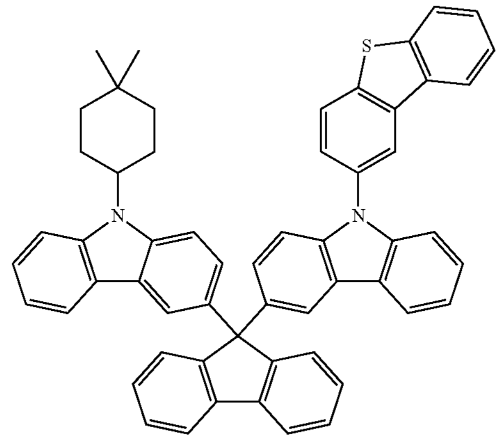
2-4-21
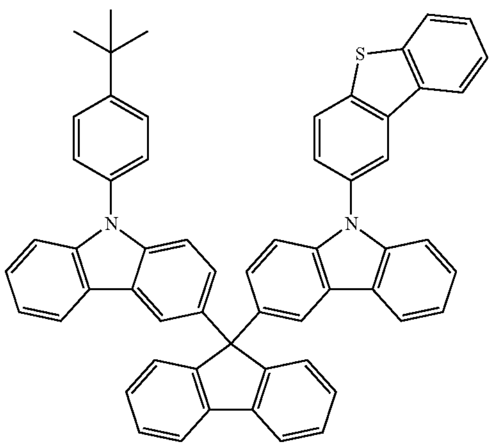
2-4-22
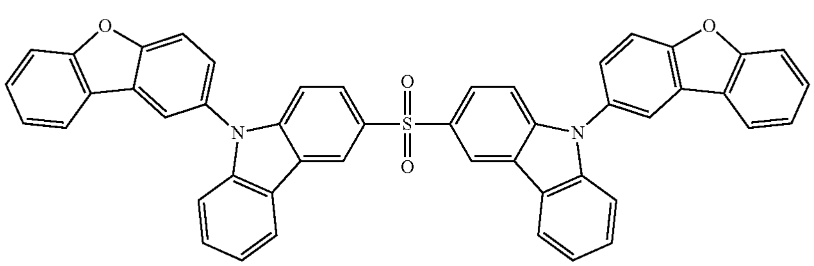
2-4-23
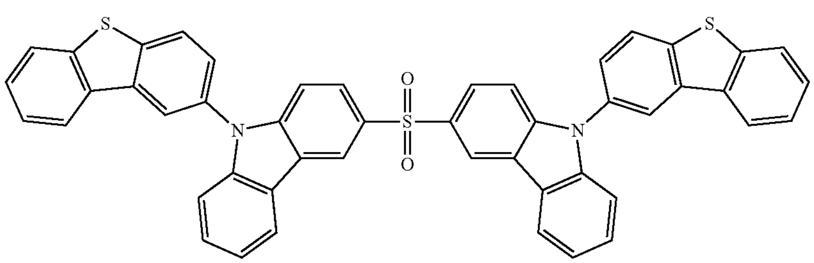

-continued
2-4-24
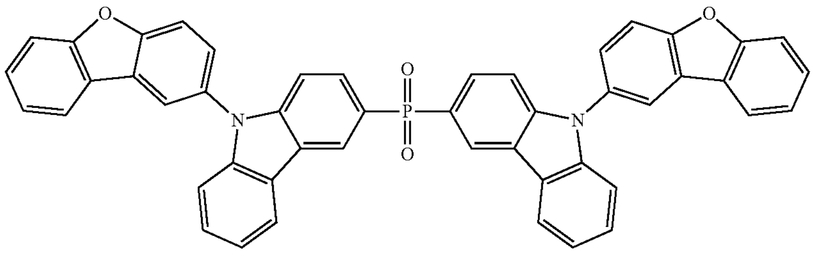
2-4-25
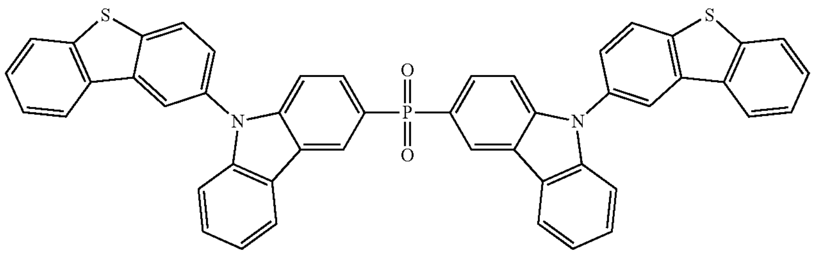
2-4-26
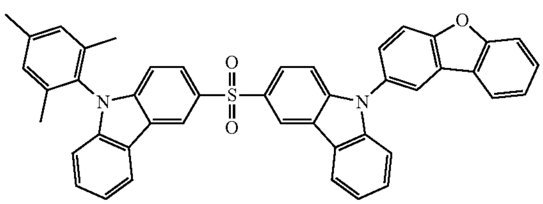
2-4-27
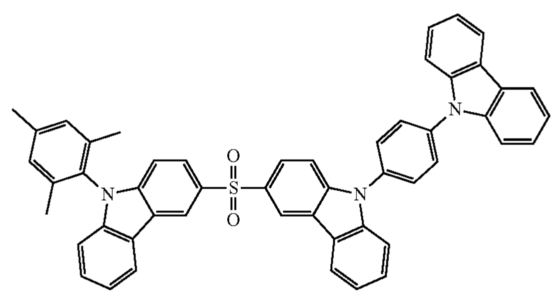
2-4-28
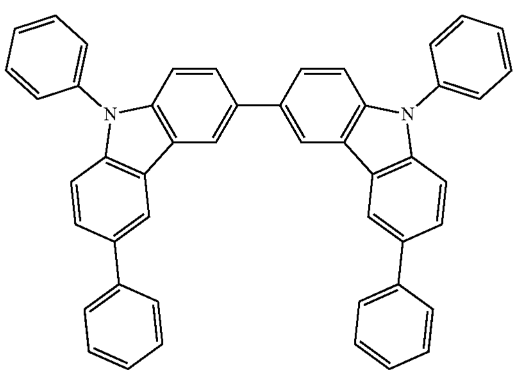
2-4-29
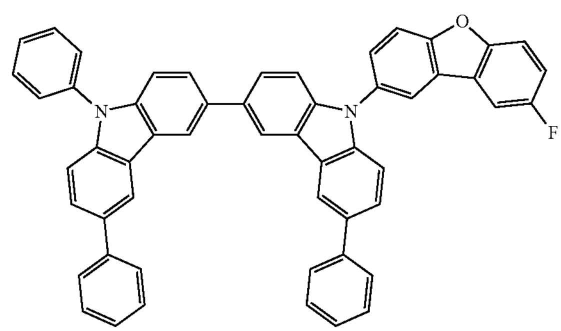
2-4-30
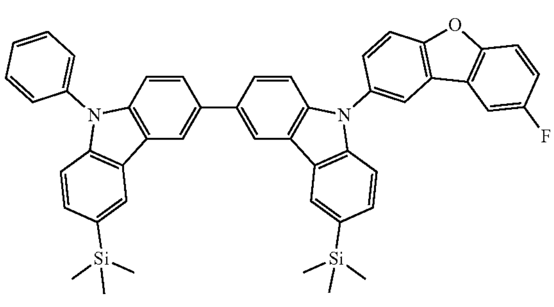
2-4-31
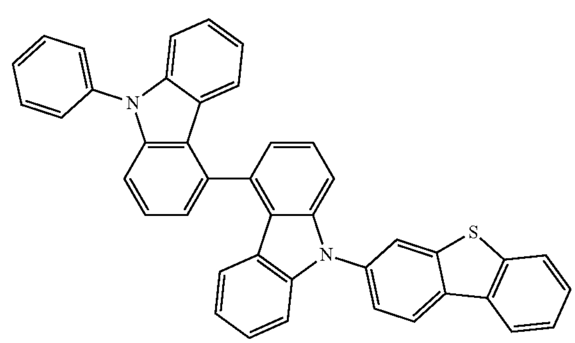

-continued
2-4-32
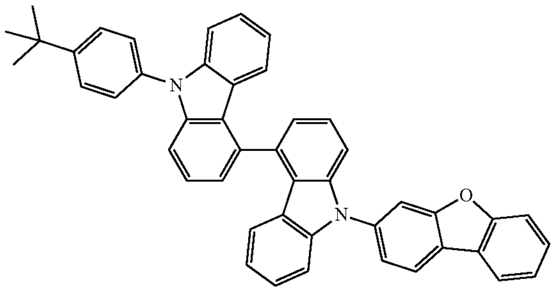
2-4-33
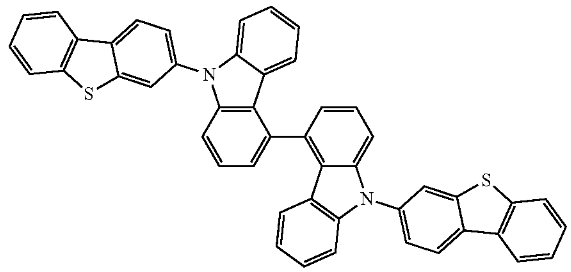
A compound represented by Formula 2-5 may be selected from Formulae 2-5-1 to 2-5-16, but embodiments of the invention are not limited thereto.
2-5-1
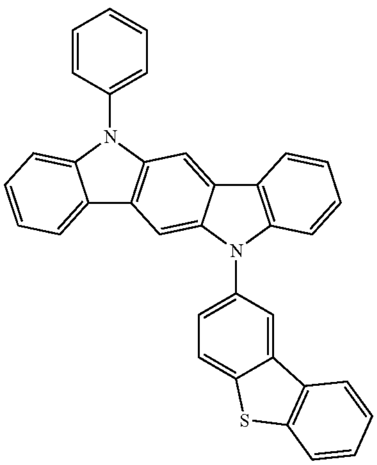
2-5-2
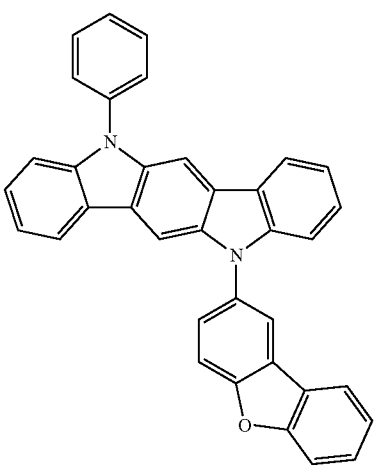
-continued
2-5-3
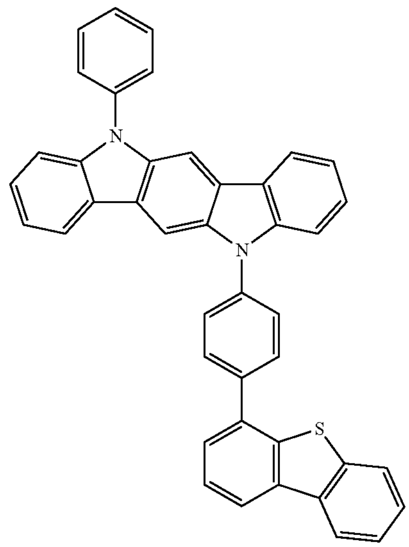
2-5-4
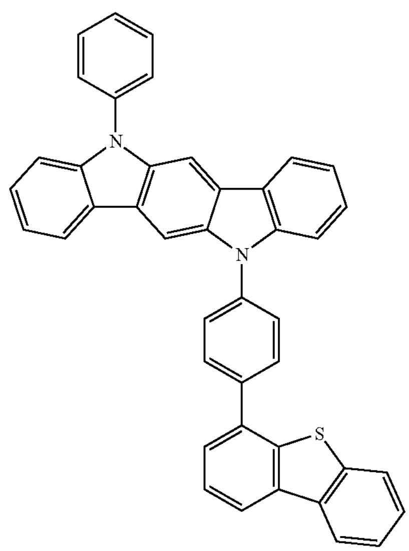

-continued
2-5-5
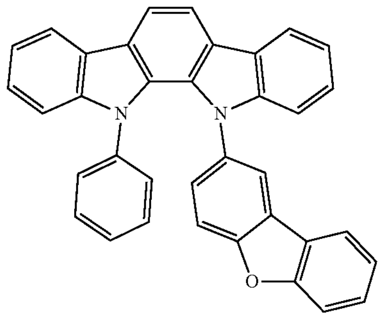
2-5-6
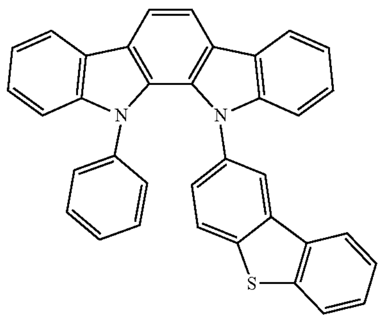
2-5-7
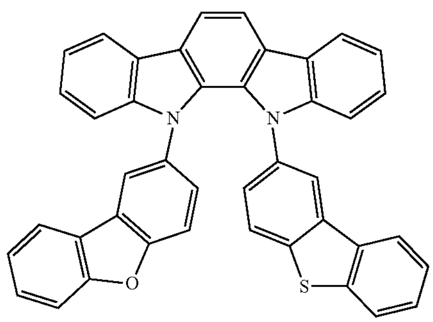
2-5-8
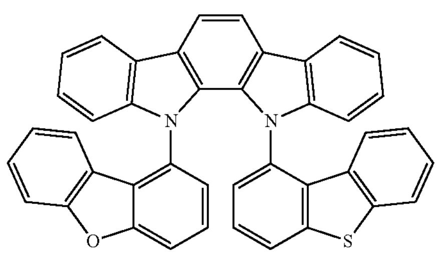
2-5-9
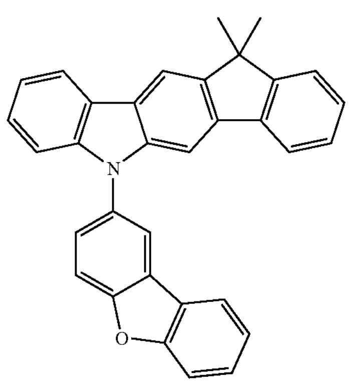
-continued
2-5-10
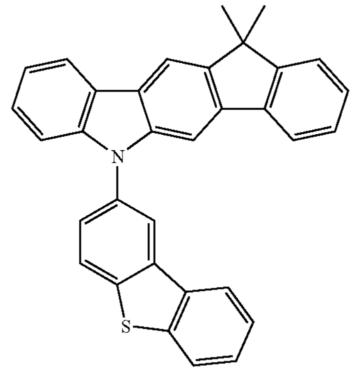
2-5-11
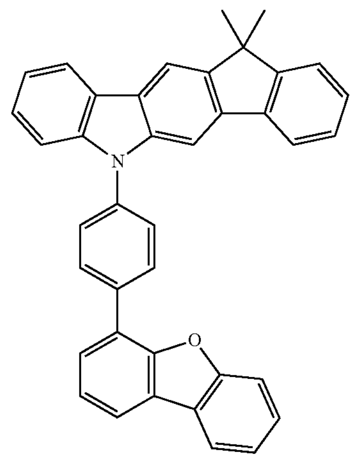
2-5-12
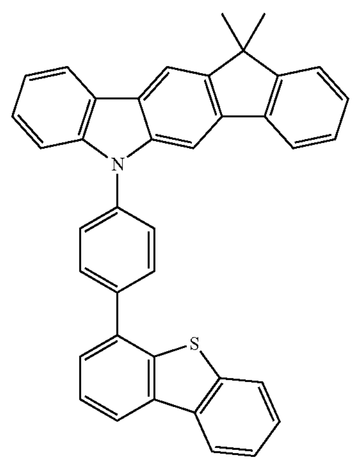
2-5-13
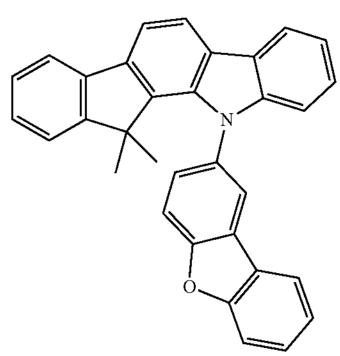

-continued
2-5-14
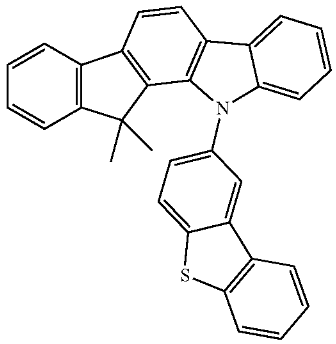
2-5-15
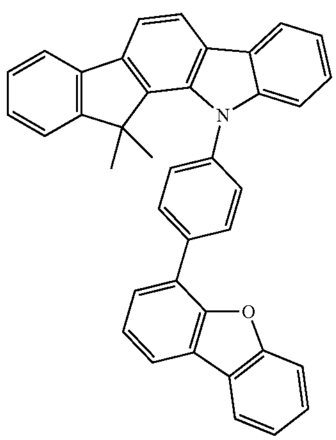
2-5-16
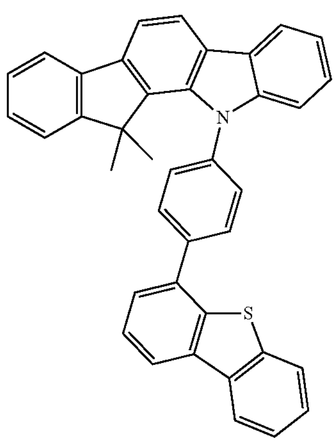
A compound represented by Formula 2-6 may be selected from Formulae 2-6-1 to 2-6-18, but embodiments of the invention are not limited thereto.
2-6-1
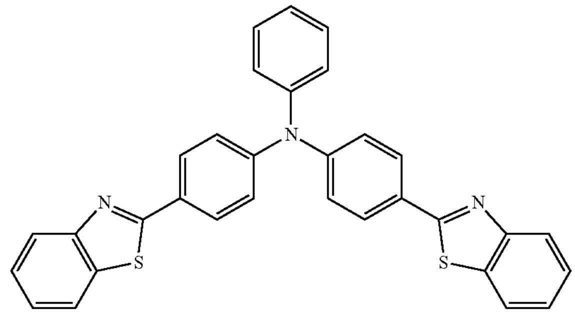
2-6-2
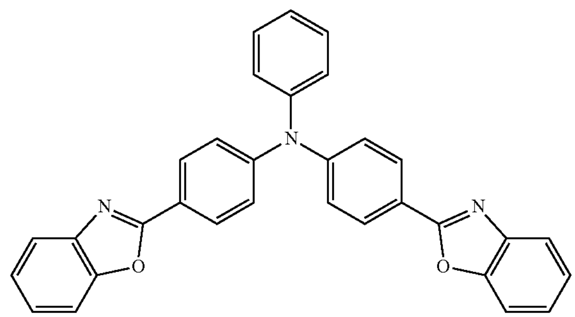
2-6-3
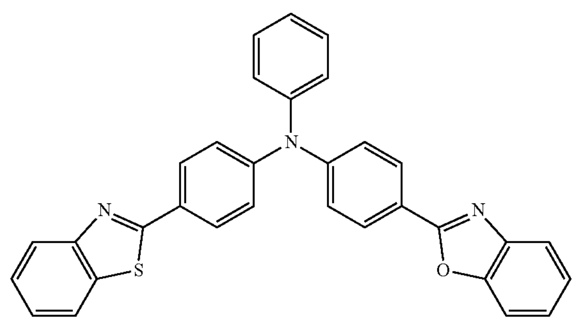
2-6-4
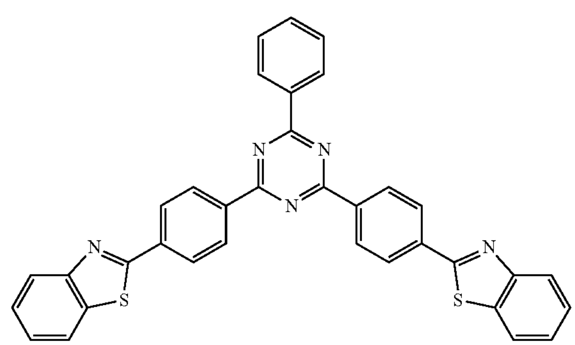

-continued
2-6-5
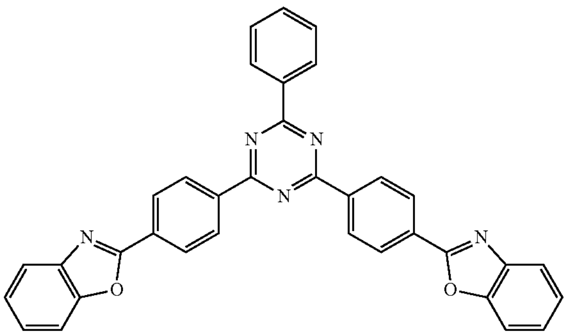
2-6-6
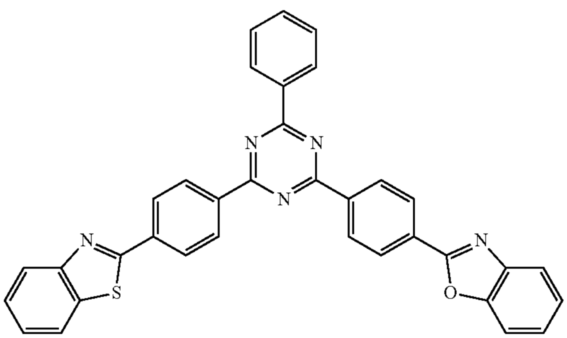
2-6-7
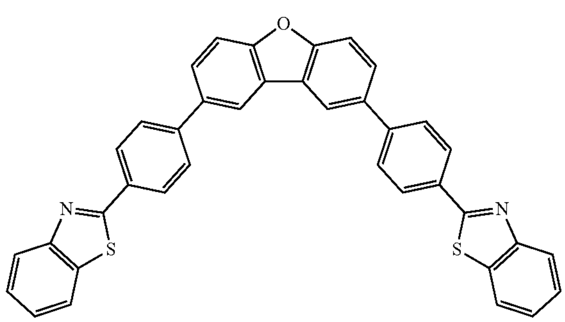
2-6-8
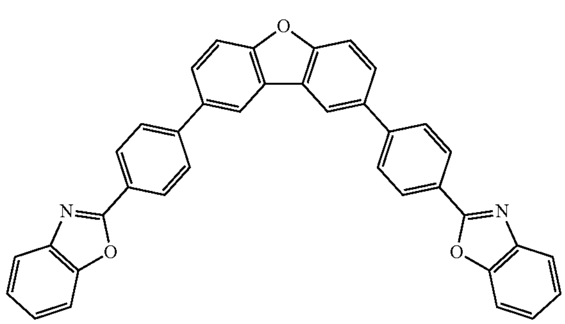
-continued
2-6-9
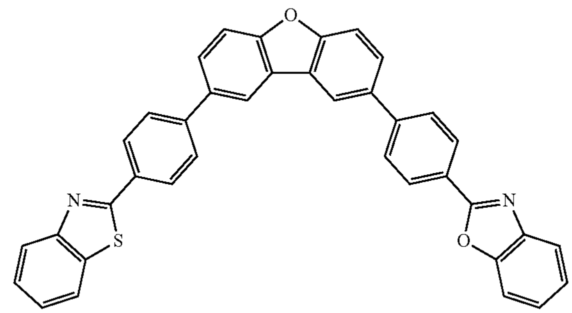
2-6-10
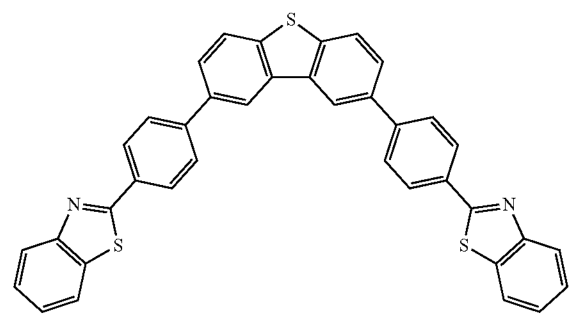
2-6-11
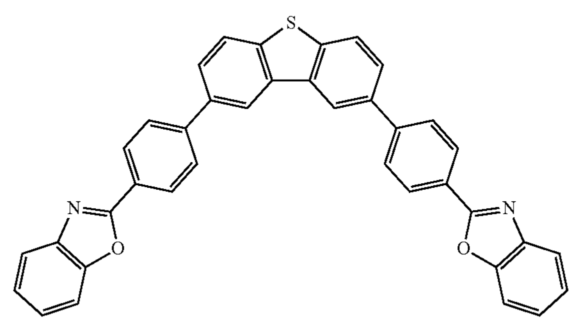
2-6-12
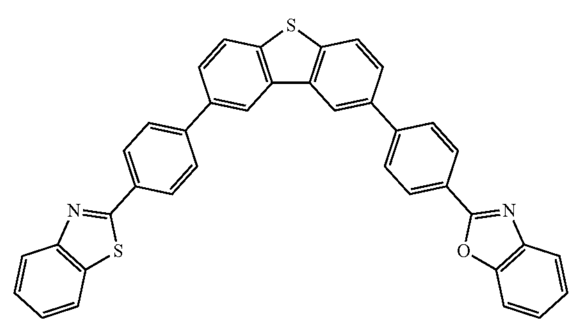

-continued 2-6-13

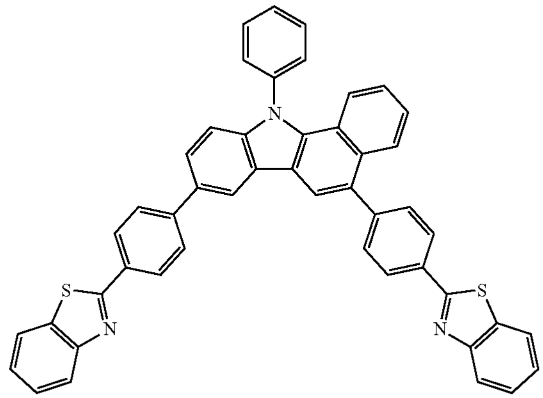

2-6-14

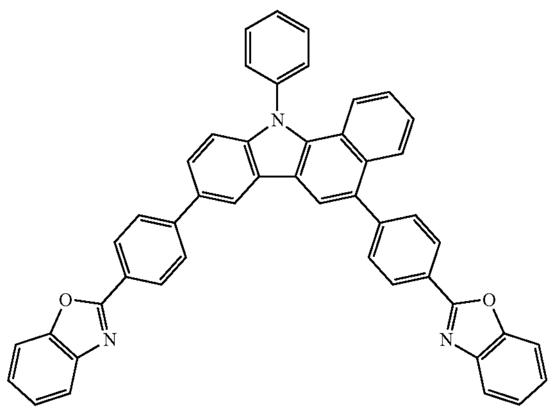

2-6-15

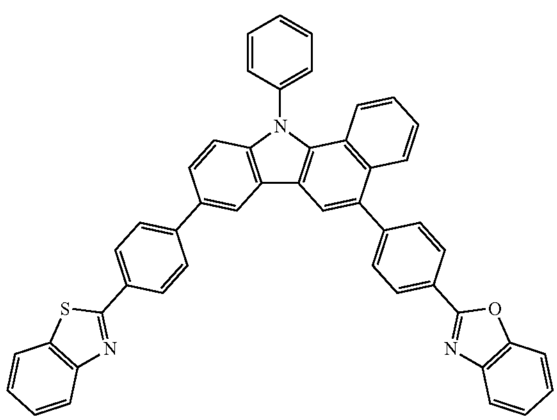

-continued 2-6-16

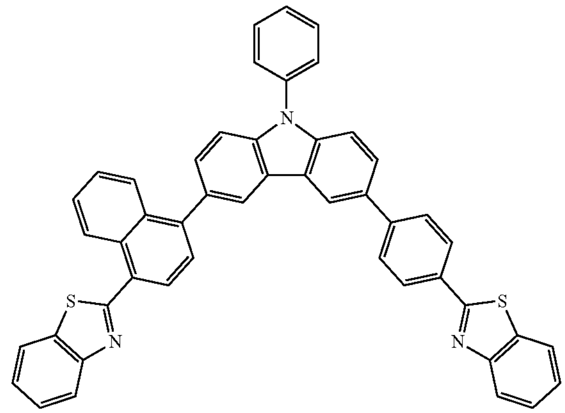

2-6-17

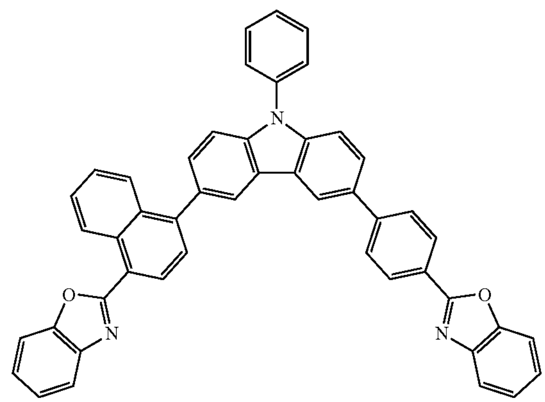

2-6-18

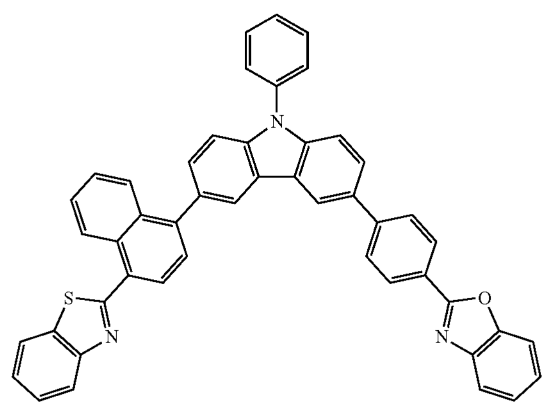

Synthesis methods of the compounds represented by Formulae 1-1 to 1-3 and Formulae 2-1 to 2-6 may be recognizable by one of ordinary skill in the art by referring to Synthesis Examples and/or Examples to be described below.

In an embodiment, the first capping layer may be located between the second electrode and the second capping layer. In this regard, the first capping layer may be located on the outside of the second electrode, and the second capping layer may be located on the first capping layer. In an embodiment, the first capping layer and the second capping layer may be sequentially stacked on the outside of the second electrode.

The first capping layer may include compounds represented by Formulae 1-1 to 1-3, and the compounds represented by Formulae 1-1 to 1-3 may be bonded to conductive materials included in the second electrode (for example, silver (Ag)) and, as a result, aggregation of the conductive materials occurring in the second electrode may be effectively suppressed. In this regard, the first capping layer may be separated from the second capping layer to include compounds represented by Formulae 1-1 to 1-3, excluding compounds represented by Formulae 2-1 to 2-6, and thus, may more effectively suppress the aggregation of conductive materials described above.

In addition, the second capping layer may include compounds represented by Formulae 2-1 to 2-6. Because the compounds represented by Formulae 2-1 to 2-6 may cap a metal together with a functional group that is included in the first capping layer and includes an unshared electron pair of Formulae 1-1 to 1-3, additional protection to an anode surface may be achieved. As a result, the first capping layer and the second capping layer may improve luminescence efficiency without causing the problem of cathode aggregation in the second electrode included in the light-emitting device.

In an embodiment, the first capping layer may be in direct contact with the second electrode. In this regard, the first capping layer may be in direct contact with the outside of the second electrode. In this regard, when the first capping layer is in contact with the second electrode, the compounds represented by Formulae 1-1 to 1-3 may be more easily bonded to the conductive materials included in the second electrode. As a result, when the first capping layer is in contact with the second electrode, aggregation of the conductive materials included in the second electrode may be more effectively prevented.

In an embodiment, the first capping layer may be in contact with the second electrode, and the second capping layer may be in contact with the first capping layer. In this regard, when the first capping layer is in contact with the second capping layer, the interaction between the compounds of Formulae 2-1 to 2-6 included in the second capping layer and the compounds of Formulae 1-1 to 1-3 included in the first capping layer may be increased. As a result, light transmission enhancement due to the interaction between the first capping layer and the second capping layer may be increased, thereby further improving the optical efficiency of the light-emitting device.

In an embodiment, the thickness of the first capping layer may be in a range of about 5 nm to about 50 nm. Within this thickness range, bonding between the conductive materials included in the second electrode and the compounds included in the first capping layer may be more easily performed, and at the same time, an impact applied from outside the light-emitting device may be absorbed by the first capping layer. In addition, when the first capping layer satisfies the above thickness range, deterioration of device characteristics due to aggregation of conductive materials and penetration thereof into a neighboring layer occurring in the absence of a capping layer may be more effectively prevented. As a result, when the first capping layer satisfies the above thickness range, prevention of aggregation of conductive materials may be more easily implemented by the bonding between the conductive materials included in the second electrode and the compounds included in the first capping layer, and at the same time, impact resistance characteristics of the light-emitting device may be realized by the first capping layer.

In an embodiment, the thickness of the second capping layer may be in a range of about 50 nm to about 100 nm. When the second capping layer satisfies the thickness range, the total refractive index of the first capping layer and the second capping layer may be more easily adjusted to be in a specific range. As a result, when the second capping layer satisfies the thickness range, light generated in an emission layer may be prevented from being refracted, reflected, or absorbed in the process of passing through the first capping layer and the second capping layer, and thus, light extraction by the first capping layer and the second capping layer may be further improved.

In an embodiment, the ratio of the thickness of the second capping layer to the thickness of the first capping layer may be about 2:1 or more. In this regard, the ratio of the thickness of the second capping layer to the thickness of the first capping layer may be 2:1 to 15:1. For example, the ratio of the thickness of the second capping layer to the thickness of the first capping layer may be about 2:1 to about 12:1, about 2:1 to about 9:1, about 5:1 to about 15:1, or about 8:1 to about 15:1. For example, when this thickness ratio range is satisfied, interaction between compounds included in each of the first capping layer and the second capping layer may be more easily performed, and the light extraction efficiency of the light-emitting device may be further improved by appropriately adjusting refractive index values of the first capping layer and the second capping layer.

In an embodiment, the second electrode may include silver (Ag). In this regard, the second electrode may include only silver (Ag), or may include other metals together with silver (Ag). For example, the second electrode may include silver (Ag) and magnesium (Mg).

In an embodiment, the amount of silver (Ag) in the second electrode may be about 95 weight percent (wt %) or more with respect to the total weight of the second electrode. For example, the amount of silver (Ag) in the second electrode may be in a range of about 95 wt % to about 100 wt % with respect to the total weight of the second electrode. In this regard, when the amount of silver (Ag) in the second electrode is about 95 wt % or more, absorption of light generated from the emission layer by the second electrode may be effectively suppressed. In addition, when the amount of silver (Ag) in the second electrode is about 95 wt % or more, silver compounds (Ag) may aggregate with each other and a light emitting surface of the second electrode may become uneven. Since the first capping layer located on the outer surface of the second electrode includes the compounds represented by Formulae 1-1 to 1-3, the aggregation of silver (Ag) may be minimized or prevented as described above. As a result, lifespan characteristics and optical characteristics of the light-emitting device may be simultaneously improved.

In an embodiment, when the amount of silver (Ag) in the second electrode is about 95 wt % or more, the light-emitting device may not include an electron injection layer as described below. As a result of removal of the electron injection layer, reduction in light efficiency due to absorption of light generated from the emission layer by the electron injection layer may be minimized or prevented.

In an embodiment, the first electrode of the light-emitting device may be an anode, the second electrode of the light-emitting device may be a cathode, the interlayer may further include a hole transport region located between the first electrode and the emission layer and an electron transport region located between the emission layer and the second electrode, the hole transport region may include a hole injection layer, a hole transport layer, an emission auxiliary layer, an electron blocking layer, or any combination thereof, and the electron transport region may include a buffer layer, a hole blocking layer, an electron control layer, an electron transport layer, an electron injection layer, or any combination thereof.

In an embodiment, the electron transport region may include a metal-containing compound and a metal-free compound, and the amount of the metal-containing compound may be about 5 wt % or less with respect to the total weight of the metal-free compound and the metal-containing compound. For example, the amount of the metal-containing compound may be in a range of greater than about 0 wt % and less than or equal to about 5 wt % with respect to the total weight of the metal-free compound and the metal-containing compound. For example, the amount of the metal-containing compound may be in a range of greater than about 0 wt % to about 4 wt % or less, greater than about 0 wt % to about 3 wt % or less, about 1 wt % or more to about 5 wt % or less, about 2 wt % or more to about 5 wt % or less, or about 2.5 wt % or more to about 5 wt % or less, with respect to the total weight of the metal-free compound and the metal-containing compound. The metal-containing compound and the metal-free compound will be described below.

In an embodiment, the electron transport layer may include a metal-containing compound and a metal-free compound, and the amount of the metal-containing compound may be in a range of greater than about 0 wt % to about 5 wt % or less with respect to the total weight of the metal-free compound and the metal-containing compound. In this regard, because the electron transport layer includes a metal-containing compound, electron injection and electron transport characteristics of the electron transport layer may be improved.

When the amount of the metal-containing compound in the electron transport layer satisfies the above range, the light-emitting device may not include the electron injection layer. As a result, due to the excellent electron injection and electron transport characteristics of the electron transport layer, the light-emitting device may have improved optical characteristics while not including an electron injection layer.

In one or more embodiments, the light-emitting device may include a first capping layer and a second capping layer located outside the first electrode or outside the second electrode, and the first capping layer and the second capping layer may be the same as described herein.

According to another aspect, an electronic apparatus includes the light-emitting device described above. The electronic apparatus may further include a thin-film transistor. In an embodiment, the electronic apparatus may further include a thin-film transistor including a source electrode and a drain electrode, and the first electrode of the light-emitting device may be electrically connected to the source electrode or the drain electrode. In one or more embodiments, the electronic apparatus may further include a color filter, a color conversion layer, a touch screen layer, a polarizing layer, or any combination thereof. More details on the electronic apparatus may be the same as described herein.

Description of FIG. 1

FIG. 1 is a schematic cross-sectional view of a light-emitting device constructed according to the principles of the invention.

The light-emitting device 10 includes a first electrode 110, an interlayer 130, and a second electrode 150. Hereinafter, the structure of the light-emitting device 10 and an illustrative method of manufacturing the light-emitting device 10 will be described in connection with FIG. 1.

First Electrode 110

In FIG. 1, a substrate may be additionally located under the first electrode 110 or above the second electrode 150. A glass substrate or a plastic substrate may be used as the substrate. In an embodiment, the substrate may be a flexible substrate, and may include plastics with excellent heat resistance and durability, such as a polyimide, a polyethylene terephthalate (PET), polycarbonate, a polyethylene naphthalate, a polyarylate (PAR), a polyetherimide, or any combination thereof.

The first electrode 110 may be formed by, for example, depositing or sputtering a material for forming the first electrode 110 on the substrate. When the first electrode 110 is an anode, the material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, the material for forming the first electrode 110 may include an indium tin oxide (ITO), an indium zinc oxide (IZO), a tin oxide ($SnO_2$), a zinc oxide (ZnO), or any combination thereof. In one or more embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combinations thereof may be used as a material for forming a first electrode.

The first electrode 110 may have a single layer consisting of a single-layered structure or a multilayer structure including a plurality of layers. For example, the first electrode 110 may have a three-layered structure of an ITO/Ag/ITO.

Interlayer 130

The interlayer 130 may be located on the first electrode 110. The interlayer 130 may include an emission layer. The interlayer 130 may further include a hole transport region located between the first electrode 110 and the emission layer and an electron transport region located between the emission layer and the second electrode 150. The interlayer 130 may further include metal-containing compounds such as organometallic compounds, inorganic materials such as quantum dots, and the like, in addition to various organic materials.

In one or more embodiments, the interlayer 130 may include, i) two or more emitting units sequentially stacked between the first electrode 110 and the second electrode 150 and ii) a charge generation layer located between the two emitting units. When the interlayer 130 includes the emitting units and the charge generation layer as described above, the light-emitting device 10 may be a tandem light-emitting device.

Hole Transport Region in Interlayer 130

The hole transport region may have: i) a single-layered structure consisting of a single layer consisting of a single material, ii) a single-layered structure consisting of a single layer consisting of a plurality of different materials, or iii) a multi-layered structure including a plurality of layers including different materials.

The hole transport region may include a hole injection layer, a hole transport layer, an emission auxiliary layer, an electron blocking layer, or any combination thereof. In an embodiment, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially from the first electrode 110.

The hole transport region may include a compound represented by Formula 201, a compound represented by Formula 202, or any combination thereof:

Formula 201

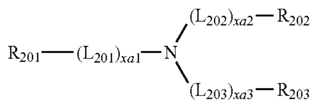

Formula 202

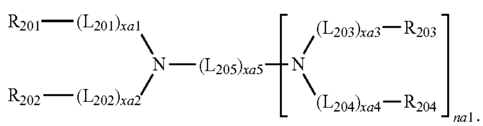

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group or the like) unsubstituted or substituted with at least one $R_{10a}$ (for example, Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In an embodiment, each of Formulae 201 and 202 may include at least one of groups represented by Formulae CY201 to CY217:

CY201

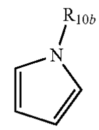

CY202

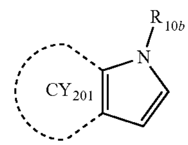

CY203

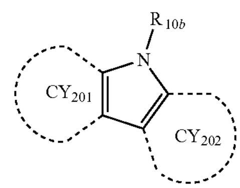

CY204

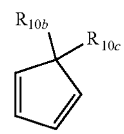

CY205

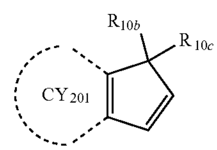

CY206

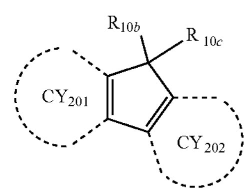

CY207

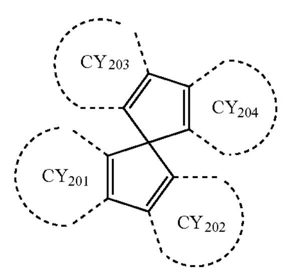

CY208

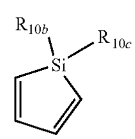

CY209

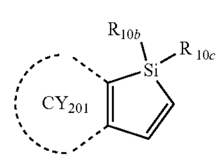

-continued

CY210

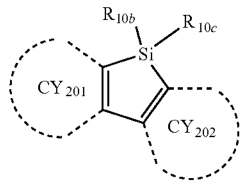

CY211

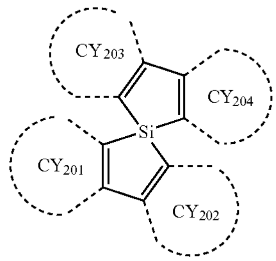

CY212

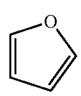

CY213

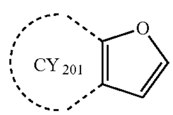

CY214

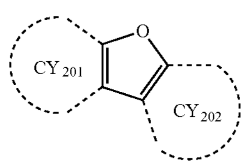

CY215

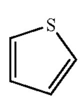

CY216

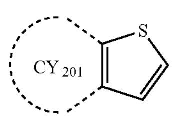

-continued

CY217

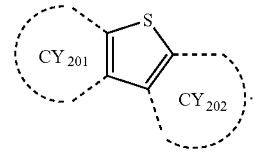

$R_{10b}$ and $R_{10c}$ in Formulae CY201 to CY217 may each be the same as described in connection with $R_{10a}$ herein, ring CY201 to ring CY204 may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$ as described herein.

In an embodiment, ring CY201 to ring CY204 in Formulae CY201 to CY217 may each independently be a benzene group, a naphthalene group, a phenanthrene group, or an anthracene group. In one or more embodiments, each of Formulae 201 and 202 may include at least one of groups represented by Formulae CY201 to CY203.

In one or more embodiments, Formula 201 may include at least one of groups represented by Formulae CY201 to CY203 and at least one of groups represented by Formulae CY204 to CY217.

In one or more embodiments, xa1 in Formula 201 may be 1, $R_{201}$ may be a group represented by one of Formulae CY201 to CY203, xa2 may be 0, and $R_{202}$ may be a group represented by one of Formulae CY204 to CY207.

In one or more embodiments, each of Formulae 201 and 202 may not include a group represented by one of Formulae CY201 to CY203. In one or more embodiments, each of Formulae 201 and 202 may not include a group represented by one of Formulae CY201 to CY203, and may include at least one of groups represented by Formulae CY204 to CY217. In an embodiment, each of Formulae 201 and 202 may not include a group represented by one of Formulae CY201 to CY217.

In an embodiment, the hole transport region may include one of Compounds HT1 to HT47, 4,4',4"-tris[phenyl(m-tolyl)amino]triphenylamine (m-MTDATA), 1-N,1-N-bis[4-(diphenylamino)phenyl]-4-N,4-N-diphenylbenzene-1,4-diamine (TDATA), 4,4',4"-tris[2-naphthyl(phenyl)amino] triphenylamine (2-TNATA), N,N'-di(1-naphthyl)-N,N'-diphenyl-(1,1'-biphenyl)-4,4'-diamine (NPB or NPD), N4,N4'-di(naphthalen-2-yl)-N4,N4'-diphenyl-[1,1'-biphenyl]-4,4'-diamine (β-NPB), N,N'-bis(3-methylphenyl)-N,N'-diphenylbenzidine (TPD), N,N'-bis(3-methylphenyl)-N,N'-diphenyl-9,9-spirobifluorene-2,7-diamine (Spiro-TPD), N2,N7-di-1-naphthalenyl-N2,N7-diphenyl-9,9'-spirobi[9H-fluorene]-2,7-diamine (Spiro-NPB), N,N'-di(1-naphthyl)-N,N'-diphenyl-2,2'-dimethyl-(1,1'-biphenyl)-4,4'-diamine (methylated NPB), 4,4'-cyclohexylidenebis[N,N-bis(4-methylphenyl)benzenamine] (TAPC), N,N,N',N'-tetrakis(3-methylphenyl)-3,3'-dimethylbenzidine (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1
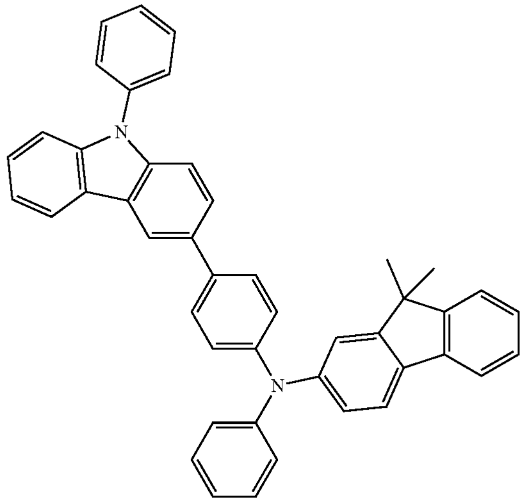
HT2
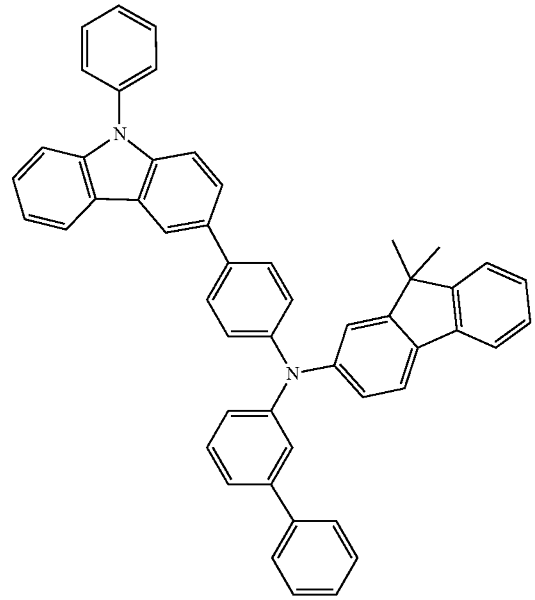
HT3
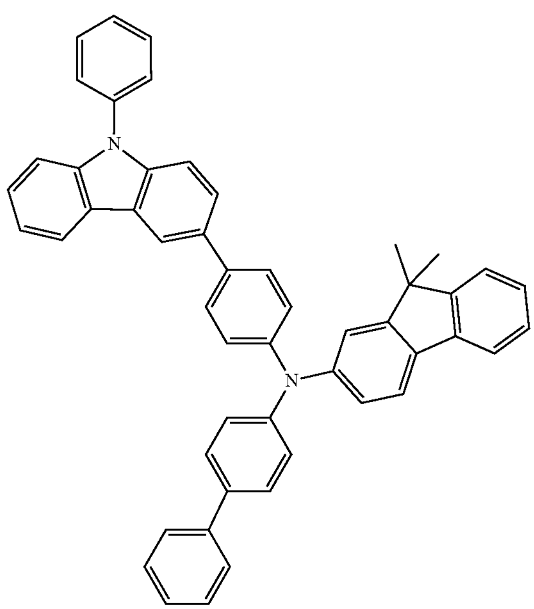
HT4
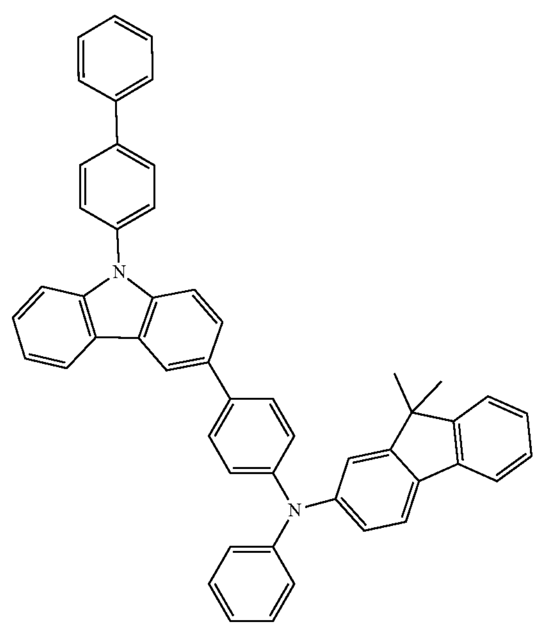

-continued
HT5
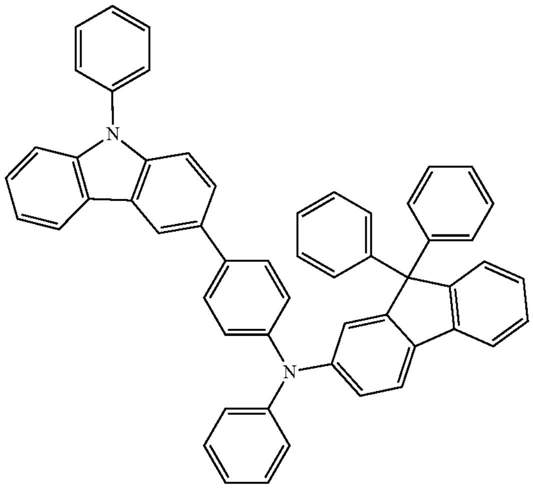
HT6
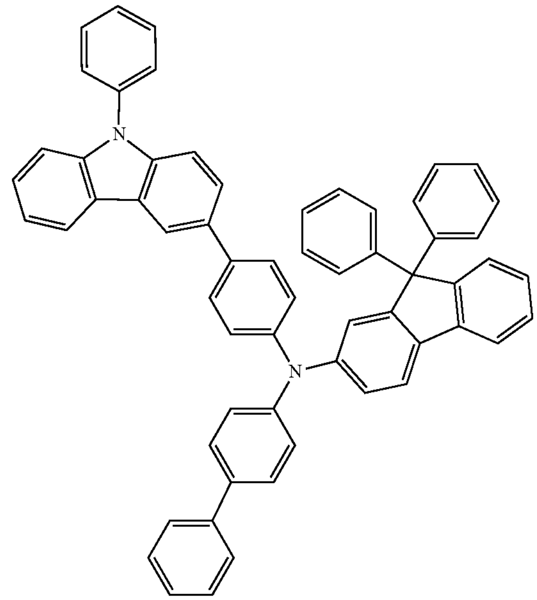
HT7
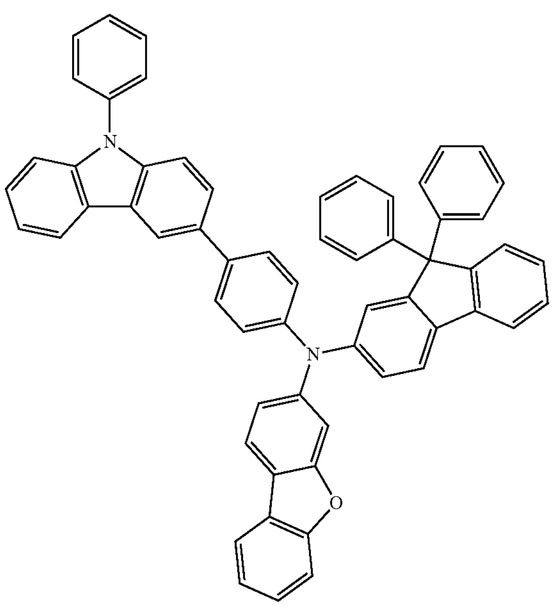
HT8
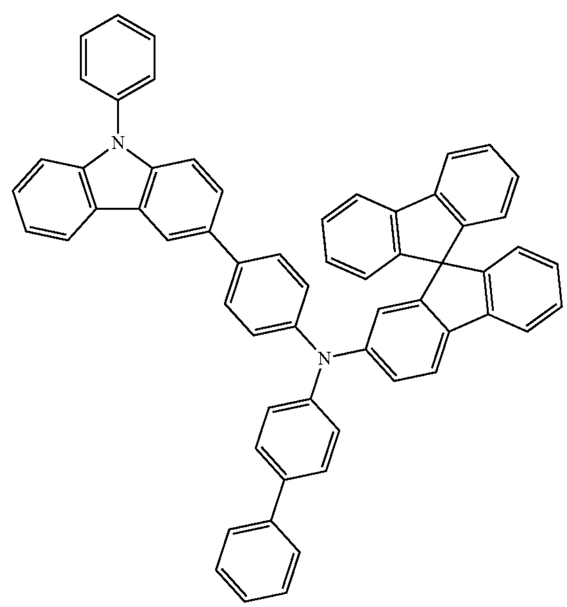

-continued
HT9
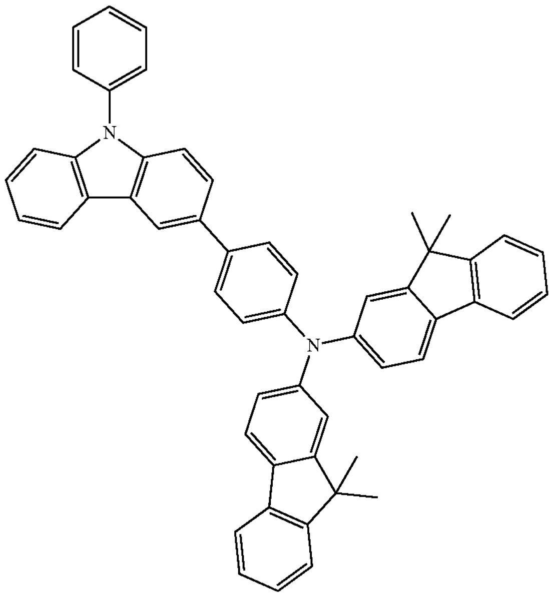
Ht10
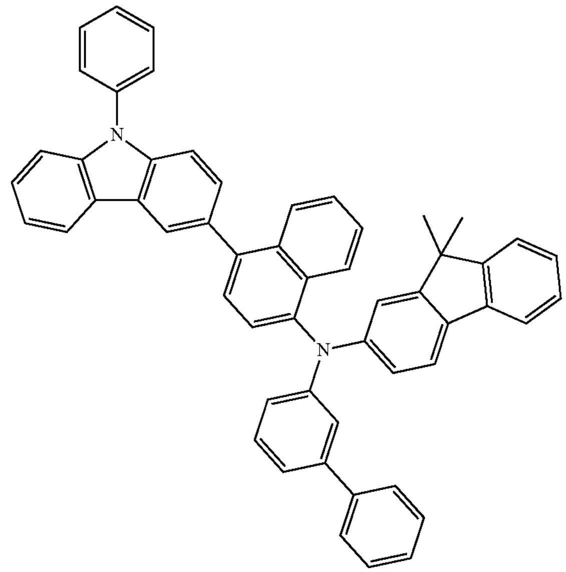
HT11
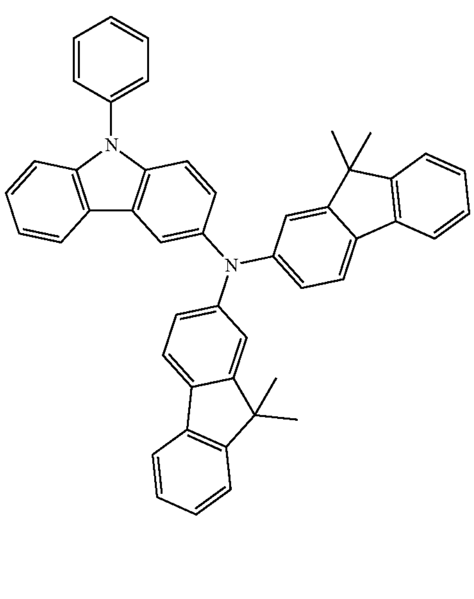
HT12
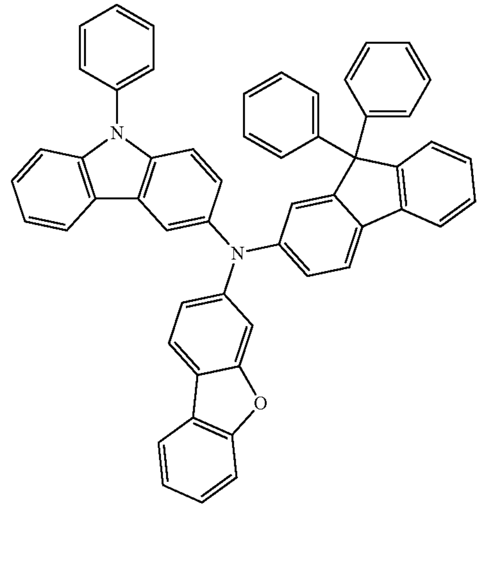

-continued
HT13
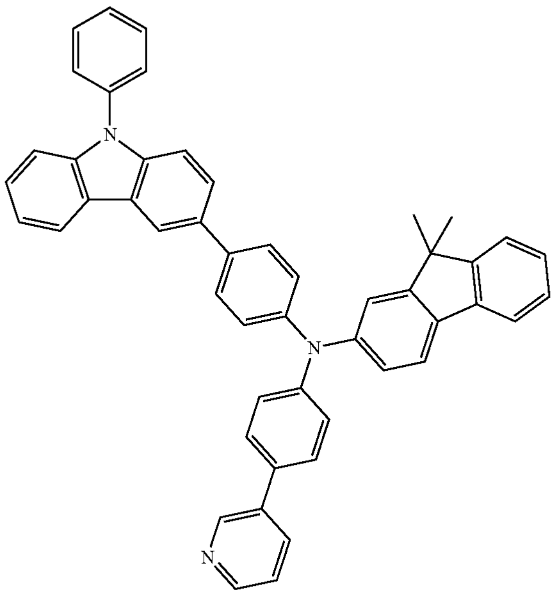
HT14
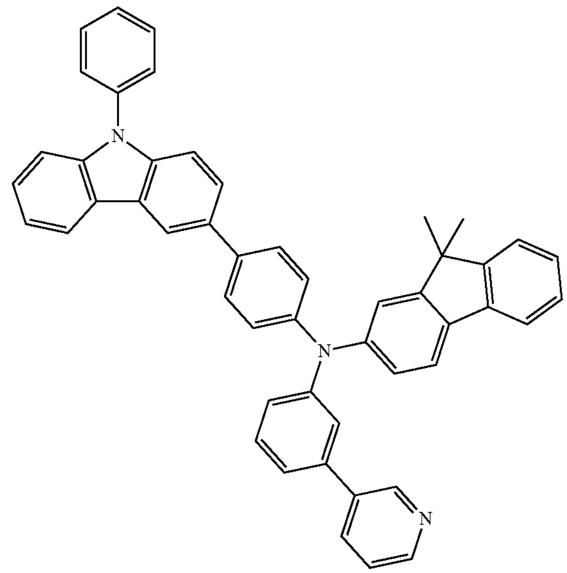
HT15
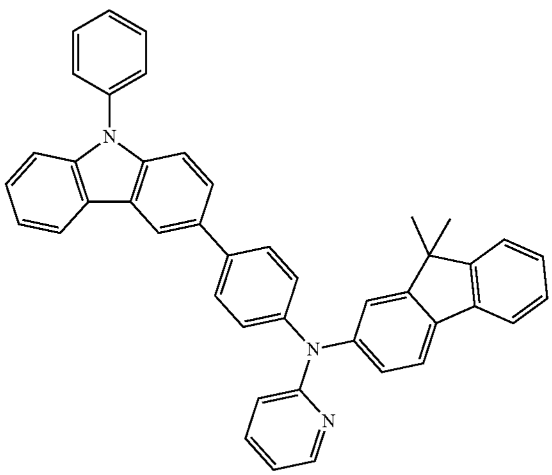
HT16
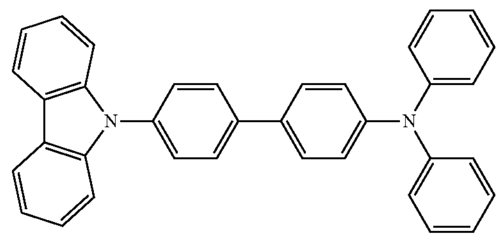
HT17
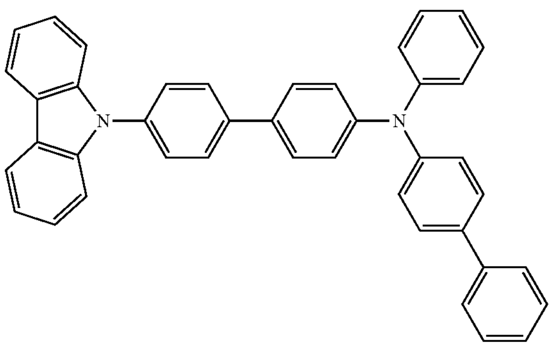
HT18
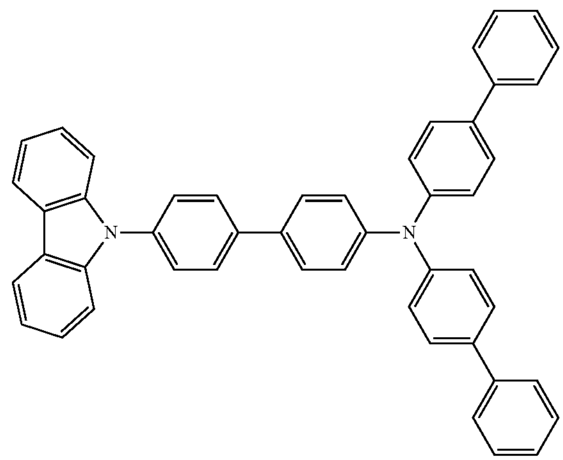

-continued
HT19
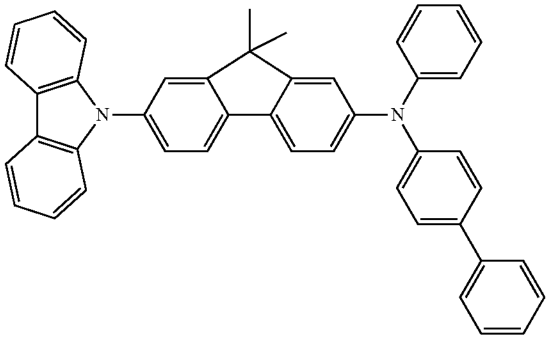
HT20
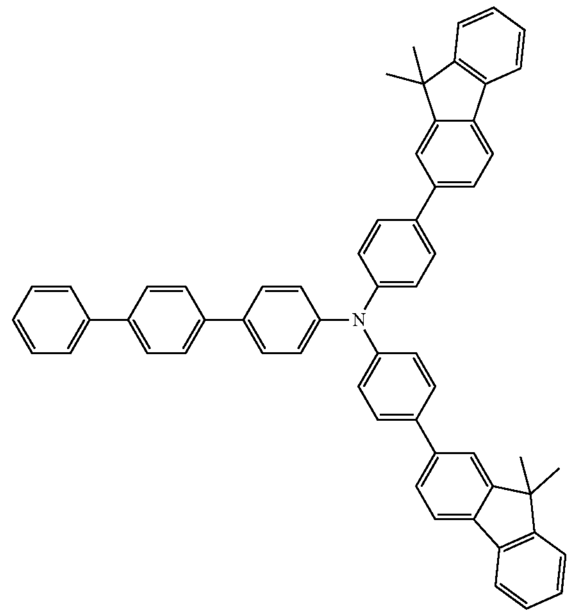
HT21
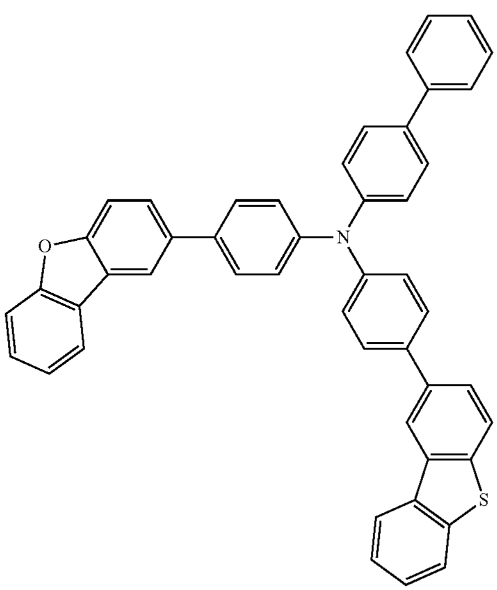
HT22
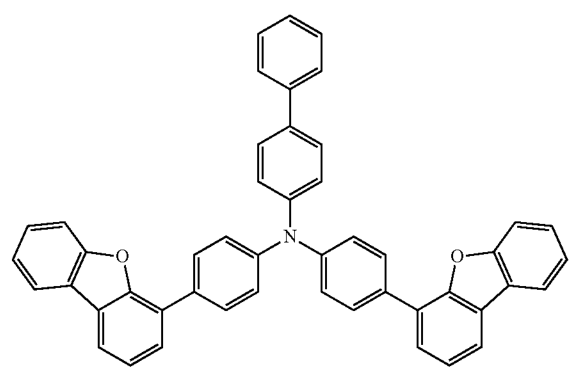

-continued
HT23
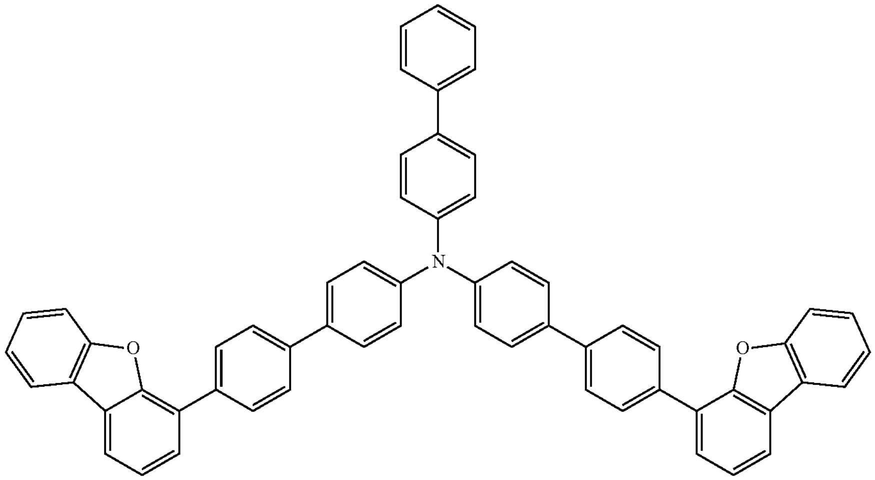
HT24
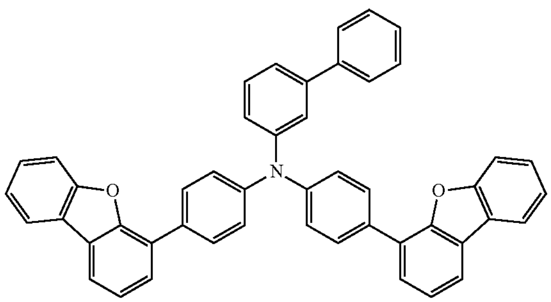
HT25
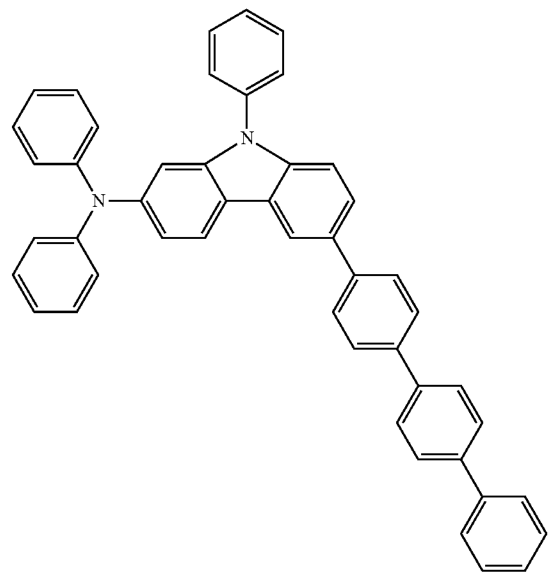
HT26
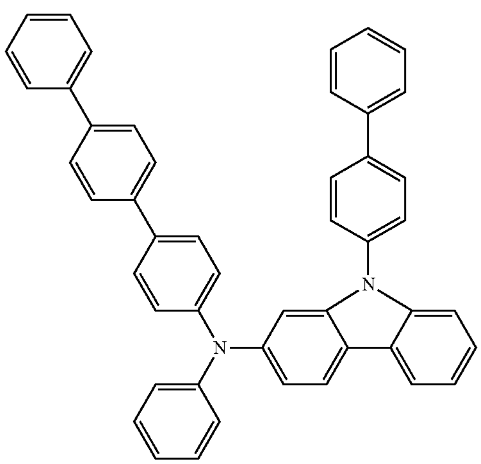
HT27
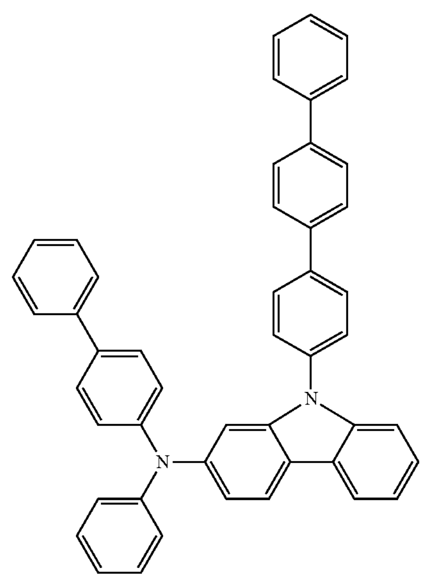

-continued
HT28
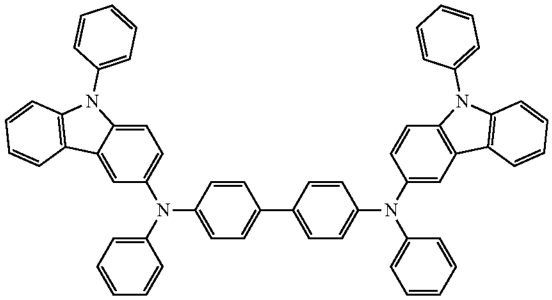
HT29
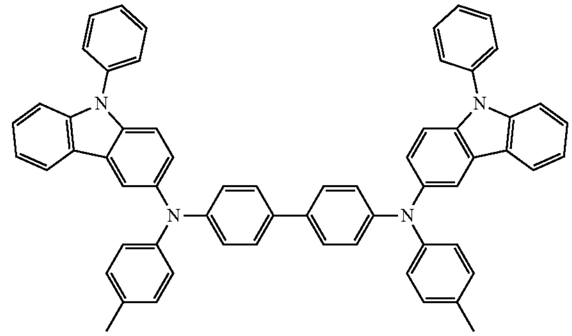
HT30
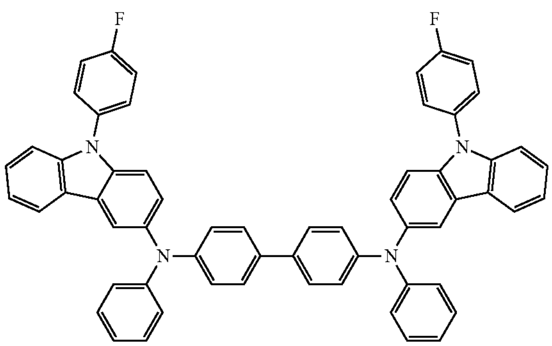
HT31
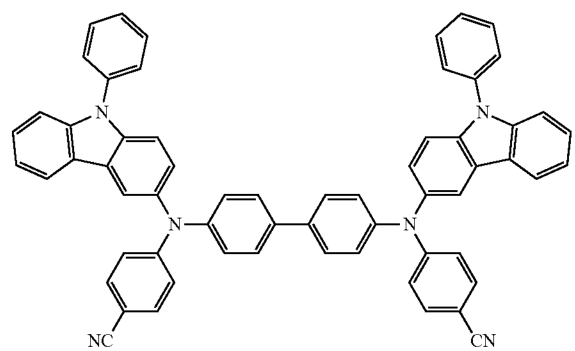
HT32
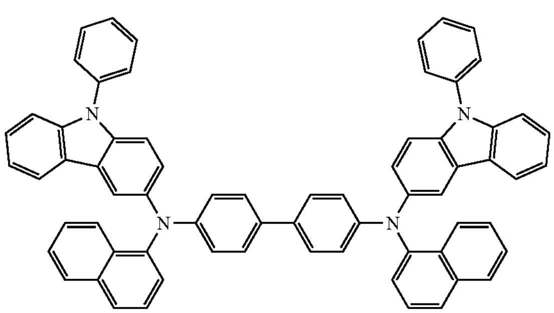
HT33
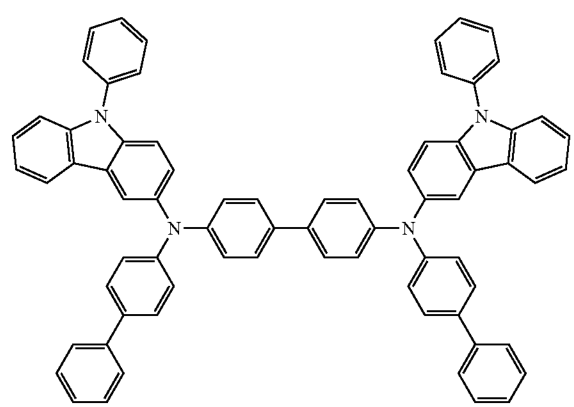

-continued
HT34
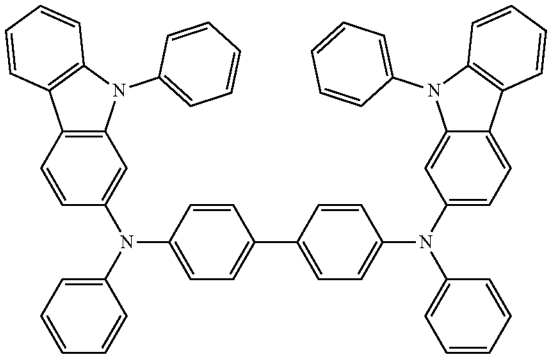
HT35
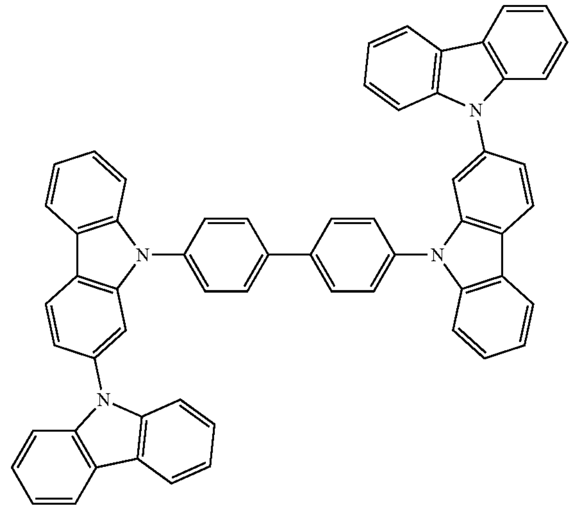
HT36
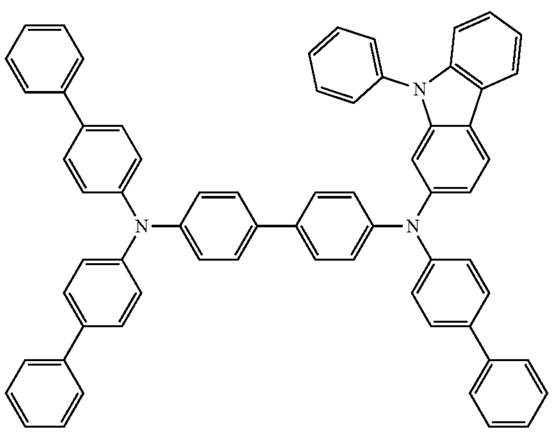
HT37
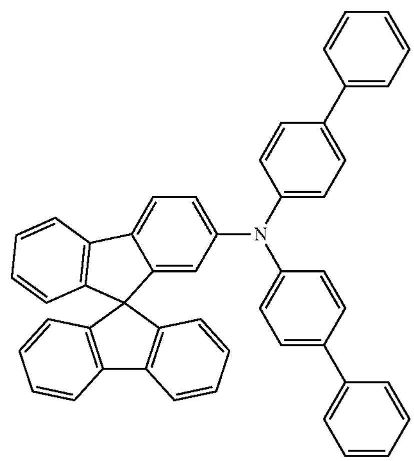
HT38
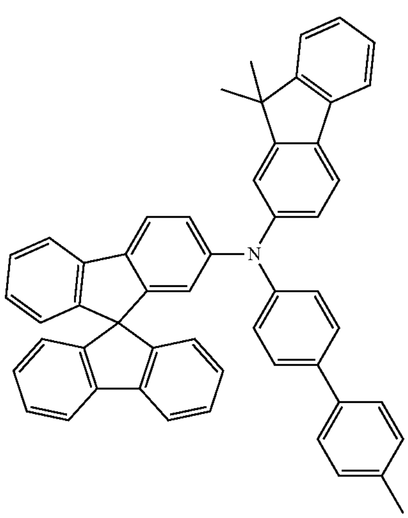
HT39
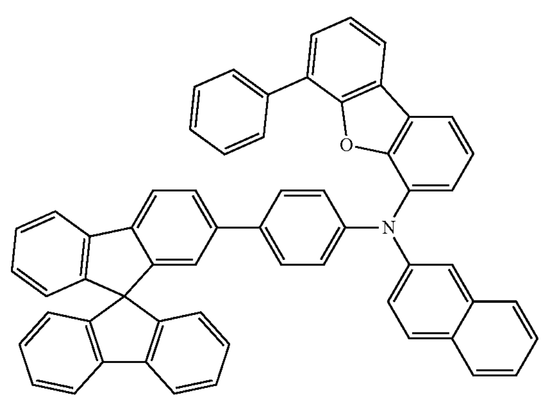

-continued
HT40
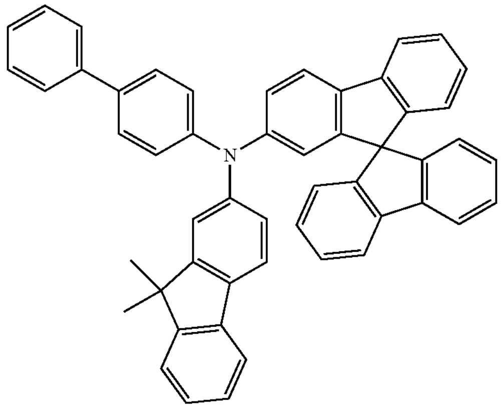
HT41
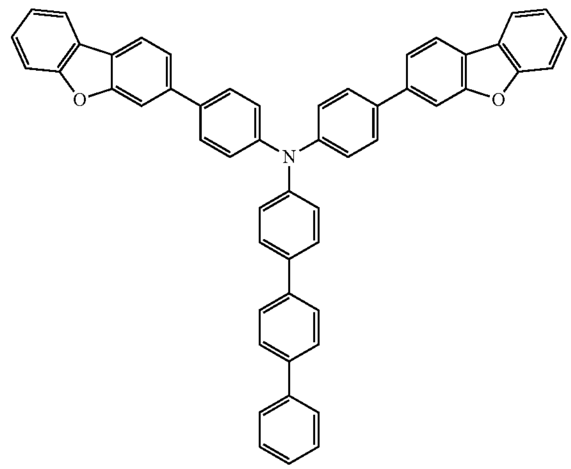
HT42
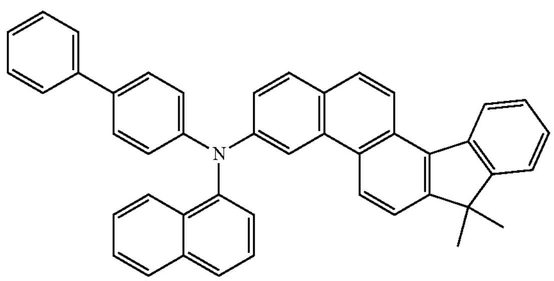
HT43
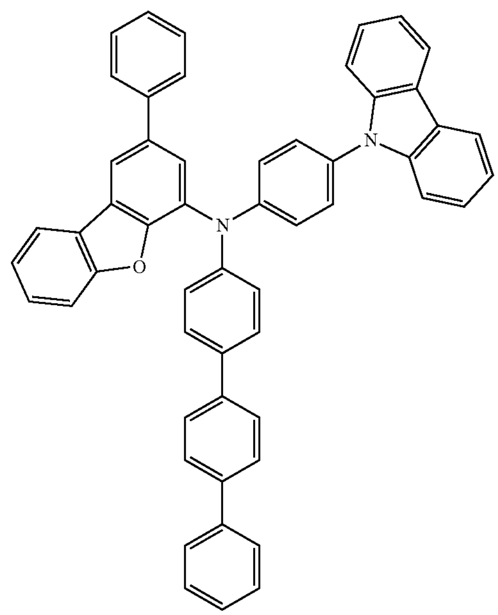
HT44
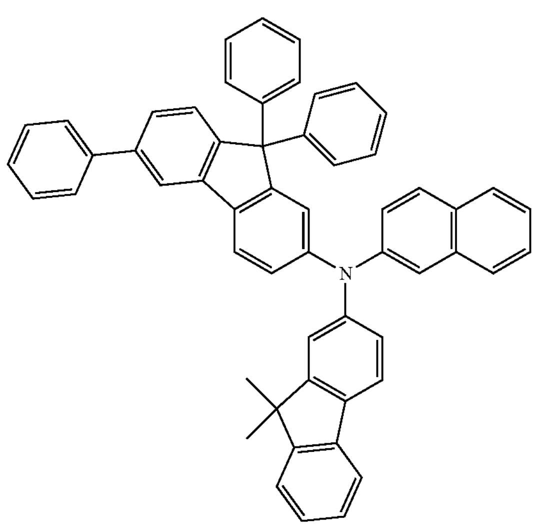
HT45
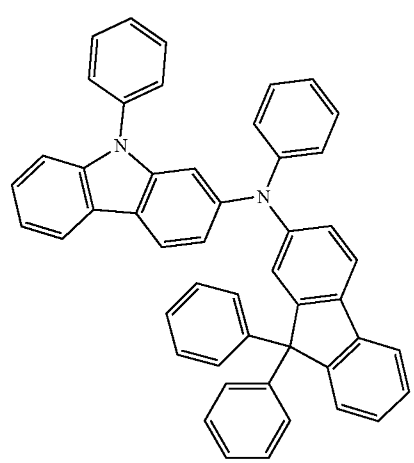

-continued
HT46
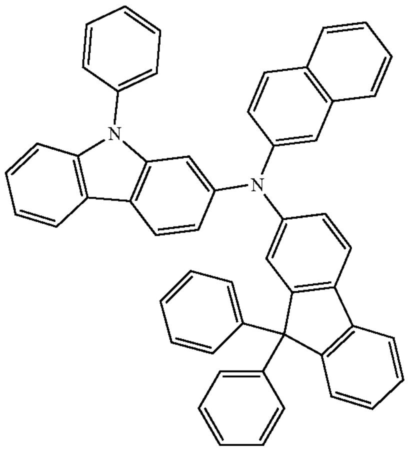
HT47
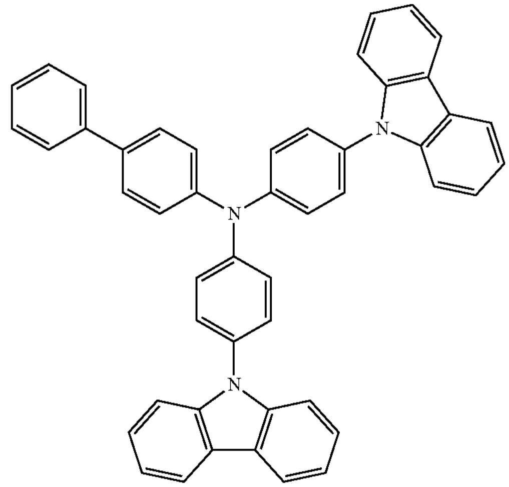
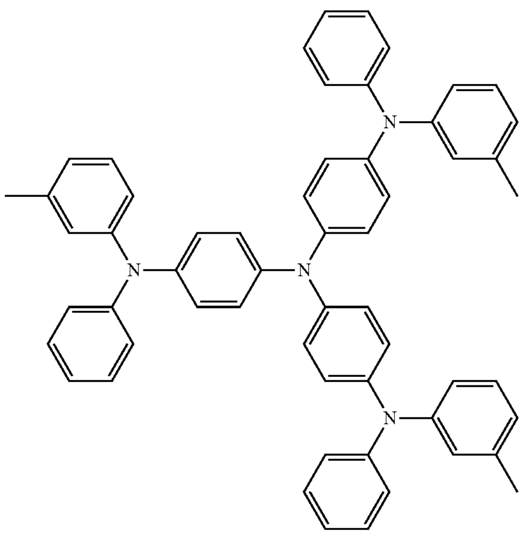
m-MTDATA
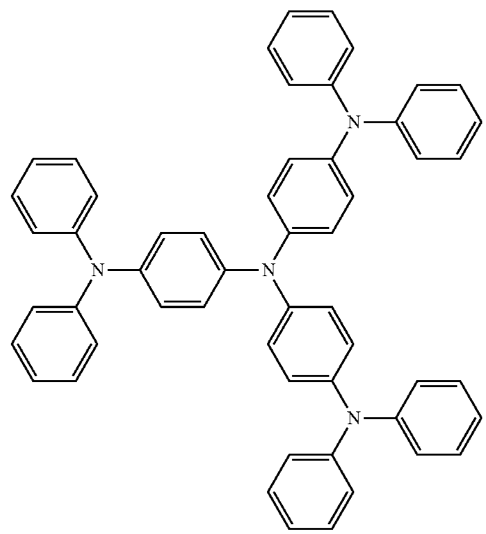
TDATA
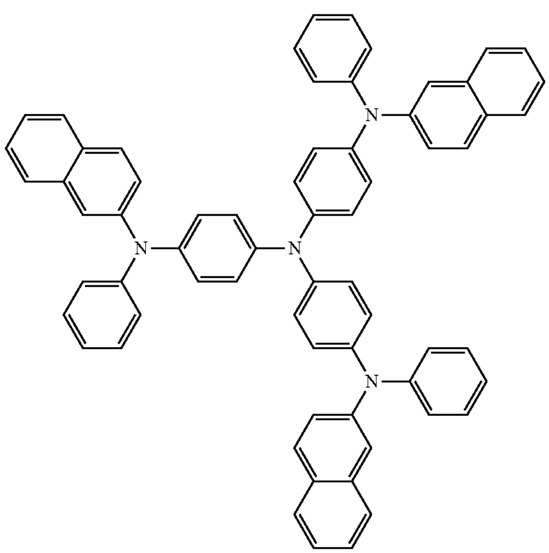
2-TNATA
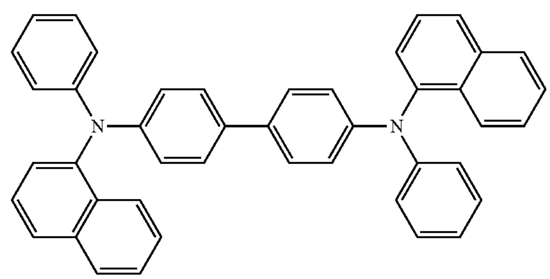
NPB -continued

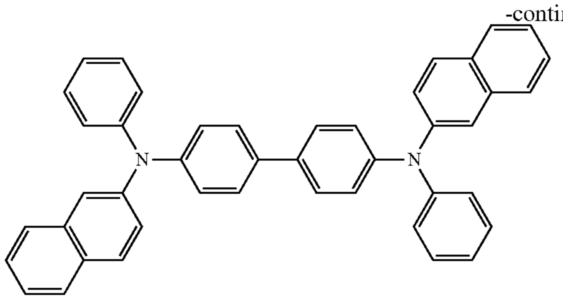

β-NPB

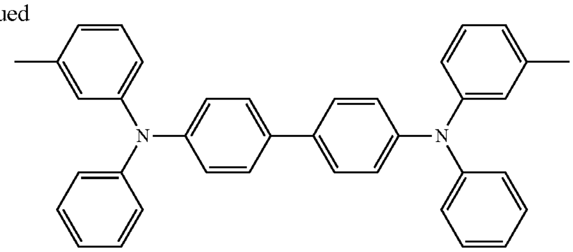

TPD

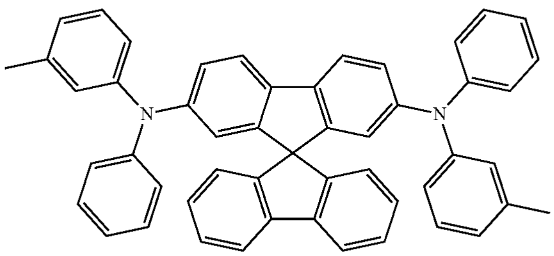

Spiro-TPD

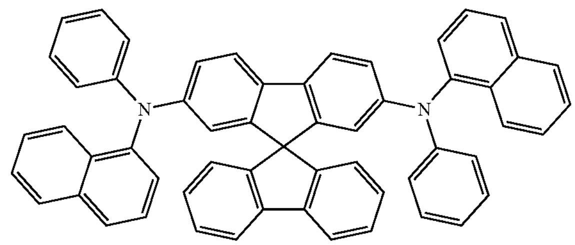

Spiro-NPB

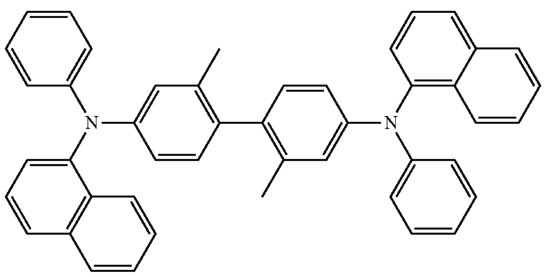

methylated-NPB

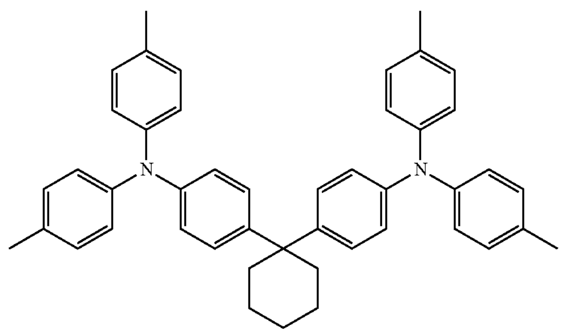

TAPC

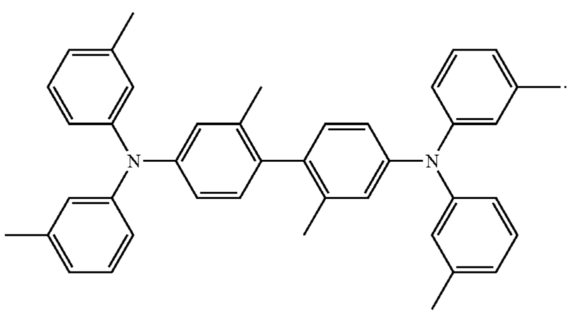

HMTPD

The thickness of the hole transport region may be in a range of about 50 Å to about 10,000 Å, for example, about 100 Å to about 4,000 Å. When the hole transport region includes the hole injection layer, the hole transport layer, or any combination thereof, the thickness of the hole injection layer may be in a range of about 100 Å to about 9,000 Å, for example, about 100 Å to about 1,000 Å, and the thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The emission auxiliary layer may increase light-emission efficiency by compensating for optical resonance distance according to the wavelength of light emitted by an emission layer, and the electron blocking layer may block the leakage of electrons from an emission layer to a hole transport region. Materials that may be included in the hole transport region may be included in the emission auxiliary layer and the electron blocking layer.

p-Dopant

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material). The charge-generation material may be, for example, a p-dopant. In an embodiment, a lowest unoccupied molecular orbital (LUMO) energy level of the p-dopant may be about −3.5 eV or less.

In an embodiment, the p-dopant may include a quinone derivative, a cyano group-containing compound, a compound containing element EL1 and element EL2, or any combination thereof. Examples of the quinone derivative may include tetracyanoquinodimethane (TCNQ) and 2,3,5,6-tetrafluoro-7,7,8,8-tetracyanoquinodimethane (F4-TCNQ). Examples of the cyano group-containing compound may include 1,4,5,8,9,12-hexaazatriphenylene-hexacarbonitrile (HAT-CN) and a compound represented by Formula 221 below.

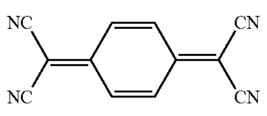

TCNQ

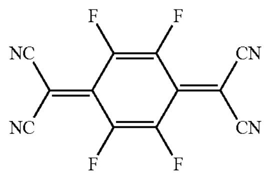

F4-TCNQ

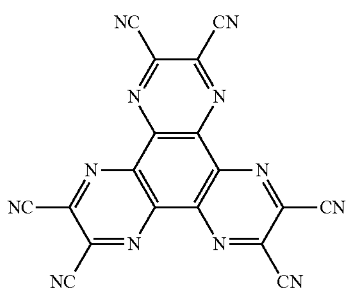

HAT-CN

Formula 221

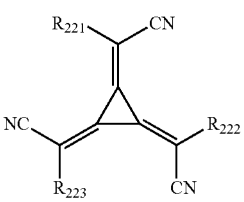

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof, or any combination thereof.

In the compound containing element EL1 and element EL2, element EL1 may be a metal, a metalloid, or a combination thereof, and element EL2 may be a non-metal, a metalloid, or a combination thereof.

Examples of the metal may include: an alkali metal (for example, lithium ($L_1$), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te). Examples of the non-metal may include oxygen (O) and a halogen (for example, F, Cl, Br, I, etc.). In an embodiment, examples of the compound containing element EL1 and element EL2 may include a metal oxide, a metal halide (for example, a metal fluoride, a metal chloride, a metal bromide, or a metal iodide), a metalloid halide (for example, a metalloid fluoride, a metalloid chloride, a metalloid bromide, or a metalloid iodide), a metal telluride, or any combination thereof.

Examples of the metal oxide may include a tungsten oxide (for example, WO, $W_2O_3$, $WO_2$, $WO_3$, $W_2O_5$, etc.), a vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and a rhenium oxide (for example, $ReO_3$, etc.).

Examples of the metal halide may include an alkali metal halide, an alkaline earth metal halide, a transition metal halide, a post-transition metal halide, and a lanthanide metal halide. Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI. Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $CrI_3$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, $FeI_2$, etc.), a ruthenium halide (for example, $RuF_2$, $RuCl_2$, $RuBr_2$, $RuI_2$, etc.), an osmium halide (for example, $OsF_2$, $OsCl_2$, $OsBr_2$, $OsI_2$, etc.), a cobalt halide (for example, $CoF_2$, $CoCl_2$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), and a gold halide (for example, AuF, AuCl, AuBr, AuI, etc.).

Examples of the post-transition metal halide may include a zinc halide (for example, $ZnF_2$, $ZnCl_2$, $ZnBr_2$, $ZnI_2$, etc.), an indium halide (for example, $InI_3$, etc.), and a tin halide (for example, $SnI_2$, etc.).

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$. Examples of the metalloid halide may include an antimony halide (for example, SbCls, etc.).

Examples of the metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.). Emission layer in interlayer 130

When the light-emitting device 10 is a full-color light-emitting device, the emission layer may be patterned into a red emission layer, a green emission layer, and/or a blue emission layer, according to sub-pixel. In one or more embodiments, the emission layer may have a stacked structure of two or more layers of the red emission layer, the green emission layer, and the blue emission layer, in which the two or more layers contact each other or are separated from each other. In one or more embodiments, the emission layer may include two or more materials of the red light-emitting material, the green light-emitting material, and the blue light-emitting material, in which the two or more materials are mixed with each other in a single layer to emit white light.

The emission layer may include a host and a dopant. The dopant may include a phosphorescent dopant, a fluorescent dopant, or any combination thereof. The amount of the dopant in the emission layer may be from about 0.01 to about 15 parts by weight based on 100 parts by weight of the host. In one or more embodiments, the emission layer may include a quantum dot. In an embodiment, the emission layer may include a delayed fluorescence material. The delayed fluorescence material may act as a host or a dopant in the emission layer. The thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Host

The host may include a compound represented by Formula 301 below:

$$[Ar_{301}]_{xb11}\text{-}[(L_{301})_{xb1}\text{-}R_{301}]_{xb21} \qquad \text{Formula 301}$$

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{301})(Q_{302})(Q_{303})$, —$N(Q_{301})(Q_{302})$, —$B(Q_{301})(Q_{302})$, —$C(=O)(Q_{301})$, —$S(=O)_2(Q_{301})$, or —$P(=O)(Q_{301})(Q_{302})$, xb21 may be an integer from 1 to 5, and $Q_{301}$ to $Q_{303}$ may each be the same as described in connection with $Q_1$ herein.

In an embodiment, when xb11 in Formula 301 is 2 or more, two or more of $Ar_{301}$(s) may be linked to each other via a single bond.

In an embodiment, the host may include a compound represented by Formula 301-1, a compound represented by Formula 301-2, or any combination thereof.

Formula 301-1

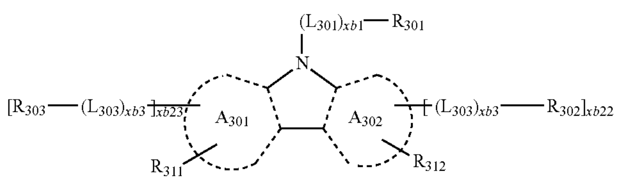

Formula 301-2

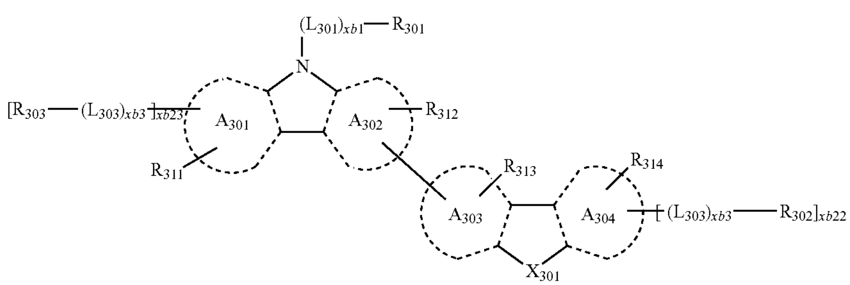

In Formulae 301-1 to 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may each be the same as described herein, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each be the same as described in connection with $R_{301}$.

In an embodiment, the host may include an alkali earth metal complex, a post-transition metal complex, or a combination thereof. In an embodiment, the host may include a Be complex (for example, Compound H55), an Mg complex, a Zn complex, or a combination thereof.

In an embodiment, the host may include one of Compounds H1 to H125, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di(carbazol-9-yl)benzene (mCP), 1,3,5-tri(carbazol-9-yl)benzene (TCP), or any combination thereof:

H1

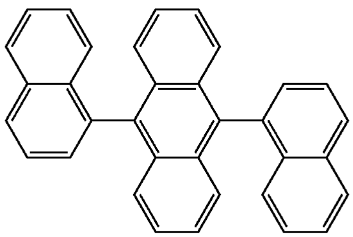

H2

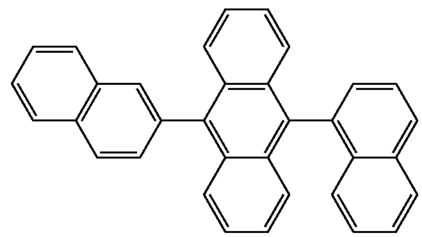

H3

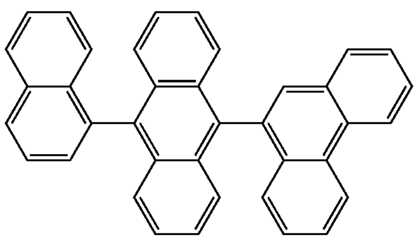

H4

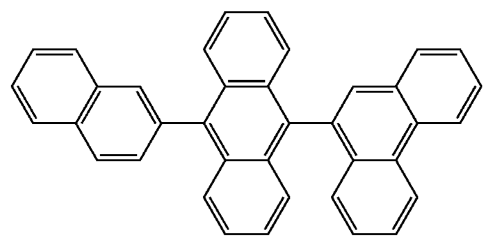

H5

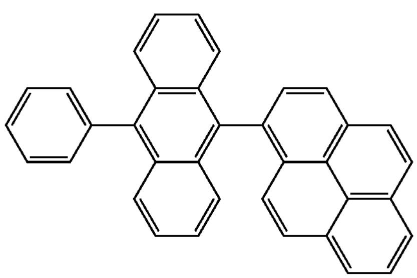

H6

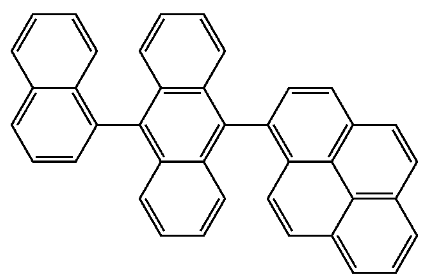

H7

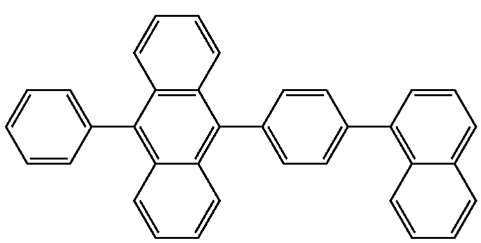

H8

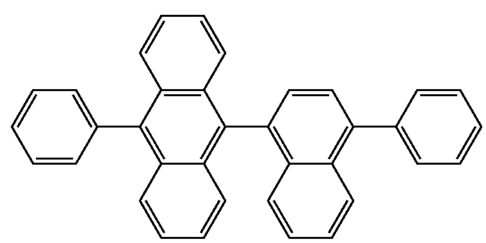

H9

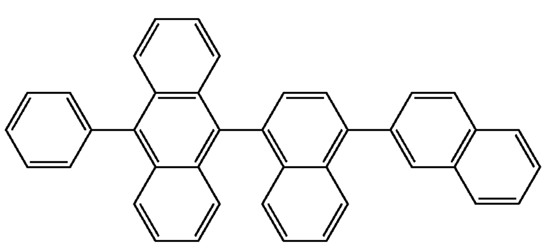

H10

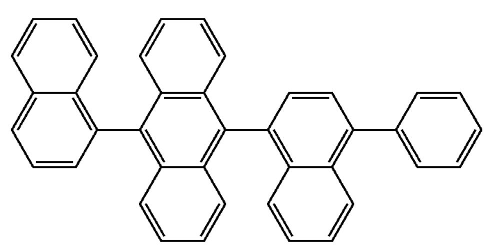

-continued
H11
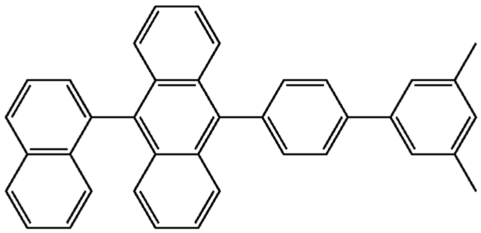
H12
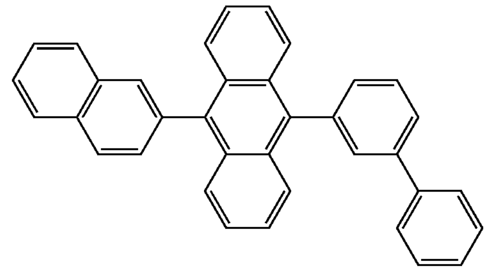
H13
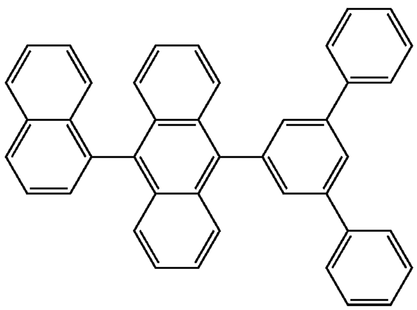
H14
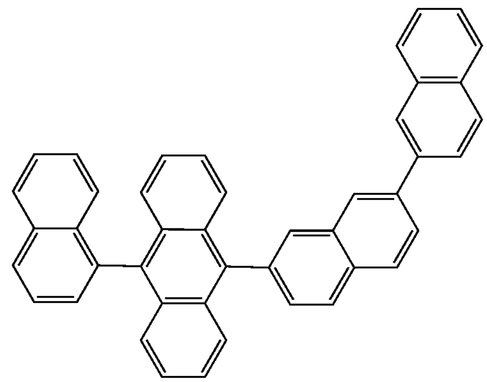
H15
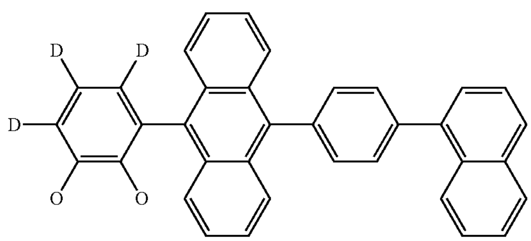
H16
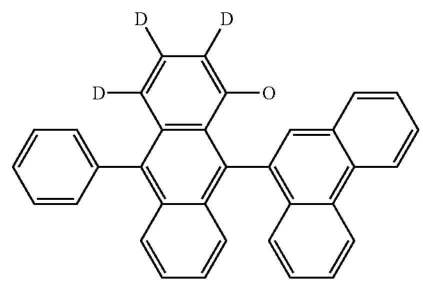
H17
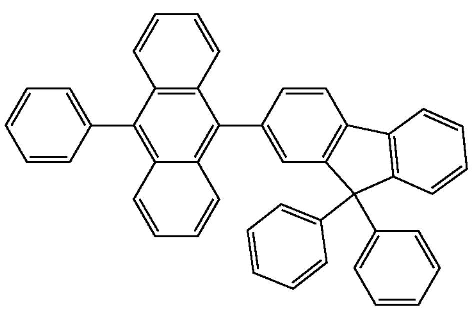
H18
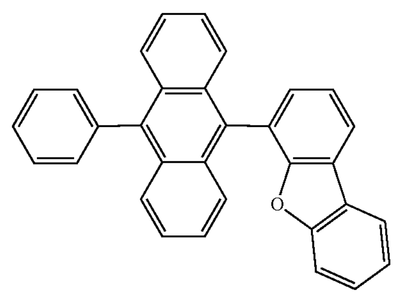
H19
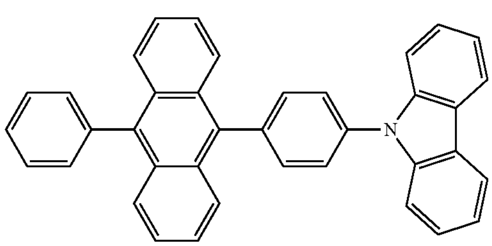
H20
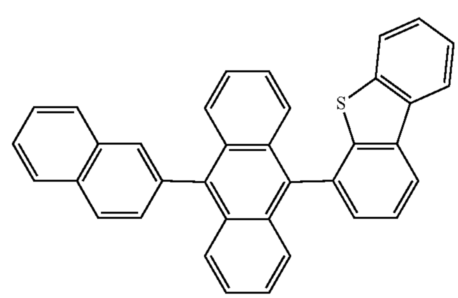

-continued
H21
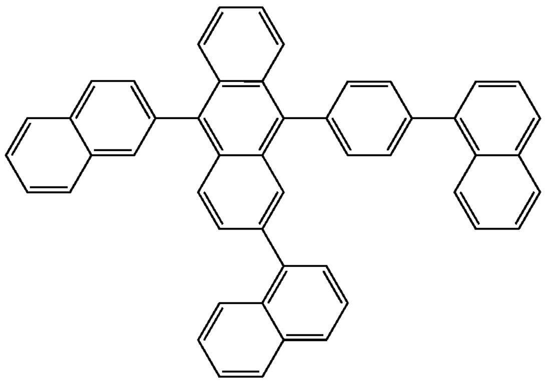
H22
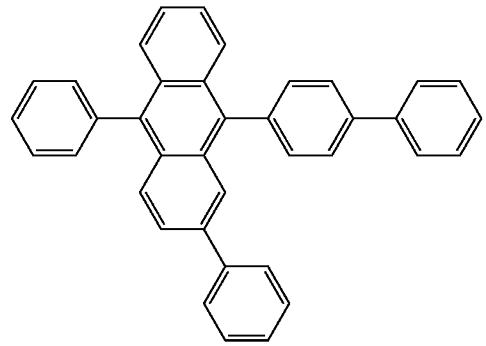
H23
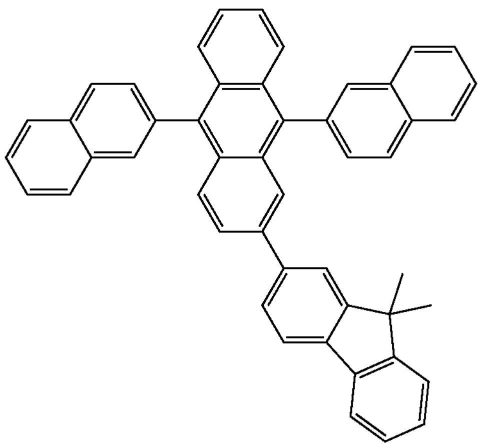
H24
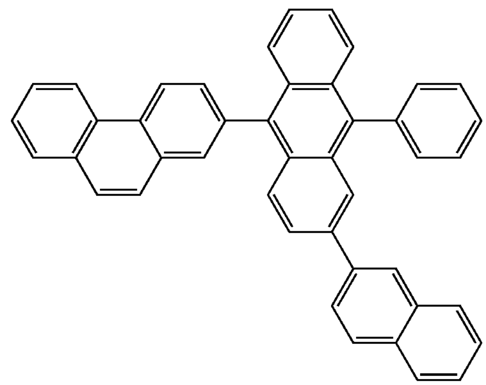
H25
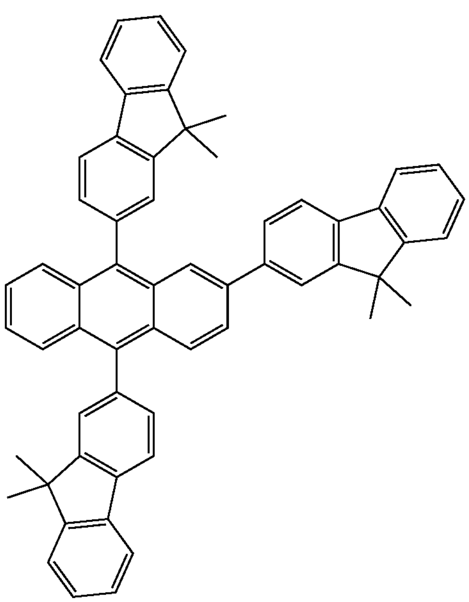
H26
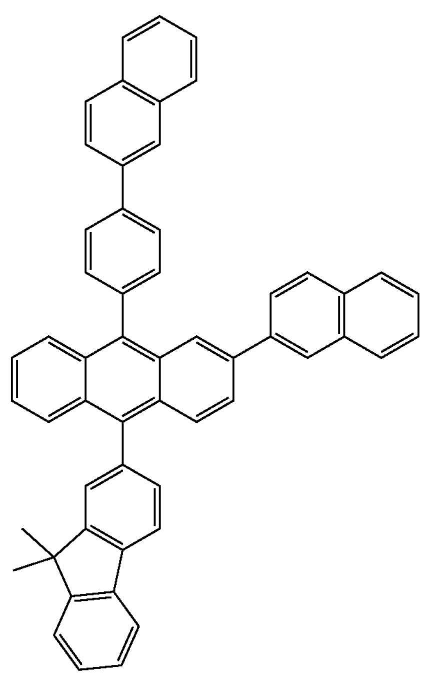

-continued
H27
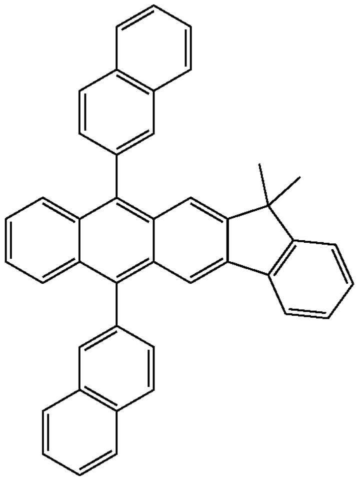
H28
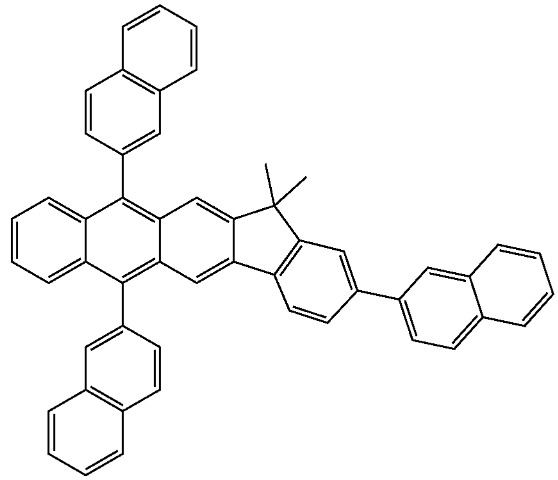
H29
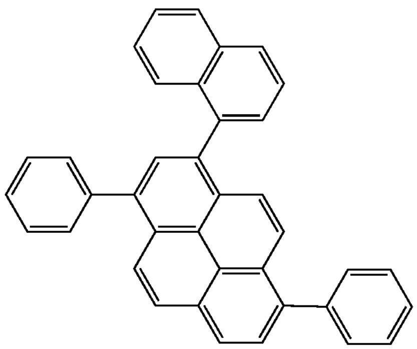
H30
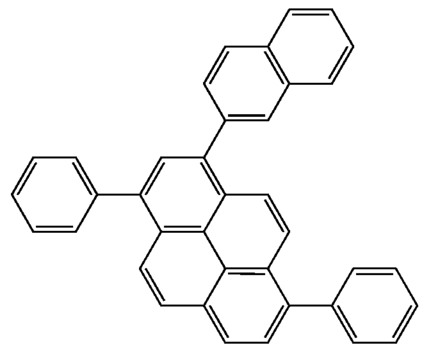
H31
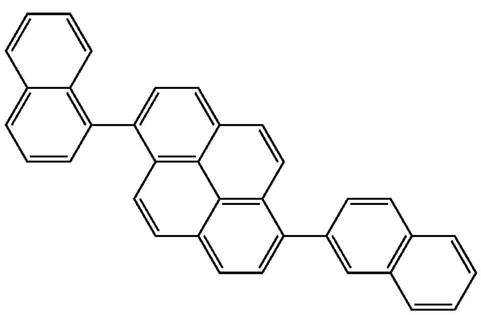
H32
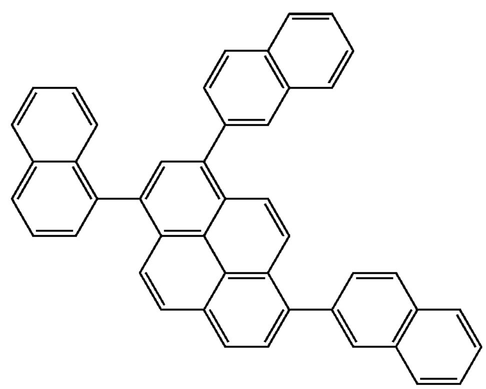
H33
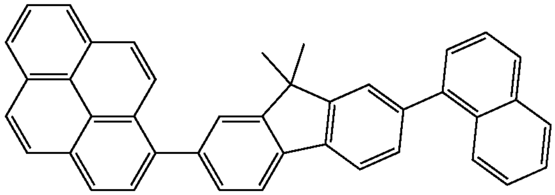
H34
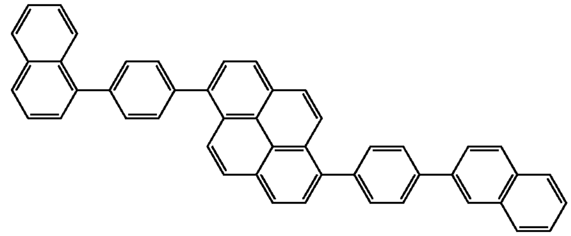

-continued
H35
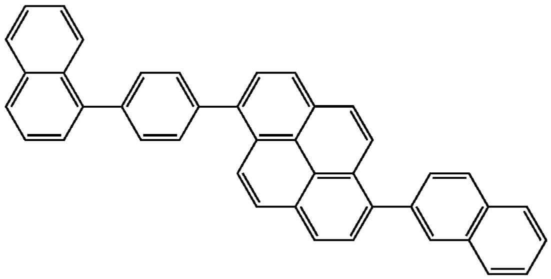
H36
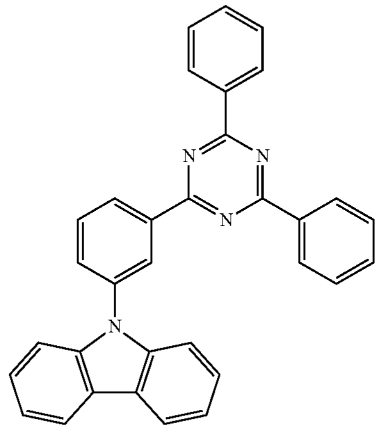
H37
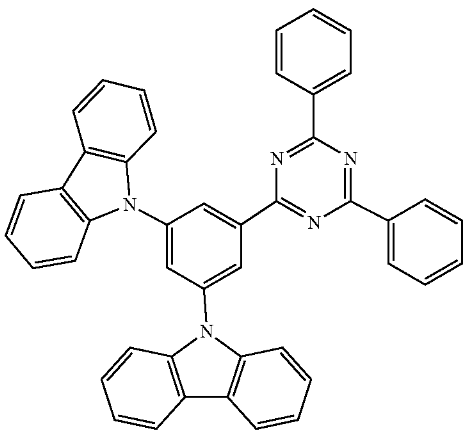
H38
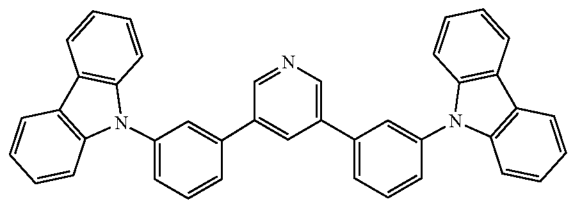
H39
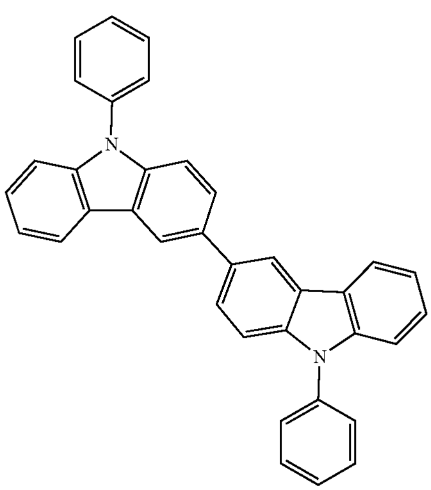
H40
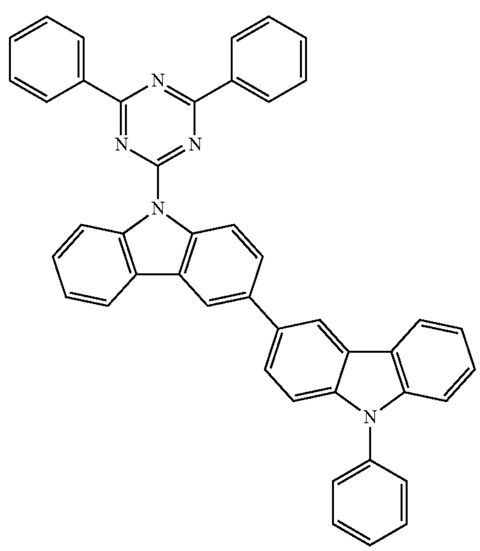

-continued
H41
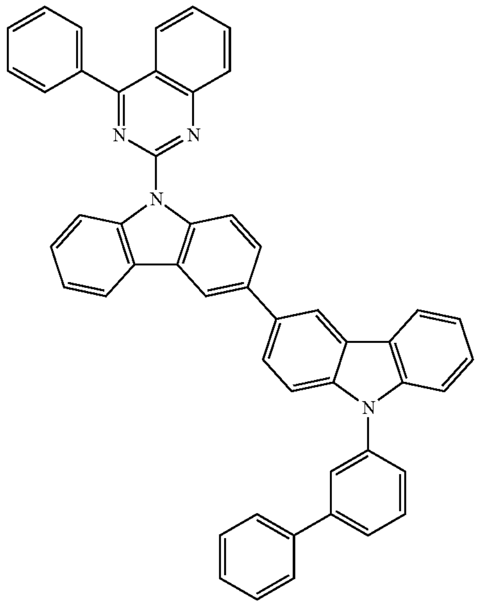
H42
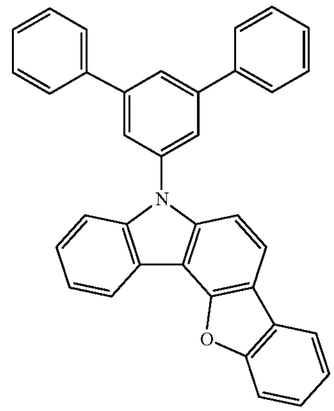
H43
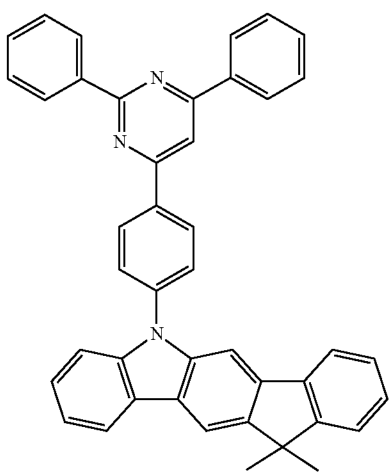
H44
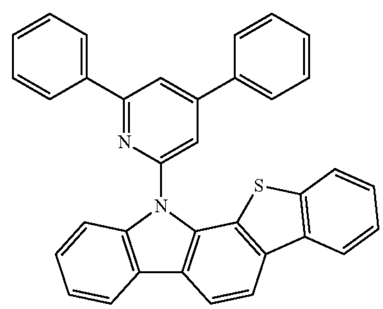
H45
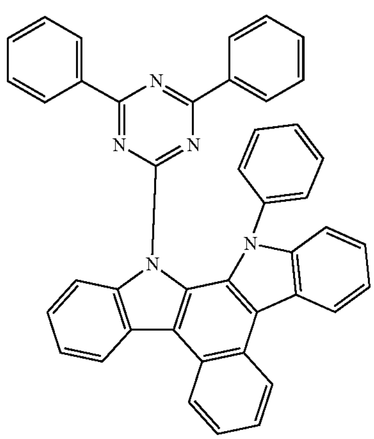
H46
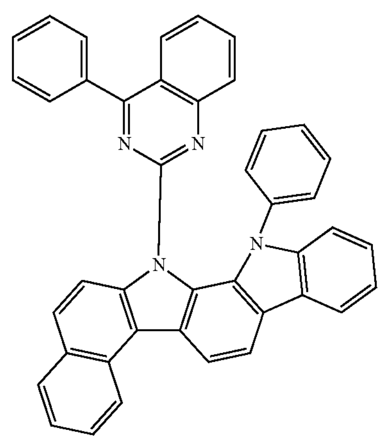

-continued
H47
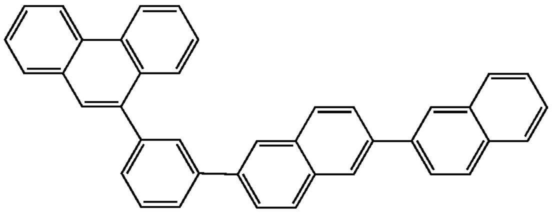
H48
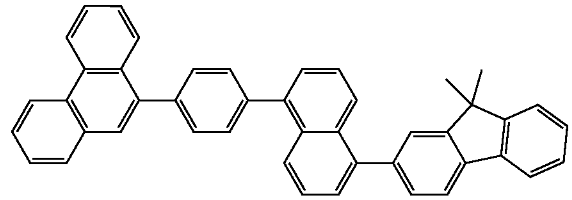
H49
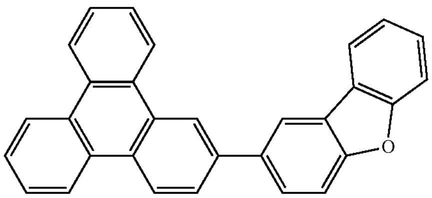
H50
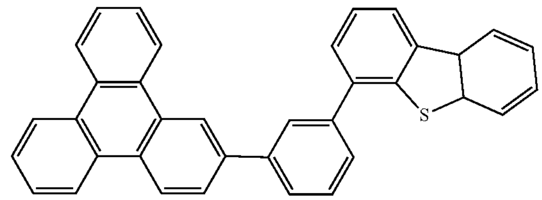
H51
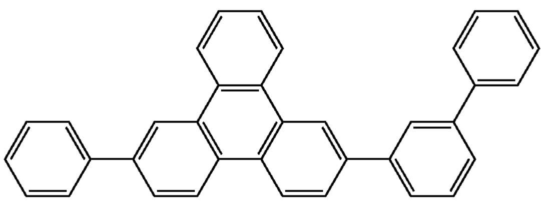
H52
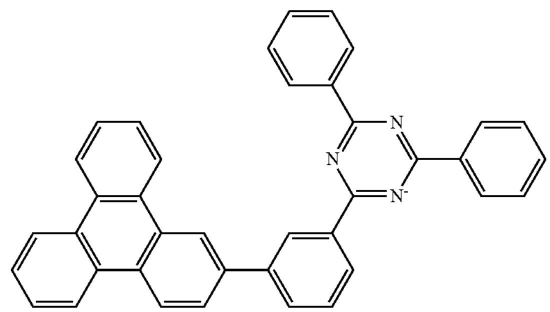
H53
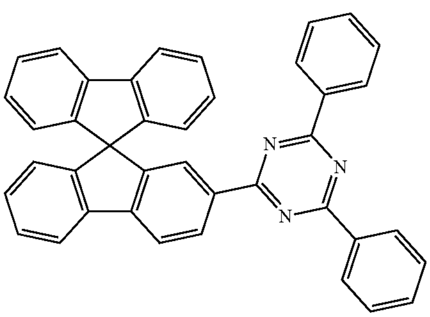
H54
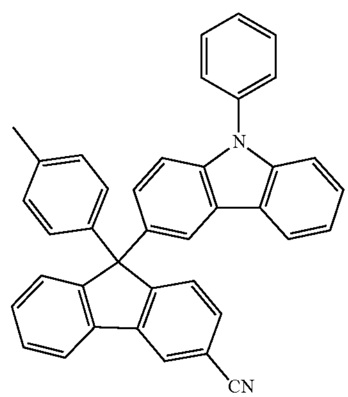
H55
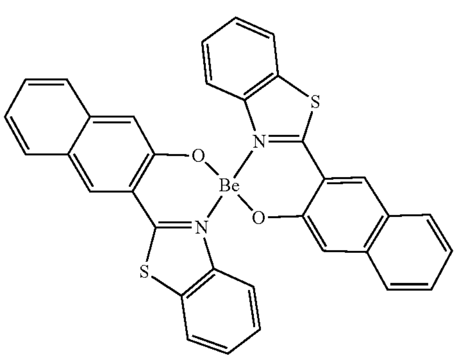
H56
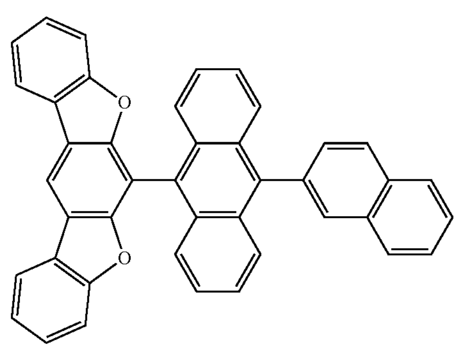

-continued
H57
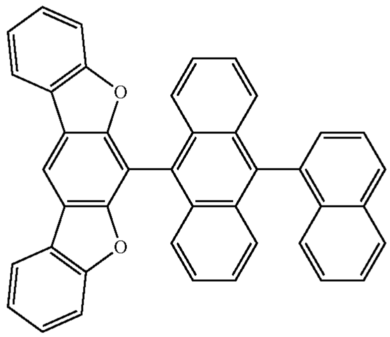
H58
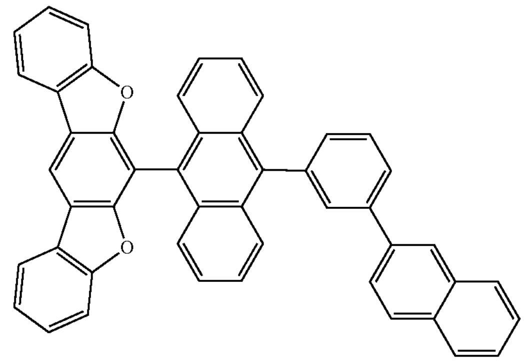
H59
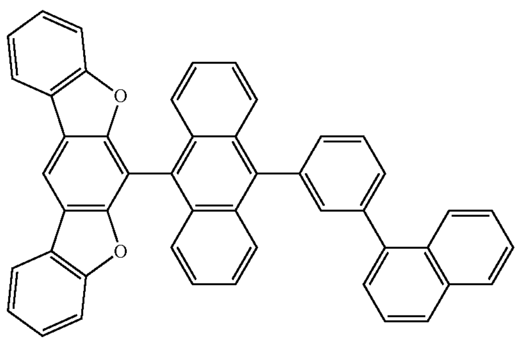
H60
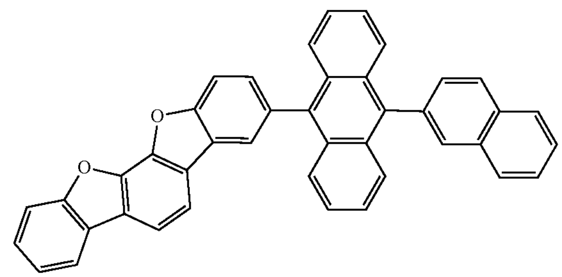
H61
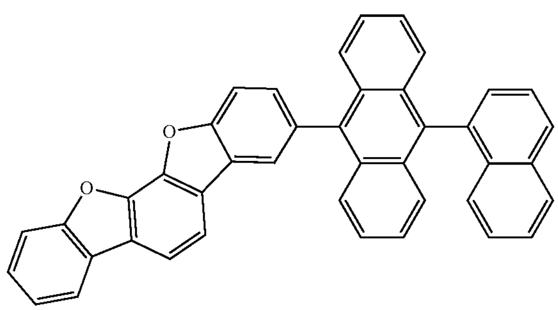
H62
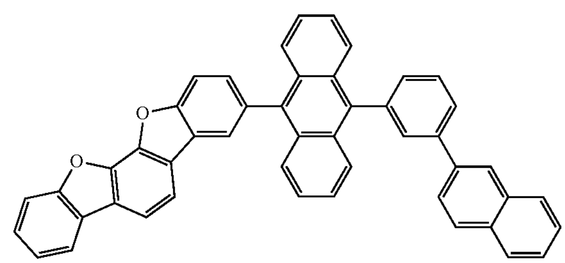
H63
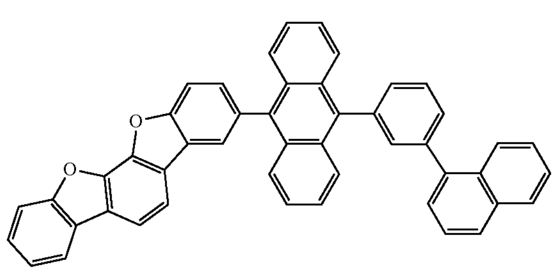
H64
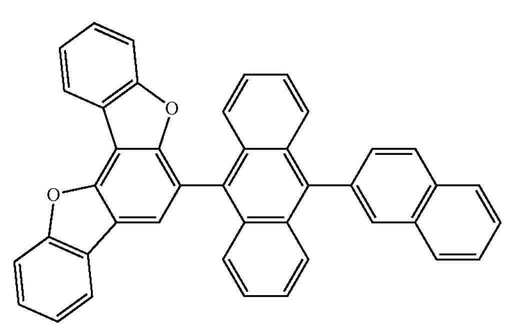

-continued
H65
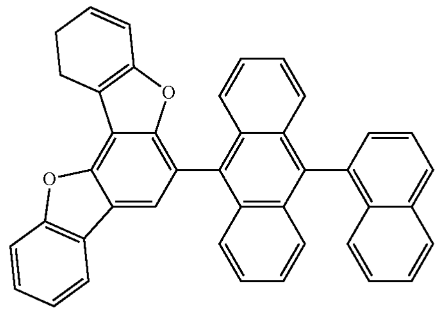
H66
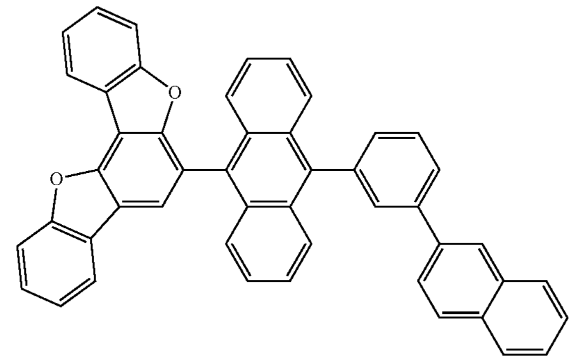
H67
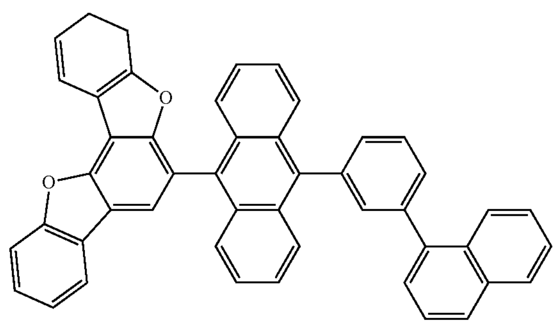
H68
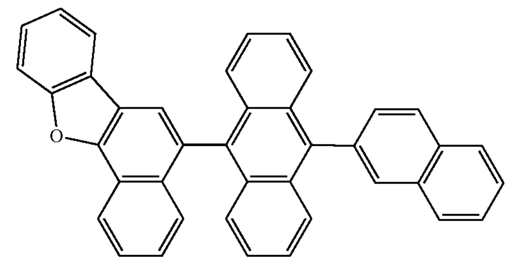
H69
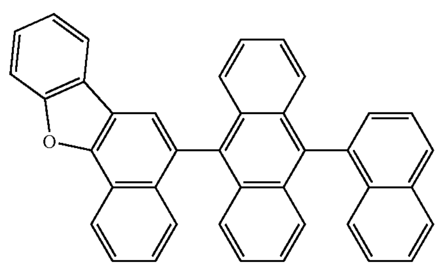
H70
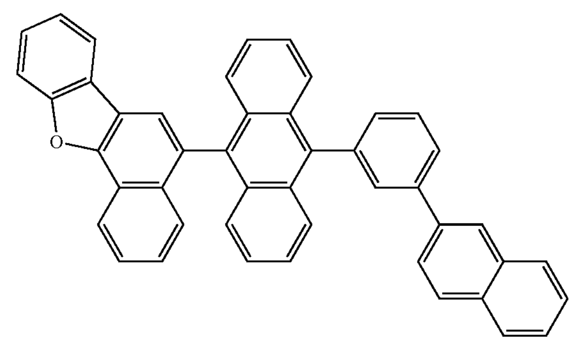
H71
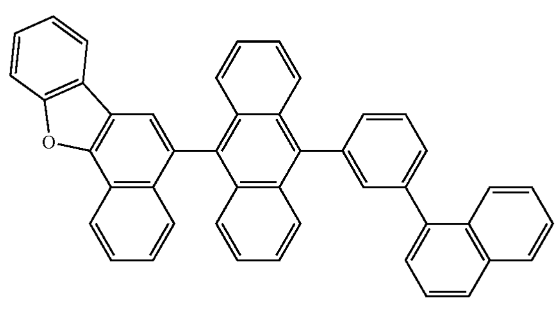
H72
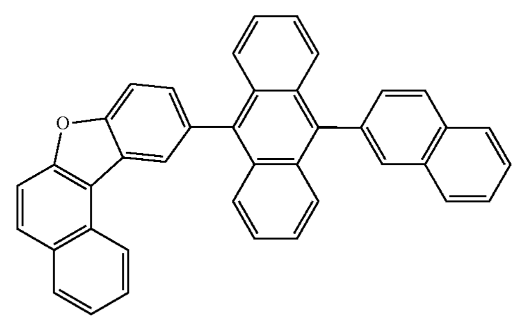

-continued
H73
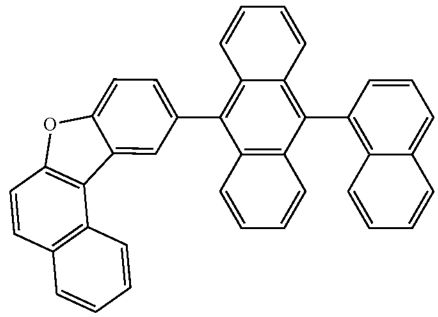
H74
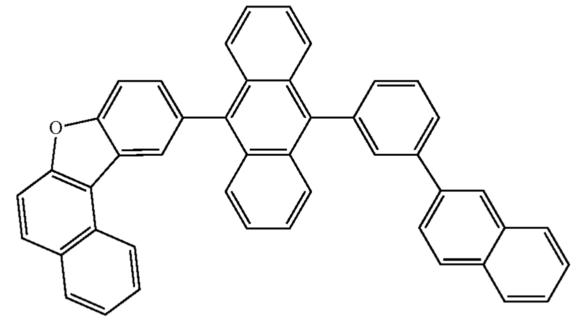
H75
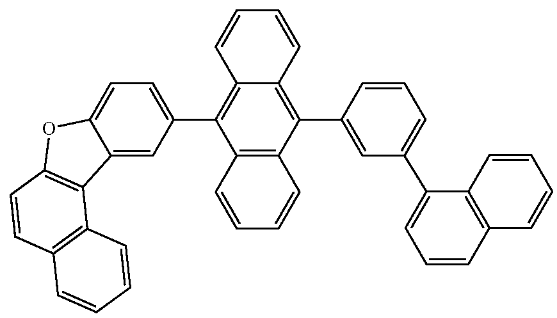
H76
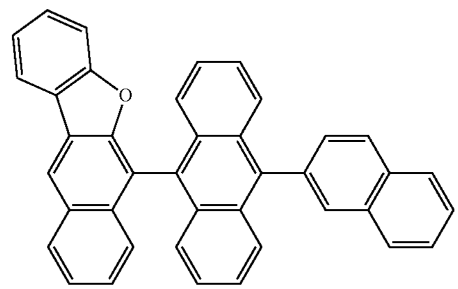
H77
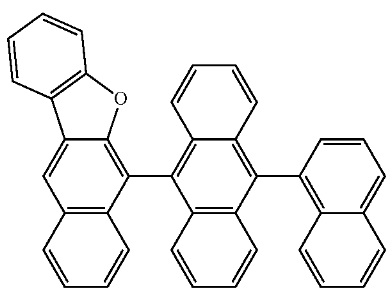
H78
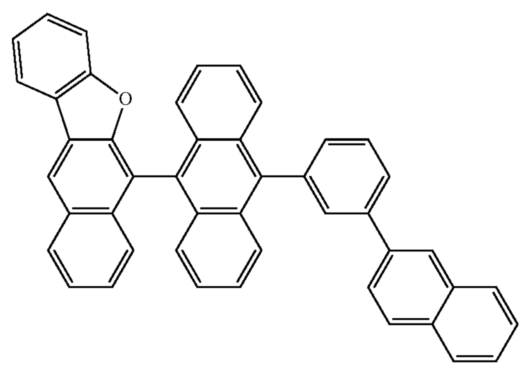
H79
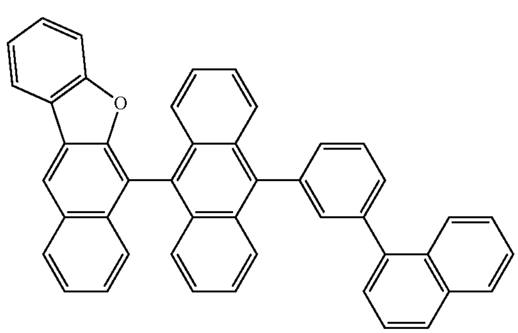
H80
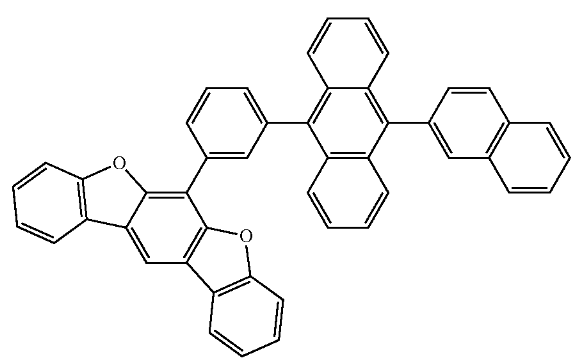

-continued
H81
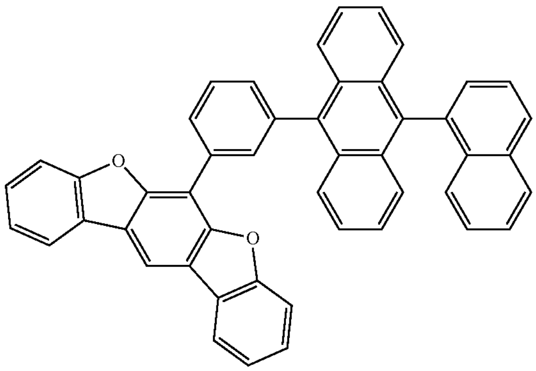
H82
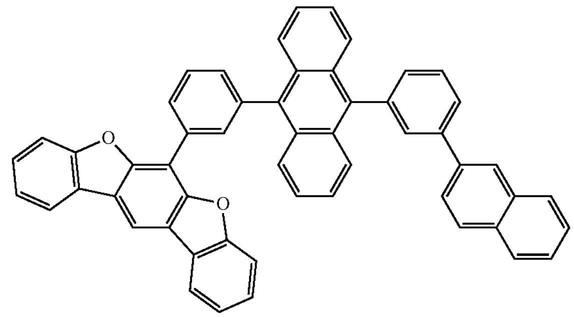
H83
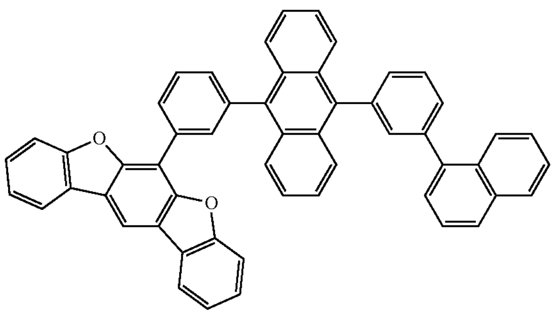
H84
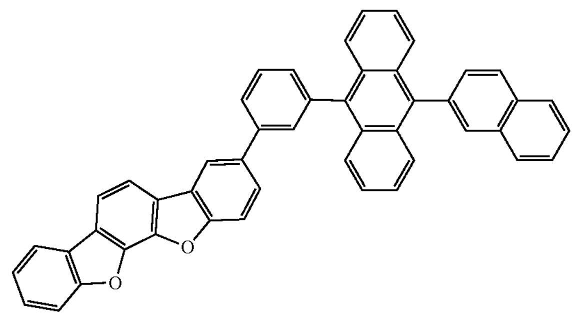
H85
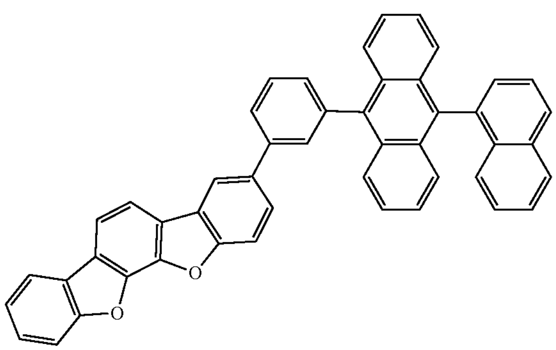
H86
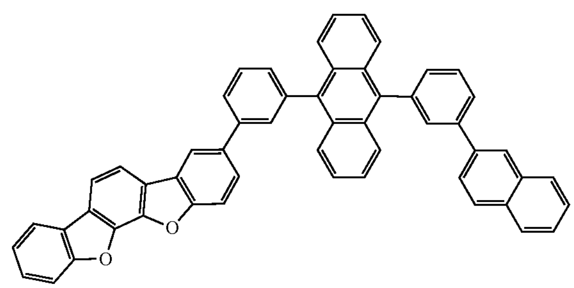
H87
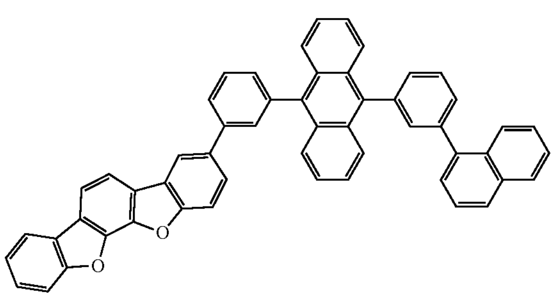
H88
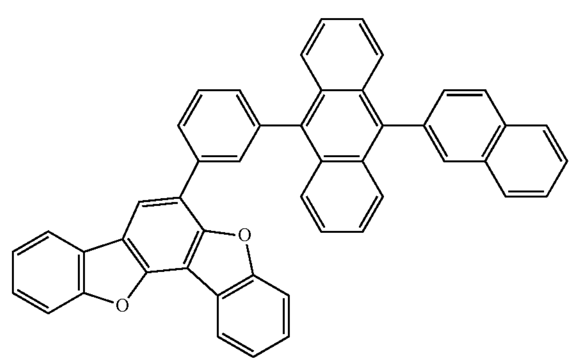

-continued
H89
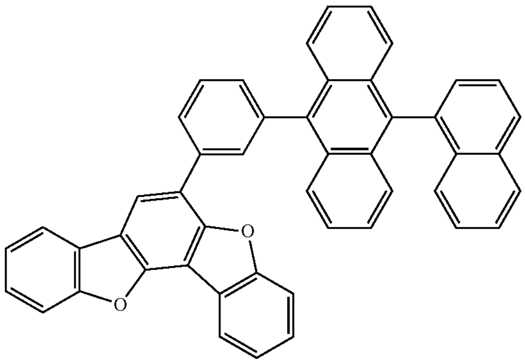
H90
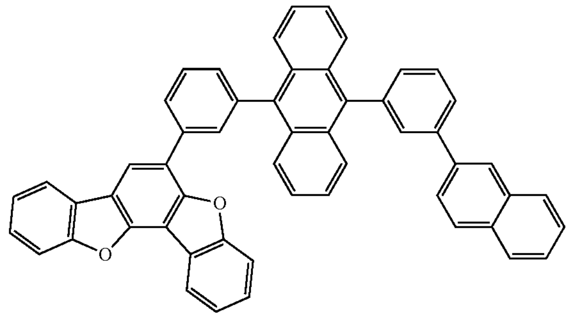
H91
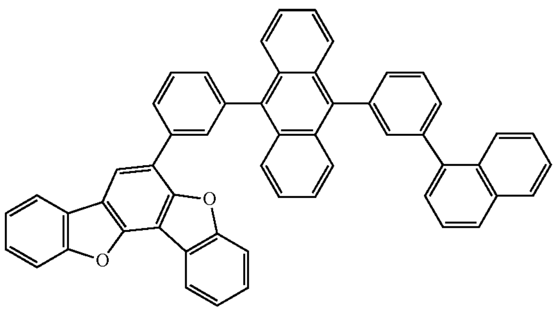
H92
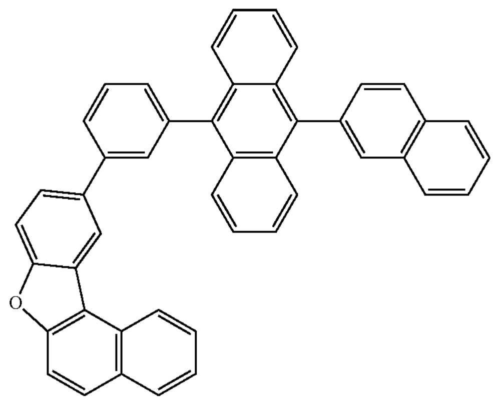
H93
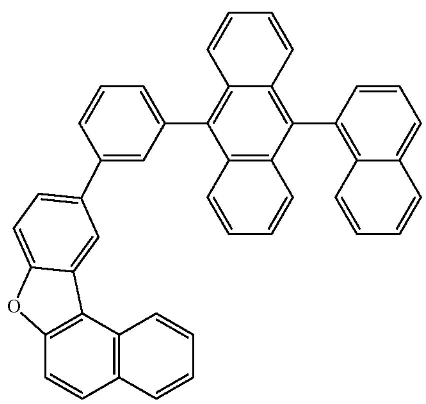
H94
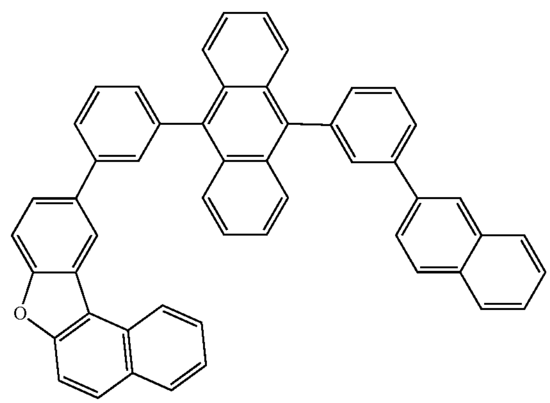
H95
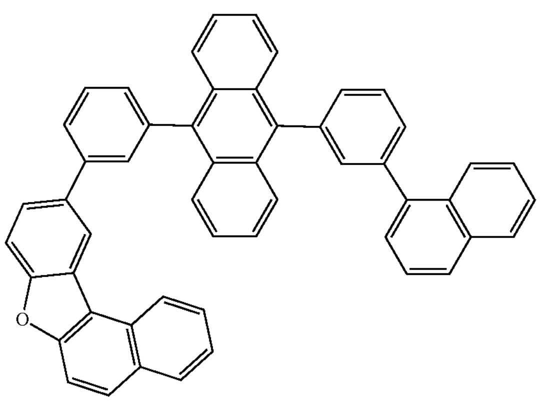
H96
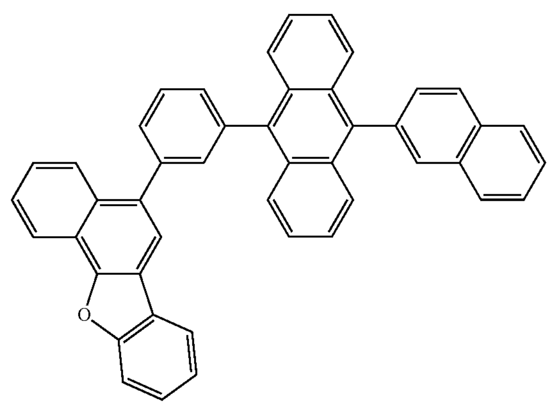

-continued
H97
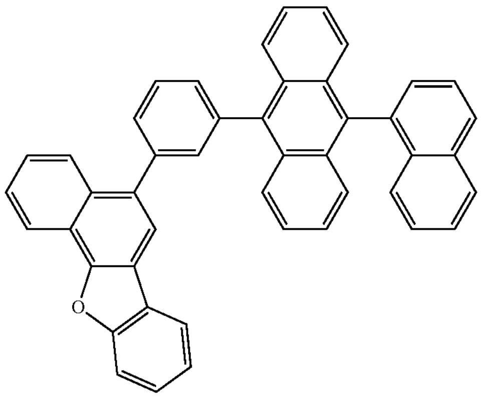
H98
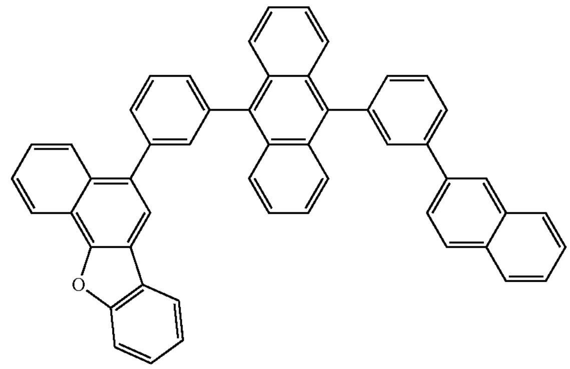
H99
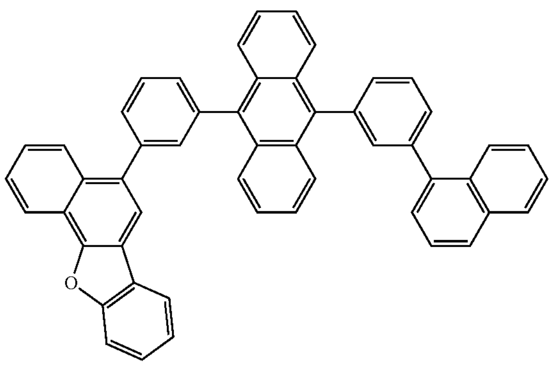
H100
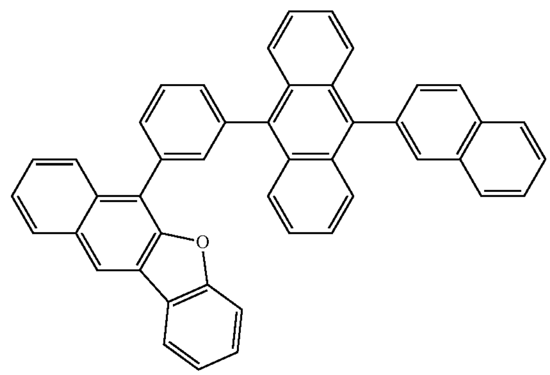
H101
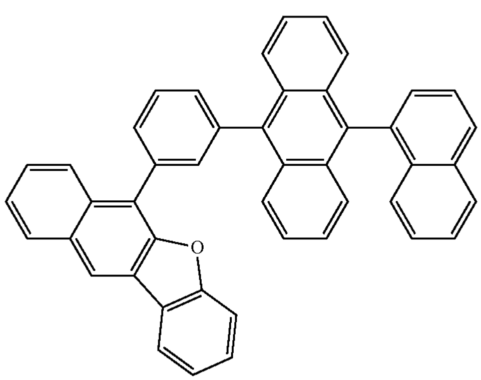
H102
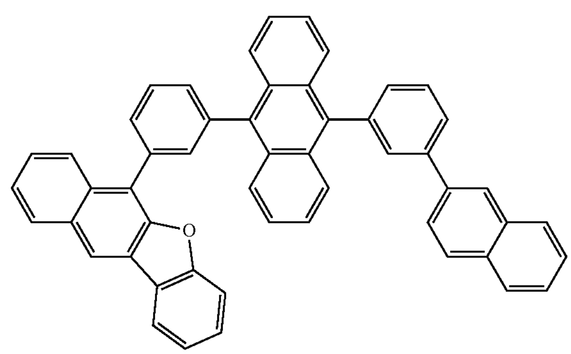

-continued
H103
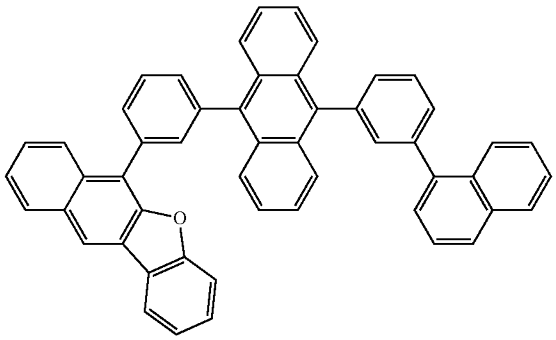
H104
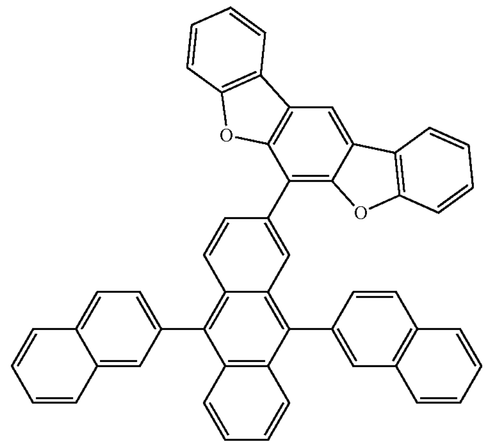
H105
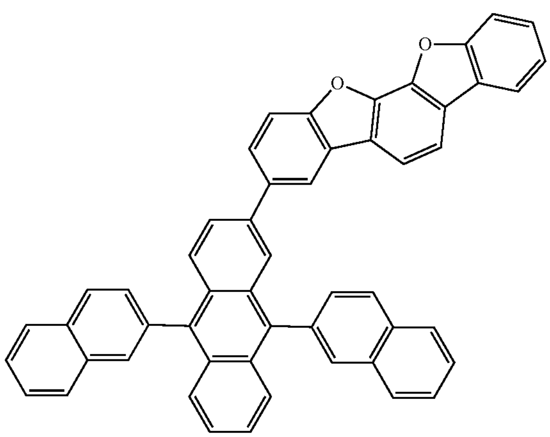
H106
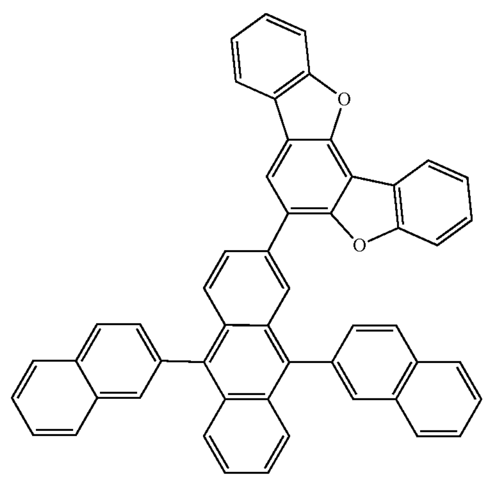
H107
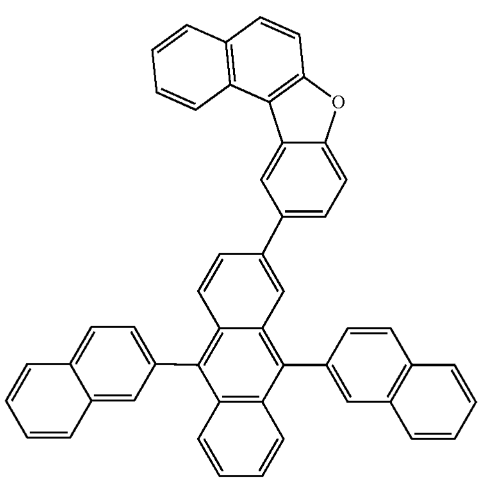
H108
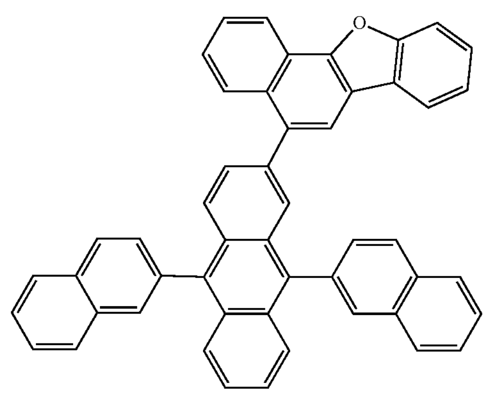

-continued
H109
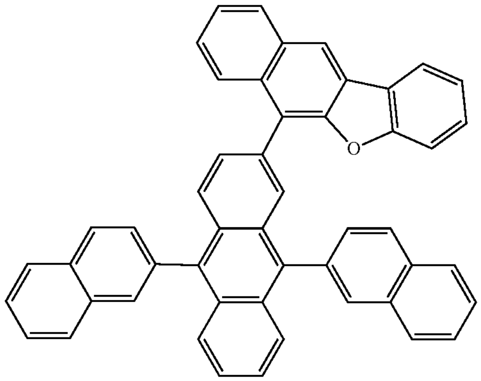
H110
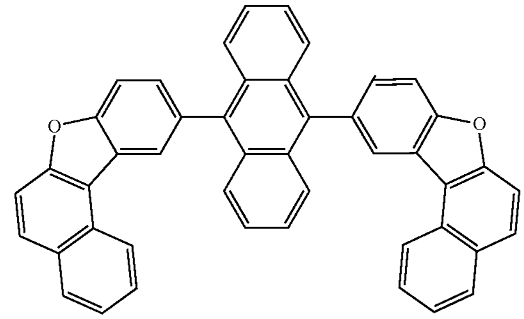
H111
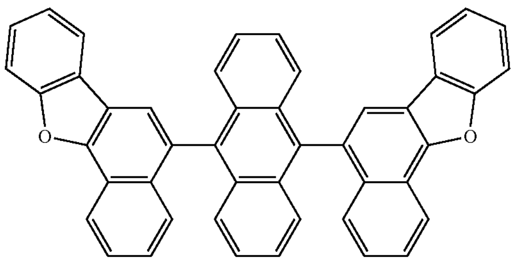
H112
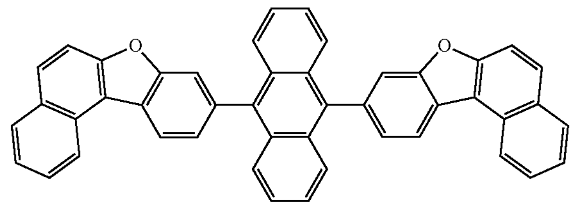
H113
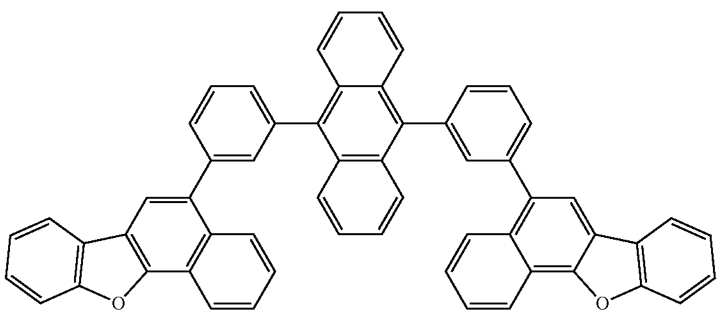
H114
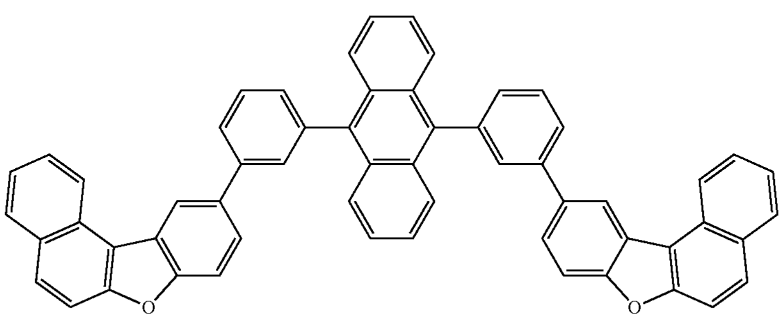

-continued
H115
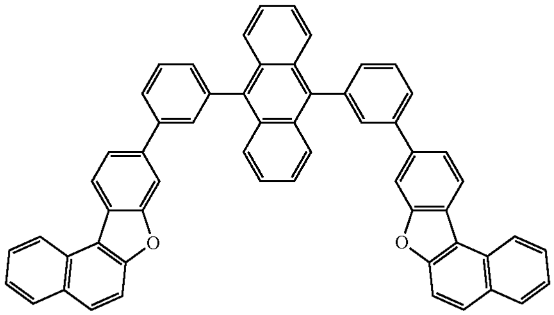
H116
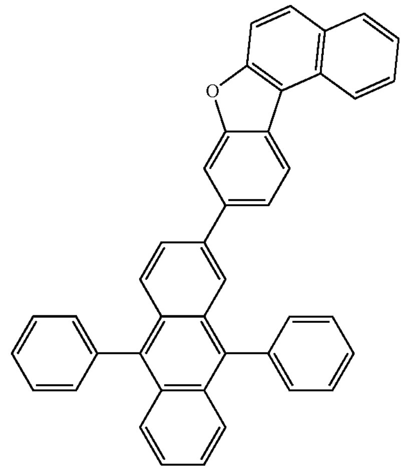
H117
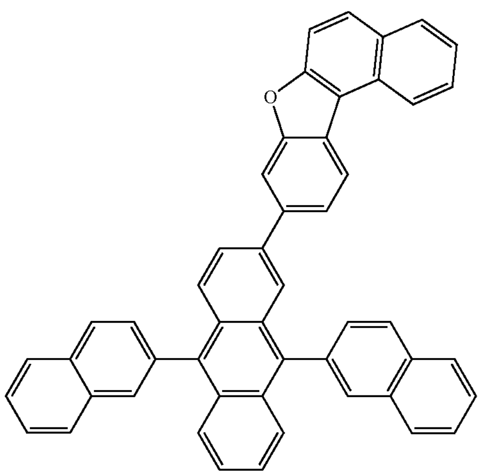
H118
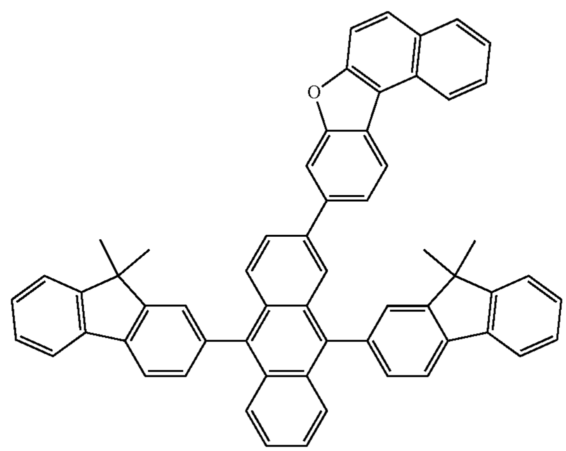
H119
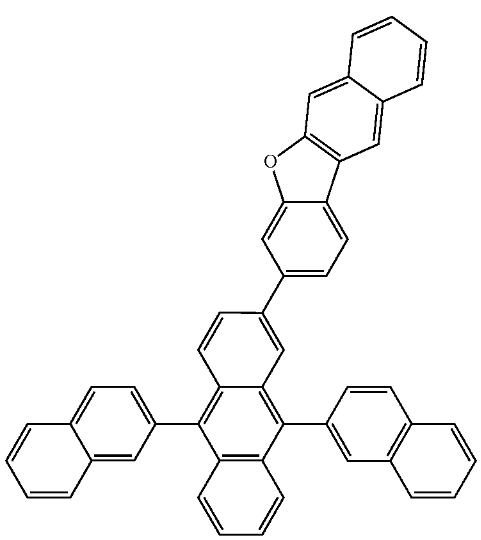
H120
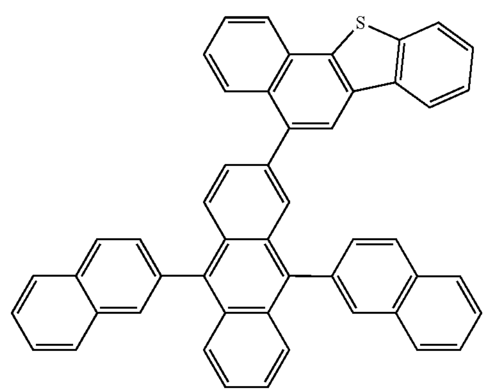

-continued

H121

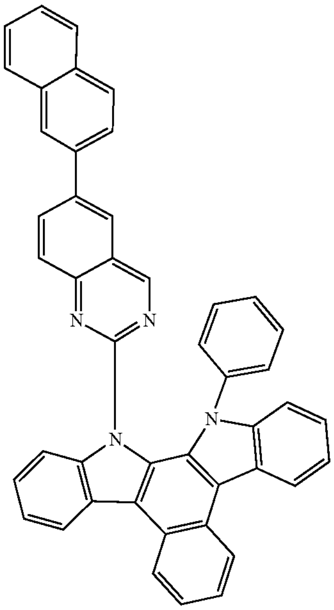

H122

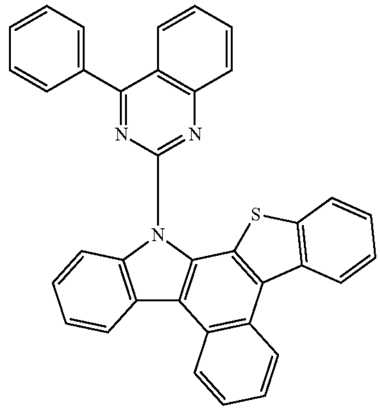

H123

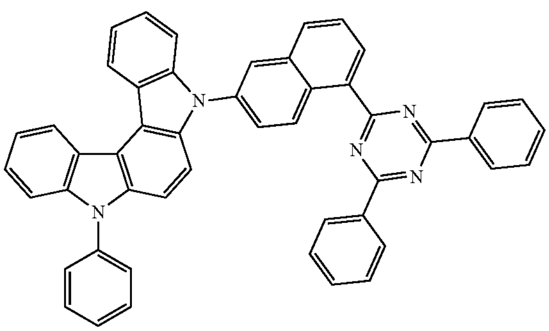

H124

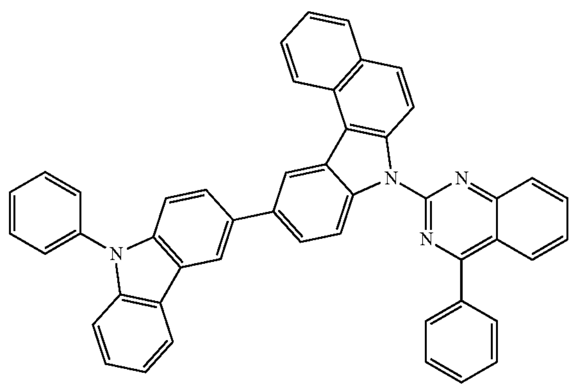

H125

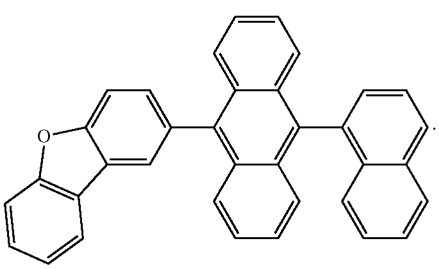

Phosphorescent Dopant

The phosphorescent dopant may include at least one transition metal as a central metal. The phosphorescent dopant may include a monodentate ligand, a bidentate ligand, a tridentate ligand, a tetradentate ligand, a pentadentate ligand, a hexadentate ligand, or any combination thereof. The phosphorescent dopant may be electrically neutral.

In an embodiment, the phosphorescent dopant may include an organometallic compound represented by Formula 401.

Formula 401

$$M(L_{401})_{xc1}(L_{402})_{xc2}$$

-continued

Formula 402

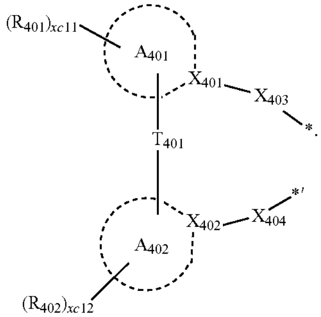

In Formulae 401 and 402,

M may be a transition metal (for example, iridium (Ir), platinum (Pt), palladium (Pd), osmium (Os), titanium (Ti), gold (Au)hafnium (Hf), europium (Eu), terbium (Tb), rhodium (Rh), rhenium (Re), or thulium (Tm)), and $L_{401}$ may be a ligand represented by Formula 402, and xc1 may be 1, 2, or 3, wherein, when xc1 is 2 or more, two or more of $L_{401}$(s) may be identical to or different from each other.

$L_{402}$ may be an organic ligand, and xc2 may be 0, 1, 2, 3, or 4, wherein, when xc2 is 2 or more, two or more of $L_{402}$(s) may be identical to or different from each other.

$X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(═O)—*', *—N($Q_{411}$)-*', *—C($Q_{411}$)($Q_{412}$)-*', *—C($Q_{411}$)═C($Q_{412}$)-*', *—C($Q_{411}$)═*', or *═C═*', $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each be the same as described in connection with $Q_1$ as described herein, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), or —P(═O)($Q_{401}$)($Q_{402}$), $Q_{401}$ to $Q_{403}$ may each be the same as described in connection with $Q_1$ herein, xc11 and xc12 may each independently be an integer from 0 to 10, and

* and *' in Formula 402 may each indicate a binding site to M in Formula 401.

In an embodiment, in Formula 402, i) $X_{401}$ may be nitrogen, and $X_{402}$ may be carbon, or ii) both $X_{401}$ and $X_{402}$ may be nitrogen.

In an embodiment, when xc1 in Formula 402 is 2 or more, two ring $A_{401}$(s) in two or more of $L_{401}$(s) may be optionally linked to each other via $T_{402}$, which is a linking group, and two ring $A_{402}$(s) may optionally be linked to each other via $T_{403}$, which is a linking group (see Compounds PD1 to PD4 and PD7). The variables $T_{402}$ and $T_{403}$ may each be the same as described in connection with $T_{401}$ as described herein.

The variable $L_{402}$ in Formula 401 may be an organic ligand. In an embodiment, $L_{402}$ may include a halogen group, a diketone group (for example, an acetylacetonate group), a carboxylic acid group (for example, a picolinate group), a —C(═O) group, an isonitrile group, a —CN group, a phosphorus group (for example, a phosphine group, a phosphite group, etc.), or any combination thereof.

The phosphorescent dopant may include, for example, one of Compounds PD1 to PD25, or any combination thereof:

PD1

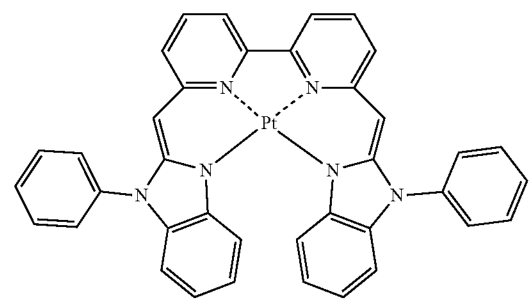

PD2

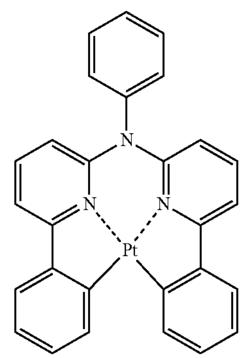

PD3

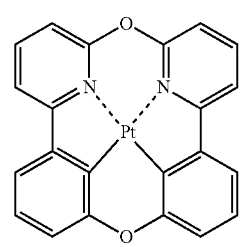

PD4

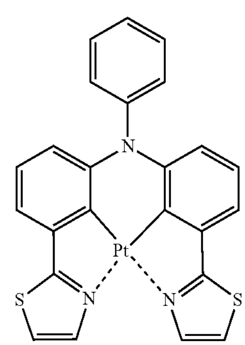

PD5
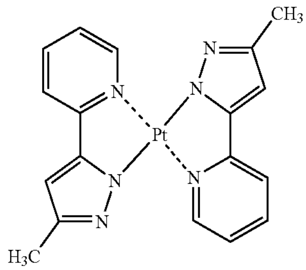
PD6
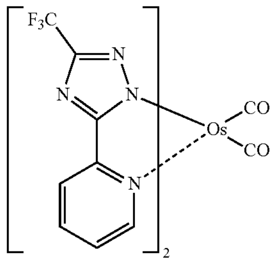
PD7
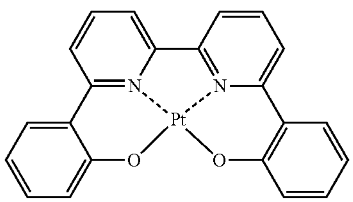
PD8
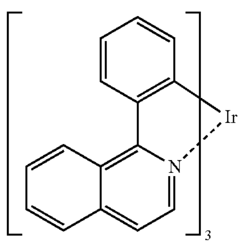
PD9
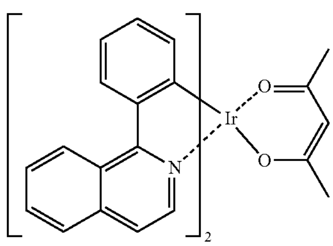
PD10
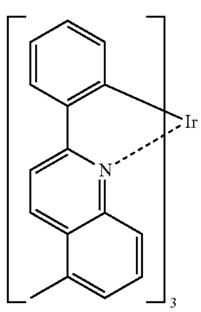
PD11
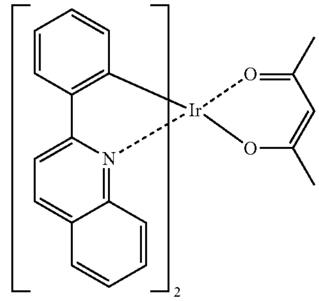
PD12
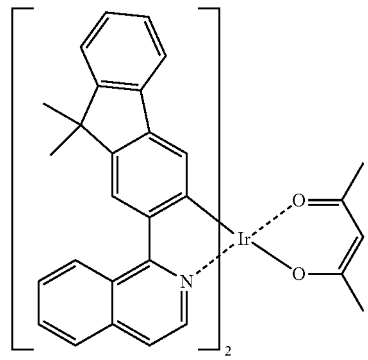
PD13
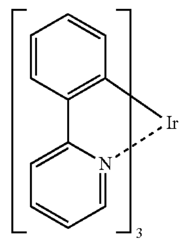
PD14
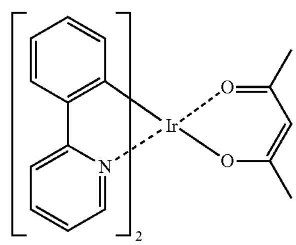
PD15
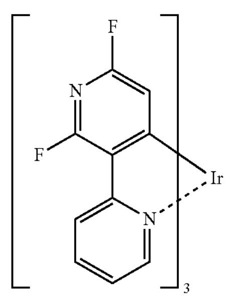

-continued
PD16
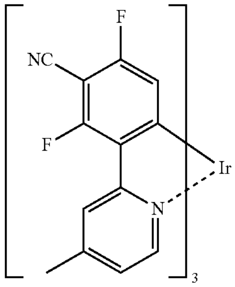
PD17
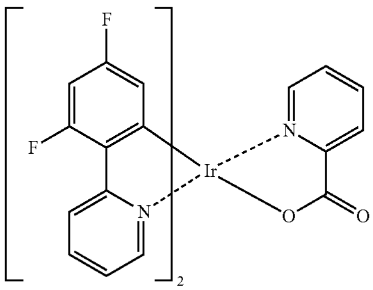
PD18
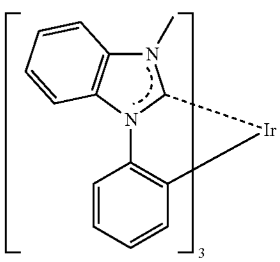
PD19
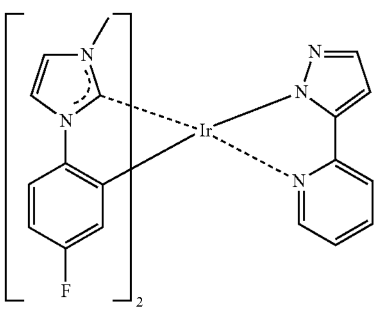
PD20
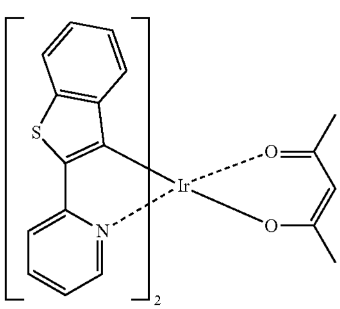
-continued
PD21
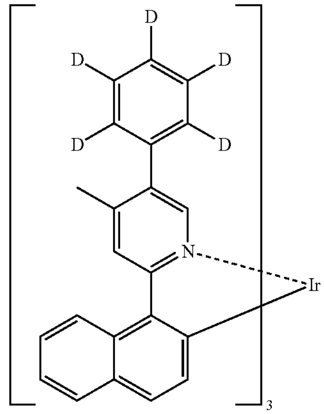
PD22
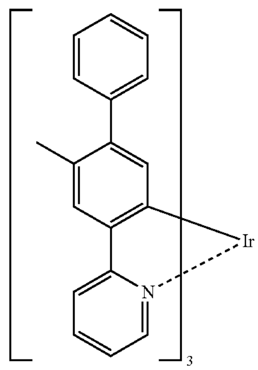
PD23
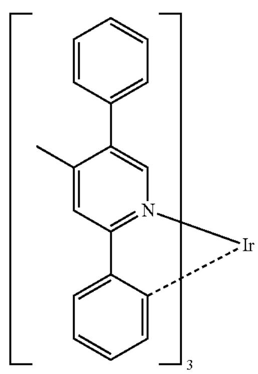
PD24
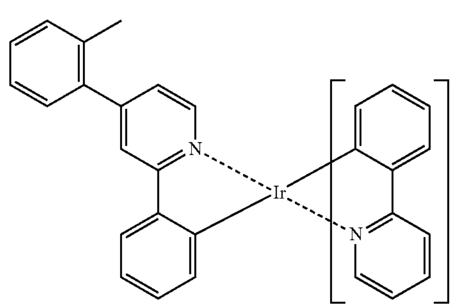

-continued

PD25

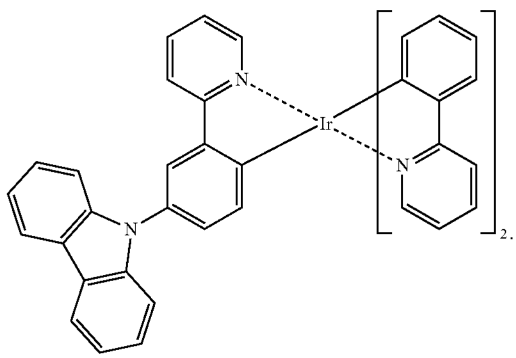

Fluorescent Dopant

The fluorescent dopant may include an amine group-containing compound, a styryl group-containing compound, or any combination thereof.

In an embodiment, the fluorescent dopant may include a compound represented by Formula 501:

Formula 501

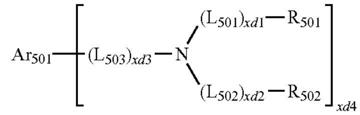

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, $Ar_{501}$ in Formula 501 may be a condensed cyclic group (for example, an anthracene group, a chrysene group, or a pyrene group) in which three or more monocyclic groups are condensed with each other.

In one or more embodiments, xd4 in Formula 501 may be 2.

In an embodiment, the fluorescent dopant may include: one of Compounds FD1 to FD36; DPVBi; DPAVBi; or any combination thereof:

FD1

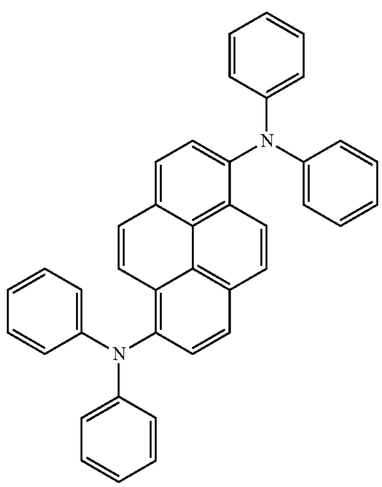

FD2

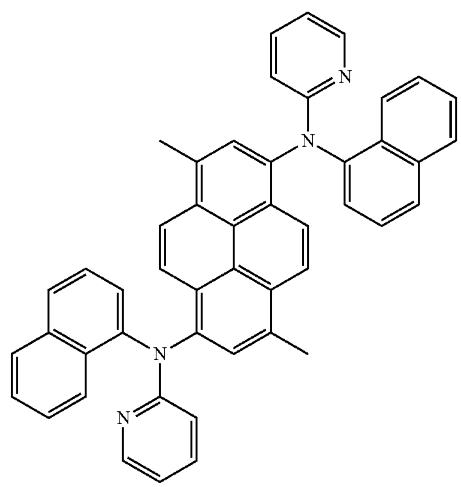

-continued
FD3
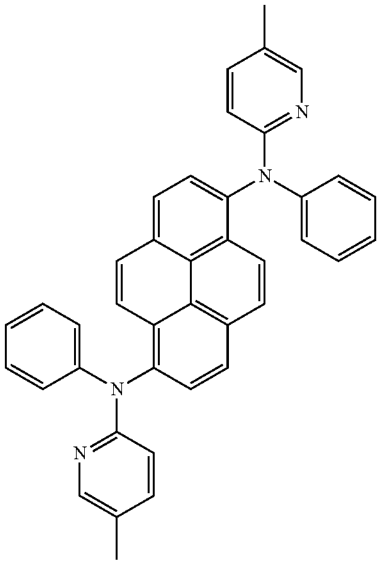
FD4
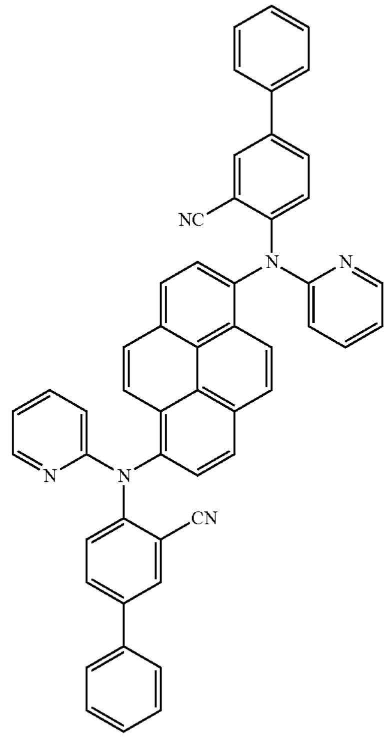
FD5
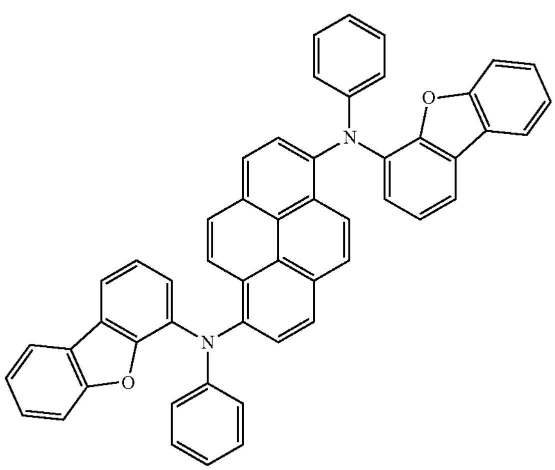
FD6
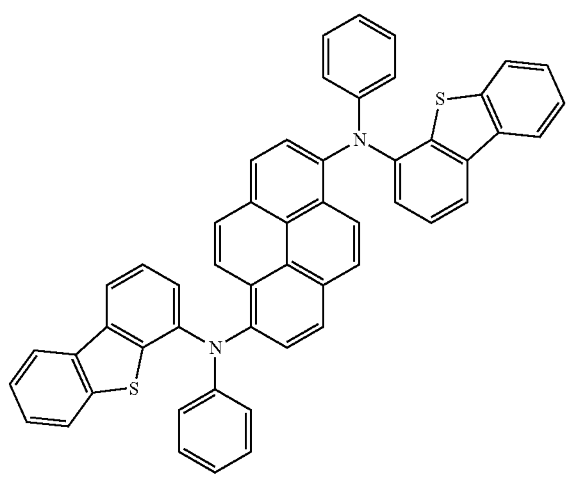

-continued
FD7
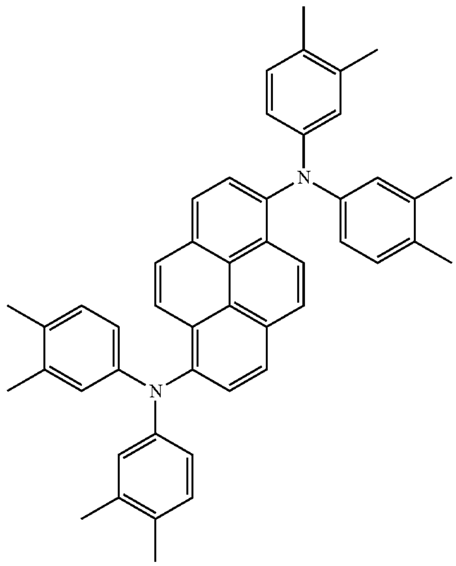
FD8
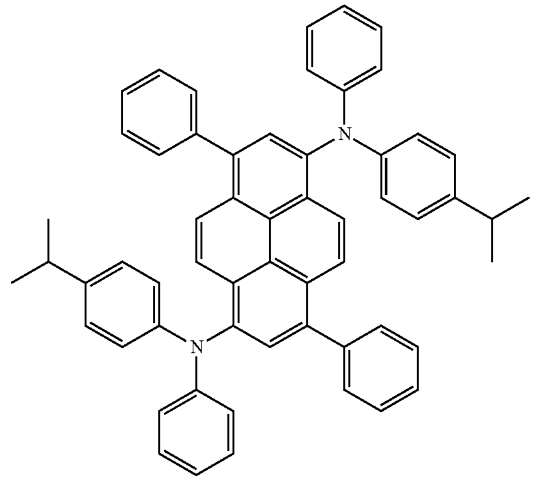
FD9
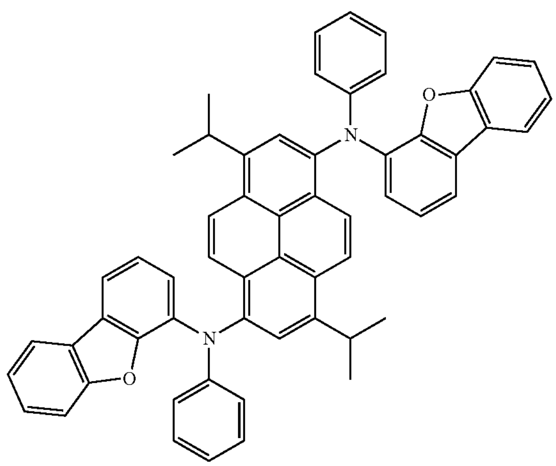
FD10
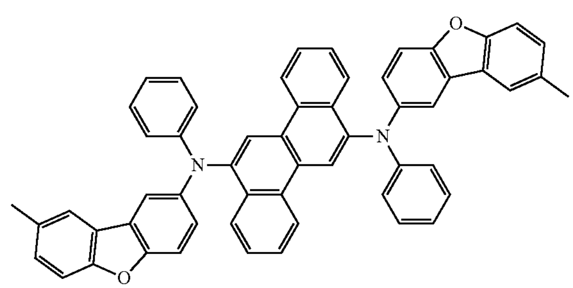
FD11
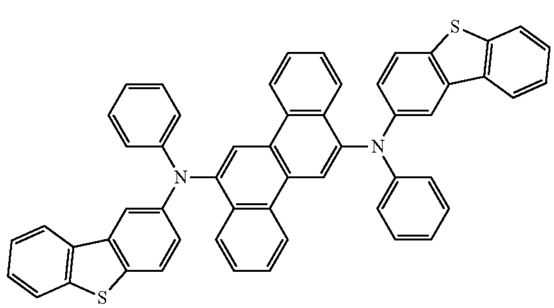
FD12
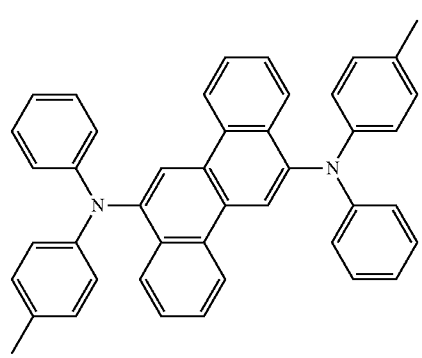

-continued
FD13
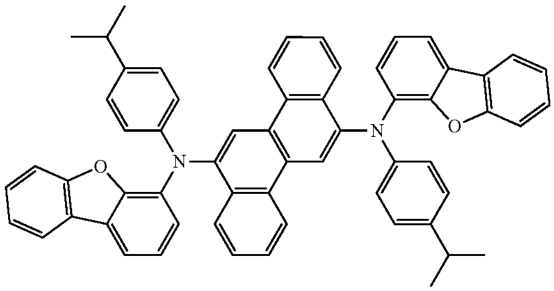
FD14
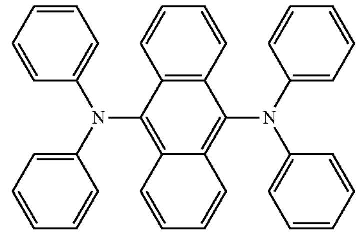
FD15
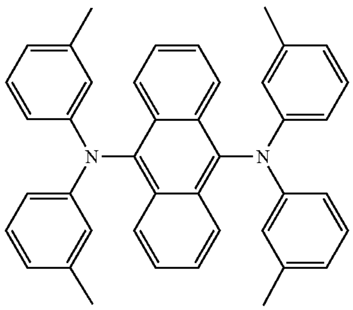
FD16
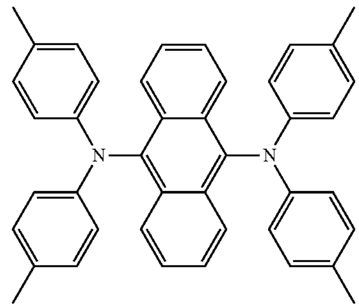
FD17
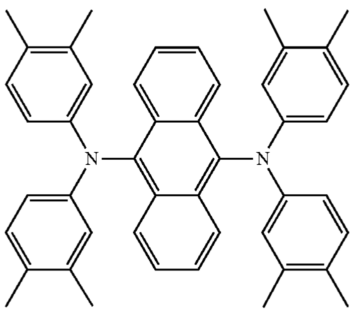
FD18
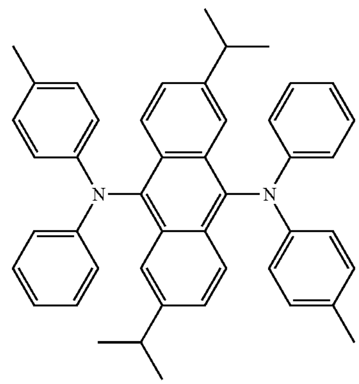
FD19
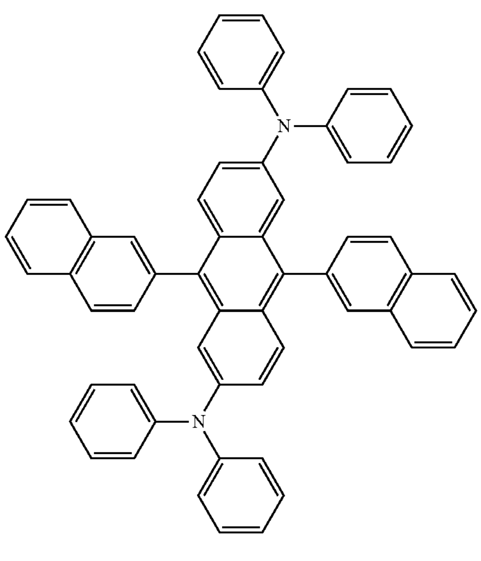
FD20
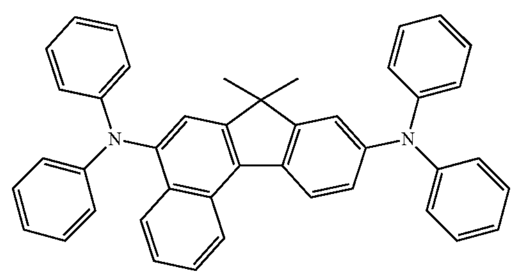

-continued
FD21
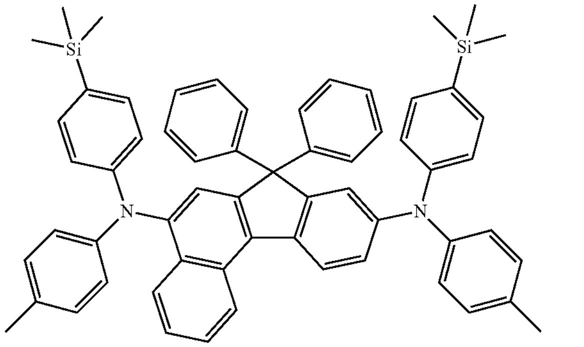
FD22
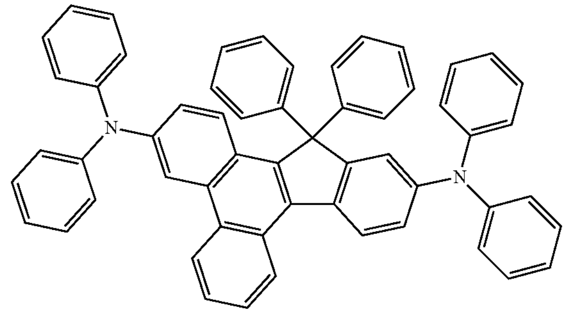
FD23
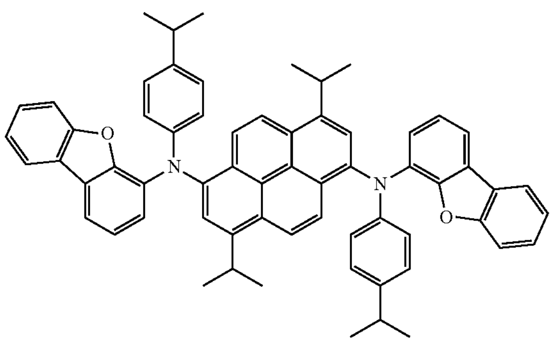
FD24
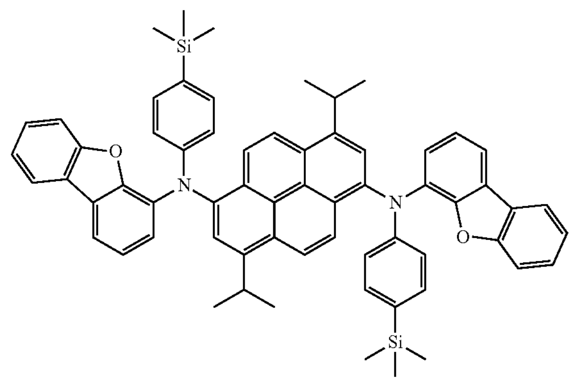
FD25
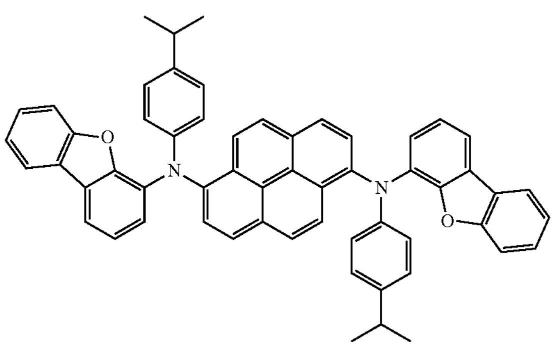
FD26
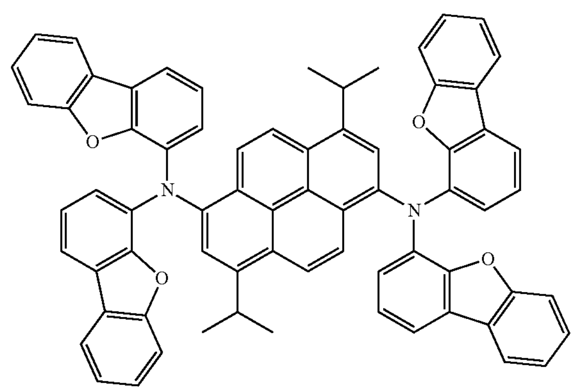
FD27
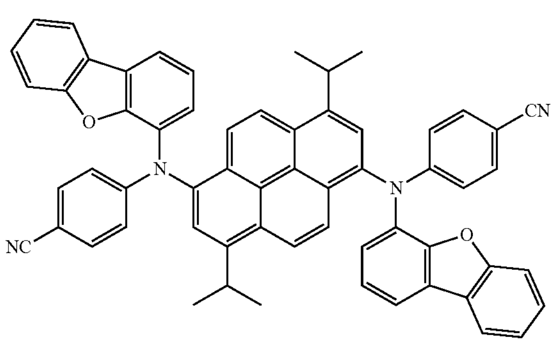
FD28
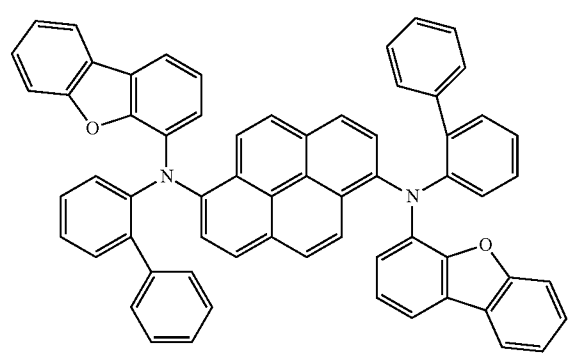

-continued
FD29
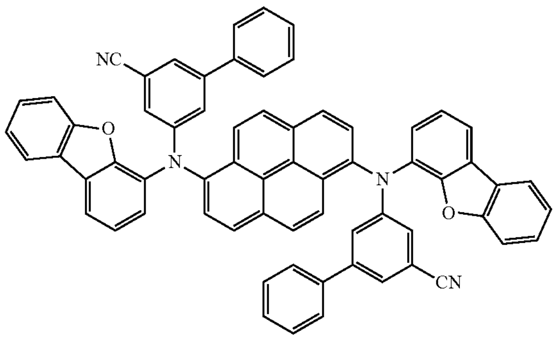
FD30
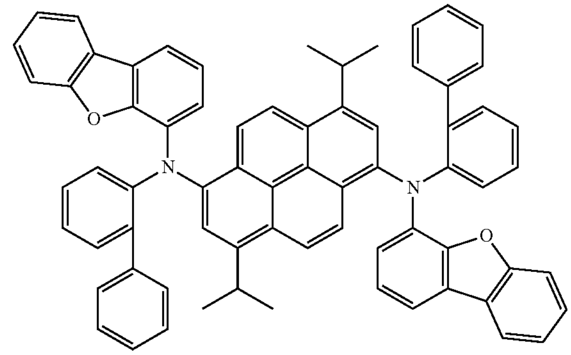
FD31
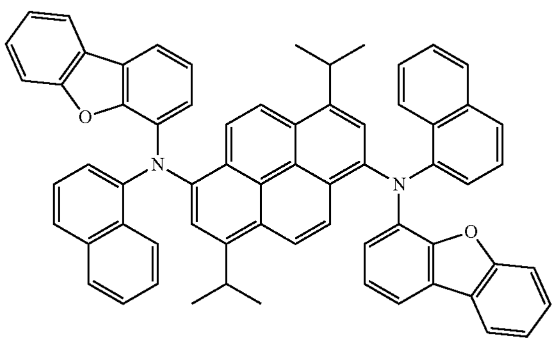
FD32
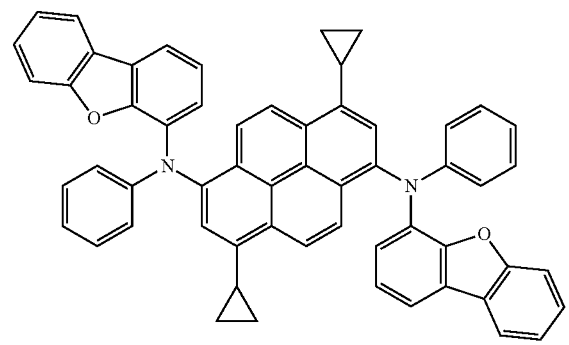
FD33
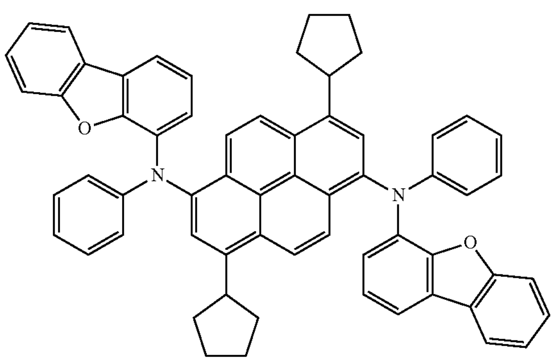
FD34
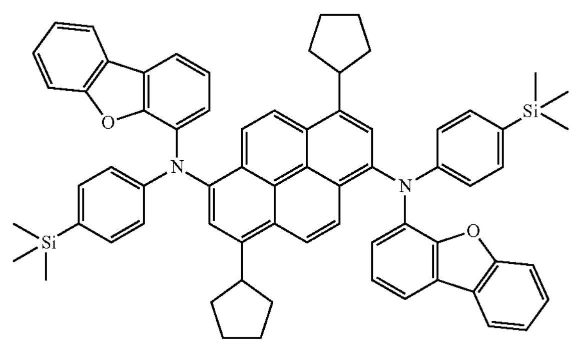
FD35
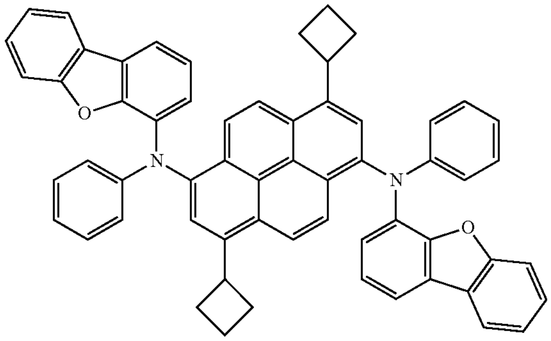
FD36
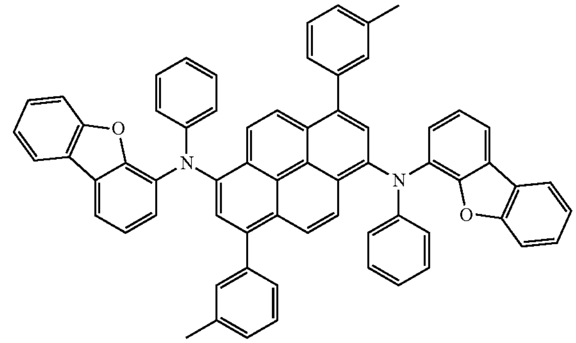

-continued

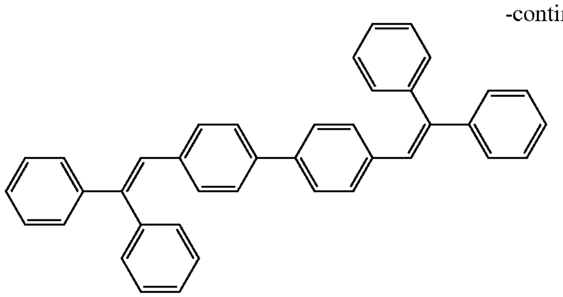

DPVBi

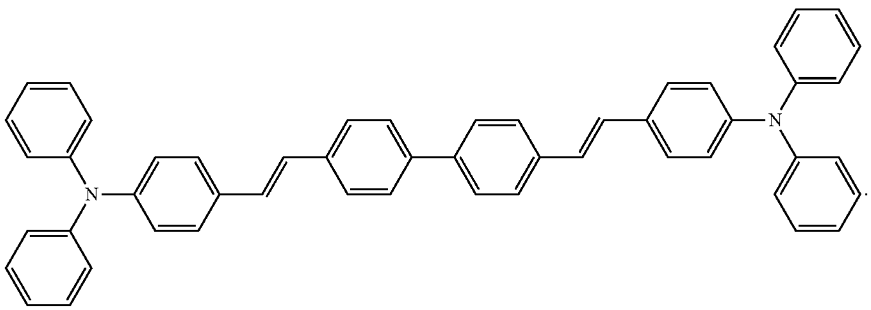

DPAVBi

Delayed Fluorescence Material

The emission layer may include a delayed fluorescence material. The delayed fluorescence material may be selected from compounds capable of emitting delayed fluorescent light based on the delayed fluorescent emission mechanism.

The delayed fluorescence material included in the emission layer may act as a host or a dopant depending on the type of other materials included in the emission layer.

In an embodiment, the difference between the triplet energy level (eV) of the delayed fluorescence material and the singlet energy level (eV) of the delayed fluorescence material may be about 0 eV or more and about 0.5 eV or less. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the light-emitting device 10 may be improved.

In an embodiment, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and ii) a material including a $C_8$-$C_{60}$ polycyclic group in which two or more cyclic groups are condensed while sharing boron (B).

In an embodiment, the delayed fluorescence material may include at least one of Compounds DF1 to DF9:

DF1

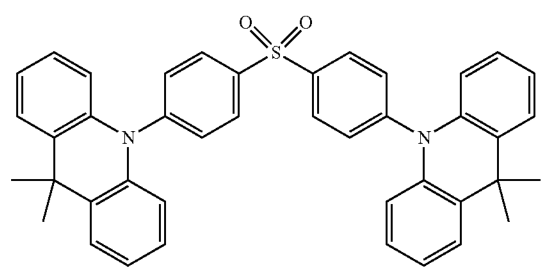

(DMAC-DPS)

DF2

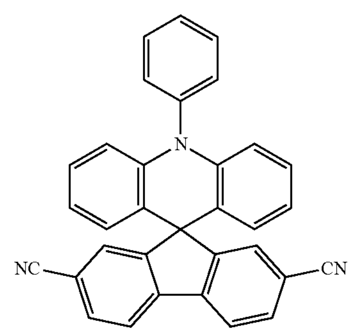

(ACRFLCN)

-continued

DF3

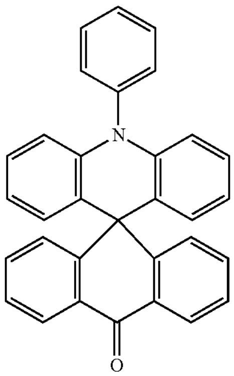

(ACRSA)

DF4

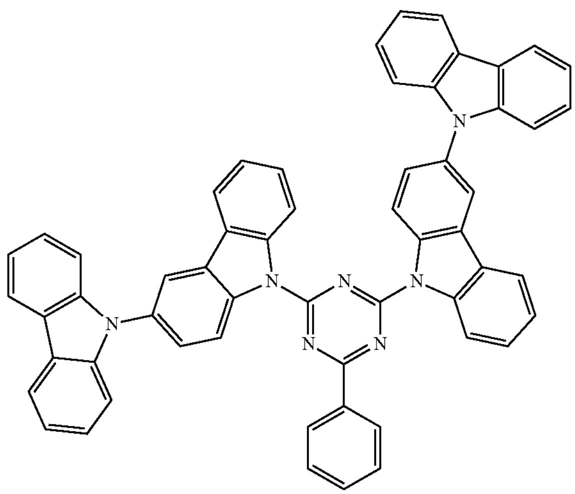

(CC2TA)

DF5

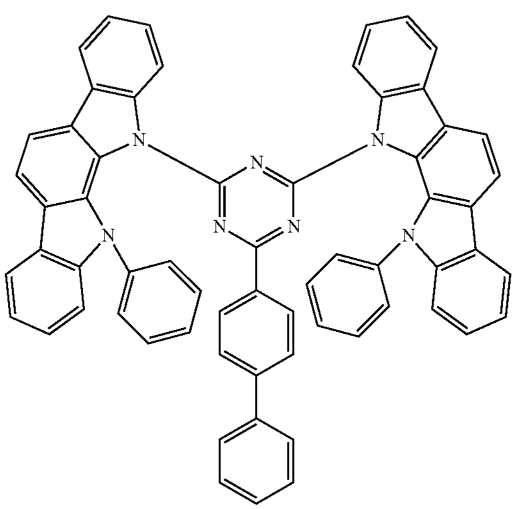

(PIC-TRZ)

-continued

DF6

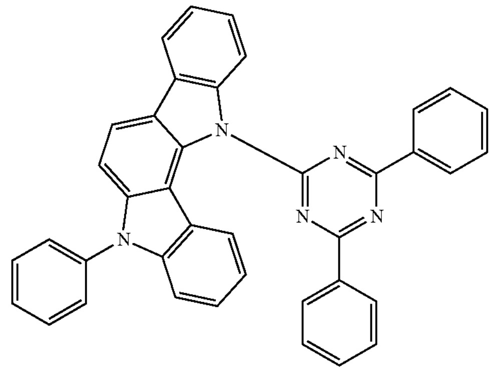

(PIC-TRZ2)

DF7

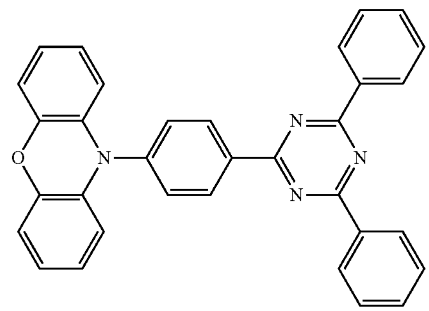

(PXZ-TRZ)

DF8

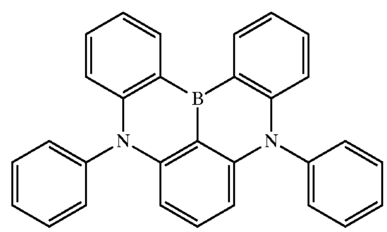

(DABNA-1)

DF9

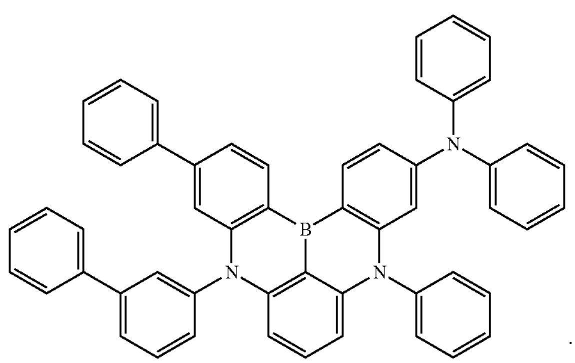

(DABNA-2)

Quantum Dot

The emission layer may include a quantum dot. As herein, the quantum dot refers to a crystal of a semiconductor compound, and may include any material capable of emitting light of various emission wavelengths according to the size of the crystal. The diameter of the quantum dot may be, for example, in a range of about 1 nm to about 10 nm. The quantum dot may be synthesized by a wet chemical process, a metal organic chemical vapor deposition process, a molecular beam epitaxy process, or any process similar thereto.

The wet chemical process refers to a method in which an organic solvent and a precursor material are mixed, and then, a quantum dot particle crystal is grown. When the crystal grows, the organic solvent acts as a dispersant naturally coordinated on the surface of the quantum dot crystal and controls the growth of the crystal. Accordingly, by using a process that is easily performed at low costs compared to a vapor deposition process, such as a metal organic chemical vapor deposition (MOCVD) process and a molecular beam epitaxy (MBE) process, the growth of quantum dot particles may be controlled.

The quantum dot may include a semiconductor compound of Groups II-VI, a semiconductor compound of Groups III-V, a semiconductor compound of Groups III-VI, a semiconductor compound of Groups I, III, and VI, a semiconductor compound of Groups IV-VI, an element or a compound of Group IV, or any combination thereof.

Examples of the semiconductor compound of Groups II-VI may include: a binary compound, such as CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the semiconductor compound of Groups III-V may include: a binary compound, such as GaN, GaP, GaAs, GaSb, AlN, AlP, AlAs, AlSb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound, such as GaAlNAs, GaAlNP, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. The semiconductor compound of Groups III-V may further include a Group II element. Examples of the semiconductor compound of Groups III-V further including a Group II element may include InZnP, InGaZnP, or InAlZnP.

Examples of the semiconductor compound of Groups III-VI may include: a binary compound, such as GaS, GaSe, $Ga_2Se_3$, GaTe, InS, InSe, $In_2Se_3$, or InTe; a ternary compound, such as $InGaS_3$ or $InGaSe_3$; or any combination thereof. Examples of the semiconductor compound of the Groups I, III, and VI may include: a ternary compound such as AgInS, $AgInS_2$, CuInS, $CuInS_2$, $CuGaO_2$, $AgGaO_2$, or $AgAlO_2$; or any combination thereof.

Examples of the semiconductor compound of Groups IV-VI may include: a binary compound, such as SnS, SnSe, SnTe, PbS, PbSe, or PbTe; a ternary compound, such as SnSeS, SnSeTe, SnSTe, PbSeS, PbSeTe, PbSTe, SnPbS, SnPbSe, or SnPbTe; a quaternary compound, such as SnPbSSe, SnPbSeTe, or SnPbSTe; or any combination thereof.

The Group IV element or compound may include: a single element compound, such as Si or Ge; a binary compound, such as SiC or SiGe; or any combination thereof. Each element included in a multi-element compound such as the binary compound, ternary compound and quaternary compound, may exist in a particle with a uniform concentration or non-uniform concentration.

The quantum dot may have a single structure having a uniform concentration of each element included in the corresponding quantum dot or a dual structure of a core-shell. In an embodiment, a material included in the core and a material included in the shell may be different from each other.

The shell of the quantum dot may act as a protective layer to prevent chemical degeneration of the core to maintain semiconductor characteristics and/or as a charging layer to impart electrophoretic characteristics to the quantum dot. The shell may be a single layer or a multi-layer. The interface between the core and the shell may have a concentration gradient that decreases toward the center of the element present in the shell.

Examples of the shell of the quantum dot may be an oxide of metal, metalloid, or non-metal, a semiconductor compound, or any combination thereof. Examples of the oxide of metal, metalloid, or non-metal may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; or any combination thereof. Examples of the semiconductor compound may include, as described herein: a semiconductor compound of Groups II-VI; a semiconductor compound of Groups III-V; a semiconductor compound of Groups III-VI; a semiconductor compound of Groups I, III, and VI; a semiconductor compound of Groups IV-VI; or any combination thereof. In an embodiment, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The full width at half maximum (FWHM) of an emission wavelength spectrum of the quantum dot may be about 45 nm or less, for example, about 40 nm or less, for example, about 30 nm or less, and within these ranges, color purity or color gamut may be increased. In addition, since light emitted through the quantum dot is emitted in all directions, a wide viewing angle may be improved.

In addition, the quantum dot may be specifically, a generally spherical, a generally pyramidal, a generally multi-armed, or a generally cubic nanoparticle, a generally nanotube-shaped, a generally nanowire-shaped, a generally nanofiber-shaped, or a generally nanoplate-shaped particle. Because the energy band gap can be adjusted by controlling the size of the quantum dot, light having various wavelength bands may be obtained from the quantum dot emission layer. Therefore, by using quantum dots of different sizes, a light-emitting device that emits light of various wavelengths may be implemented. In an embodiment, the size of the quantum dot may be selected to emit red, green and/or blue light. In addition, the size of the quantum dot may be configured to emit white light by combining light of various colors.

Electron Transport Region in Interlayer 130

The electron transport region may have: i) a single-layered structure consisting of a single layer consisting of a single material, ii) a single-layered structure consisting of a single layer consisting of a plurality of different materials, or iii) a multi-layered structure including a plurality of layers including different materials.

The electron transport region may include a buffer layer, a hole blocking layer, an electron control layer, an electron transport layer, an electron injection layer, or any combination thereof.

In an embodiment, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, for each structure, constituting layers are sequentially stacked from an emission layer.

The electron transport region (for example, the buffer layer, the hole blocking layer, the electron control layer, or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601 below:

$$[Ar_{601}]_{xe11}\text{-}[(L_{601})_{xe1}\text{-}R_{601}]_{xe21} \qquad \text{Formula 601}$$

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ may each be the same as described in connection with $Q_1$ herein, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In an embodiment, when xe11 in Formula 601 is 2 or more, two or more of $Ar_{601}$(s) may be linked to each other via a single bond.

In an embodiment, $Ar_{601}$ in Formula 601 may be a substituted or unsubstituted anthracene group.

In an embodiment, the electron transport region may include a compound represented by Formula 601-1:

Formula 601-1

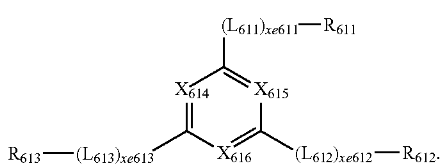

In Formula 601-1, $X_{614}$ may be N or C($R_{614}$), $X_{615}$ may be N or C($R_{615}$), $X_{616}$ may be N or C($R_{616}$), at least one of $X_{614}$ to $X_{616}$ may be N, $L_{611}$ to $L_{613}$ may each be the same as described in connection with $L_{601}$, xe611 to xe613 may each be the same as described in connection with xe1, $R_{611}$ to $R_{613}$ may each be the same as described in connection with $R_{601}$, and $R_{614}$ to $R_{16}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group substituted or unsubstituted at least one $R_{10a}$.

In an embodiment, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), tris-(8-hydroxyquinoline)aluminum ($Alq_3$), bis(2-methyl-8-quinolinolato-N1,08)-(1,1'-biphenyl-4-olato)aluminum (BAlq), 3-(biphenyl-4-yl)-5-(4-tert-butylphenyl)-4-phenyl-4H-1,2,4-triazole (TAZ), 4-(naphthalen-1-yl)-3,5-diphenyl-4H-1,2,4-triazole (NTAZ), or any combination thereof:

ET1

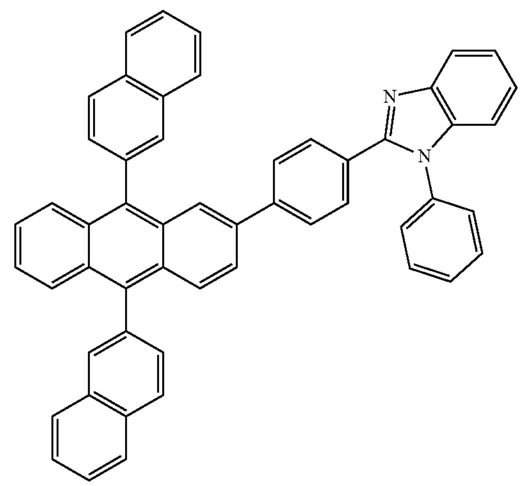

ET2

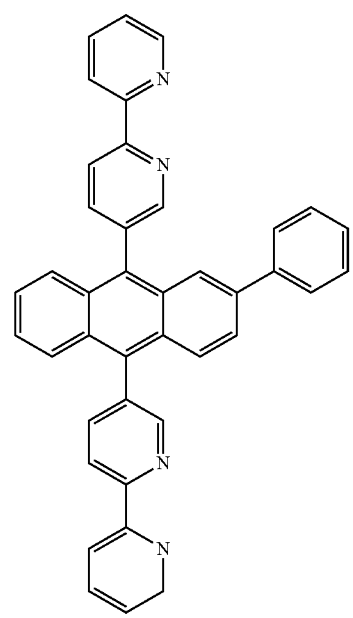

-continued
ET3
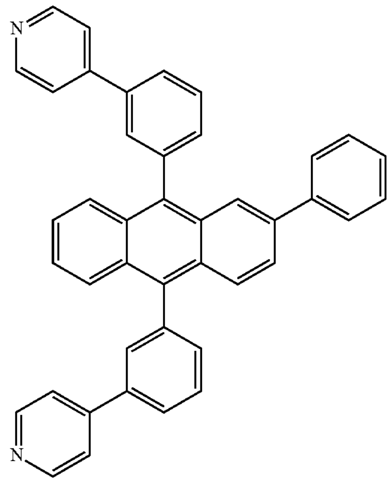
ET4
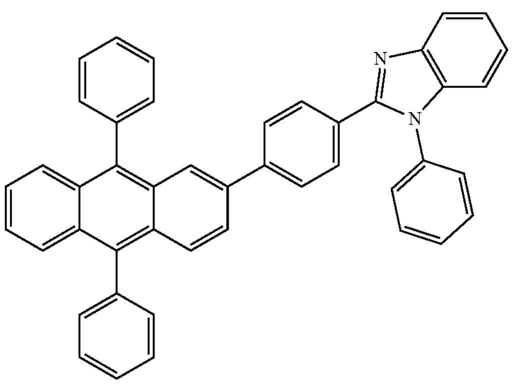
ET5
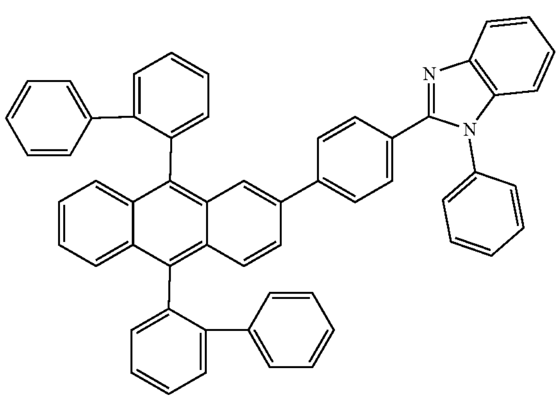
-continued
ET6
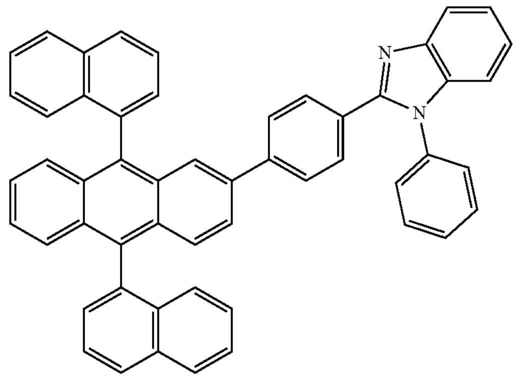
ET7
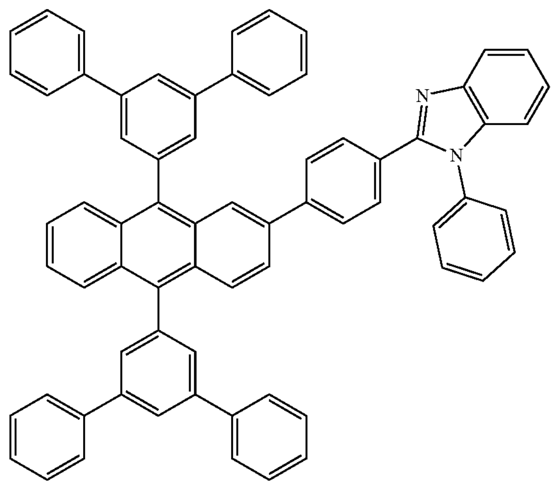
ET8
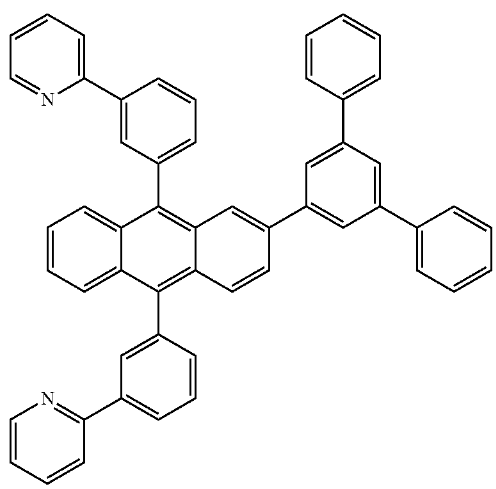

-continued
ET9
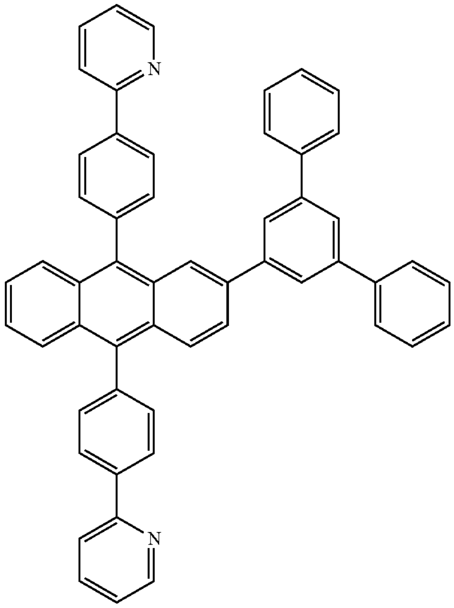
ET10
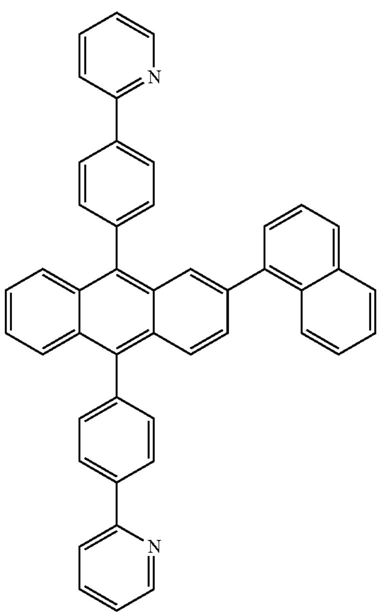
-continued
ET11
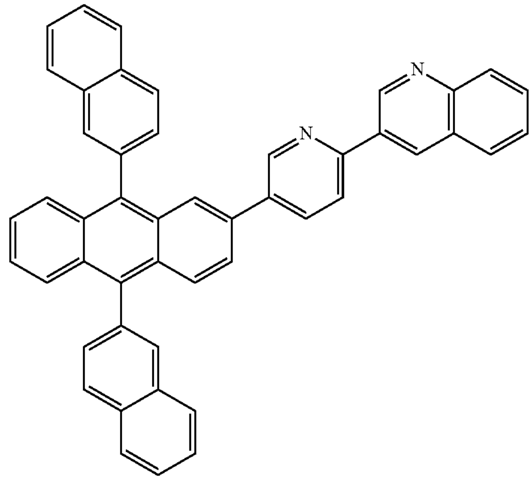
ET12
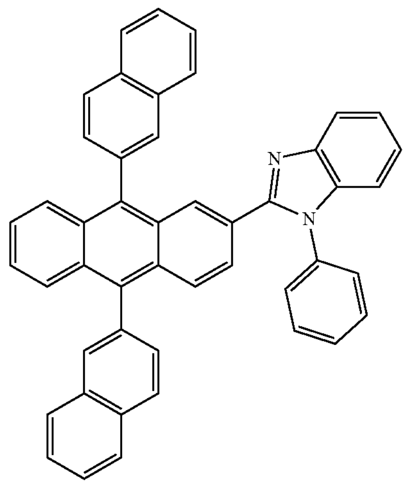
ET13
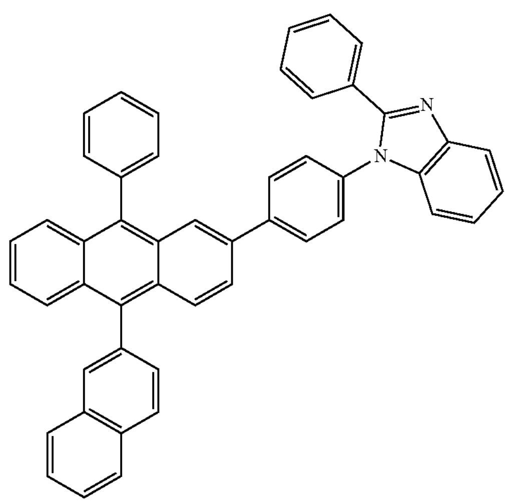

-continued
ET14
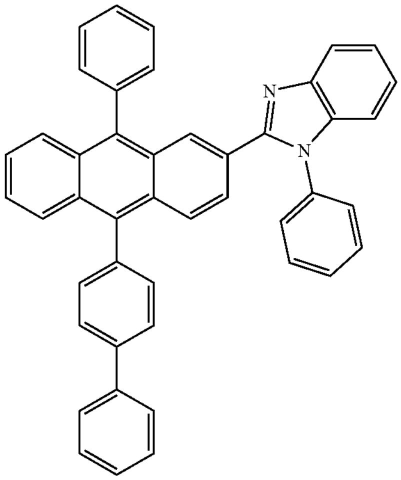
ET15
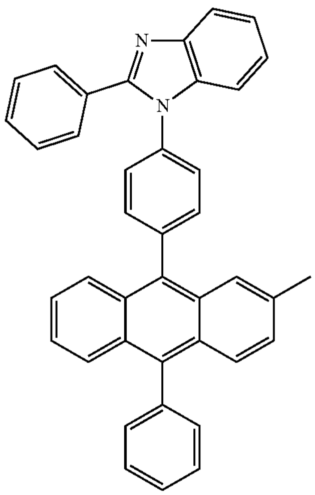
ET16
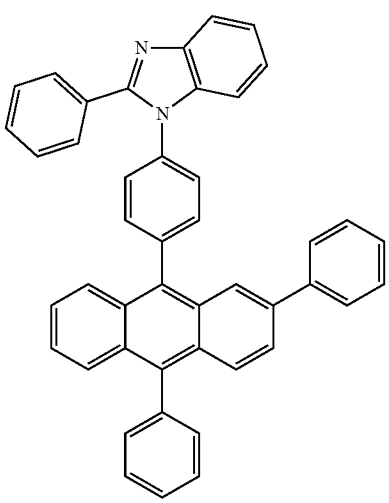
-continued
ET17
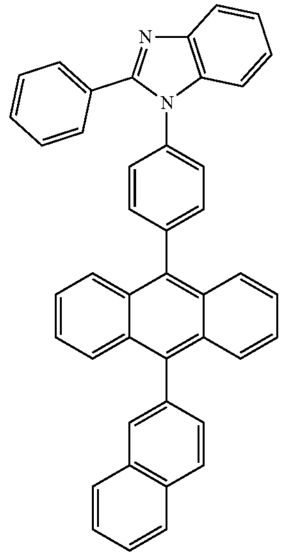
ET18
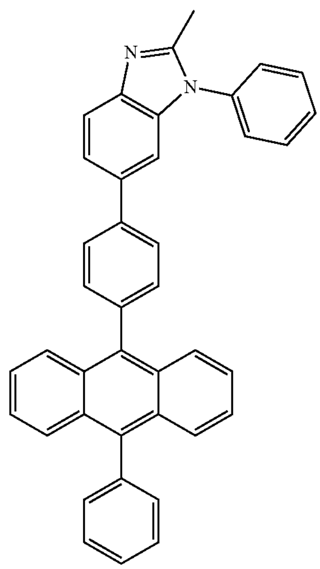
ET19
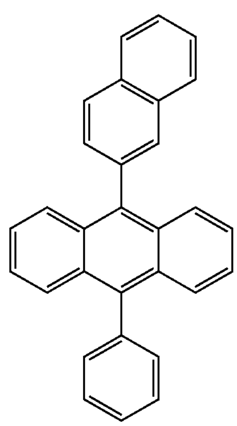

ET20
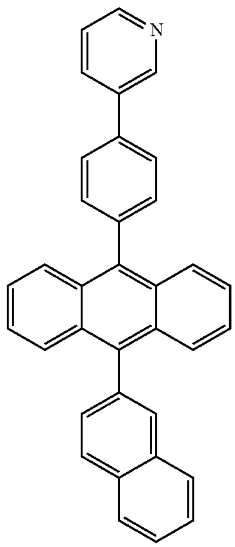
ET21
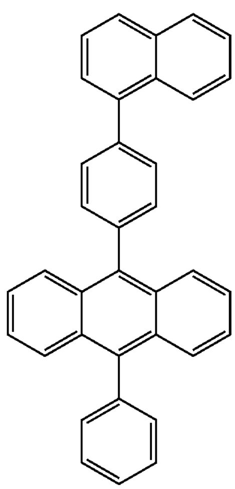
ET22
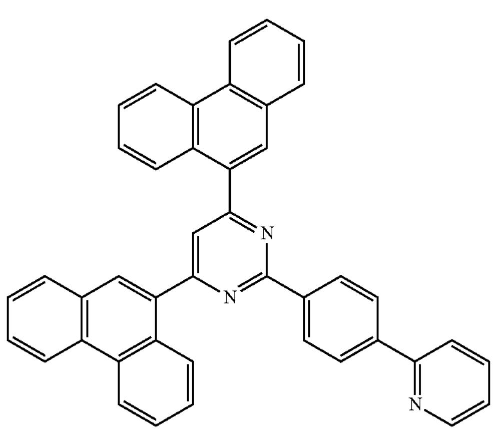
ET23
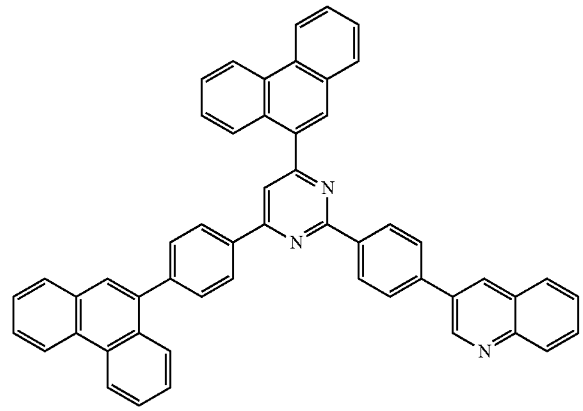
ET24
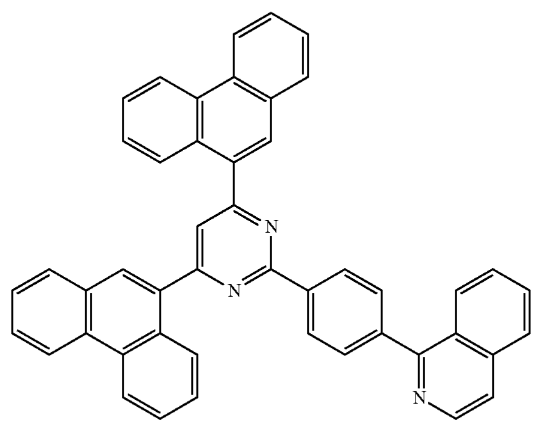
ET25
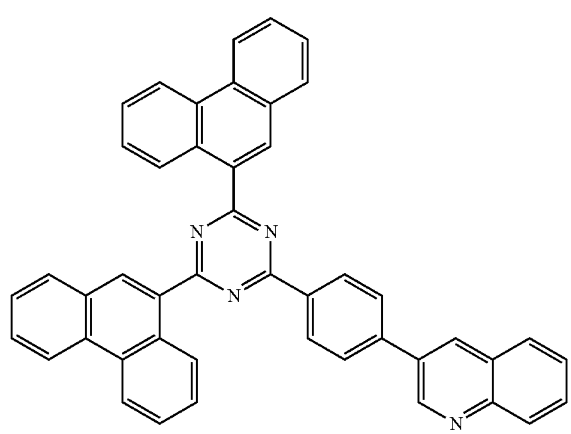

-continued
ET26
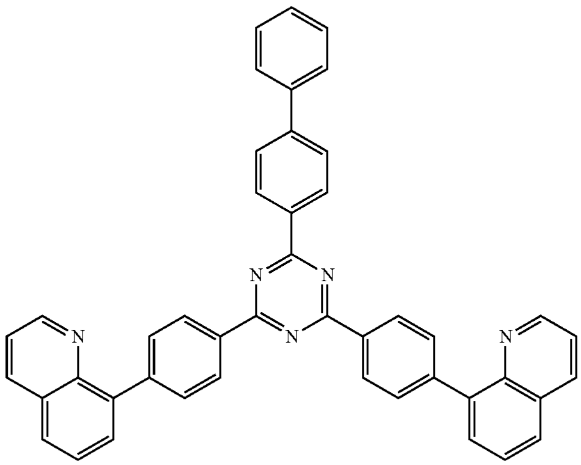
ET27
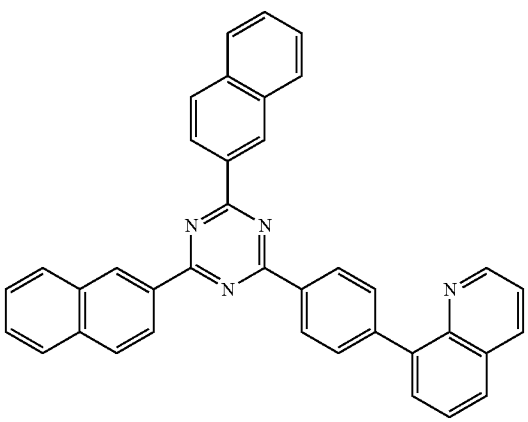
ET28
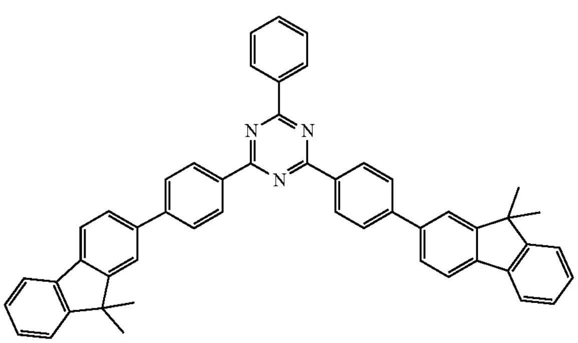
-continued
ET29
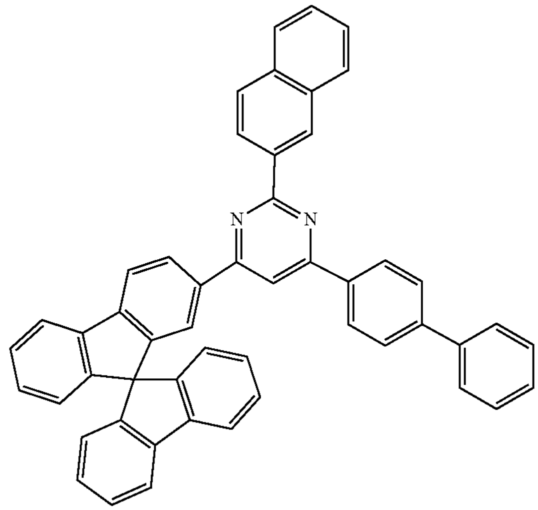
ET30
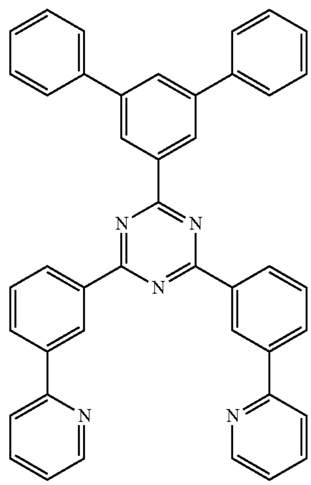
ET31
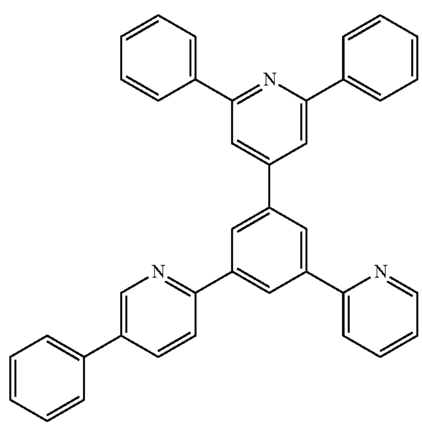

-continued
ET32
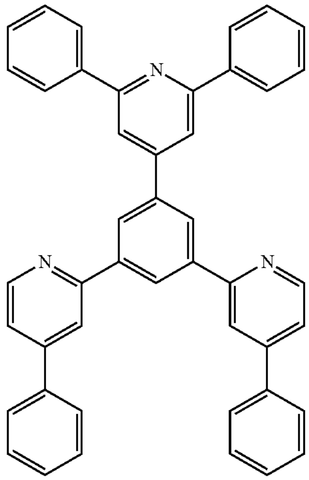
ET33
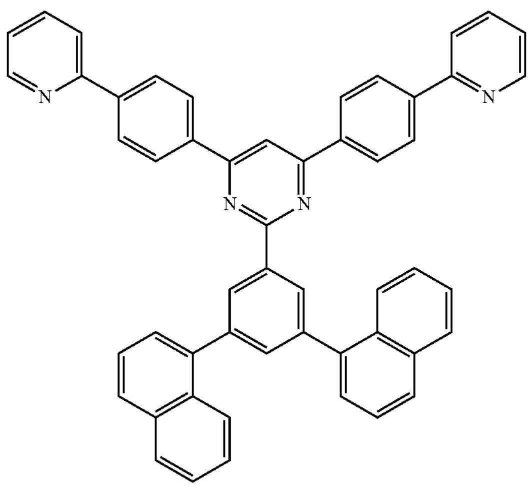
ET34
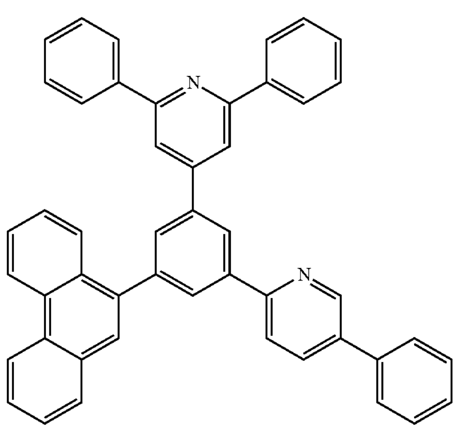
-continued
ET35
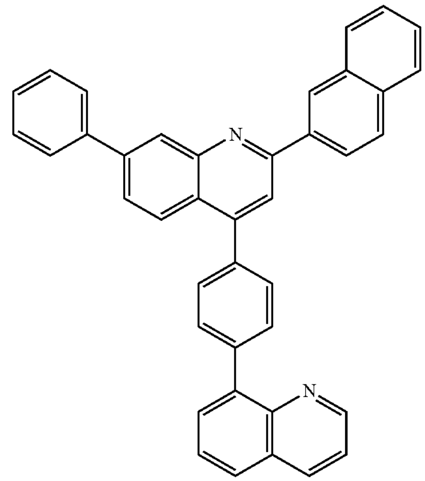
ET36
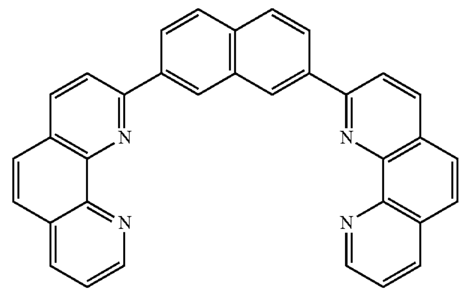
ET37
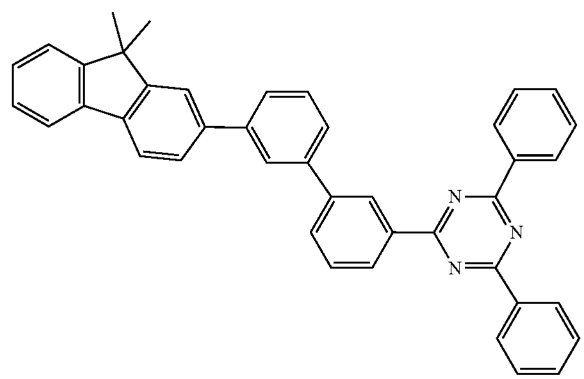
ET38
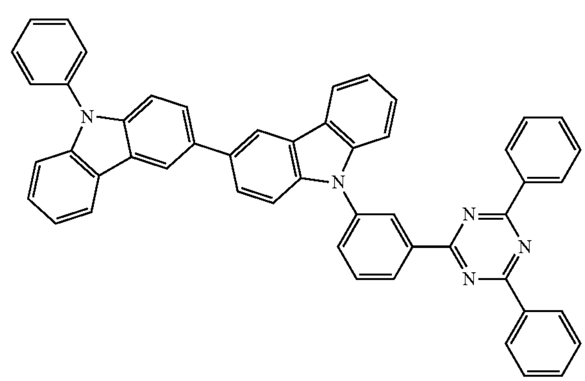

-continued
ET39
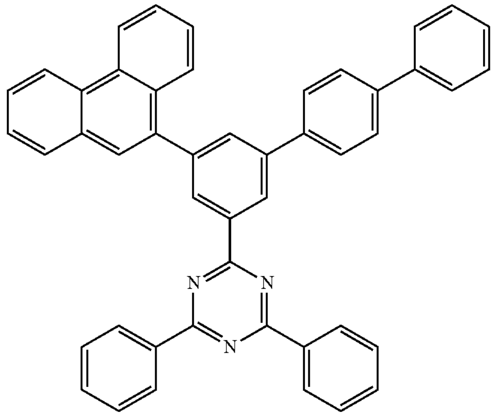
ET40
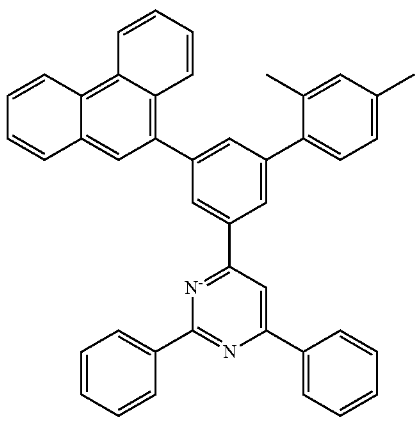
ET41
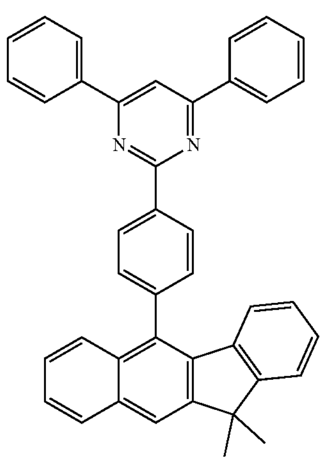
-continued
ET42
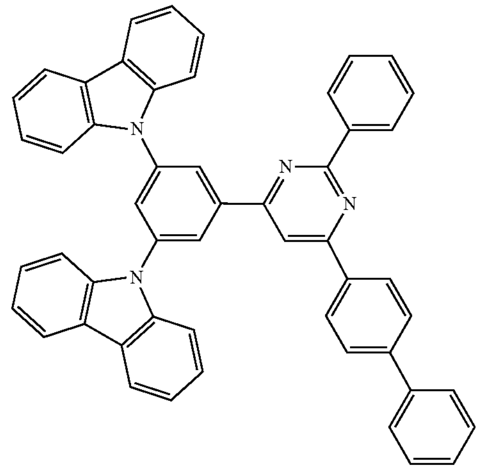
ET43
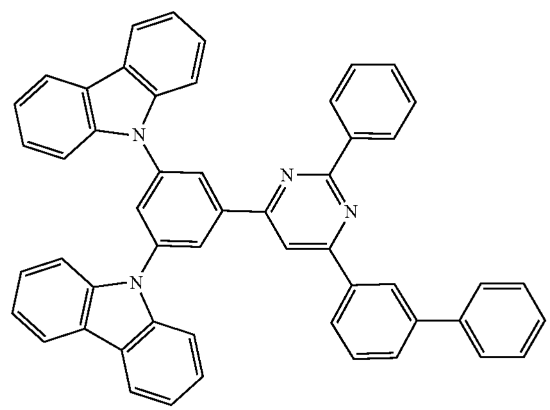
ET44
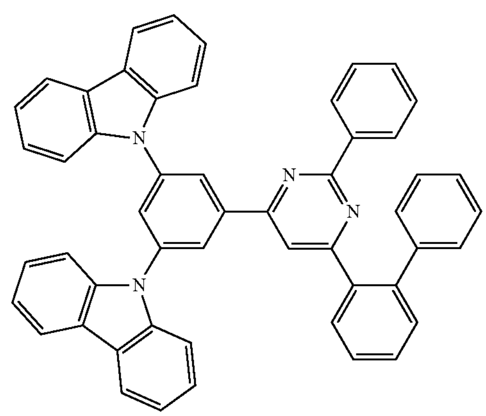
ET45
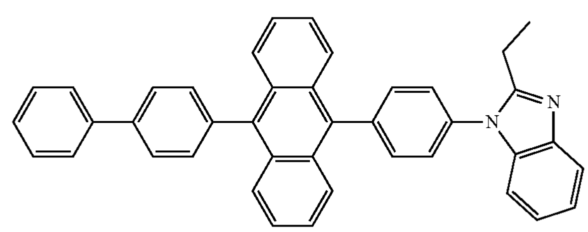

-continued

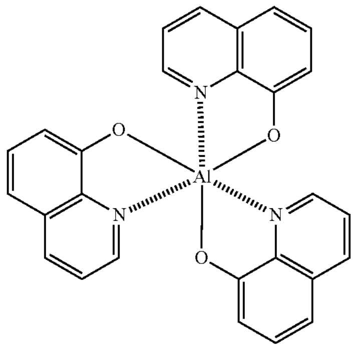

Alq3

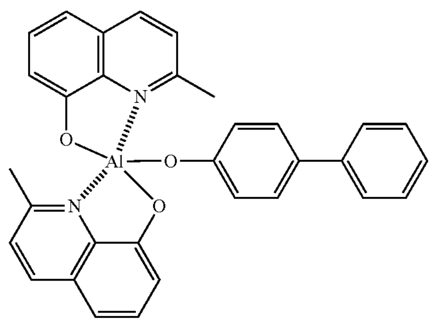

BAlq

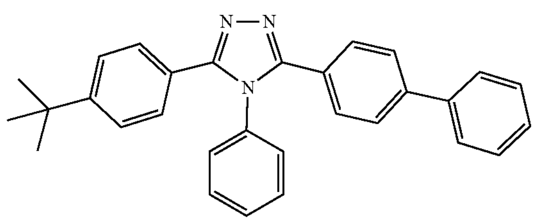

TAZ

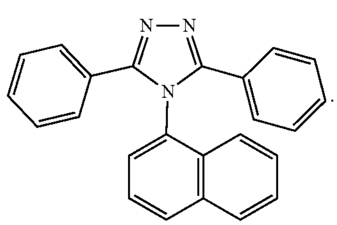

NTAZ

The thickness of the electron transport region may be from about 160 Å to about 5,000 Å, for example, from about 100 Å to about 4,000 Å. When the electron transport region includes a buffer layer, a hole blocking layer, an electron control layer, an electron transport layer, or any combination thereof, the thickness of the buffer layer, the hole blocking layer, or the electron control layer may each independently be from about 20 Å to about 1,000 Å, for example, about 30 Å to about 300 Å, and the thickness of the electron transport layer may be from about 100 Å to about 1,000 Å, for example, about 150 Å to about 500 Å. When the thicknesses of the buffer layer, the hole blocking layer, the electron control layer, the electron transport layer and/or the electron transport layer are within these ranges, satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth-metal complex, or any combination thereof. The metal ion of the alkali metal complex may be a Li ion, a Na ion, a K ion, a Rb ion, or a Cs ion, and the metal ion of the alkaline earth-metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a $L_1$ complex. The Li complex may include, for example, Compound ET-D1 (lithium quinolate, LiQ) or ET-D2:

ET-D1

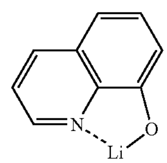

ET-D2

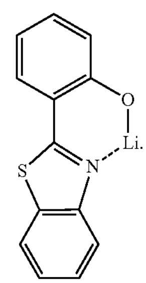

The electron transport region may include an electron injection layer that facilitates the injection of electrons from the second electrode 150. The electron injection layer may directly contact the second electrode 150.

The electron injection layer may have: i) a single-layered structure consisting of a single layer consisting of a single material, ii) a single-layered structure consisting of a single layer consisting of a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides, halides (for example, fluorides, chlorides, bromides, or iodides), or tellurides of the alkali metal, the alkaline earth metal, and the rare earth metal, or any combination thereof.

The alkali metal-containing compound may include alkali metal oxides, such as $Li_2O$, $Cs_2O$, or $K_2O$, alkali metal halides, such as LiF, NaF, CsF, KF, LiI, NaI, CsI, or KI, or any combination thereof. The alkaline earth metal-containing compound may include an alkaline earth metal compound, such as BaO, SrO, CaO, $Ba_xSr_{1-x}O$ (x is a real number satisfying the condition of $0<x<1$), or $Ba_xCa_{1-x}O$ (x is a real number satisfying the condition of $0<x<1$). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In an embodiment, the electron injection layer may further include an organic material (for example, a compound represented by Formula 601).

In an embodiment, the electron injection layer may consist of i) an alkali metal-containing compound (for example, an alkali metal halide), ii) a) an alkali metal-containing compound (for example, an alkali metal halide); and b) an alkali metal, an alkaline earth metal, a rare earth metal, or any combination thereof. In an embodiment, the electron injection layer may be a KI:Yb co-deposited layer or an RbI:Yb co-deposited layer.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

The thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

Second Electrode 150

The second electrode 150 may be located on the interlayer 130. The second electrode 150 may be a cathode, which is an electron injection electrode, and as the material for the second electrode 150, a metal, an alloy, an electrically conductive compound, or any combination thereof, each having a low work function, may be used.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof. The second electrode 150 may be a transmissive electrode, a semi-transmissive electrode, or a reflective electrode. The second electrode 150 may have a single-layered structure or a multi-layered structure including two or more layers.

Capping Layer

The first capping layer 190-1 and the second capping layer 190-2 may be located outside the second electrode 150. A lower capping layer may be located outside the first electrode 110. In detail, the light-emitting device 10 may have a structure in which the first electrode 110, the interlayer 130, the second electrode 150, the first capping layer 190-1, and the second capping layer 190-2 are sequentially stacked in this stated order. The light-emitting device 10 may have a structure in which a third capping layer, the first electrode 110, the interlayer 130, the second electrode 150, the first capping layer 190-1, and the second capping layer 190-2 are sequentially stacked in this stated order.

Light generated in an emission layer of the interlayer 130 of the light-emitting device 10 may be extracted toward the outside through the first electrode 110, which is a semi-transmissive electrode or a transmissive electrode, and the third capping layer, and light generated in an emission layer of the interlayer 130 of the light-emitting device 10 may be extracted toward the outside through the second electrode 150, which is a semi-transmissive electrode or a transmissive electrode, the first capping layer 190-1, and the second capping layer 190-2.

The first capping layer 190-1, the second capping layer 190-2, and the third capping layer may increase external luminescence efficiency, although not wanting to be bound by theory, due to the principle of constructive interference. Accordingly, light extraction efficiency of the light-emitting device 10 is increased, so that the luminescence efficiency of the light-emitting device 10 may be improved.

Each of the first capping layer 190-1 and the second capping layer 190-2 may further include a material having a refractive index (at 589 nm) of about 1.6 or more. The third capping layer may include a material having a refractive index (at 589 nm) of about 1.6 or more.

The first capping layer 190-1, the second capping layer 190-2, and the third capping layer may each independently be an organic capping layer including an organic material, an inorganic capping layer including an inorganic material, or an organic-inorganic composite capping layer including an organic material and an inorganic material.

The first capping layer 190-1 may include at least one compound selected from Formulae 1-1 to 1-3. The second capping layer 190-2 may include at least one compound selected from Formulae 2-1 to 2-6.

In addition, at least one of the first capping layer 190-1, the second capping layer 190-2, and the third capping layer may each independently further include a carbocyclic compound, a heterocyclic compound, an amine group-containing compound, a porphine derivative, a phthalocyanine derivative, a naphthalocyanine derivative, an alkali metal complex, an alkaline earth-metal complex, or any combination thereof. The carbocyclic compound, the heterocyclic compound, and the amine group-containing compound may be optionally substituted with a substituent containing O, N, S, Se, Si, F, Cl, Br, I, or any combination thereof. In an embodiment, at least one of the first capping layer 190-1, the second capping layer 190-2, and the third capping layer may each independently further include a compound represented by Formula 201, a compound represented by Formula 202, or any combination thereof.

In one or more embodiments, at least one of the first capping layer 190-1, the second capping layer 190-2, and the third capping layer may each independently further include one of Compounds HT28 to HT33, one of Compounds CP1 to CP6, N4,N4'-di(naphthalen-2-yl)-N4,N4'-diphenyl-[1,1'-biphenyl]-4,4'-diamine (β-NPB), or any combination thereof:

CP1

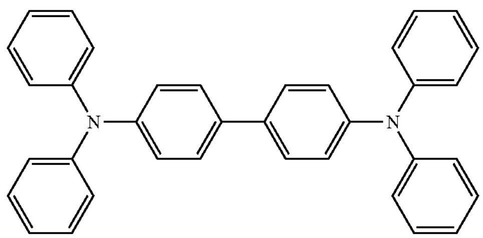

CP2

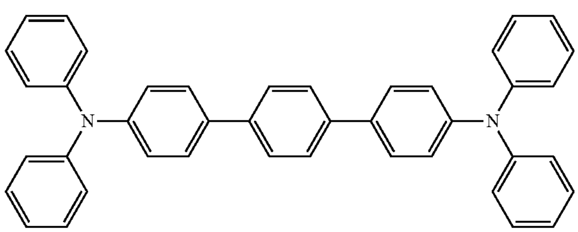

CP3

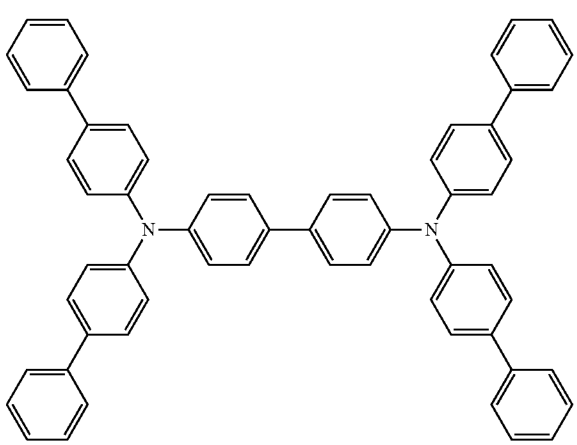

-continued

CP4

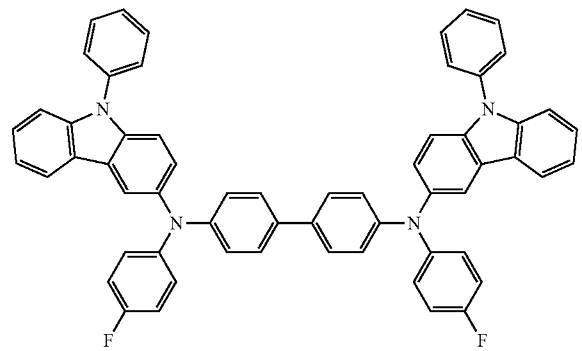

CP5

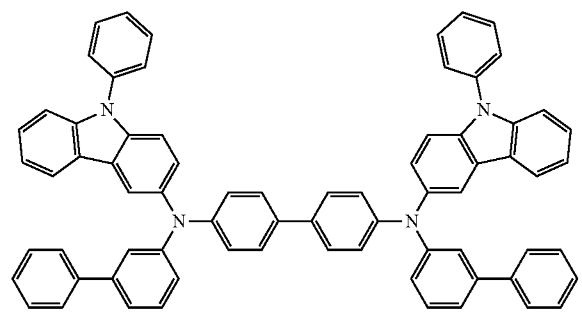

CP6

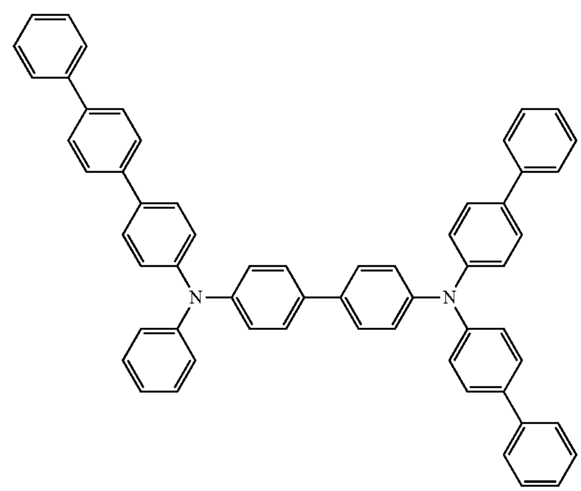

β-NPB

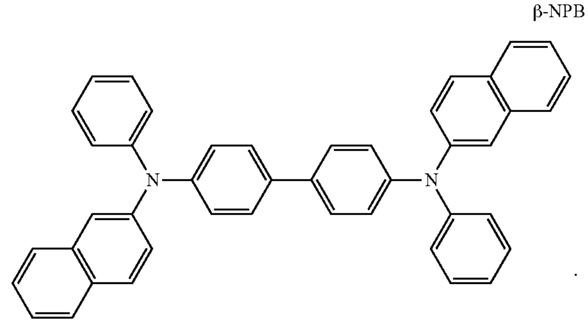

Film

The condensed cyclic compound represented by Formula 1 may be included in various films. Thus, according to another aspect, a film including the condensed cyclic compound represented by Formula 1 may be provided. The film, for example, may be an optical member (or, a light controller), for example, a color filter, a color conversion member, a capping layer, a light extraction efficiency enhancement layer, a selective light-absorbing layer, a polarizing layer, a quantum dot-containing layer, etc., a light-blocking member, for example, a light-reflecting layer, a light-absorbing layer, etc., a protective member, for example, an insulating layer, a dielectric layer, etc., or the like.

Electronic Apparatus

The light-emitting device may be included in various electronic apparatuses. In an embodiment, an electronic apparatus including the light-emitting device may be a light-emitting apparatus, an authentication apparatus, or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. In an embodiment, light emitted from the light-emitting device may be blue light or white light. The light-emitting device may be the same as described above. In an embodiment, the color conversion layer may include a quantum dot. The quantum dot may be, for example, a quantum dot as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film may be located between the plurality of subpixel areas to define each of the subpixel areas. The color filter may further include a plurality of color filter areas and light-blocking patterns located between the plurality of color filter areas, and the color conversion layer may further include a plurality of color conversion areas and light-blocking patterns located between the plurality of color conversion areas.

The plurality of color filter areas (or the plurality of color conversion areas) may include a first area emitting first-color light, a second area emitting second-color light, and/or a third area emitting third-color light, and the first-color light, the second-color light, and/or the third-color light may have different maximum emission wavelengths from one another. In an embodiment, the first-color light may be red light, the second-color light may be green light, and the third-color light may be blue light. In an embodiment, the plurality of color filter areas (or the plurality of color conversion areas) may include quantum dots. In detail, the first area may include a red quantum dot, the second area may include a green quantum dot, and the third area may not include a quantum dot. The quantum dot may be the same as described herein. Each of the first area, the second area and/or the third area may further include a scattering body.

In an embodiment, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths from one another. In detail, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an activation layer, wherein any one of the source electrode and the drain electrode may be electrically connected to any one of the first electrode and the second electrode of the light-emitting device. The thin-film transistor may further include a gate electrode, a gate insulating film, or the like. The activation layer may include a crystalline silicon, an amorphous silicon, an organic semiconductor, an oxide semiconductor, or the like.

The electronic apparatus may further include a sealing portion for sealing the light-emitting device. The sealing portion may be located between the color filter and/or the color conversion layer and the light-emitting device. The sealing portion may allow light from the light-emitting device to be extracted to the outside, while simultaneously preventing ambient air and moisture from penetrating into the light-emitting device. The sealing portion may be a sealing substrate including a transparent glass substrate or a plastic substrate. The sealing portion may be a thin film encapsulation layer including at least one layer of an organic layer and/or an inorganic layer. When the sealing portion is a thin film encapsulation layer, the electronic apparatus may be flexible.

Various functional layers may be additionally located on the sealing portion, in addition to the color filter and/or the color conversion layer, according to the use of the electronic apparatus. Examples of the functional layers may include a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device, a biometric information collector. The electronic apparatus may take the form of, or be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 2:
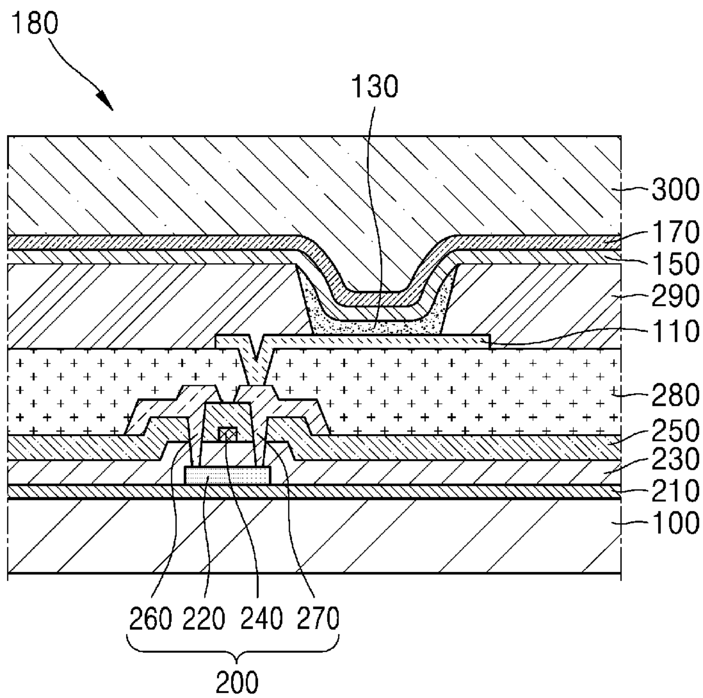
FIG. 2 is a schematic cross-sectional view of an embodiment of a light-emitting apparatus including a light-emitting device constructed according to the principles of the invention.
Figure 3:
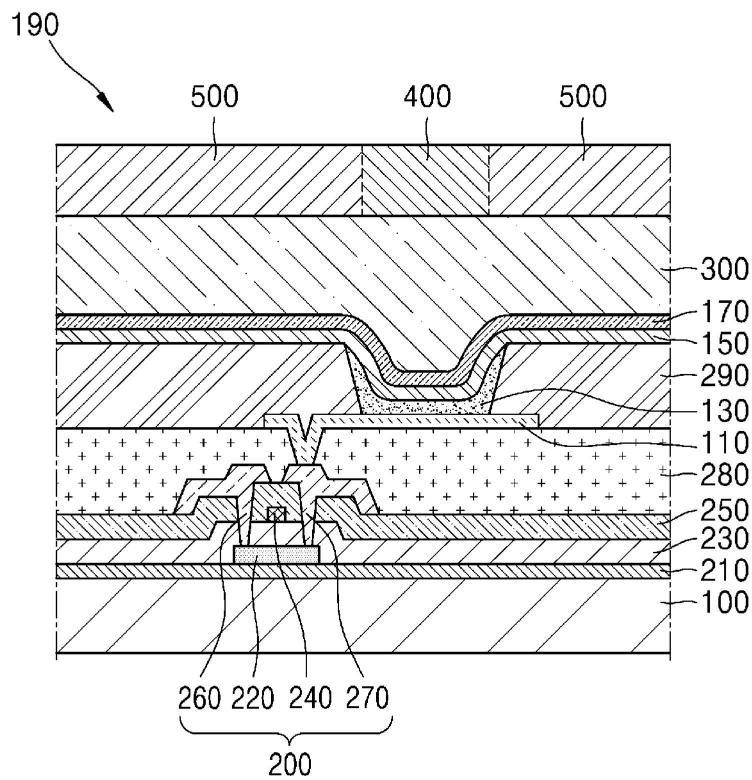
FIG. 3 is a schematic cross-sectional view of another embodiment of a light-emitting apparatus including a light-emitting device constructed according to the principles of the invention.

Description of FIGS. 2 and 3

FIG. 2 is a schematic cross-sectional view of an embodiment of a light-emitting apparatus including a light-emitting device constructed according to the principles of the invention.

The light-emitting apparatus 180 of FIG. 2 includes a substrate 100, a thin-film transistor (TFT) 200, a light-emitting device 10, and an encapsulation portion 300 that seals the light-emitting device 10.

The substrate 100 may be a flexible substrate, a glass substrate, or a metal substrate. A buffer layer 210 may be located on the substrate 100. The buffer layer 210 may prevent penetration of impurities through the substrate 100 and may provide a substantially flat surface on the substrate 100.

A TFT 200 may be located on the buffer layer 210. The TFT 200 may include an activation layer 220, a gate electrode 240, a source electrode 260, and a drain electrode 270. The activation layer 220 may include an inorganic semiconductor such as silicon or polysilicon, an organic semiconductor, or an oxide semiconductor, and may include a source region, a drain region, and a channel region.

A gate insulating film 230 for insulating the activation layer 220 from the gate electrode 240 may be located on the activation layer 220, and the gate electrode 240 may be located on the gate insulating film 230.

An interlayer insulating film 250 may be located on the gate electrode 240. The interlayer insulating film 250 may be located between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be located to be in contact with the exposed portions of the source region and the drain region of the activation layer 220.

The TFT 200 may be electrically connected to the light-emitting device to drive the light-emitting device 10 and may be protected by being covered with a passivation layer 280. The passivation layer 280 may include an inorganic insulating film, an organic insulating film, or a combination thereof. The light-emitting device 10 may be provided on the passivation layer 280. The light-emitting device 10 may include the first electrode 110, the interlayer 130, and the second electrode 150.

The first electrode 110 may be located on the passivation layer 280. The passivation layer 280 does not completely cover the drain electrode 270 and exposes a portion of the drain electrode 270, and the first electrode 110 may be connected to the exposed portion of the drain electrode 270.

A pixel defining layer 290 including an insulating material may be located on the first electrode 110. The pixel defining layer 290 may expose a certain region of the first electrode 110, and the interlayer 130 may be formed in the exposed region of the first electrode 110. The pixel defining layer 290 may be a polyimide or polyacryl-based organic film. At least some layers of the interlayer 130 may extend beyond the upper portion of the pixel defining layer 290 to be located in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on the light-emitting device to protect the light-emitting device from moisture or oxygen. The encapsulation portion 300 may include: an inorganic film including a silicon nitride ($SiN_x$), a silicon oxide ($SiO_x$), an indium tin oxide, an indium zinc oxide, or any combination thereof, an organic film including a polyethylene terephthalate, a polyethylene naphthalate, a polycarbonate, a polyimide, a polyethylene sulfonate, a polyoxymethylene, a polyarylate, a hexamethyldisiloxane, an acrylic resin (for example, a polymethyl methacrylate, a polyacrylic acid, or the like), an epoxy-based resin (for example, an aliphatic glycidyl ether (AGE), or the like), or a combination thereof; or a combination of the inorganic film and the organic film.

FIG. 3 is a schematic cross-sectional view of another embodiment of a light-emitting apparatus including a light-emitting device constructed according to the principles of the invention.

The light-emitting apparatus 190 of FIG. 3 is substantially the same as the light-emitting apparatus 180 of FIG. 2, except that a light-blocking pattern 500 and a functional region 400 are additionally located on the encapsulation portion 300. The functional region 400 may be i) a color filter area, ii) a color conversion area, or iii) a combination of the color filter area and the color conversion area. In an embodiment, the light-emitting device 10 included in the light-emitting apparatus 190 of FIG. 3 may be a tandem light-emitting device.

Manufacture Method

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed and the structure of a layer to be formed.

Definition of Terms

As used herein, the expression "(a capping layer) includes a compound represented by Formula 1-1" as used herein may include a case in which "(a capping layer) includes one compound of Formula 1-1 or two or more different compounds of Formula 1-1". In addition, descriptions of Formulae 1-2, 1-3, 2-1 to 2-6 may be understood in the same manner.

As used herein, the term "interlayer" refers to a single layer and/or all of a plurality of layers located between a first electrode and a second electrode of a light-emitting device.

As used herein, the term "atom" may mean an element or its corresponding radical bonded to one or more other atoms.

The terms "hydrogen" and "deuterium" refer to their respective atoms and corresponding radicals, and the terms "—F, —Cl, —Br, and —I" are radicals of, respectively, fluorine, chlorine, bromine, and iodine.

As used herein, a substituent for a monovalent group, e.g., alkyl, may also be, independently, a substituent for a corresponding divalent group, e.g., alkylene.

The term "$C_3$-$C_{60}$ carbocyclic group" as used herein refers to a cyclic group consisting of carbon only as a ring-forming atom and having three to sixty carbon atoms, and the term "$C_1$-$C_{60}$ heterocyclic group" as used herein refers to a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are fused with each other. In an embodiment, the number of ring-forming atoms of the $C_1$-$C_{60}$ heterocyclic group may be 3 to 61.

The term "cyclic group" as used herein includes the $C_3$-$C_{60}$ carbocyclic group and the $C_1$-$C_{60}$ heterocyclic group.

The term "n electron-rich $C_3$-$C_{60}$ cyclic group" as used herein refers to a cyclic group that has three to sixty carbon atoms and does not include *—N═*' as a ring-forming moiety, and the term "n electron-deficient nitrogen-containing $C_1$-$C_{60}$ cyclic group" as used herein refers to a heterocyclic group that has one to sixty carbon atoms and includes *—N═*' as a ring-forming moiety.

In an embodiment, the $C_3$-$C_{60}$ carbocyclic group may be i) a group T1 or ii) a fused cyclic group in which two or more groups T1 are fused with each other, for example, a cyclopentadiene group, an adamantane group, a norbornane group, a benzene group, a pentalene group, a naphthalene group, an azulene group, an indacene group, acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group.

The $C_1$-$C_{60}$ heterocyclic group may be i) a group T2, ii) a fused cyclic group in which two or more groups T2 are fused with each other, or iii) a fused cyclic group in which at least one group T2 and at least one group T1 are fused with each other, for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group.

The π electron-rich $C_3$-$C_{60}$ cyclic group may be i) a group T1, ii) a fused cyclic group in which two or more groups T1 are fused with each other, iii) a group T3, iv) a fused cyclic group in which two or more groups T3 are fused with each other, or v) a fused cyclic group in which at least one group T3 and at least one group T1 are fused with each other, for example, a $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, or a benzothienodibenzothiophene group.

The π electron-deficient nitrogen-containing $C_1$-$C_{60}$ cyclic group may be i) a group T4, ii) a fused cyclic group in which two or more group T4 are fused with each other, iii) a fused cyclic group in which at least one group T4 and at least one group T1 are fused with each other, iv) a fused cyclic group in which at least one group T4 and at least one group T3 are fused with each other, or v) a fused cyclic group in which at least one group T4, at least one group T1, and at least one group T3 are fused with one another, for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group.

The group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as used herein refer to a group that is fused with a cyclic group, a monovalent group, or a polyvalent group (for example, a divalent group, a trivalent group, a tetravalent group, or the like), according to the structure of a formula described with corresponding terms. In an embodiment, "a benzene group" may be a benzo group, a phenyl group, a phenylene group, or the like, which may be easily understood by one of ordinary skill in the art according to the structure of a formula including the "benzene group."

In an embodiment, examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic fused polycyclic group, and a monovalent non-aromatic fused heteropolycyclic group, and examples of the divalent $C_3$-$C_{60}$ carbocyclic group and the monovalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic fused polycyclic group, and a substituted or unsubstituted divalent non-aromatic fused heteropolycyclic group.

The term "$C_1$-$C_{60}$ alkyl group" as used herein refers to a linear or branched aliphatic hydrocarbon monovalent group that has one to sixty carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having a structure corresponding to the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having a structure corresponding to the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having a structure corresponding to the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof include a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having a structure corresponding to the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has 1 to 10 carbon atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having a structure corresponding to the $C_1$-$C_{10}$ heterocycloalkyl group.

The term $C_3$-$C_{10}$ cycloalkenyl group used herein refers to a monovalent cyclic group that has 3 to 10 carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having a structure corresponding to the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having a structure corresponding to the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be fused with each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be fused with each other.

The term "monovalent non-aromatic fused polycyclic group" as used herein refers to a monovalent group (for example, having 8 to 60 carbon atoms) having two or more rings fused with each other, only carbon atoms as ring-forming atoms, and no aromaticity in its entire molecular structure. Examples of the monovalent non-aromatic fused polycyclic group include an indenyl group, a fluorenyl group, a spiro-bifluorenyl group, a benzofluorenyl group, an indenophenanthrenyl group, and an indenoanthracenyl group. The term "divalent non-aromatic fused polycyclic group" as used herein refers to a divalent group having a structure corresponding to a monovalent non-aromatic fused polycyclic group.

The term "monovalent non-aromatic fused heteropolycyclic group" as used herein refers to a monovalent group (for example, having 1 to 60 carbon atoms) having two or more rings fused to each other, at least one heteroatom other than carbon atoms, as a ring-forming atom, and non-aromaticity in its entire molecular structure. Examples of the monovalent non-aromatic fused heteropolycyclic group include a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic heterofused polycyclic group" as used herein refers to a divalent group having a structure corresponding to a monovalent non-aromatic heterofused polycyclic group.

The term "$C_6$-$C_{60}$ aryloxy group" as used herein refers to —$OA_{102}$ (wherein $A_{102}$ is the $C_6$-$C_{60}$ aryl group), and the term "$C_6$-$C_{60}$ arylthio group" as used herein refers to —$SA_{103}$ (wherein $A_{103}$ is the $C_6$-$C_{60}$ aryl group).

The term "$C_7$-$C_{60}$ aryl alkyl group" as used herein refers to -$A_{104}A_{105}$ (wherein $A_{104}$ is a $C_1$-$C_{54}$ alkylene group, and $A_{105}$ is a $C_6$-$C_{59}$ aryl group), and the term $C_2$-$C_{60}$ heteroaryl alkyl group" as used herein refers to -$A_{106}A_{107}$ (wherein $A_{106}$ is a $C_1$-$C_{59}$ alkylene group, and $A_{107}$ is a $C_1$-$C_{59}$ heteroaryl group).

The term "$R_{10a}$" as used herein refers to:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{11})(Q_2)(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{12})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof, or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

$Q_1$ to $Q_3$, $Q_{11}$ to $Q_{13}$, $Q_{21}$ to $Q_{23}$ and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, a $C_7$-$C_{60}$ aryl alkyl group; or a $C_2$-$C_{60}$ heteroaryl alkyl group.

The term "heteroatom" as used herein refers to any atom other than a carbon atom. Examples of the heteroatom include O, S, N, P, Si, B, Ge, Se, or any combination thereof.

The term "the third-row transition metal" as used herein includes hafnium (Hf), tantalum (Ta), tungsten (W), rhenium (Re), osmium (Os), iridium (Ir), platinum (Pt), and gold (Au).

The term "Ph" as used herein refers to a phenyl group, the term "Me" as used herein refers to a methyl group, the term "Et" as used herein refers to an ethyl group, the term "ter-Bu" or "$Bu^t$" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula or moiety.

Hereinafter, a compound made according to the principles and certain embodiments of the invention and a light-emitting device made according to the principles and certain embodiments of the invention will be described in detail with reference to Synthesis Examples and Comparative Examples. The wording "B was used instead of A" used in describing Synthesis Examples refers to that an identical molar equivalent of B was used in place of A.

EXAMPLES

Reference Example

As an anode, a 15 Ω/cm² (1,200 Å) ITO glass substrate available from Corning, Inc. of Corning, N.Y. (may be referred hereinafter as "ITO glass substrate) was cut to a size of 50 mm×50 mm×0.5 mm, sonicated with acetone isopropyl alcohol and pure water for 15 minutes each, and then cleaned by irradiation of ultraviolet rays and exposure of ozone thereto for 30 minutes. Then, the ITO glass substrate was loaded onto a vacuum deposition apparatus.

Compound HT1 was vacuum-deposited on the ITO anode formed on the glass substrate to form a hole injection layer having a thickness of 120 nm, and then, Compound HT2 was vacuum-deposited on the hole injection layer to form a hole transport layer having a thickness of 10 nm.

Compounds BH1 (host) and BD1 (dopant), as depicted below, were co-deposited at a weight ratio of 98:2 on the hole transport layer to form an emission layer having a thickness of 20 nm.

Subsequently, Compound 1-1-1 (referenced above as Formula 1-1-1) and LiQ were co-deposited at a weight ratio of 50:50 on the emission layer to form an electron transport layer having a thickness of 30 nm. Ytterbium (Yb) was deposited on the electron transport layer to form an electron injection layer having a thickness of 1 nm. The elements Ag and Mg were vacuum-deposited at a weight ratio of 97:3 on the electron injection layer to form a cathode having a thickness of 10 nm. Compound 2-2-2 (referenced above as Formula 2-2-2) was deposited on the cathode to form a second capping layer having a thickness of 10 nm, thereby completing the manufacture of a light-emitting device.

Example 1

As an anode, an ITO 15 Ω/cm² (1,200 Å) glass substrate was cut to a size of 50 mm×50 mm×0.5 mm, sonicated with acetone isopropyl alcohol and pure water for 15 minutes each, and then cleaned by irradiation of ultraviolet rays and exposure to ozone for 30 minutes. Then, the ITO glass substrate was loaded onto a vacuum deposition apparatus.

Compound HT1 was vacuum-deposited on the ITO anode formed on the glass substrate to form a hole injection layer having a thickness of 120 nm, and then, Compound HT2 was vacuum-deposited on the hole injection layer to form a hole transport layer having a thickness of 10 nm.

Compounds BH1 (host) and BD1 (dopant) were co-deposited at a weight ratio of 98:2 on the hole transport layer to form an emission layer having a thickness of 20 nm.

Subsequently, Compound 1-1-1 and Ytterbium (Yb) were co-deposited at a weight ratio of 97:3 on the emission layer to form an electron transport layer having a thickness of 30 nm. The elements Ag and Mg were vacuum-deposited at a weight ratio of 97:3 on the electron transport layer to form a cathode having a thickness of 10 nm. Compound 1-1-1 was deposited on the cathode to form a first capping layer having a thickness of 10 nm, and then, Compound 2-2-1 (referenced above as Formula 2-2-1) was deposited on the first capping layer to form a second capping layer having a thickness of 60 nm, thereby completing the manufacture of a light-emitting device.

HT1

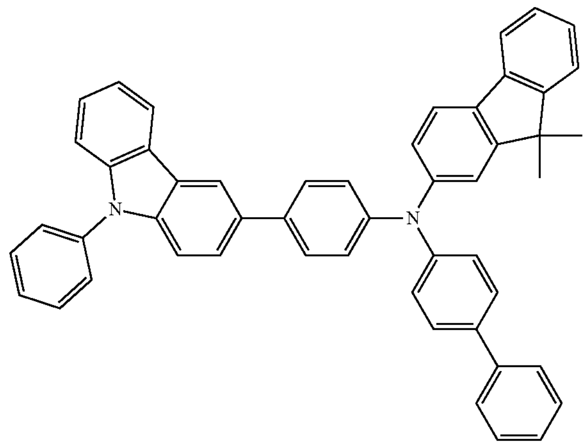

HT2

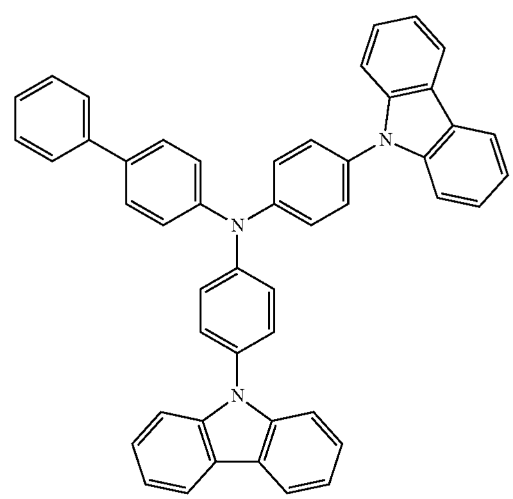

BH1

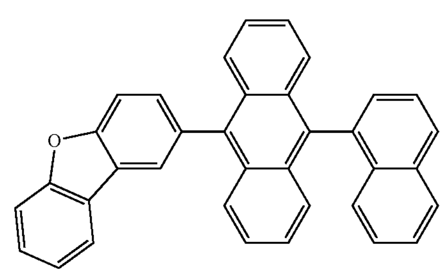

-continued

BD1

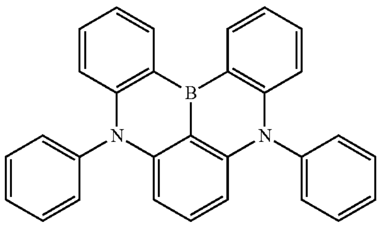

1-1-1

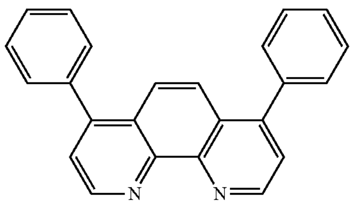

-continued 2-2-1

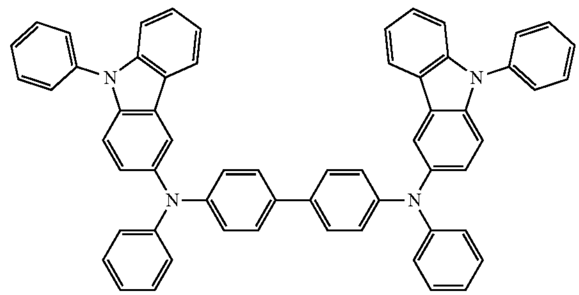

Examples 2 to 8 and Comparative Examples 1 to 5

A light-emitting device was manufactured in the same manner as in Example 1, except that the electron transport layer materials, first capping layer materials, and second capping layer materials indicated in Table 1 were used in certain ratios in forming the light-emitting device.

TABLE 1

| | Electron transport layer | | Cathode | | First capping layer | | Second capping layer | |
|---|---|---|---|---|---|---|---|---|
| | Material (weight ratio) | Thickness (nm) | Material (weight ratio) | Thickness (nm) | Compound (weight ratio) | Thickness (nm) | Compound | Thickness (nm) |
| Example 1 | 1-1-1:Yb (97:3) | 30 | Ag:Mg (97:3) | 10 | 1-1-1 | 10 | 2-2-1 | 60 |
| Example 2 | 1-1-1:Yb (97:3) | 30 | Ag:Mg (97:3) | 10 | 1-1-1 | 10 | 2-2-2 | 60 |
| Example 3 | 1-1-1:Yb (97:3) | 30 | Ag (100) | 15 | 1-1-1 | 10 | 2-2-1 | 60 |
| Example 4 | 1-1-1:Yb (97:3) | 30 | Ag (100) | 15 | 1-1-1 | 10 | 2-2-1 | 60 |
| Example 5 | 1-1-1:Li (80:20) | 30 | Ag:Mg (97:3) | 10 | 1-1-1 | 10 | 2-2-1 | 60 |
| Example 6 | 1-1-1:Li (80:20) | 30 | Ag:Mg (97:3) | 10 | 1-1-1 | 10 | 2-2-1 | 60 |
| Example 7 | 1-1-1:Li (80:20) | 30 | Ag (100) | 15 | 1-1-1 | 10 | 2-2-2 | 60 |
| Example 8 | 1-1-1:Li (80:20) | 30 | Ag (100) | 15 | 1-1-1 | 10 | 2-2-1 | 60 |
| Comparative Example 1 | TPBI (100) | 30 | Ag:Mg (97:3) | 10 | CP004 | 70 | — | — |
| Comparative Example 2 | Bphen:Cs (97:3) | 30 | Ag (100) | 15 | MeO-TPD | 70 | — | — |
| Comparative Example 3 | ET1:Yb (97:3) | 30 | Ag (100) | 15 | 2-2-1 | 70 | — | — |
| Comparative Example 4 | TE1:Yb (97:3) | 30 | Ag:Mg (97:3) | 10 | 2-2-2 | 60 | — | — |
| Comparative Example 5 | ET1:Yb (97:3) | 30 | Ag:Mg (97:3) | 10 | 1-1-1:2-2-2 (5:5) | 60 | — | — |

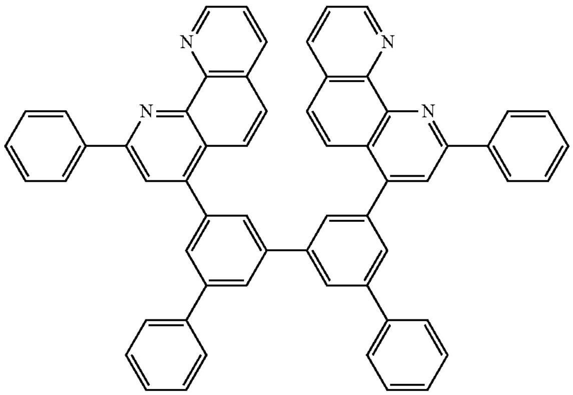

CP004

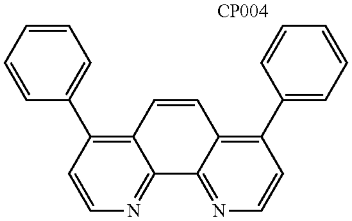

Bphen

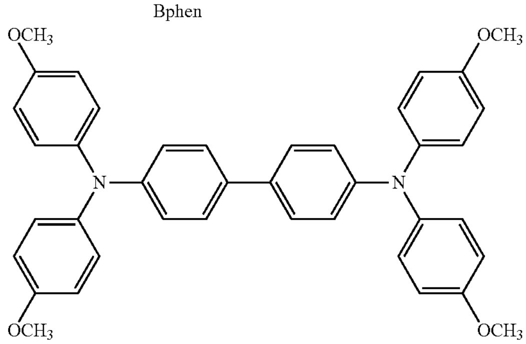

MeO-TPD

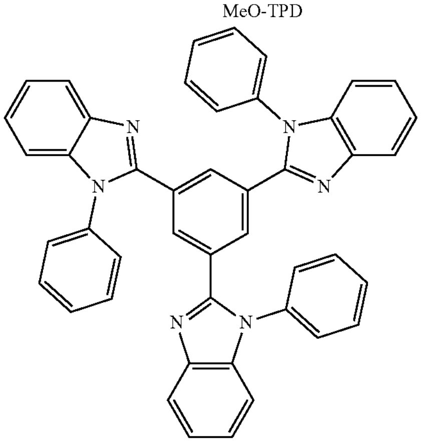

TPBI 2-2-2

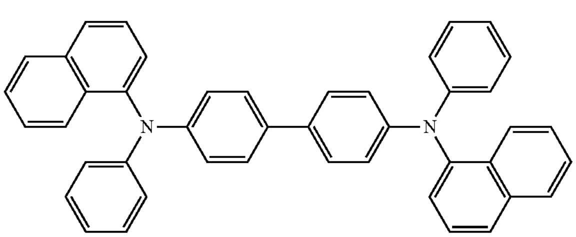

Evaluation Example 1

To evaluate characteristics of the light-emitting devices manufactured according to Reference Example, Examples 1 to 8, and Comparative Examples 1 to 5, the driving voltage at the current density of 10 mA/cm$^2$, luminescence efficiency, and lifespan thereof were measured. The driving voltage of a light-emitting device was measured using a source meter sold under the trade designation Keithley Instrument Inc., 2400 series by Tektronix, Inc., of Beaverton, Oregon, and the lifespan was evaluated by measuring the amount of time (T) lapsed when luminance was 97% of the initial luminance at the same current density. The luminescence efficiency was measured using the measurement device sold under the trade designation C9920-2-12 by Hamamatsu Photonics Inc. of Hamamatsu-city, Japan. The measurement results of Examples 1 to 8 and Comparative Examples 1 to 5 are expressed as relative values with respect to Reference Example, and are shown in Table 2.

TABLE 2

| | Lifespan(%) | Luminescence efficiency(%) | Driving voltage(V) |
|---|---|---|---|
| Reference Example | 100 | 100 | 3.50 |
| Example 1 | 108 | 112 | 3.25 |
| Example 2 | 109 | 115 | 3.25 |
| Example 3 | 113 | 118 | 3.26 |
| Example 4 | 115 | 123 | 3.27 |
| Example 5 | 105 | 122 | 3.26 |
| Example 6 | 106 | 125 | 3.27 |
| Example 7 | 112 | 125 | 3.25 |
| Example 8 | 111 | 126 | 3.25 |
| Comparative Example 1 | 79 | 95 | 3.71 |
| Comparative Example 2 | 85 | 91 | 3.88 |
| Comparative Example 3 | 99 | 108 | 3.34 |
| Comparative Example 4 | 100 | 103 | 3.35 |
| Comparative Example 5 | 92 | 101 | 3.50 |

From Table 2, it can be seen that the light-emitting devices of Examples 1 to 8 have significantly and unexpectedly reduced driving voltage and improved luminescence efficiency and lifespan characteristics compared to the light-emitting devices of Comparative Examples 1 to 5.

Light-emitting devices including a dual capping layer including the specific compounds constructed according to the principles and illustrative embodiments of the invention have high efficiency and long lifespan characteristics.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light-emitting device comprising:

a first electrode;

a second electrode facing the first electrode;

an interlayer between the first electrode and the second electrode and comprising an emission layer; and a first capping layer and a second capping layer outside the second electrode, wherein the first capping layer comprises at least one compound selected from compounds represented by Formulae 1-1 to 1-3, and the second capping layer comprises at least one compound selected from compounds represented by Formulae 2-1 to 2-6:

Formula 1-1

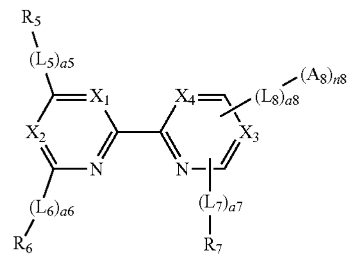

Formula 1-2

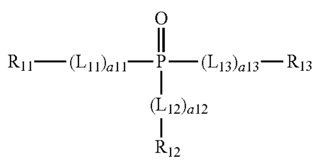

Formula 1-3

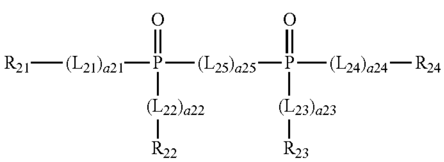

Formula 2-1

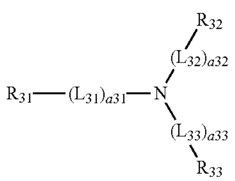

Formula 2-2

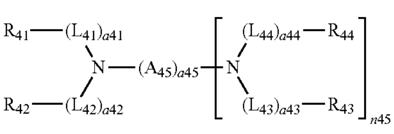

Formula 2-3

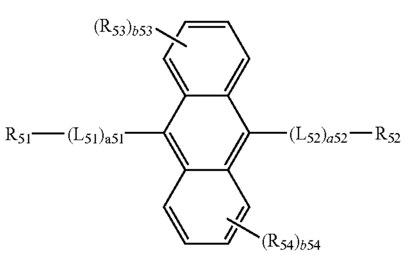

-continued

Formula 2-4

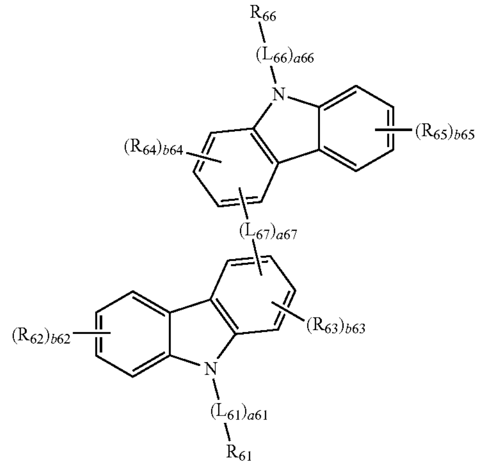

Formula 2-5

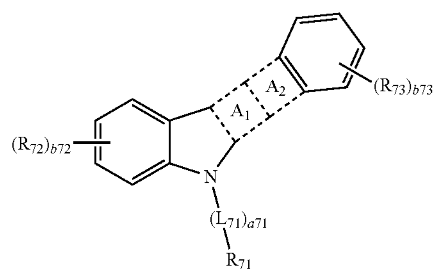

Formula 2-6

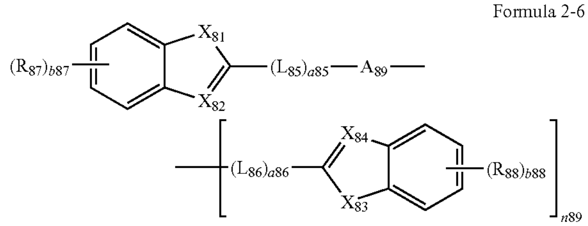

wherein, in Formulae 1-1, 2-2, and 2-6, n8 is 0 or 1, when n8 is 0, $(A_8)_{n8}$ is represented by $*-R_8$, when n8 is 1, $(A_8)_{n8}$ is represented by Formula 1A, Formula 1A

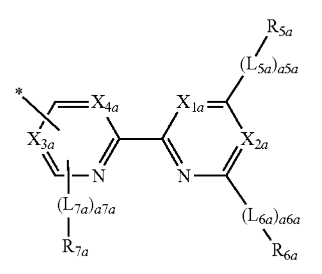

n45 is 1 or 2, when n45 is 1, $A_{45}$ is: $*-O-*'$; $*-S-*'$; $*-Se-*'$; $*-N(R_{45a})-*'$; $*-C(R_{45a})(R_{45b})-*'$; $*-Si(R_{45a})(R_{45b})-*'$; $*-S(=O)_2-*'$; $*-P(=O)(R_{45a})-*'$; a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, when n45 is 2, $A_{45}$ is a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, n89 is 0 or 1, when n89 is 0, $A_{89}$ is *—N($R_{89a}$)($R_{89b}$), a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, when n89 is 1, $A_{89}$ is: *—O—*'; *—S—*'; *—Se—*'; *—N($R_{89a}$)—*'; *—C($R_{89a}$)($R_{89b}$)—*'; *—Si($R_{89a}$)($R_{89b}$)—*'; *—S(═O)$_2$—*'; *—P(═O)($R_{89a}$)—*'; a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, wherein, in Formulae 1-1, 1-A, 1-2, 1-3, 1-1-1, 2-1, 2-2, 2-3, 2-4, 2-5, and 2-6, $X_1$ is C-($L_1$)$_{a1}$-$R_1$ or N, $X_2$ is C-($L_2$)$_{a2}$-$R_2$ or N, $X_3$ is C-($L_3$)$_{a3}$-$R_3$ or N, $X_4$ is C-($L_4$)$_{a4}$-$R_4$ or N, $X_{1a}$ is C-($L_{1a}$)$_{a1a}$-$R_{1a}$ or N, $X_{2a}$ is C-($L_{2a}$)$_{a2a}$-$R_{2a}$ or N, $X_{3a}$ is C-($L_{3a}$)$_{a3a}$-$R_{2a}$ or N, $X_{4a}$ is C-($L_{4a}$)$_{a4a}$-$R_{4a}$ or N, $X_{81}$ is C($R_{81a}$)($R_{81b}$), Si($R_{81a}$)($R_{81b}$), N($R_{81a}$), O, S, or Se, $X_{82}$ is C($R_{82a}$) or N, $X_{83}$ is C($R_{83a}$)($R_{83b}$), Si($R_{83a}$)($R_{83b}$), N($R_{83a}$), O, S, or Se, $X_{84}$ is C($R_{84a}$) or N, ring $A_1$ is a substituted or unsubstituted benzene ring, ring $A_2$ is a 5-membered ring represented by Formula 2A, Formula 2A

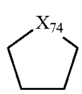

wherein, in Formula 2A, $X_{74}$ is C($R_{74a}$)($R_{74b}$), Si($R_{74a}$)($R_{74b}$), N($R_{74a}$), O, S, or Se, $L_1$ to $L_8$, $L_{1a}$ to $L_{7a}$, $L_{11}$ to $L_{13}$, $L_{21}$ to $L_{25}$, $L_{31}$ to $L_{33}$, $L_{41}$ to $L_{44}$, $L_{51}$ to $L_{52}$, $L_{61}$, $L_{66}$, $L_{67}$, $L_{71}$, $L_{85}$, and $L_{86}$ are each, independently from one another: *—O—*'; *—S—*'; *—Se—*'; *—N($R_{10}$)—*'; *—C($R_{10}$)($R_{20}$)—*'; *—Si($R_{10}$)($R_{20}$)—*'; *—S(═O)$_2$—*'; *—P(═O)($R_{10}$)—*'; a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, a1 to 8, a1a to a7a, a11 to a13, a21 to a25, a31 to a33, a41 to a45, a51 to a52, a61, a66, a67, a71, a85, and a86 are each, independently from one another, an integer from 1 to 5, $R_1$ to $R_8$, $R_{1a}$ to $R_{7a}$, $R_{10}$, $R_{20}$, $R_{11}$ to $R_{13}$, $R_{21}$ to $R_{24}$, $R_{31}$ to $R_{33}$, $R_{41}$ to $R_{44}$, $R_{45a}$, $R_{45b}$, $R_{51}$ to $R_{54}$, $R_{61}$ to $R_{66}$, $R_{71}$ to $R_{73}$, $R_{74a}$, $R_{74b}$, $R_{81a}$, $R_{81b}$, $R_{82a}$, $R_{83a}$, $R_{83b}$, $R_{84a}$, $R_{87}$, $R_{88}$, $R_{89a}$, and $R_{89b}$ are each independently selected from hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(═O)($Q_1$), —S(═O)$_2$($Q_1$), and —P(═O)($Q_1$)($Q_2$), b53, b54, b62, b65, b72, b73, b87, and b88 are each, independently from one another, an integer from 0 to 4, b63 and b64 are each, independently from one another, an integer from 0 to 3, two neighboring groups among $R_1$ to $R_8$, $R_{1a}$ to $R_{7a}$, $R_{10}$, $R_{20}$, $R_{11}$ to $R_{13}$, $R_{21}$ to $R_{24}$, $R_{31}$ to $R_{33}$, $R_{41}$ to $R_{44}$, $R_{45a}$, $R_{45b}$, $R_{51}$ to $R_{54}$, $R_{61}$ to $R_{66}$, $R_{71}$ to $R_{73}$, $R_{74a}$, $R_{74b}$, $R_{81a}$, $R_{81b}$, $R_{82a}$, $R_{83a}$, $R_{83b}$, $R_{84a}$, $R_{87}$, $R_{88}$, $R_{89a}$, and $R_{89b}$ are optionally linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_3$-$C_{60}$ carbocyclic group unsubstituted or substituted with at least one $R_{10a}$ or a $C_1$-$C_{60}$ heterocyclic group substituted or unsubstituted at least one $R_{10a}$, $R_{10a}$ is:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each, independently from one another, unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, or a C6-$C_{60}$ arylthio group, each, independently from one another, unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each, independently from one another: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each, independently from one another unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and

* and *' each indicate a binding site to a neighboring atom.

2. The light-emitting device of claim 1, wherein the first capping layer is between the second electrode and the second capping layer.

3. The light-emitting device of claim 2, wherein the first capping layer contacts the second electrode.

4. The light-emitting device of claim 1, wherein the first capping layer has a thickness of about 5 nm to about 50 nm, and the second capping layer has a thickness of about 50 nm to about 100 nm.

5. The light-emitting device of claim 1, wherein a ratio of a thickness of the second capping layer to a thickness of the first capping layer is from about 2:1 to about 15:1.

6. The light-emitting device of claim 1, wherein the second electrode comprises silver.

7. The light-emitting device of claim 6, wherein silver is present in the second electrode in an amount of about 95 wt % or more with respect to the total weight of the second electrode.

8. The light-emitting device of claim 1, wherein the first electrode comprises an anode, the second electrode comprises a cathode, the interlayer further comprises a hole transport region between the emission layer and the first electrode, and an electron transport region between the emission layer and the second electrode, the hole transport region comprises a hole injection layer, a hole transport layer, an emission auxiliary layer, an electron blocking layer, or any combination thereof, and the electron transport region comprises a hole blocking layer, an electron transport layer, an electron injection layer, or any combination thereof.

9. The light-emitting device of claim 8, wherein the electron transport region comprises a metal-containing compound and a metal-free compound, and the metal-containing compound is present in an amount of about 5 wt % or less with respect to the total weight of the metal-free compound and the metal-containing compound.

10. The light-emitting device of claim 1, wherein $L_1$ to $L_8$, $L_{1a}$ to $L_{8a}$, $L_{11}$ to $L_{13}$, $L_{21}$ to $L_{25}$, $L_{31}$ to $L_{33}$, $L_{41}$ to $L_{44}$, $L_{51}$ to $L_{52}$, $L_{61}$, $L_{66}$, $L_{67}$, $L_{71}$, $L_{85}$, and $L_{86}$ are each, independently from one another:

a single bond; *—O—*'; *—S—*'; *—Se—*'; *—N($R_{10}$)—*'; *—C($R_{10}$)($R_{20}$)—*'; *—Si($R_{10}$)($R_{20}$)—*'; *—S(═O)$_2$—*'; or *—P(═O)($R_{10}$)—*'; or a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a quinolinylene group, an isoquinolinylene group, a benzoquinolinylene group, a benzoisoquinolinylene group, a dibenzoquinolinylene group, a dibenzoisoquinolinylene group, a 6,9-dihydro-5H-indeno[2,1-b]fluoranthenylene group, a 9,10-dihydrodibenzo[e,l]acephenanthrylene group, a benzo[g]fluoranthenylene group, a benzo[f]tetraphenylene group, a benzo[m]tetraphenylene group, a benzochrysenylene group, a biphenylene group, a phenylpyridinylene group, a phenanthrolene group, a dibenzoquinolinylene group, a bipyridinylene group, or a pyridinylene group, each, independently from one another, unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a quinolinyl group, an isoquinolinyl group, a benzoquinolinyl group, a benzoisoquinolinyl group, a dibenzoquinolinyl group, a dibenzoisoquinolinyl group, a 6,9-dihydro-5H-indeno[2,1-b]fluoranthenyl group, a 9,10-dihydrodibenzo[e,l]acephenanthryl group, a benzo[g]fluoranthenyl group, a benzo[f]tetraphenyl group, a benzo[m]tetraphenyl group, a benzochrysenyl group, a biphenyl group, a phenylpyridinyl group, a phenanthrolinyl group, a dibenzoquinol group, a bipyridinyl group, a pyridinyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), —P(═O)($Q_{31}$)($Q_{32}$), or a combination thereof, $R_{10}$ and $R_{20}$ are, independently from one another, have the same meaning as described in claim 1,

* and *' each indicate a binding site to a neighboring atom, and $Q_{31}$ to $Q_{33}$ are each, independently from one another, a $C_1$-$C_{10}$ alkyl group, a $C_1$-$C_{10}$ alkoxy group, a phenyl group, a biphenyl group, a terphenyl group, or a naphthyl group.

11. The light-emitting device of claim 1, wherein $L_1$ to $L_8$, $L_{1a}$ to $L_{8a}$, $L_{11}$ to $L_{13}$, $L_{21}$ to $L_{25}$, $L_{31}$ to $L_{33}$, $L_{41}$ to $L_{44}$, $L_{51}$ to $L_{52}$, $L_{61}$, $L_{66}$, $L_{67}$, $L_{71}$, $L_{85}$, and $L_{86}$ are each, independently from one another:

a single bond; *—O—*'; *—S—*'; *—Se—*'; *—N($R_{10}$)—*'; *—C($R_{10}$)($R_{20}$)—*'; *—Si($R_{10}$)($R_{20}$)—*'; *—S(═O)$_2$—*'; *—P(═O)($R_{10}$)—*';

a phenylene group, a naphthylene group, a spiro-anthracenefluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a thiophenylene group, a furanylene group, a carbazolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a quinolinylene group, an isoquinolinylene group, a benzoquinolinylene group, a benzoisoquinolinylene group, a dibenzoquinolinylene group, a dibenzoisoquinolinylene group, a 6,9-dihydro-5H-indeno[2,1-b]fluoranthenylene group, a 9,10-dihydrodibenzo[e,l]acephenanthrylene group, a benzo[g]fluoranthenylene group, a benzo[f]tetraphenylene group, a benzo[m]tetraphenylene group, a benzochrysenylene group, a biphenylene group, a phenylpyridinylene group, a phenanthrolinylene group, a dibenzoquinolinylene group, a bipyridinylene group, or a pyridinylene group; each, independently from one another, unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a naphthyl group, a spiro-anthracene fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a quinolinyl group, an isoquinolinyl group, a benzoquinolinyl group, a benzoisoquinolinyl group, a dibenzoquinolinyl group, a dibenzoisoquinolinyl group, a 6,9-dihydro-5H-indeno[2,1-b]fluoranthenyl group, a 9,10-hydro[e,l]acephenanthryl group, a benzo[g]fluoranthenyl group, a benzo[f]tetraphenyl group, a benzo[m]tetraphenyl group, a benzochrysenyl group, a biphenyl group, a phenylpyridinyl group, a phenanthrolinyl group, a dibenzoquinol group, a bipyridinyl group, a pyridinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or a combination thereof,

* and *' each indicate a binding site to a neighboring atom, and $Q_{31}$ to $Q_{33}$ are each, independently from one another, $C_1$-$C_{10}$ alkyl group, a $C_1$-$C_{10}$ alkoxy group, a phenyl group, a biphenyl group, a terphenyl group, or a naphthyl group.

12. The light-emitting device of claim 1, wherein $R_1$ to $R_8$, $R_{1a}$ to $R_{7a}$, $R_{10}$, $R_{20}$, $R_{11}$ to $R_{13}$, $R_{21}$ to $R_{24}$, $R_{31}$ to $R_{33}$, $R_{41}$ to $R_{44}$, $R_{45a}$, $R_{45b}$, $R_{51}$ to $R_{54}$, $R_{61}$ to $R_{66}$, $R_{71}$ to $R_{73}$, $R_{74a}$, $R_{74b}$, $R_{81a}$, $R_{81b}$, $R_{82a}$, $R_{83a}$, $R_{83b}$, $R_{84a}$, $R_{87}$, $R_{88}$, $R_{89a}$, and $R_{89b}$ are each, independently from one another:

hydrogen, deuterium, —F, —Cl, —Br, —I, a hydroxyl group, a cyano group, or a nitro group;

a $C_1$-$C_{60}$ alkyl group or a $C_1$-$C_{60}$ alkoxy group, each, independently from one another, unsubstituted or substituted with deuterium, —F, —Cl, —Br, —I, a hydroxyl group, a cyano group, a nitro group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof;

a cyclopentyl group, a cyclohexyl group, a cycloheptyl group, an adamantanyl group, a norbornanyl group, a norbornenyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-anthracenefluorenyl group, a benzofluoranthenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a benzoisoquinolinyl group, a dibenzoquinolinyl group, a dibenzoisoquinolinyl group, a benzophenanthrolinyl group, a phthalazinyl group, a naphthyridinyl group, a quinoxalinyl group, a benzoquinoxalinyl group, a quinazolinyl group, a benzoquinazolinyl group, a dibenzoquinazolinyl group, a dibenzoquinoxalinyl group, a cinnolinyl group, a phenanthridinyl group, an acridinyl group, a phenanthrolinyl group, a phenazinyl group, a phenoxazinyl group, a phenothiazinyl group, a phenoxathinyl group, a benzimidazolyl group, a benzofuranyl group, a benzothiophenyl group, a benzosilolyl group, a benzothiazolyl group, a benzoisothiazolyl group, a benzoxazolyl group, a benzoisoxazolyl group, a benzochrysenyl group, a benzotriazole group, a benzodiazole group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphthosilolyl group, a phenanthrobenzofuranyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indeno carbazolyl group, an indolocarbazolyl group, a benzophenanthrenyl group, a tetraphenyl group, a benzotetraphenyl group, a fluoranthenobenzofuranyl group, a 9,9-dimethyl-9H-indeno[2,1-b]fluoranthenyl group, or a dibenzo[e,l]acephenanthrylenyl group, each, independently from one another, unsubstituted or substituted with deuterium, —F, —Cl, —Br, —I, a hydroxyl group, a cyano group, a nitro group, a $C_1$-$C_{60}$ alkyl group, a $C_1$-$C_{60}$ alkoxy group, a cyclopentyl group, a cyclohexyl group, a cycloheptyl group, an adamantanyl group, a norbornanyl group, a norbornenyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-anthracenefluorenyl group, a benzofluoranthenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a benzothiazolyl group, a benzoisothiazolyl group, a benzoxazolyl group, a benzoisoxazolyl group, a benzochrysenyl group, a triazolyl group, a tetrazolyl group, a thiadiazolyl group, an oxadiazolyl group, a triazinyl group, a carbazolyl group, a dibenzofuranyl group, a dibenzothiophenyl group, a dibenzosilolyl group, a benzocarbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphthosilolyl group, a phenanthrobenzofuranyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, an indenopyrrolyl group, an indolopyrrolyl group, an indeno carbazolyl group, an indolocarbazolyl group, a benzophenanthrenyl group, a fluoranthenobenzofuranyl group, a tetraphenyl group, a benzotetraphenyl group, a dibenzo[e,l]acephenanthrylenyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), —P(═O)($Q_{31}$)($Q_{32}$), or any combination thereof, or —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), wherein $Q_1$ to $Q_3$ and $Q_{31}$ to $Q_{33}$ are each, independently from one another: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group; or $C_1$-$C_{60}$ heterocyclic group, each, independently from one another, unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

13. The light-emitting device of claim 1, wherein $R_1$ to $R_8$, $R_{1a}$ to $R_{7a}$, $R_{10}$, $R_{20}$, $R_{11}$ to $R_{13}$, $R_{21}$ to $R_{24}$, $R_{31}$ to $R_{33}$, $R_{41}$ to $R_{44}$, $R_{45a}$, $R_{45b}$, $R_{51}$ to $R_{54}$, $R_{61}$ to $R_{66}$, $R_{71}$ to $R_{73}$, $R_{74a}$, $R_{74b}$, $R_{81a}$, $R_{81b}$, $R_{82a}$, $R_{83a}$, $R_{83b}$, $R_{84a}$, $R_{87}$, $R_{88}$, $R_{89a}$, and $R_{89b}$ are each, independently from one another:

hydrogen, deuterium, —F, —Cl, —Br, —I, a hydroxyl group, a cyano group, or a nitro group;

a $C_1$-$C_{60}$ alkyl group or a $C_1$-$C_{60}$ alkoxy group, each unsubstituted or substituted with deuterium, —F, —Cl, —Br, —I, a hydroxyl group, a cyano group, a nitro group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof, —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$); or one of Formulae 4-1 to 4-324:

4-1

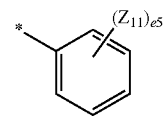

4-2

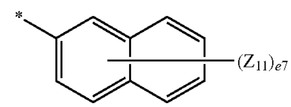

4-3

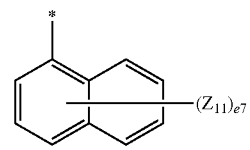

4-4

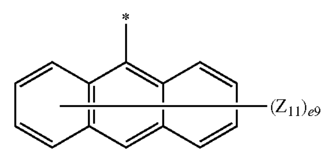

4-5

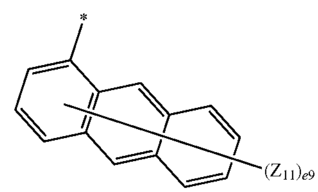

4-6

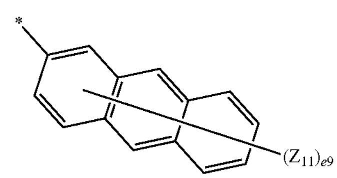

4-7

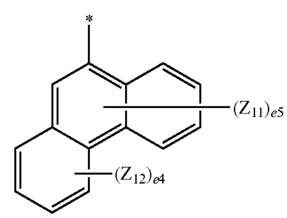

4-8

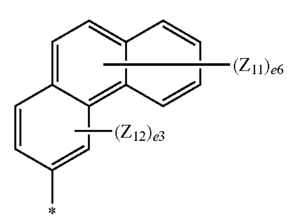

-continued
4-9
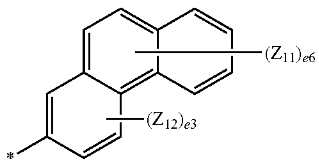
4-10
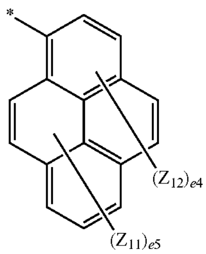
4-11
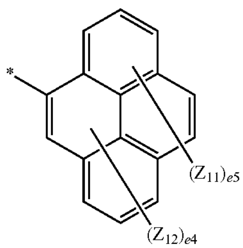
4-12
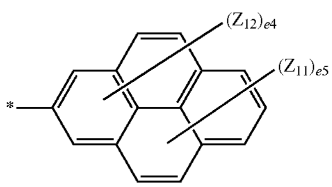
4-13
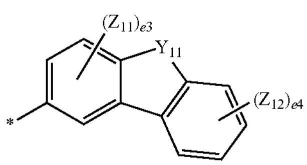
4-14
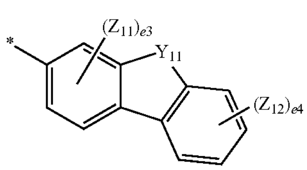
4-15
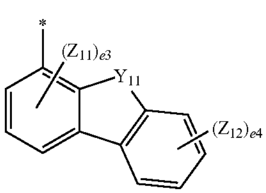
4-16
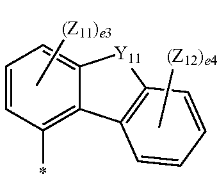
-continued
4-17
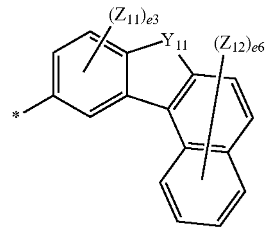
4-18
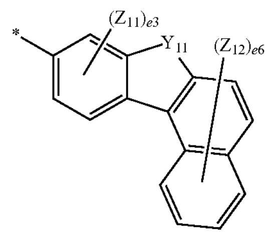
4-19
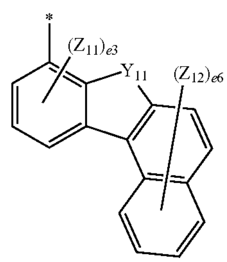
4-20
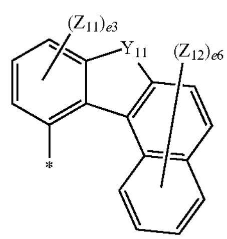
4-21
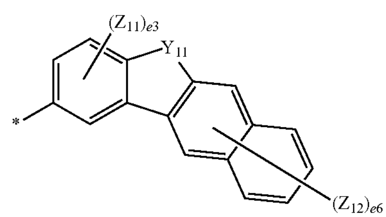
4-22
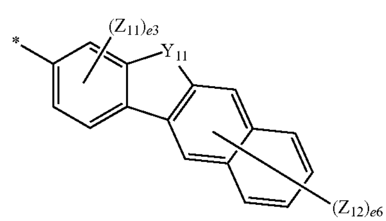

-continued
4-23
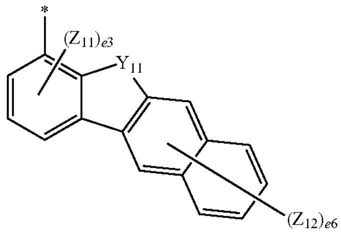
4-24
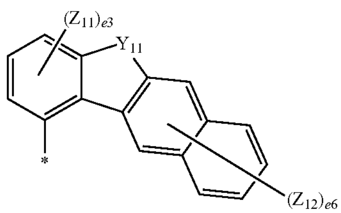
4-25
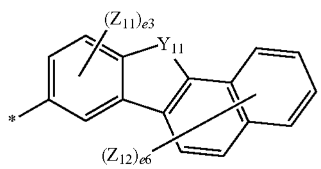
4-26
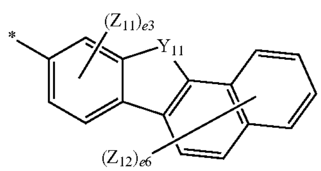
4-27
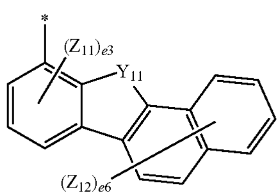
4-28
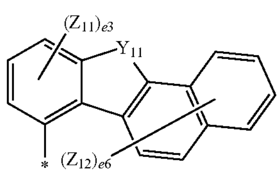
4-29
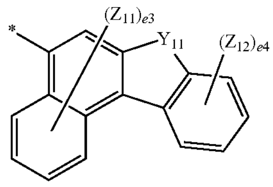
4-30
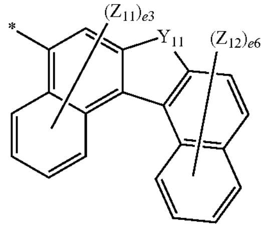
-continued
4-31
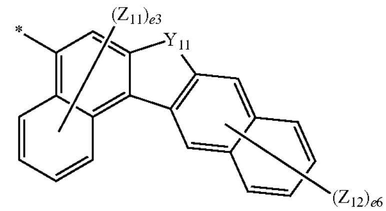
4-32
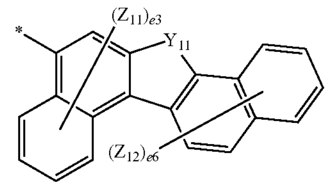
4-33
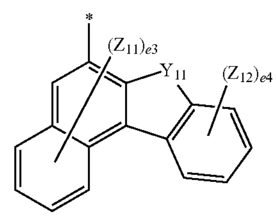
4-34
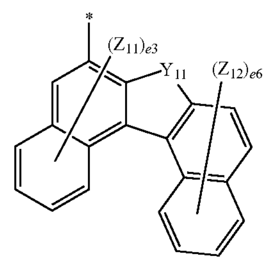
4-35
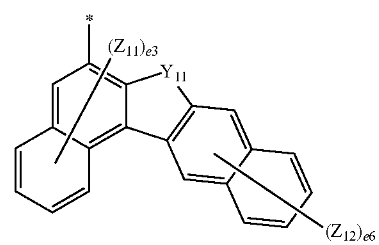
4-36
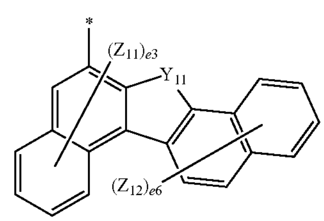
4-37
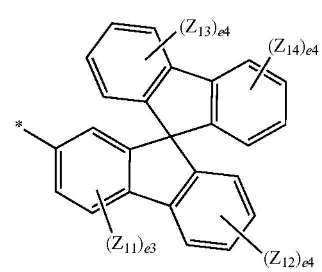

-continued
4-38
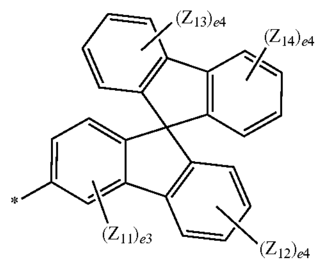
4-39
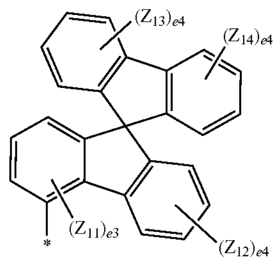
4-40
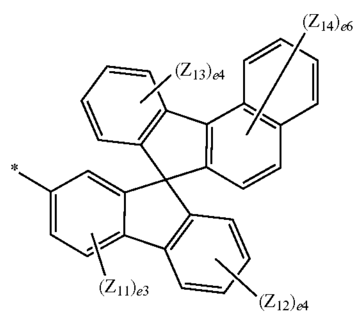
4-41
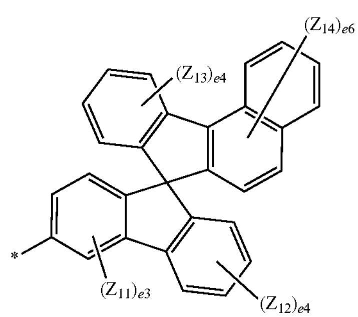
4-42
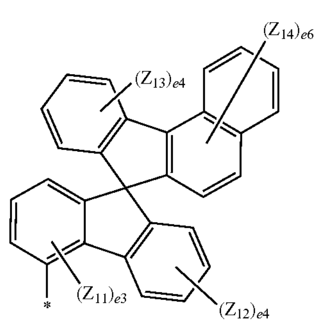
-continued
4-43
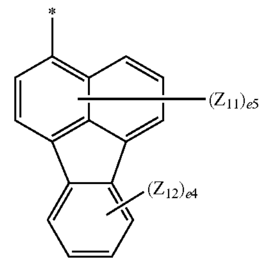
4-44
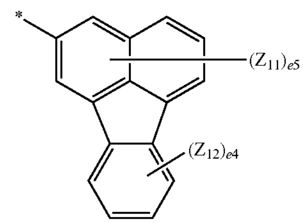
4-45
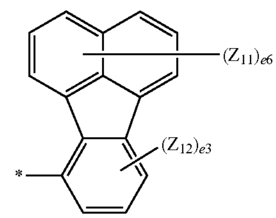
4-46
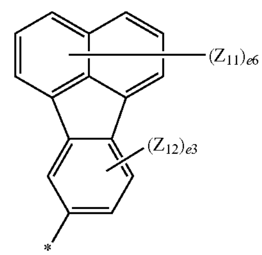
4-47
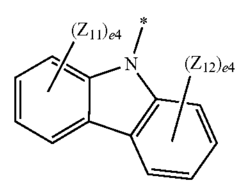
4-48
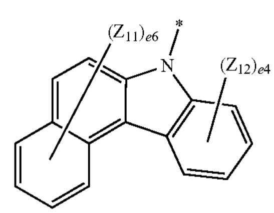
4-49
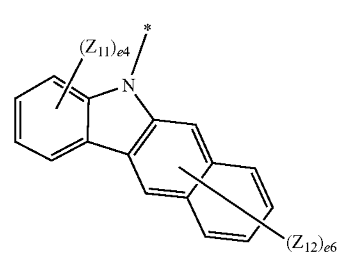

-continued
4-50
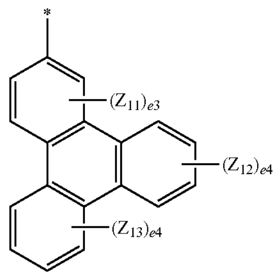
4-51
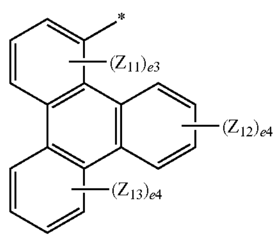
4-52
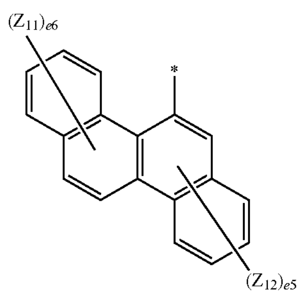
4-53
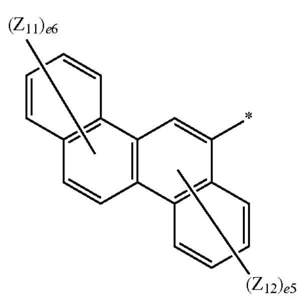
4-54
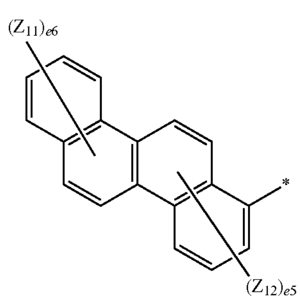
-continued
4-55
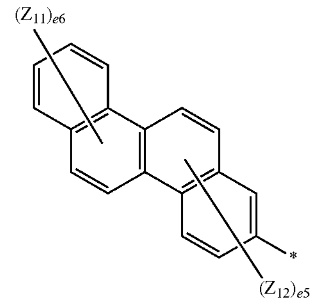
4-56
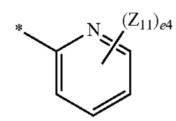
4-57
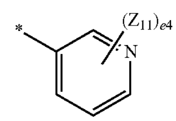
4-58
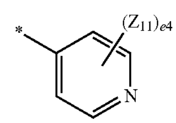
4-59
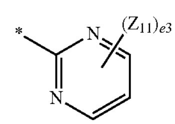
4-60
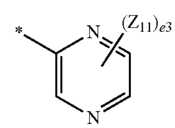
4-61
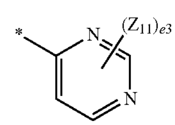
4-62
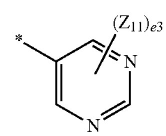
4-63
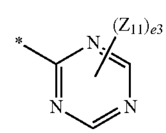
4-64
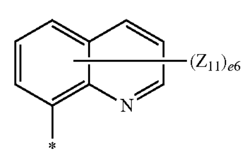
4-65
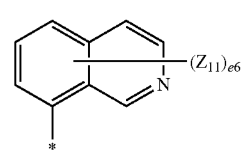

-continued
4-66
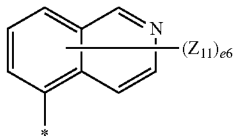
4-67
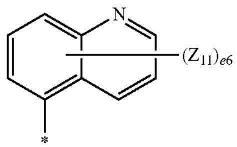
4-68
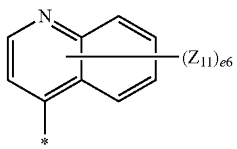
4-69
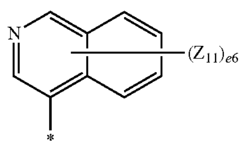
4-70
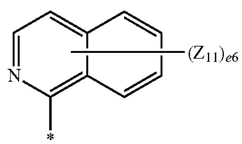
4-71
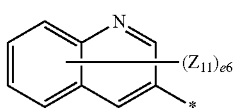
4-72
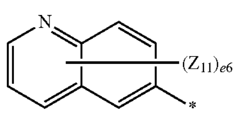
4-73
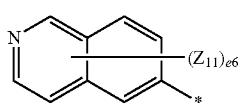
4-74
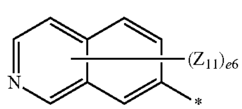
4-75
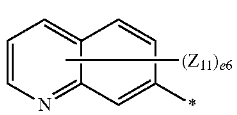
4-76
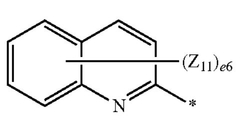
4-77
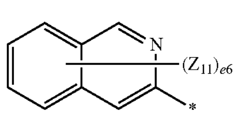
-continued
4-78
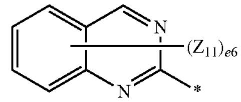
4-79
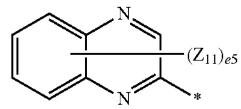
4-80
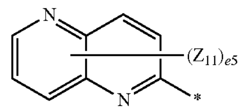
4-81
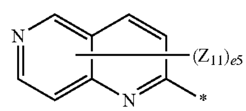
4-82
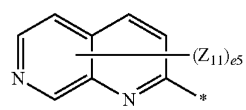
4-83
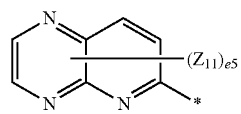
4-84
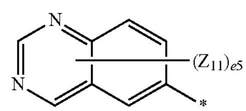
4-85
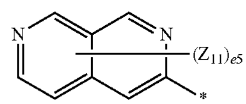
4-86
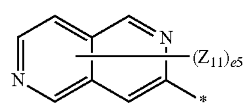
4-87
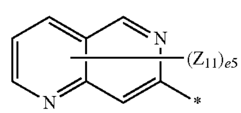
4-88
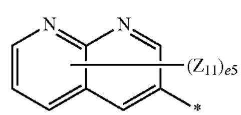
4-89
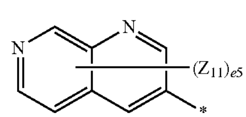
4-90
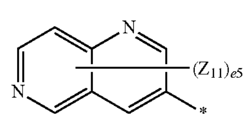
4-91
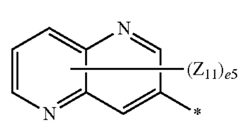

-continued
4-92
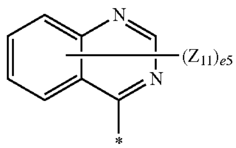
4-93
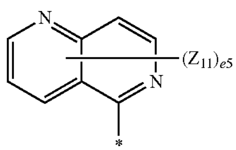
4-94
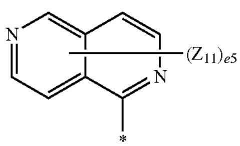
4-95
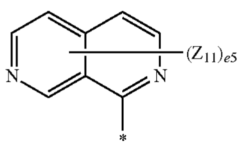
4-96
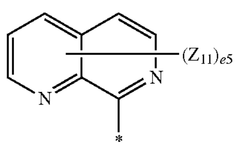
4-97
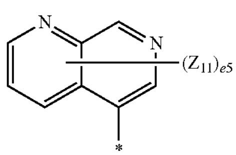
4-98
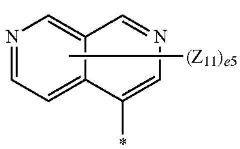
4-99
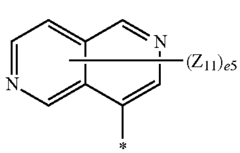
4-100
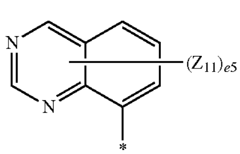
4-101
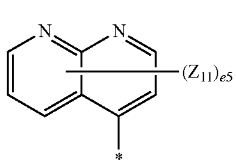
-continued
4-102
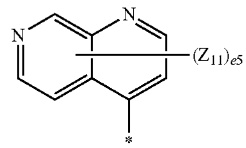
4-103
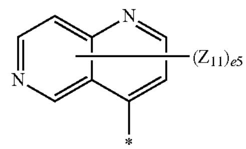
4-104
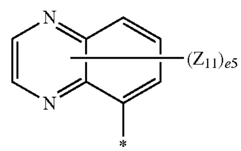
4-105
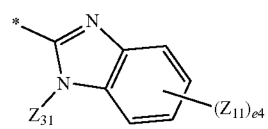
4-106
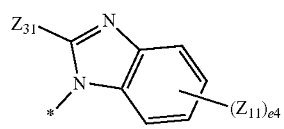
4-107
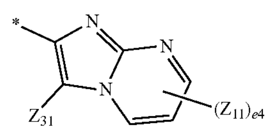
4-108
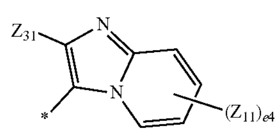
4-109
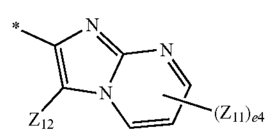
4-110
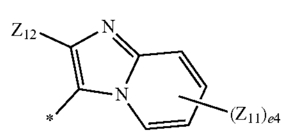
4-111
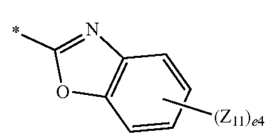
4-112
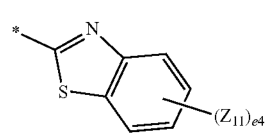

-continued
4-113
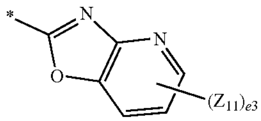
4-114
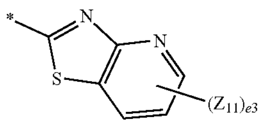
4-115
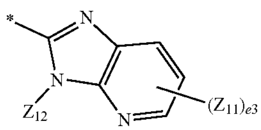
4-116
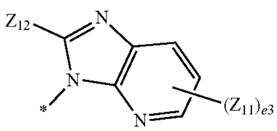
4-117
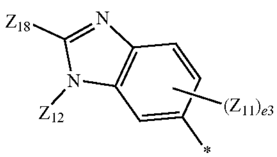
4-118
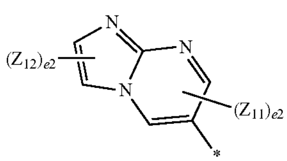
4-119
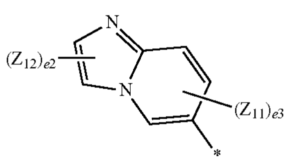
4-120
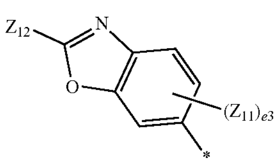
4-121
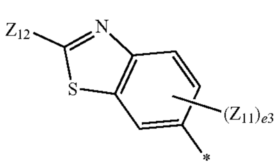
4-122
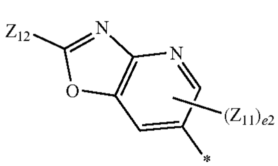
-continued
4-123
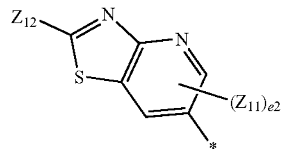
4-124
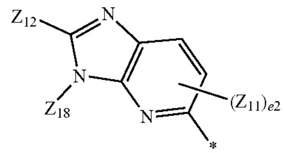
4-125
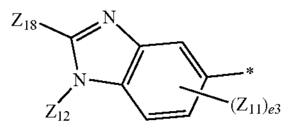
4-126
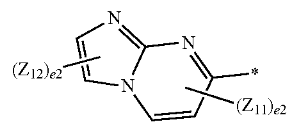
4-127
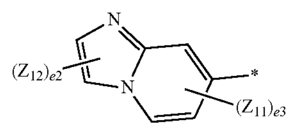
4-128
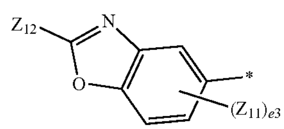
4-129
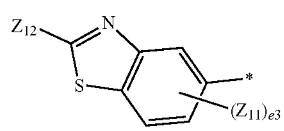
4-130
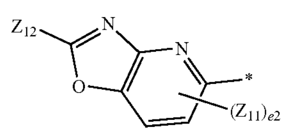
4-131
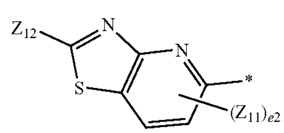
4-132
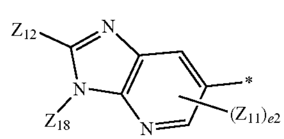
4-133
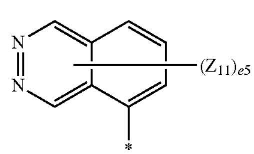

-continued
4-134
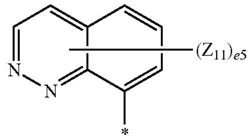
4-135
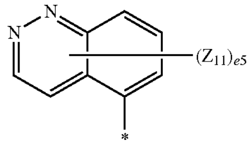
4-136
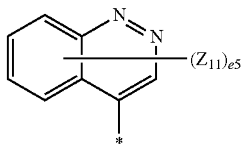
4-137
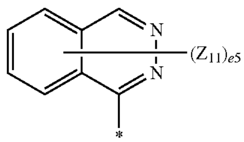
4-138
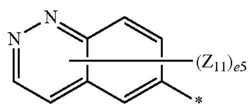
4-139
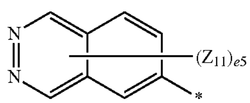
4-140
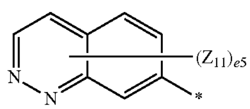
4-141
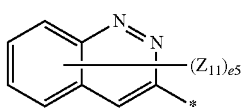
4-142
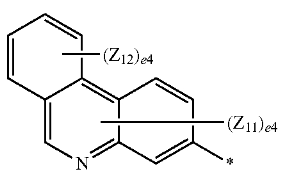
4-143
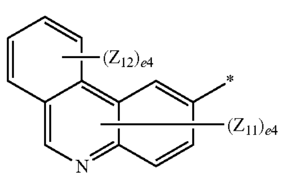
4-144
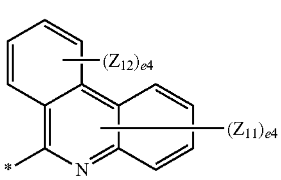
-continued
4-145
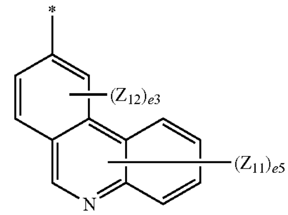
4-146
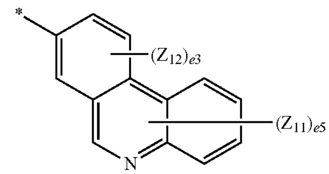
4-147
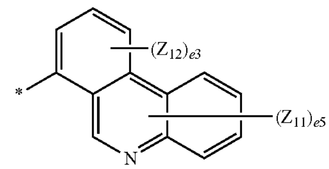
4-148
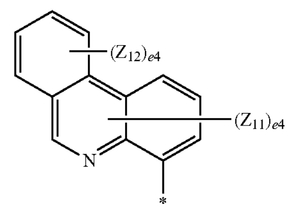
4-149
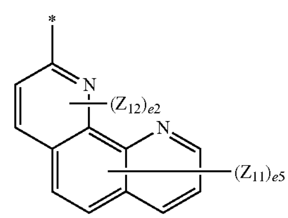
4-150
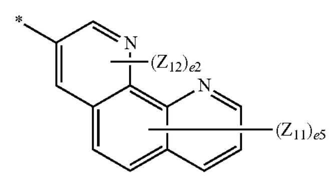
4-151
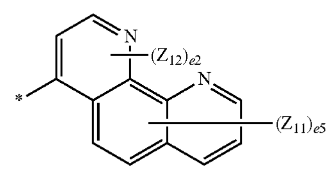
4-152
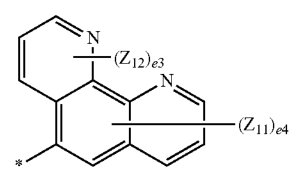

-continued
4-153
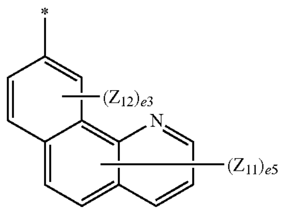
4-154
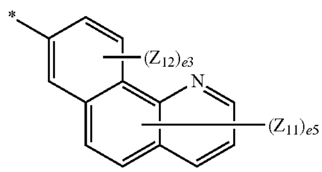
4-155
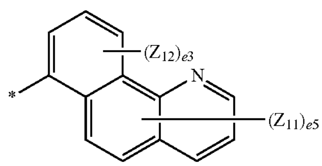
4-156
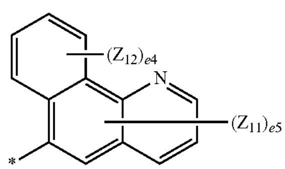
4-157
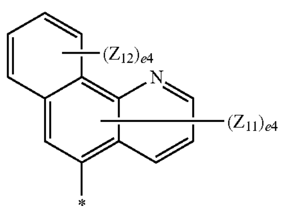
4-158
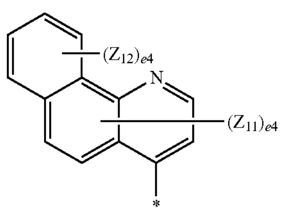
4-159
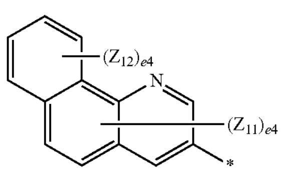
4-160
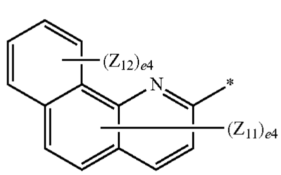
-continued
4-161
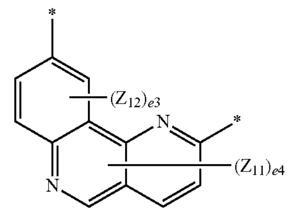
4-162
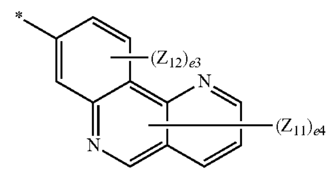
4-163
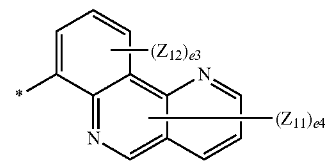
4-164
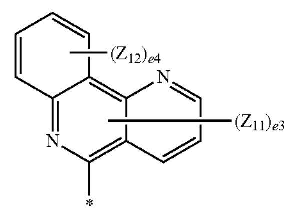
4-165
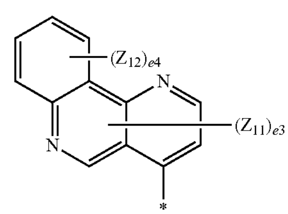
4-166
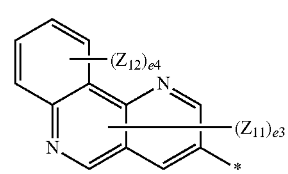
4-167
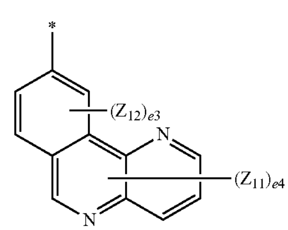
4-168
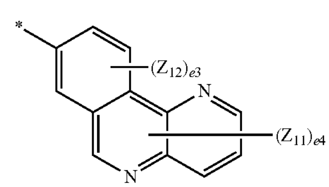

-continued
4-169
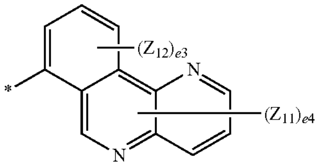
4-170
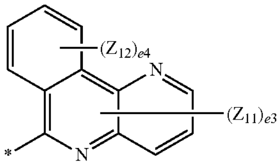
4-171
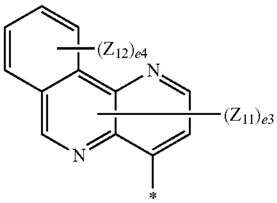
4-172
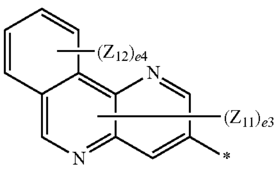
4-173
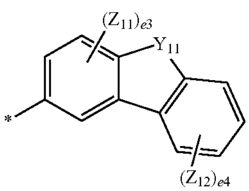
4-174
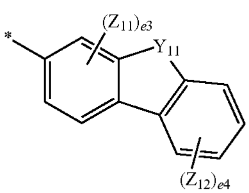
4-175
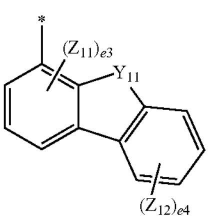
4-176
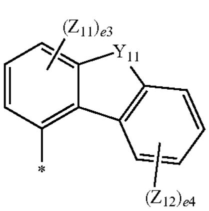
-continued
4-177
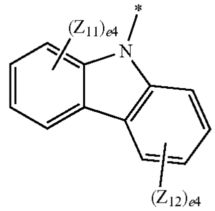
4-178
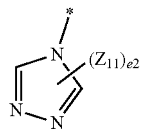
4-179
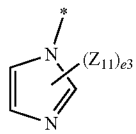
4-180
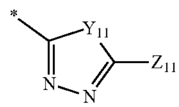
4-181
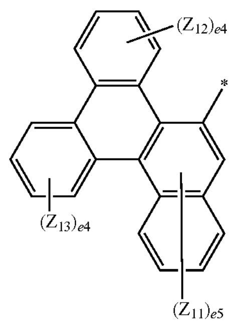
4-182
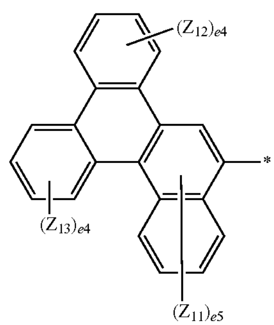
4-183
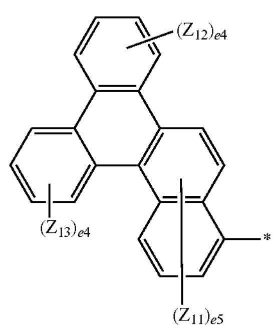

4-184
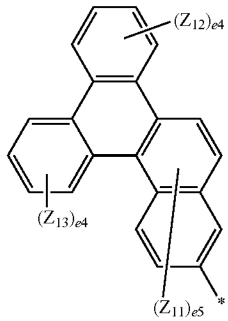
4-185
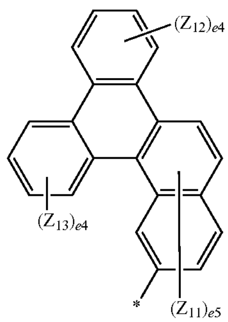
4-186
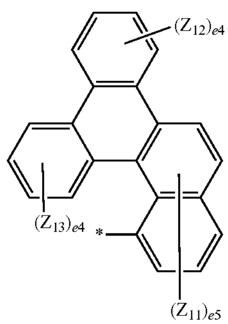
4-187
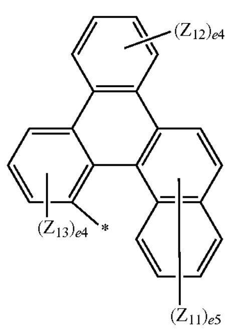
4-188
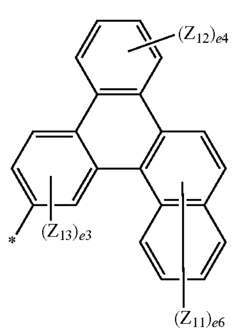
4-189
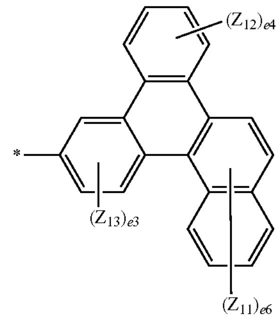
4-190
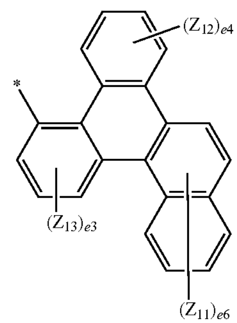
4-191
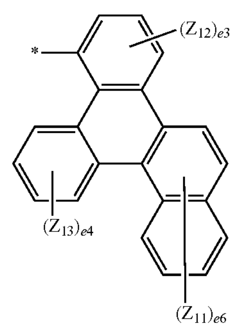
4-192
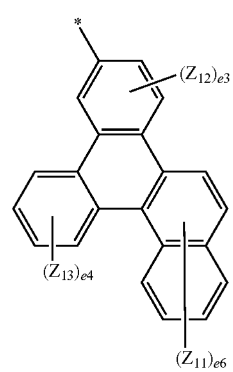

-continued
4-193
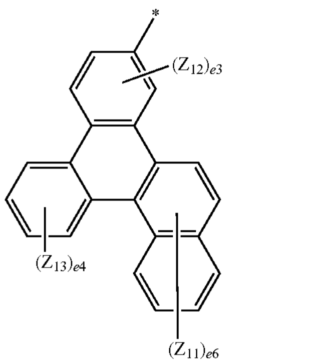
4-194
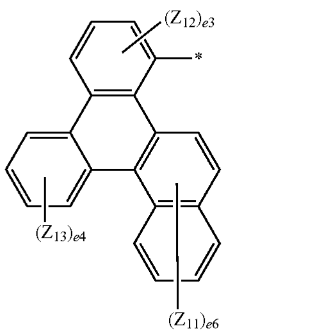
4-195
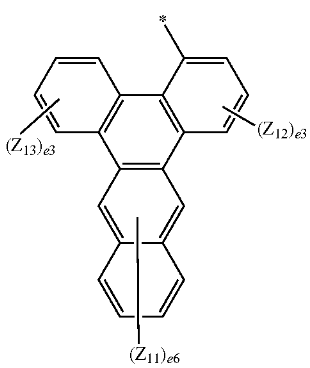
4-196
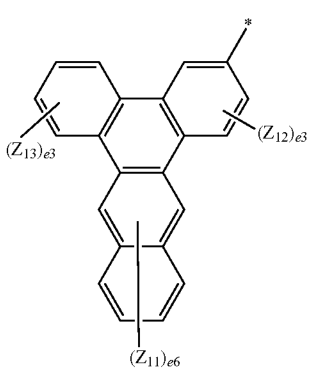
-continued
4-197
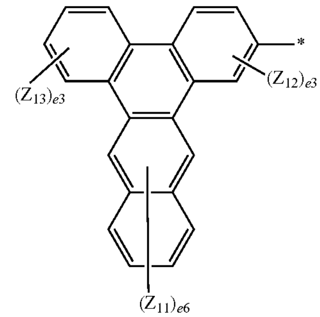
4-198
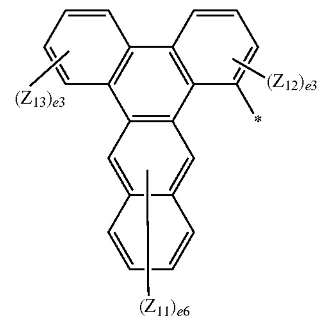
4-199
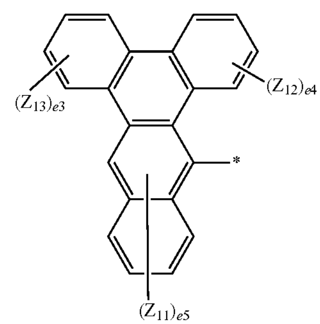
4-200
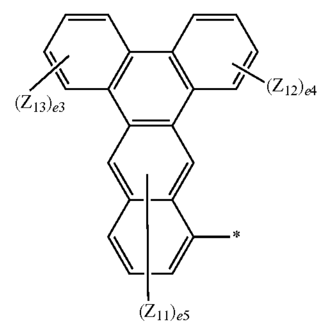
4-201
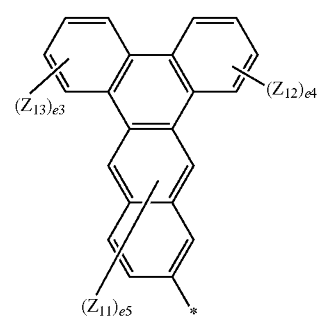

4-202
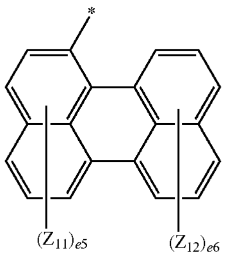
4-203
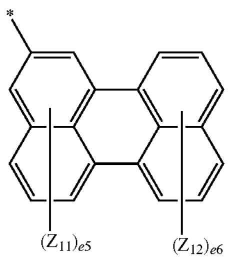
4-204
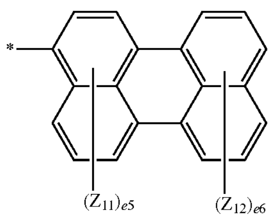
4-205
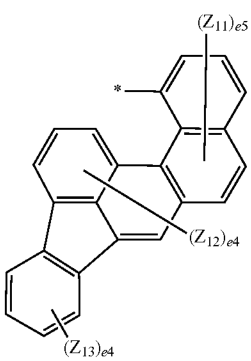
4-206
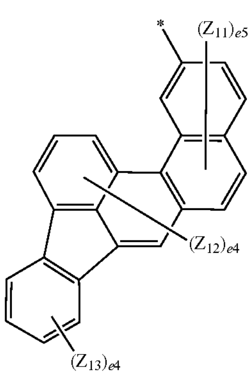
4-207
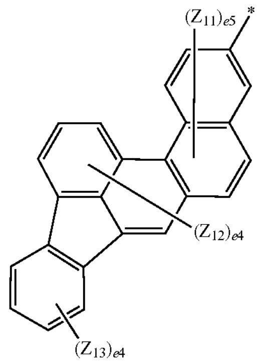
4-208
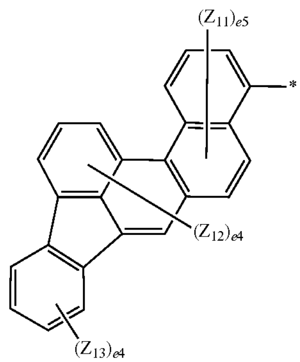
4-209
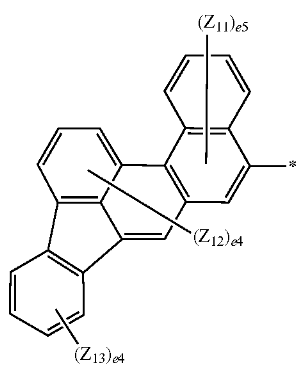
4-210
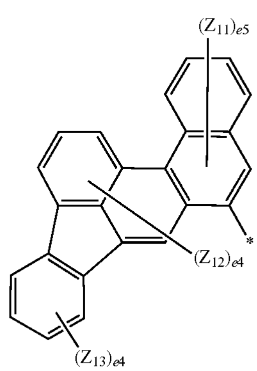

4-211
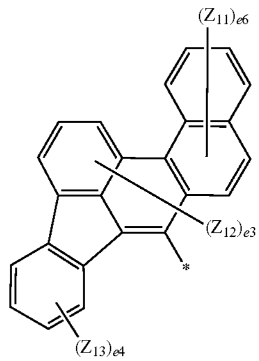
4-212
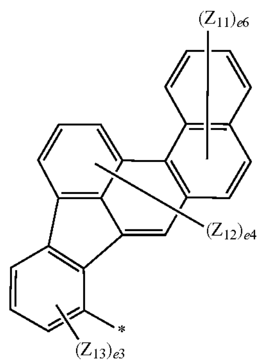
4-213
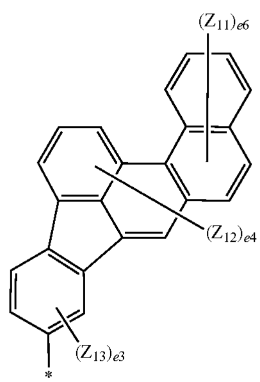
4-214
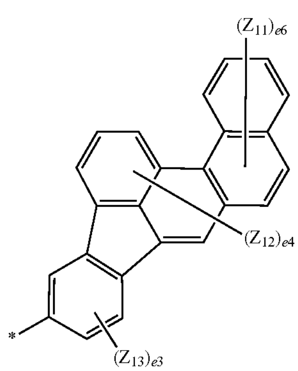
4-215
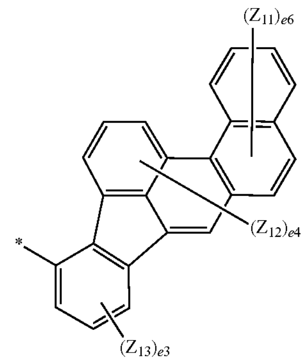
4-216
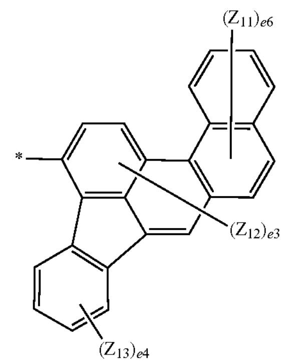
4-217
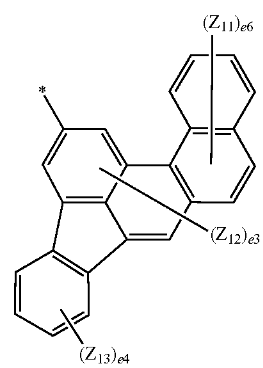
4-218
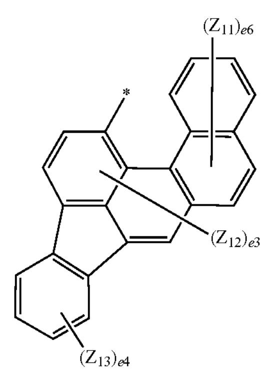

-continued
4-219
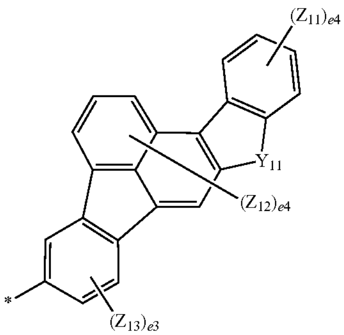
4-220
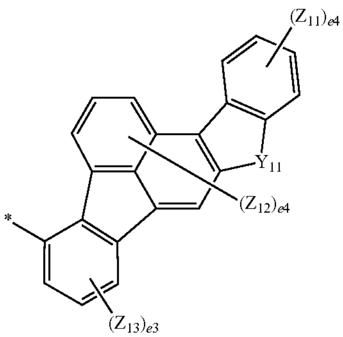
4-221
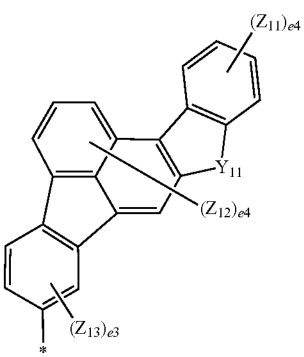
4-222
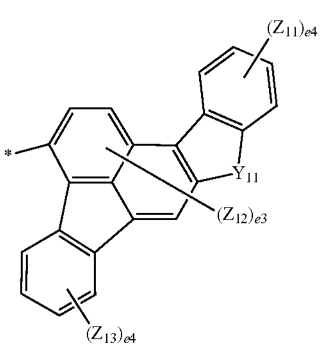
-continued
4-223
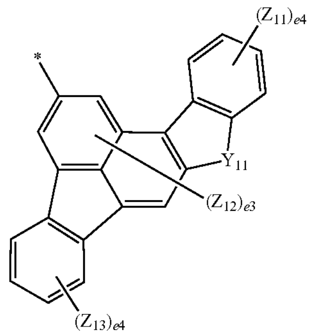
4-224
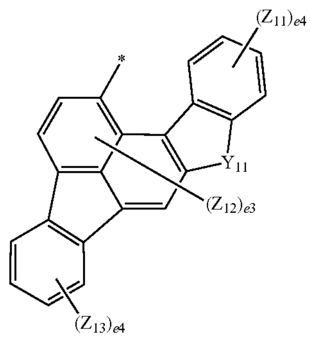
4-225
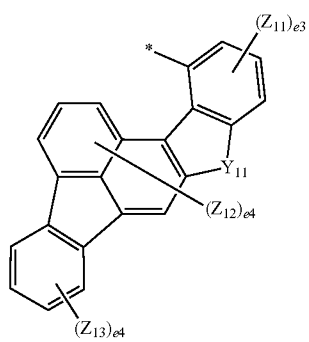
4-226
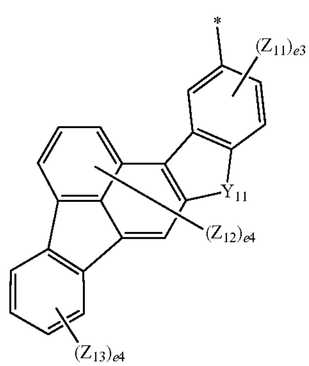

-continued
4-227
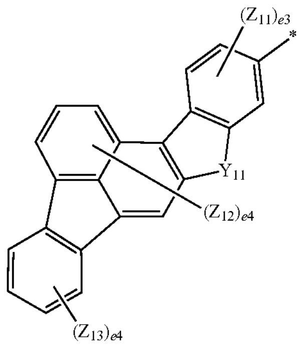
4-228
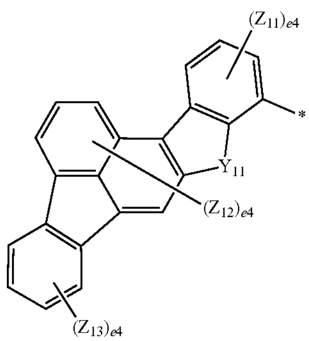
4-229
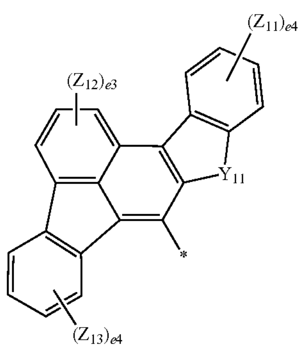
4-230
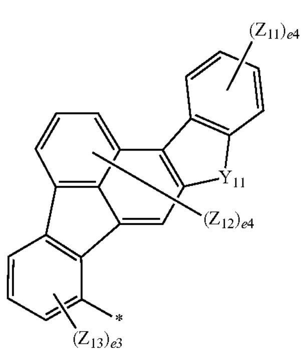
-continued
4-231
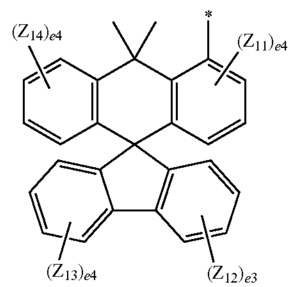
4-232
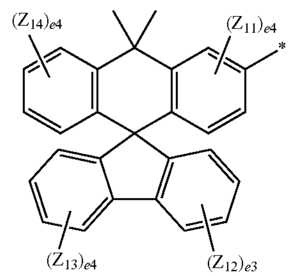
4-233
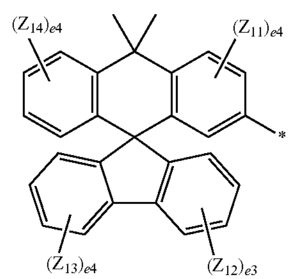
4-234
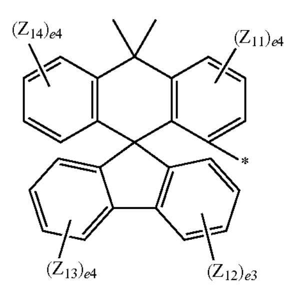
4-235
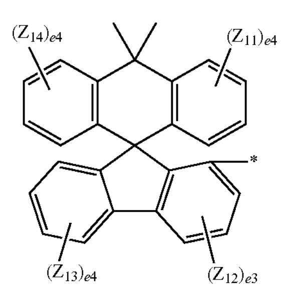

-continued
4-236
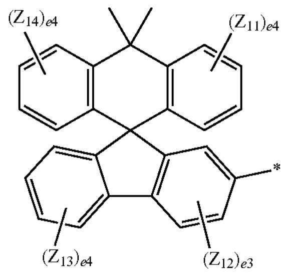
4-237
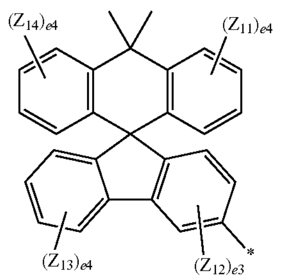
4-238
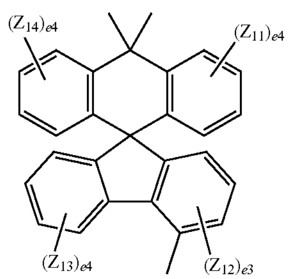
4-239
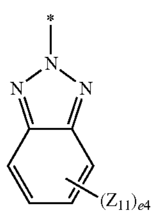
4-240
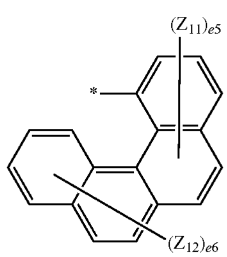
4-241
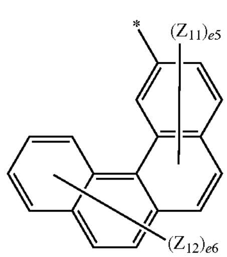
-continued
4-242
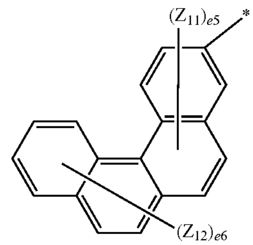
4-243
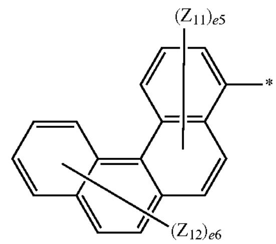
4-244
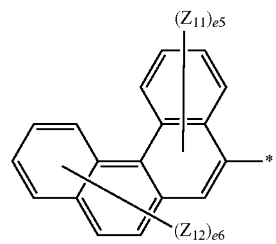
4-245
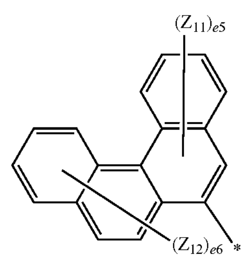
4-246
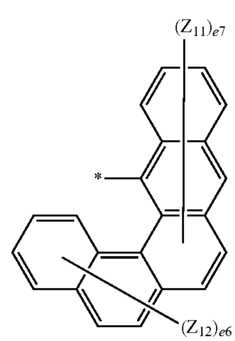

-continued
4-247
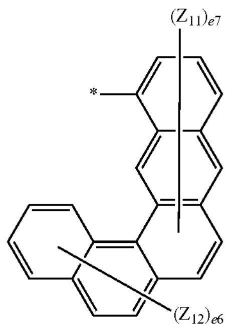
4-248
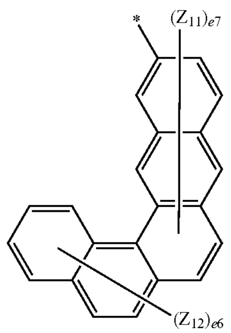
4-249
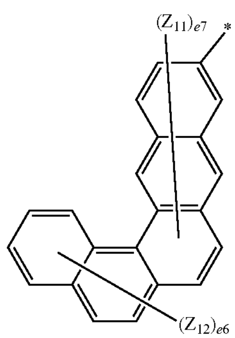
4-250
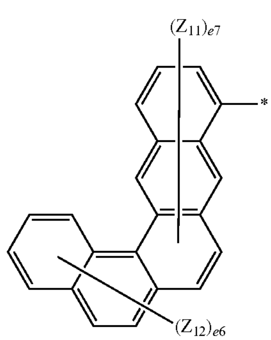
-continued
4-251
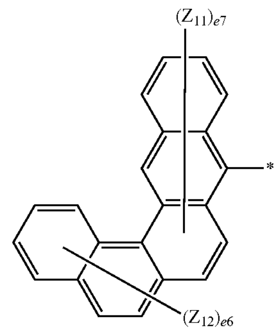
4-252
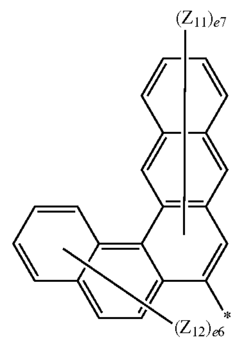
4-253
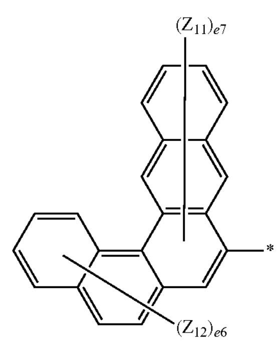
4-254
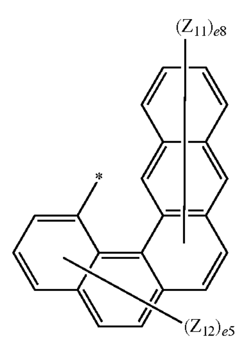

-continued
4-255
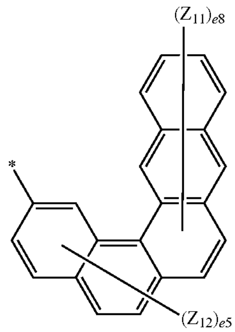
4-256
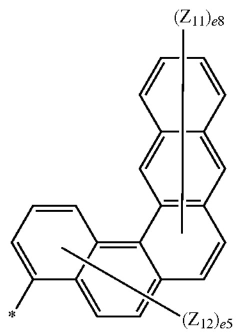
4-257
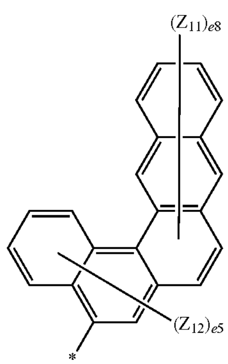
4-258
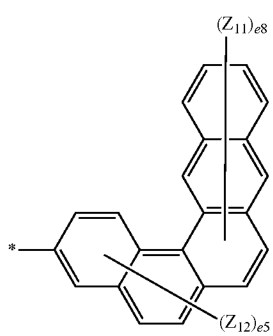
-continued
4-259
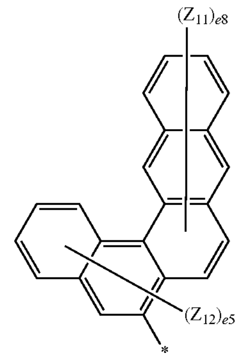
4-260
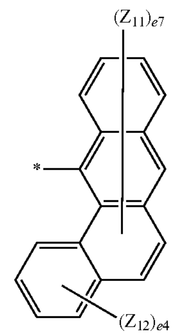
4-261
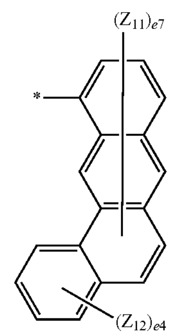
4-262
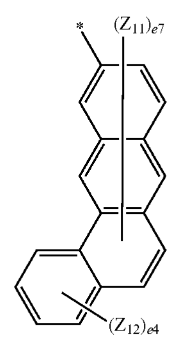

-continued
4-263
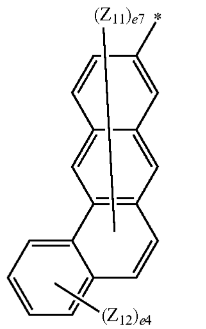
4-264
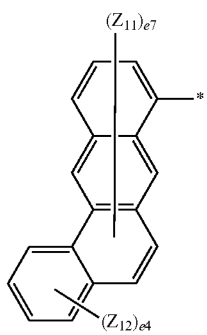
4-265
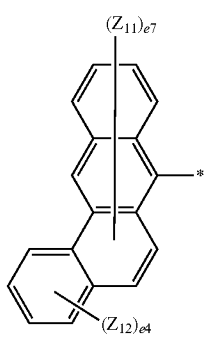
4-266
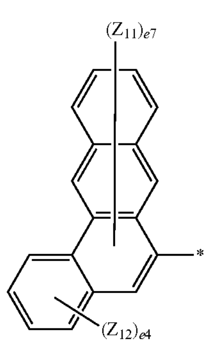
-continued
4-267
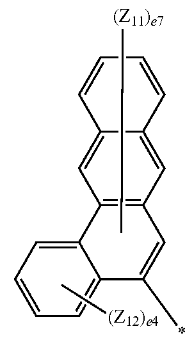
4-268
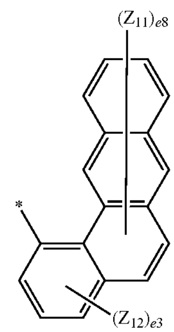
4-269
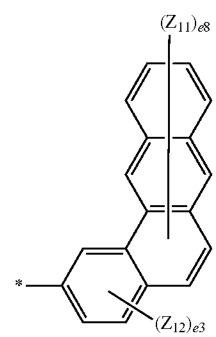
4-270
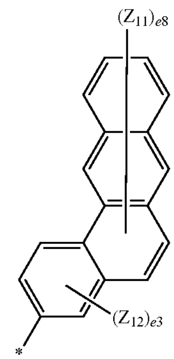

-continued
4-271
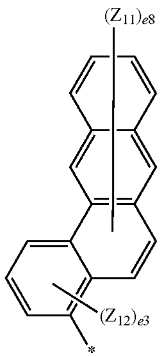
4-272
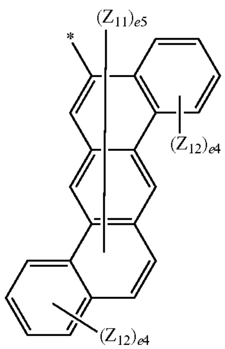
4-273
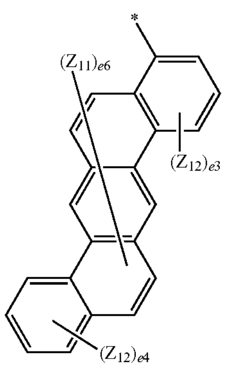
4-274
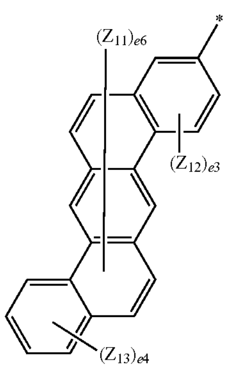
-continued
4-275
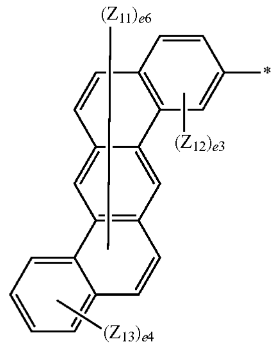
4-276
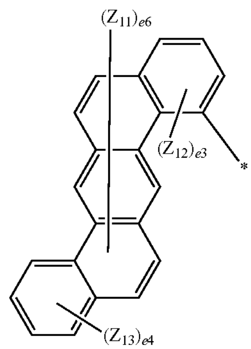
4-277
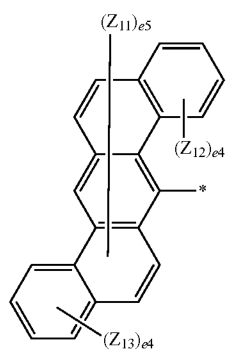
4-278
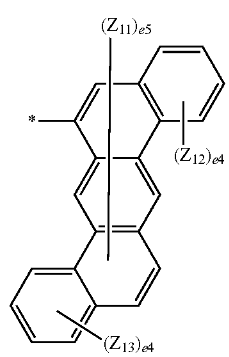

-continued
4-279
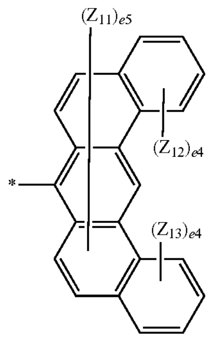
4-280
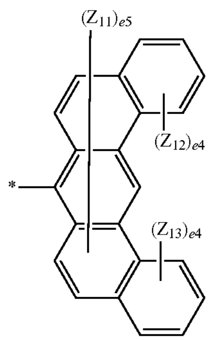
4-281
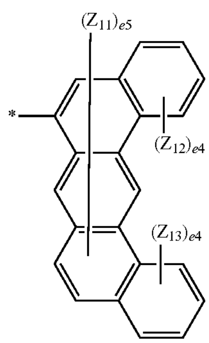
4-282
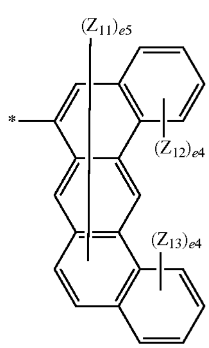
-continued
4-283
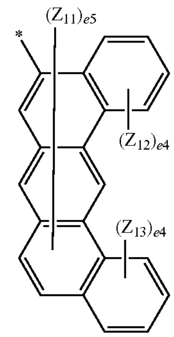
4-284
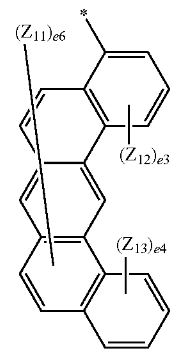
4-285
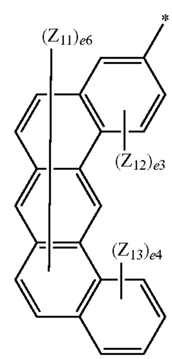
4-286
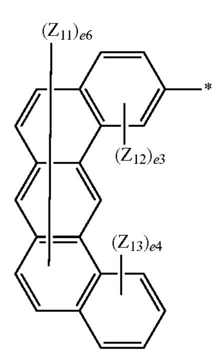

-continued
4-287
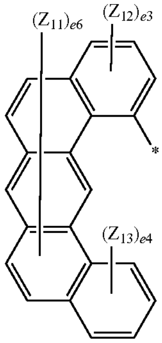
4-288
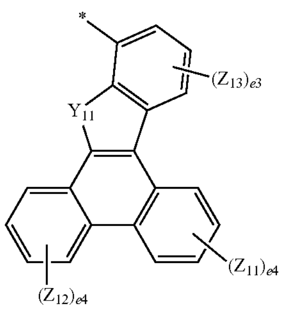
4-289
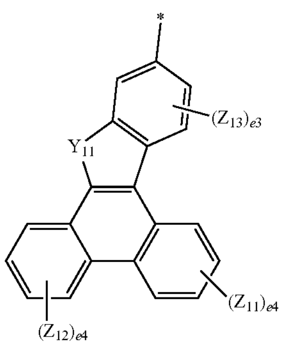
4-290
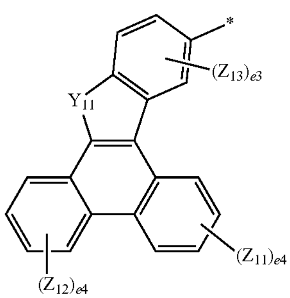
4-291
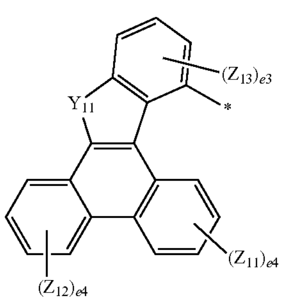
-continued
4-292
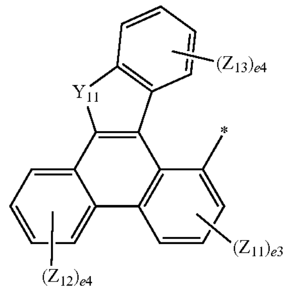
4-293
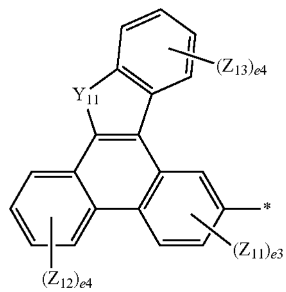
4-294
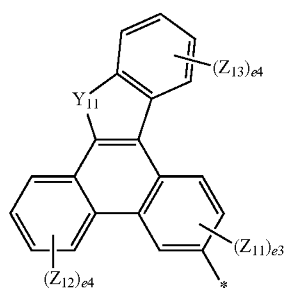
4-295
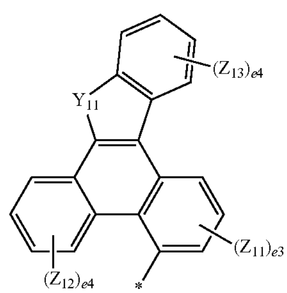
4-296
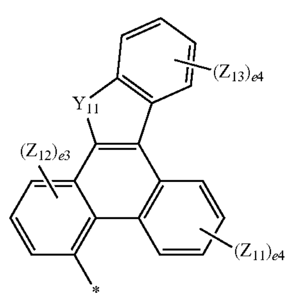

-continued
4-297
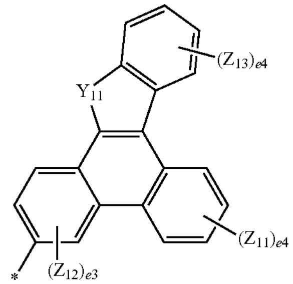
4-298
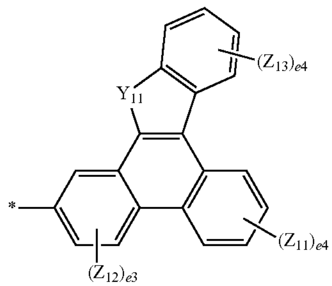
4-299
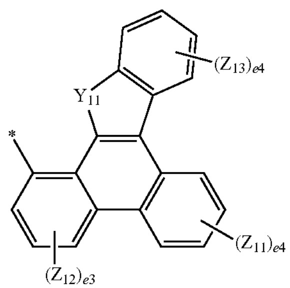
4-300
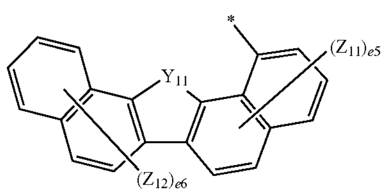
4-301
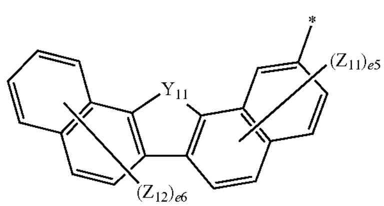
4-302
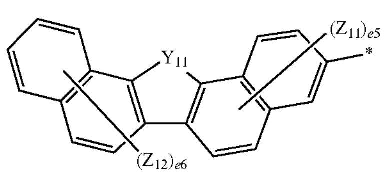
4-303
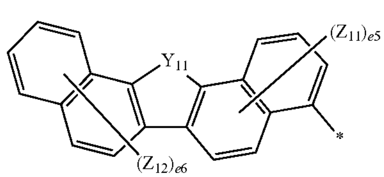
-continued
4-304
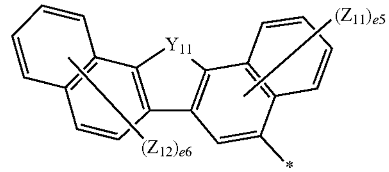
4-305
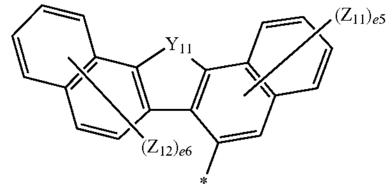
4-306
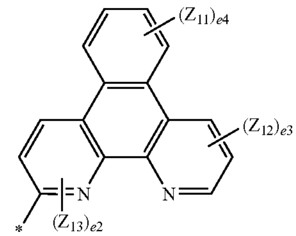
4-307
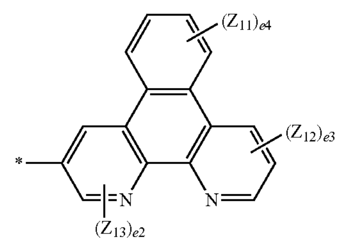
4-308
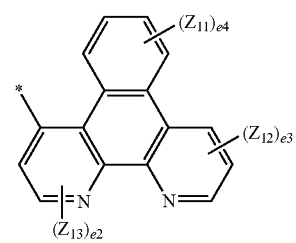
4-309
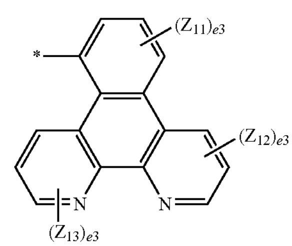
4-310
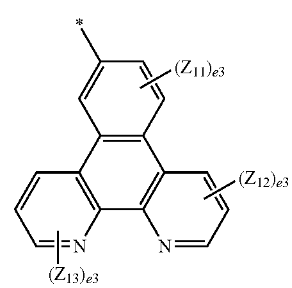

4-311
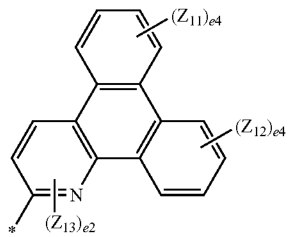
4-312
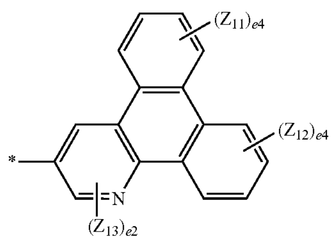
4-313
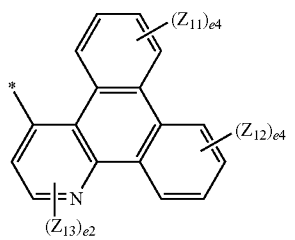
4-314
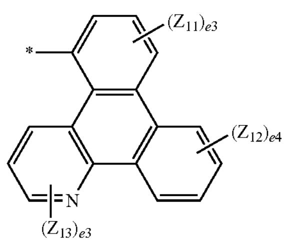
4-315
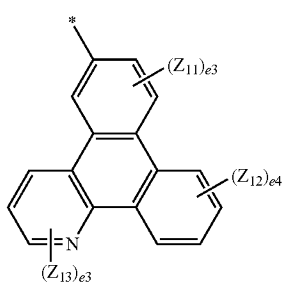
4-316
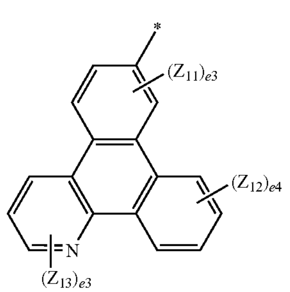
4-317
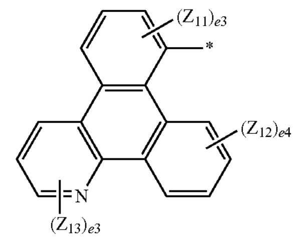
4-318
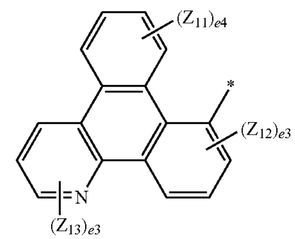
4-319
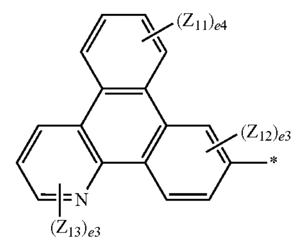
4-320
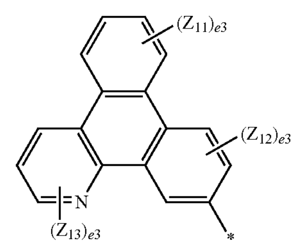
4-321
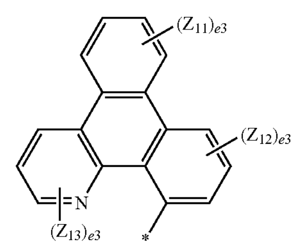
4-322
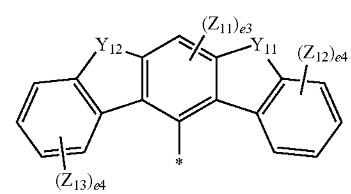
4-323
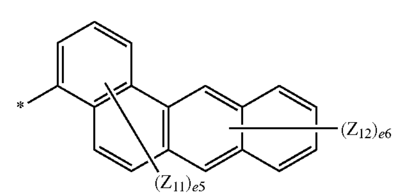

-continued 4-324

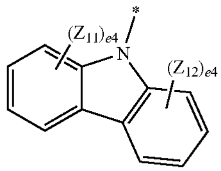

wherein, in Formulae 4-1 to 4-324, $Y_{11}$ is O, S, Se, $N(Z_{18})$, $Si(Z_{18})(Z_{15})$, or $C(Z_{18})(Z_{15})$, $Y_{12}$ is O, S, Se, $N(Z_{16})$, $Si(Z_{16})(Z_{17})$, or $C(Z_{16})(Z_{17})$, $Z_{11}$ to $Z_{18}$ are each independently:

hydrogen, deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each, independently from one another, unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each, independently from one another, unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or any combination thereof; or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ are each, independently from one another: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group; or a $C_1$-$C_{60}$ heterocyclic group, each, independently from one another, unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, e2 is an integer from 0 to 2, e3 is an integer from 0 to 3, e4 is an integer from 0 to 4, e5 is an integer from 0 to 5, e6 is an integer from 0 to 6, e7 is an integer from 0 to 7, e8 is an integer from 0 to 8, e9 is an integer from 0 to 9, and

* indicates a binding site to a neighboring group.

14. The light-emitting device of claim 1, wherein Formula 1-1 is one of Formulae 1-1(a) to 1-1(e);

Formula 1-2 is one of Formulae 1-2(a) to 1-2(d); and

Formula 1-3 is Formula 1-3(a):

Formula 1-1(a)

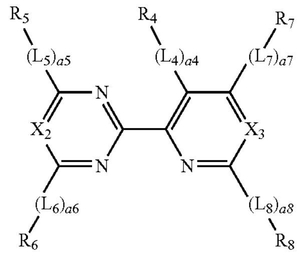

Formula 1-1(b)

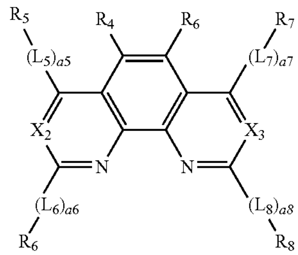

Formula 1-1(c)

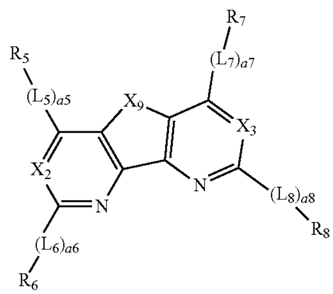

Formula 1-1(d)

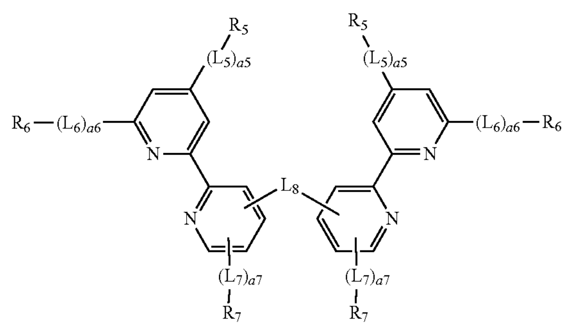

Formula 1-1(e)

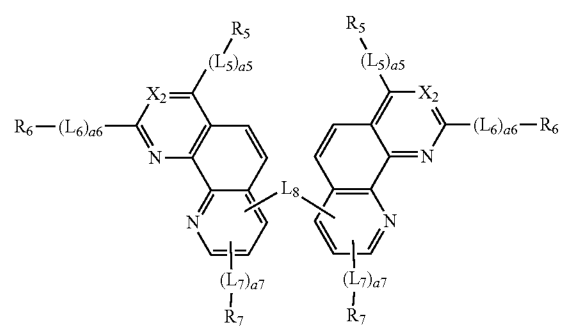

-continued

Formula 1-2(a)

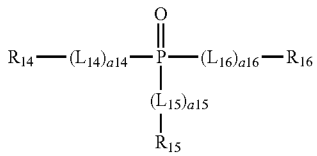

Formula 1-2(b)

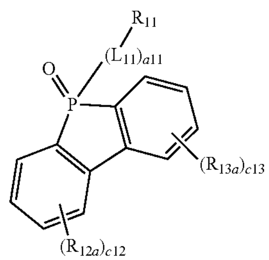

Formula 1-2(c)

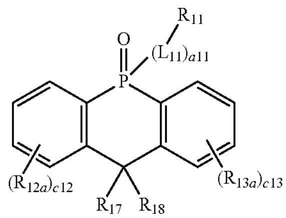

Formula 1-2(d)

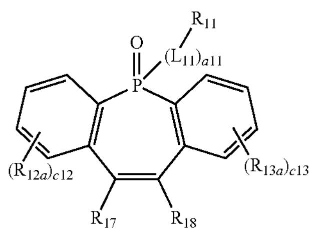

Formula 1-3(a)

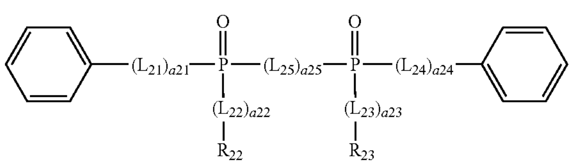

wherein, in Formulae 1-1(a) to 1-1(e), 1-2(a) to 1-2(d), and 1-3(a), $X_2$ to $X_3$, $L_4$ to $L_8$, $L_{11}$, $L_{21}$ to $L_{25}$, a4 to a8, a11, a14 to a16, a21 to a25, $R_4$ to $R_8$, $R_{11}$, and $R_{22}$ to $R_{23}$ have, independently from one another, the same meanings, as in claim 1, $X_9$ is O, S, Se, $N(R_{9a})$, $Si(R_{9a})(R_{9b})$, or $C(R_{9a})(R_{9b})$, at least one of $R_{14}$ to $R_{16}$ is a phenanthrenyl group, an anthracenyl group, a fluoranthenyl group, a triphenylenyl group, a pyrenyl group, a chrysenyl group, a benzo[g]chrysenyl group, a benzo[k]tetraphenyl group, a benzo[m]tetraphenyl group, a benzo[f]tetraphenyl group, a perylenyl group, a benzo[k]fluoranthenyl group, a dibenzo[e,l]acephenanthrenyl group, a 9,9-dimethyl-9H-indeno[2,1-b]fluoranthenyl group, a fluorenyl group, a spiro-bifluorenyl group, a spiro-anthracenefluorenyl group, a benzo[c]phenanthrenyl group, a tetraphenyl group, a dibenzo[b,d]furanyl group, a dibenzo[b,d]thiophenyl group, a carbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphthosilolyl group, a phenanthrobenzofuranyl group, a fluoranthenobenzofuranyl group, a phenanthridinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a phenoxazinyl group, a phenothiazinyl group, a phenoxathinyl group, a benzimidazolyl group, a benzofuranyl group, a benzothiophenyl group, and a benzosilolyl group, each, independently from one another, unsubstituted or substituted with a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, a phenanthrenyl group, an anthracenyl group, a fluoranthenyl group, a triphenylenyl group, a pyrenyl group, a chrysenyl group, a benzo[g]chrysenyl group, a benzo[k]tetraphenyl group, a benzo[m]tetraphenyl group, a benzo[f]tetraphenyl group, a perylenyl group, a benzo[k]fluoranthenyl group, a dibenzo[e,l]acephenanthrenyl group, a 9,9-dimethyl-9H-indeno[2,1-b]fluoranthenyl group, a fluorenyl group, a spiro-bifluorenyl group, a spiro-anthracene-fluorenyl group, a benzo[c]phenanthrenyl group, a tetraphenyl group, a dibenzo[b,d]furanyl group, a dibenzo[b,d]thiophenyl group, a carbazolyl group, a naphthobenzofuranyl group, a naphthobenzothiophenyl group, a naphthobenzosilolyl group, a dibenzocarbazolyl group, a dinaphthofuranyl group, a dinaphthothiophenyl group, a dinaphthosilolyl group, a phenanthrobenzofuranyl group, a fluoranthenobenzofuranyl group, a phenanthridinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a benzoquinazolinyl group, a cinnolinyl group, a phenanthridinyl group, an acridinyl group, a phenanthrolinyl group, a phenazinyl group, a phenoxazinyl group, a phenothiazinyl group, a phenoxathinyl group, a benzimidazolyl group, a benzofuranyl group, a benzothiophenyl group, a benzosilolyl group, or any combination thereof, $L_{14}$-$L_{16}$ have, independently from one another, the same meanings as $R_{11}$ in claim 1, $R_{9a}$, $R_{9b}$, $R_{12a}$, $R_{13a}$, $R_{14}$ to $R_{18}$ have, independently from one another, the same meanings as $R_{10a}$ in claim 1, c12 and c13 are each, independently from one another, an integer from 0 to 4, and two neighboring groups among $R_4$ to $R_8$, $R_{12a}$, $R_{9a}$, $R_{9b}$, $R_{12a}$, $R_{13a}$, $R_{14}$ to $R_{18}$ are optionally linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_3$-$C_{60}$ carbocyclic group unsubstituted or substituted with at least one $R_{10a}$ or a $C_1$-$C_{60}$ heterocyclic group substituted or unsubstituted at least one $R_{10a}$.

15. The light-emitting device of claim 1, wherein Formula 1-1 is one of Formulae 1-1-1 to 1-1-18;
Formula 1-2 is one of Formulae 1-2-1 to 1-2-92; and
Formula 1-3 is one of Formulae 1-3-1 to 1-3-8:
1-1-1
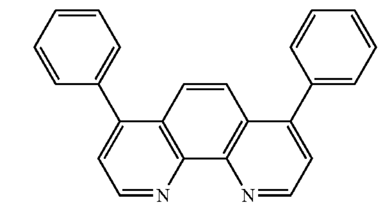
1-1-2
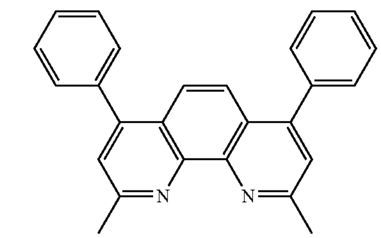
1-1-3
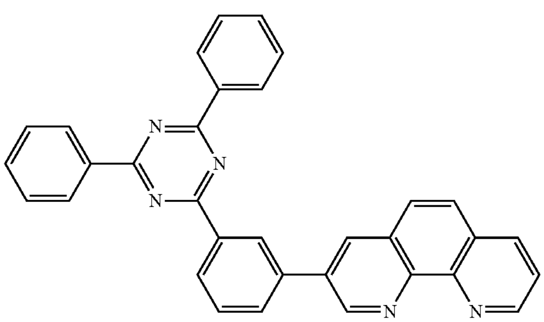
1-1-4
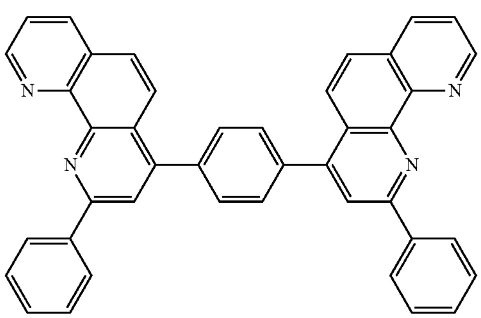
1-1-5
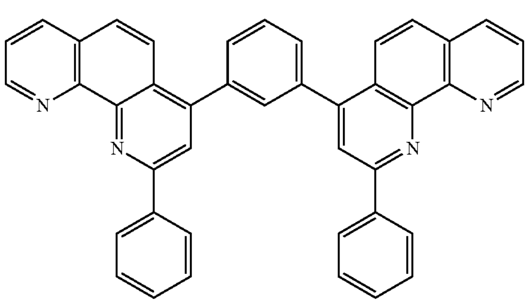
-continued
1-1-6
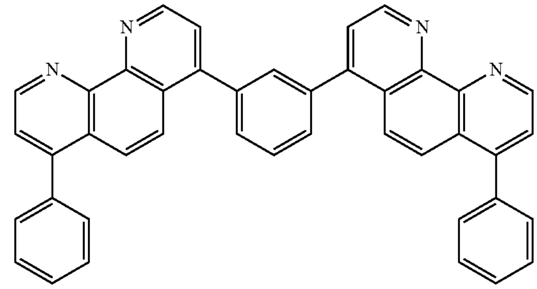
1-1-7
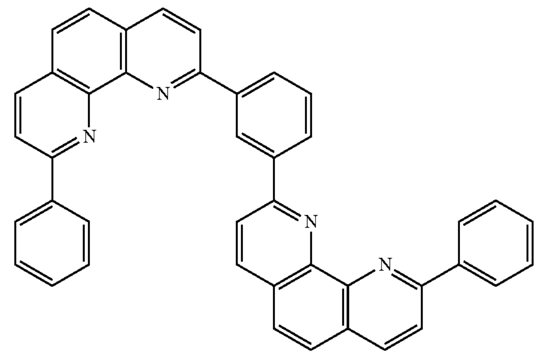
1-1-8
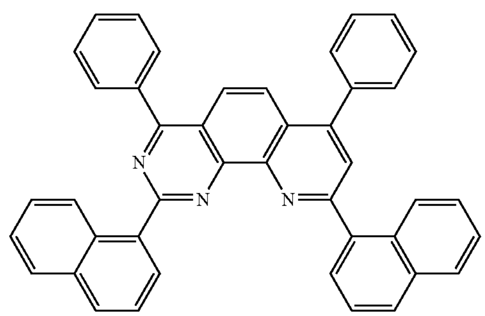
1-1-9
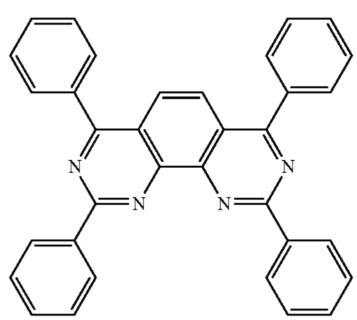

-continued
1-1-10
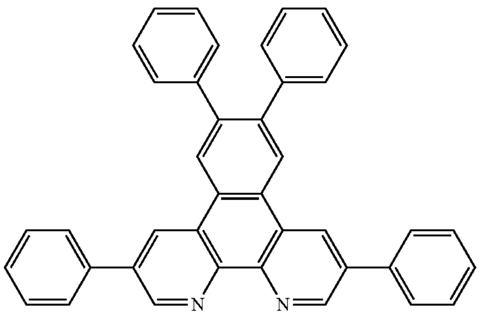
1-1-11
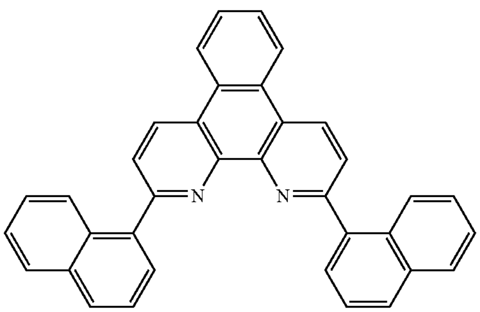
1-1-12
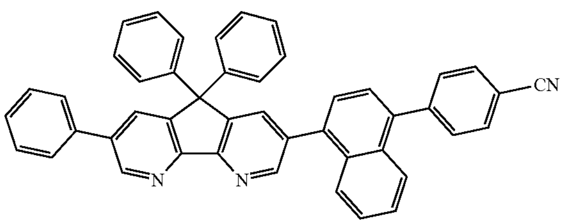
1-1-13
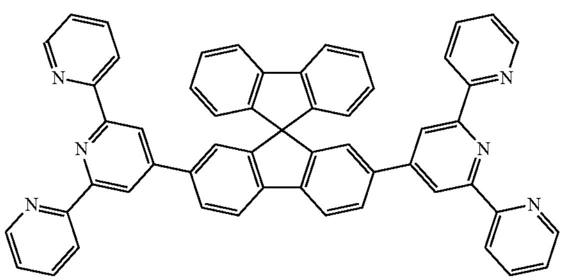
1-1-14
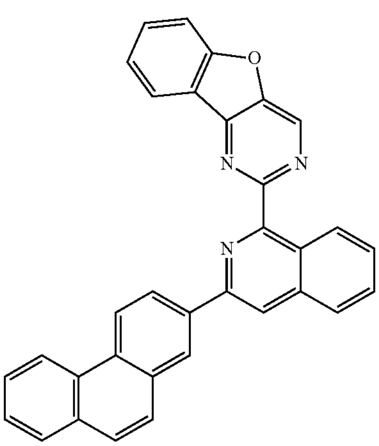
-continued
1-1-15
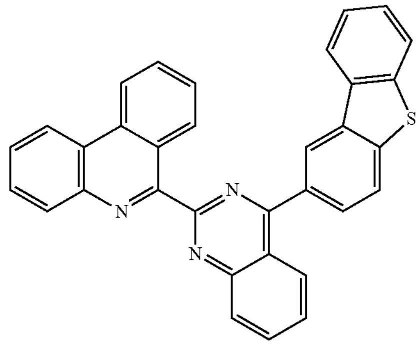
1-1-16
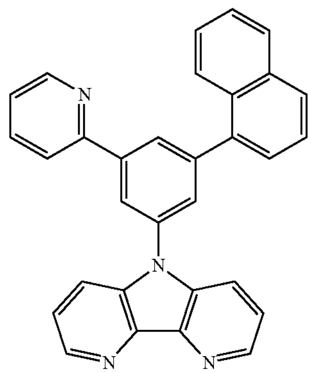
1-1-17
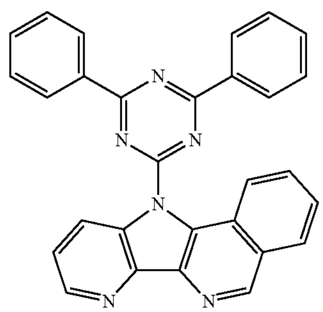
1-1-18
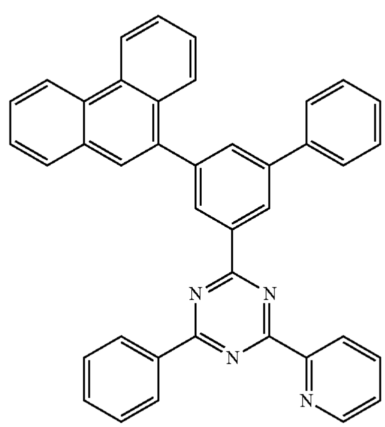

-continued
1-2-1
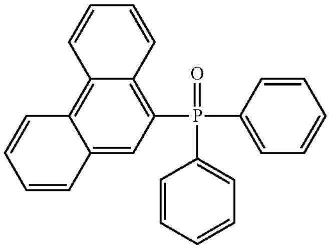
1-2-2
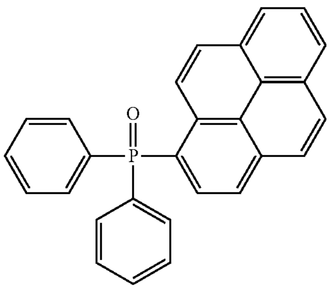
1-2-3
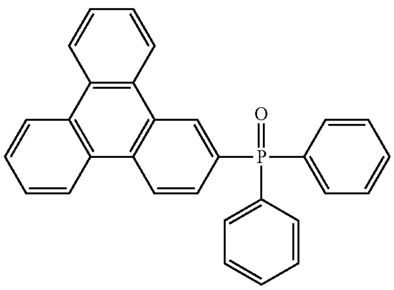
1-2-4
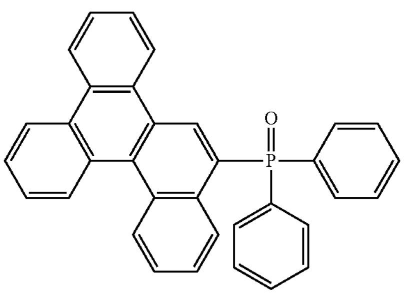
1-2-5
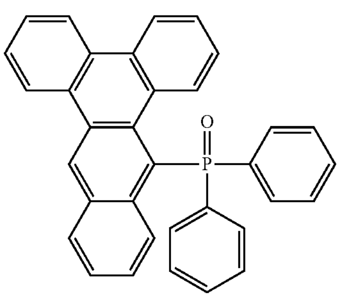
-continued
1-2-6
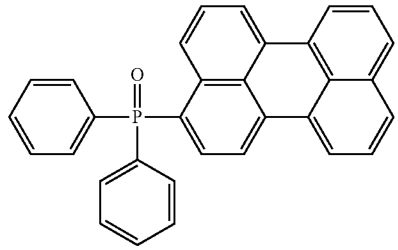
1-2-7
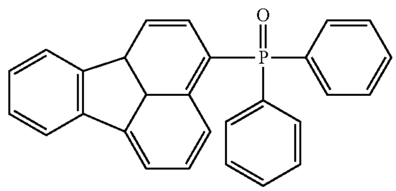
1-2-8
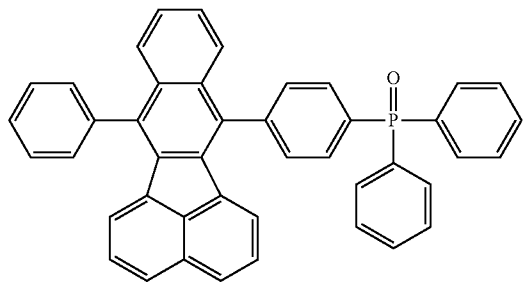
1-2-9
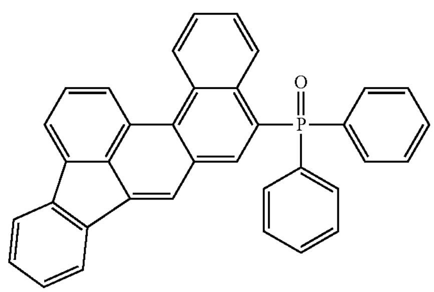
1-2-10
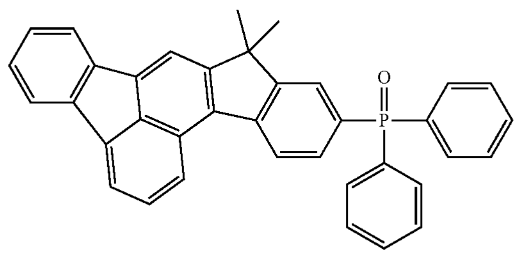

-continued
1-2-11
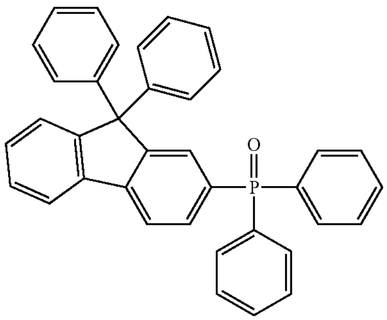
1-2-12
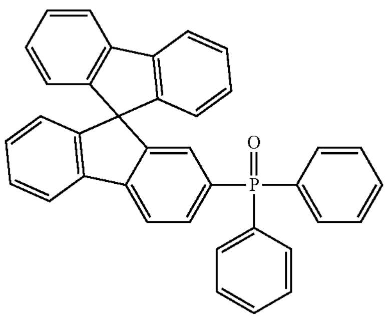
1-2-13
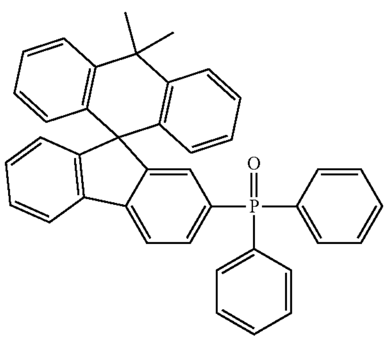
1-2-14
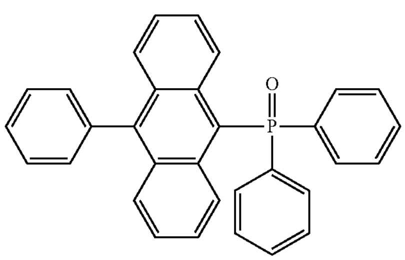
1-2-15
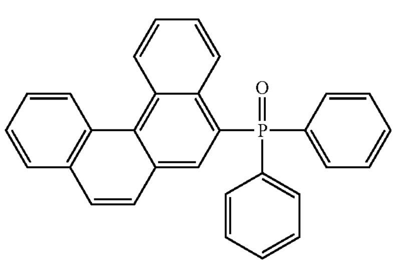
-continued
1-2-16
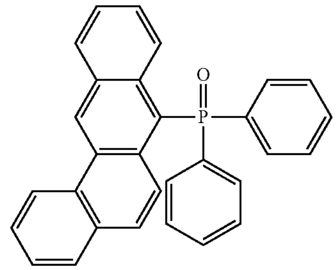
1-2-17
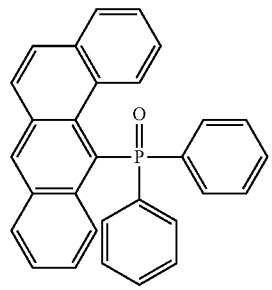
1-2-18
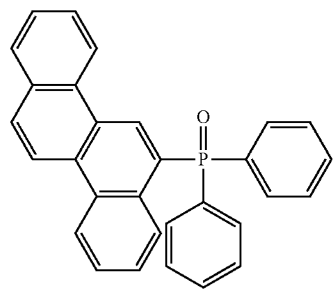
1-2-19
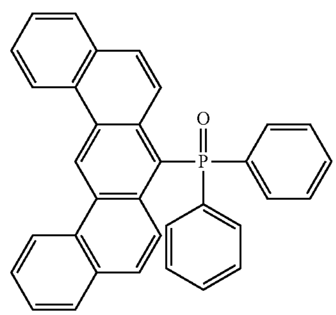
1-2-20
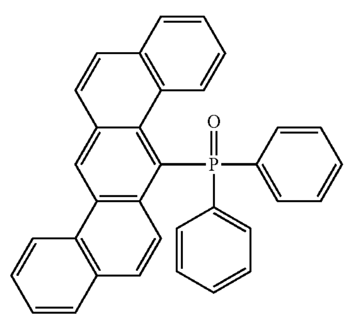

-continued
1-2-21
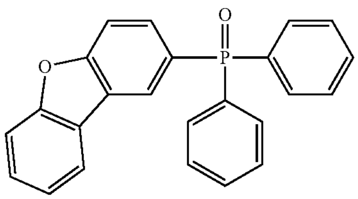
1-2-22
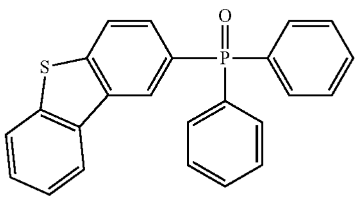
1-2-23
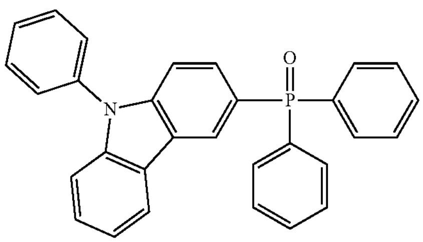
1-2-24
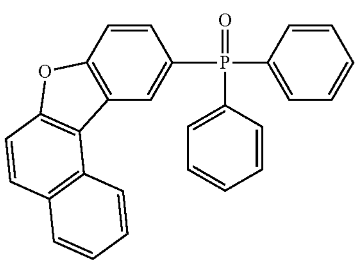
1-2-25
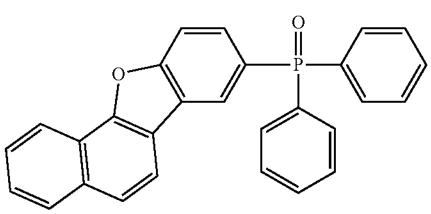
1-2-26
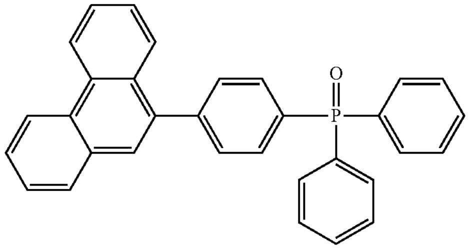
-continued
1-2-27
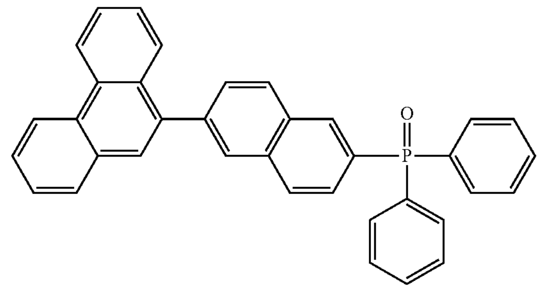
1-2-28
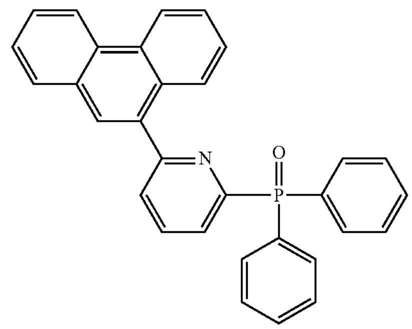
1-2-29
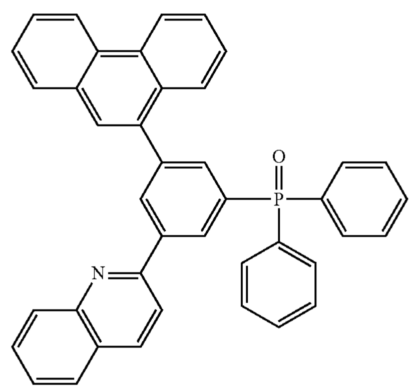
1-2-30
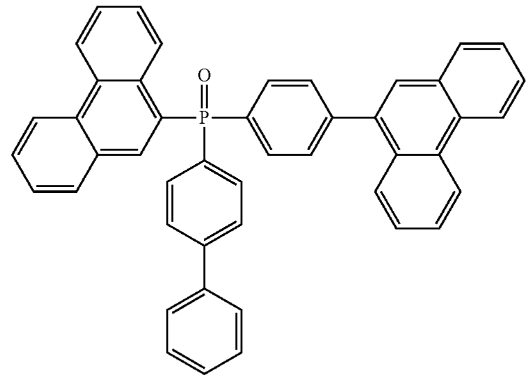

-continued
1-2-31
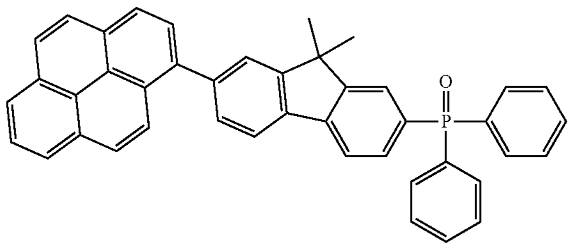
1-2-32
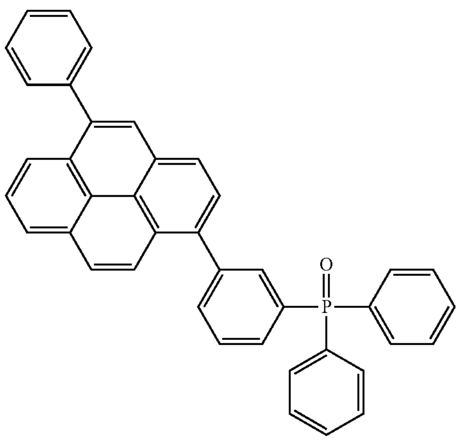
1-2-33
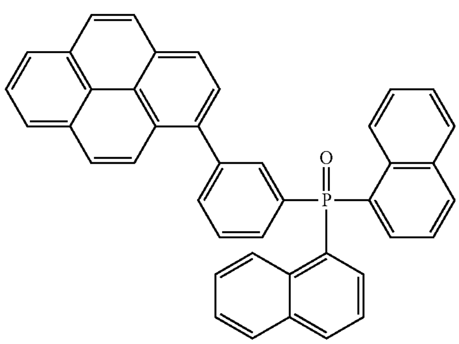
1-2-34
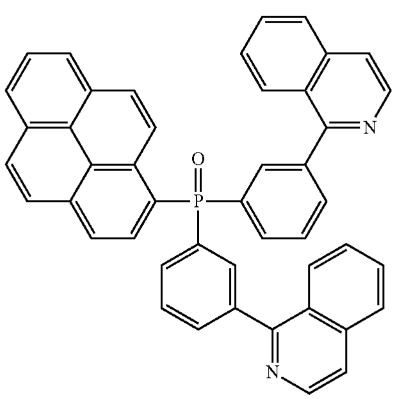
-continued
1-2-35
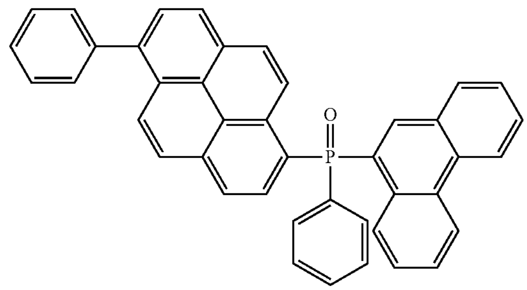
1-2-36
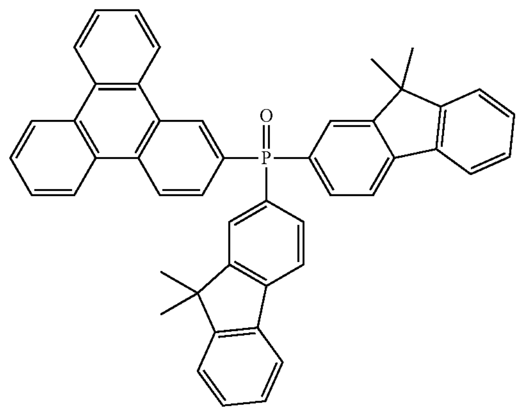
1-2-37
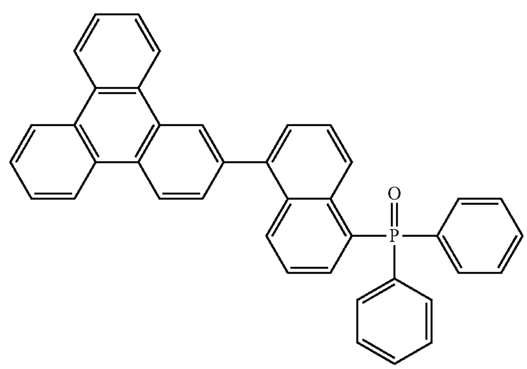
1-2-38
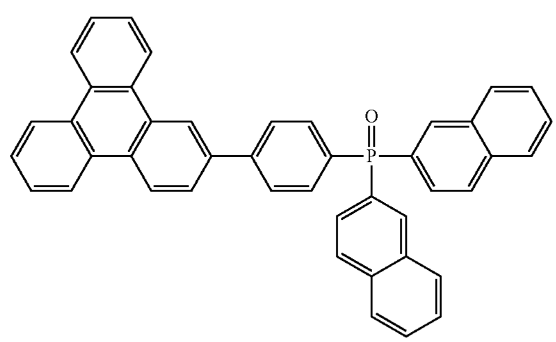

1-2-39
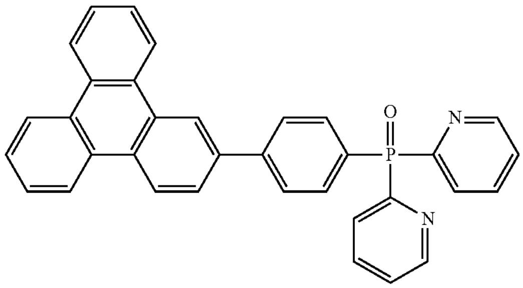
1-2-40
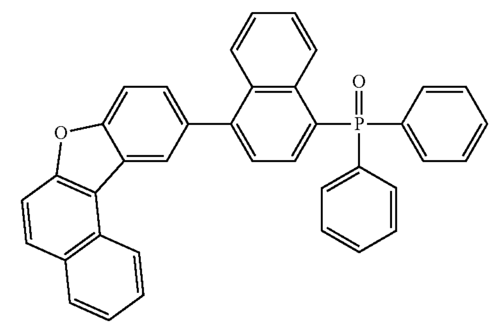
1-2-41
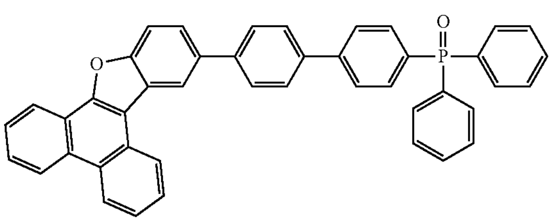
1-2-42
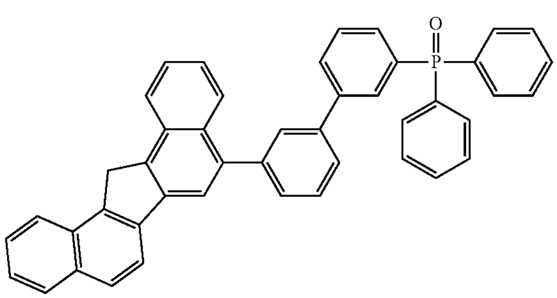
1-2-43
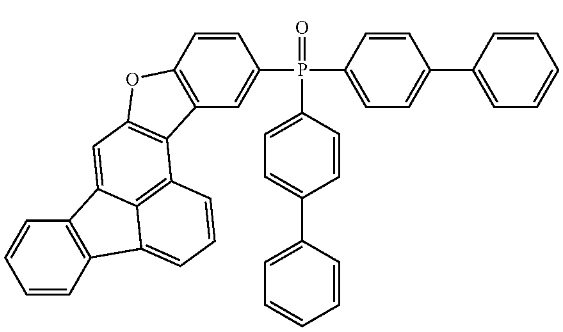
1-2-44
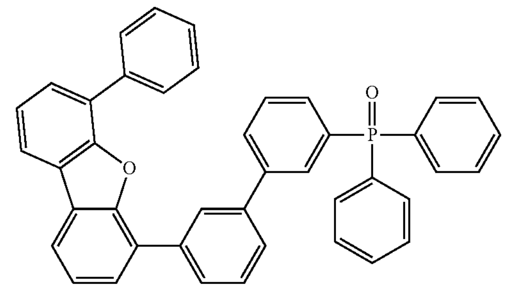
1-2-45
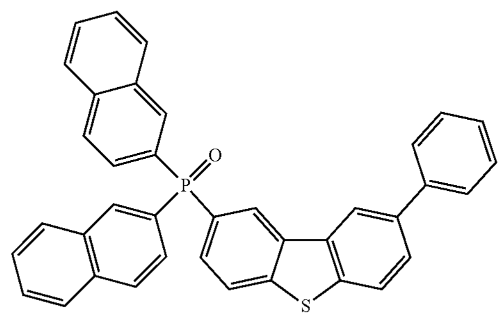
1-2-46
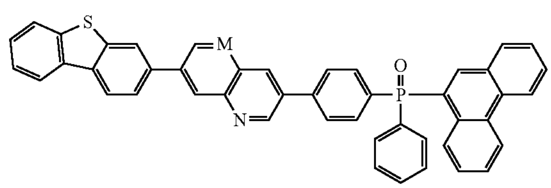
1-2-47
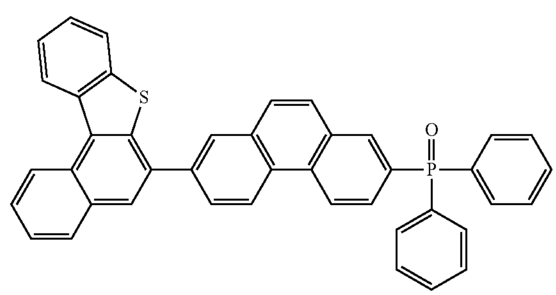
1-2-48
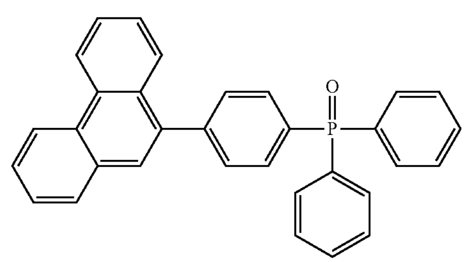

1-2-49
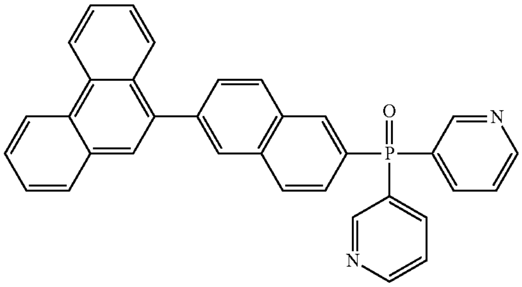
1-2-50
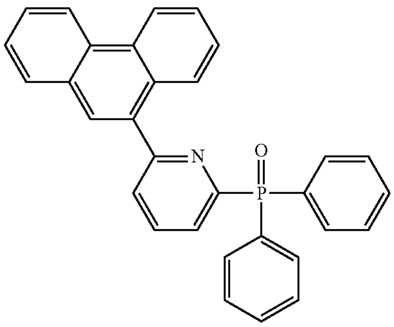
1-2-51
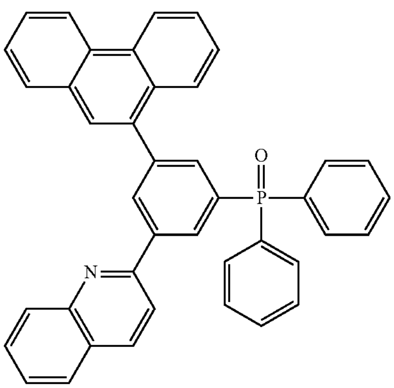
1-2-52
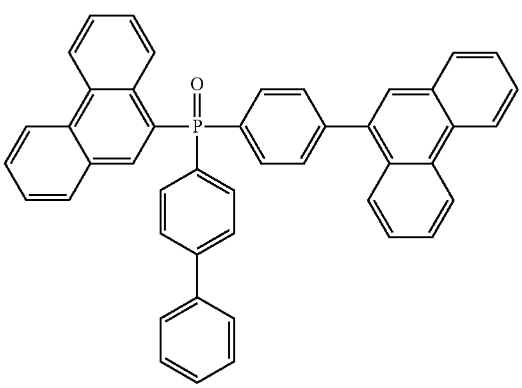
1-2-53
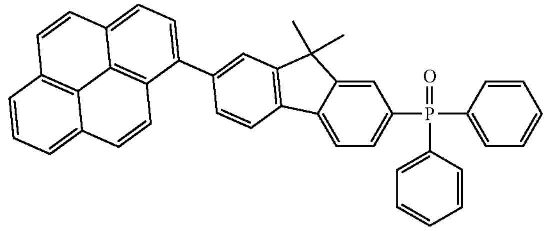
1-2-54
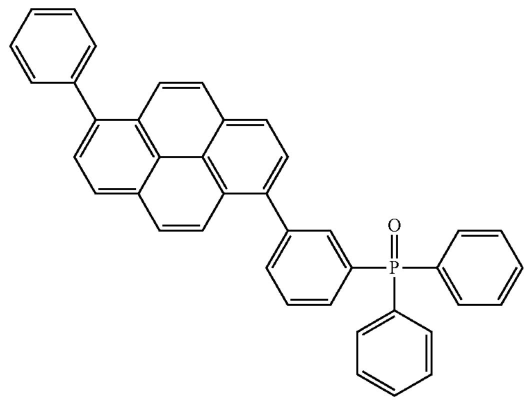
1-2-55
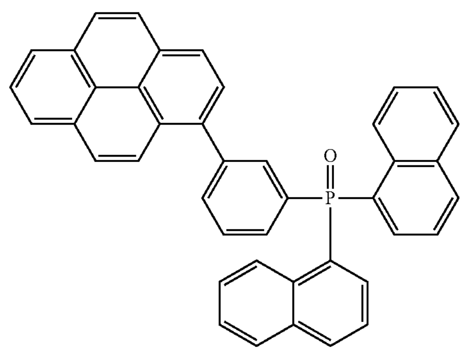
1-2-56
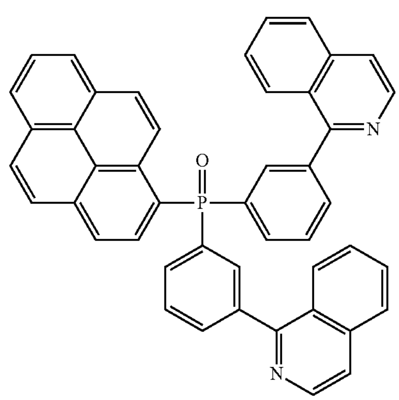

-continued
1-2-57
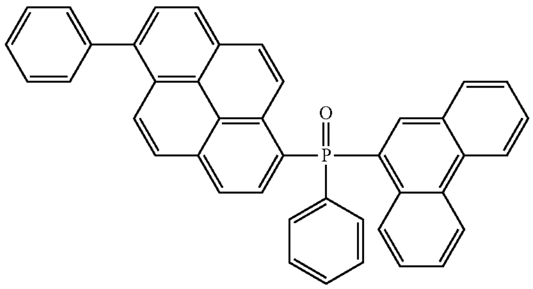
1-2-58
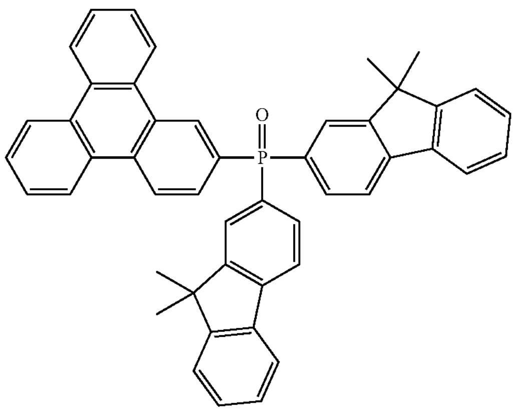
1-2-59
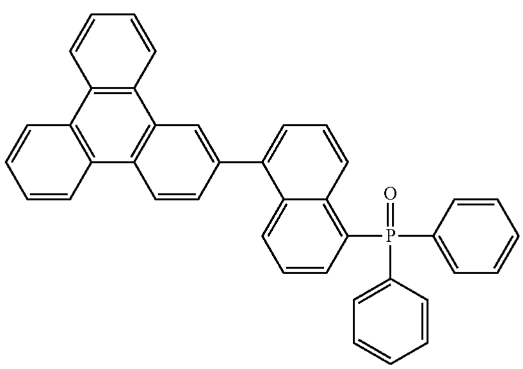
1-2-60
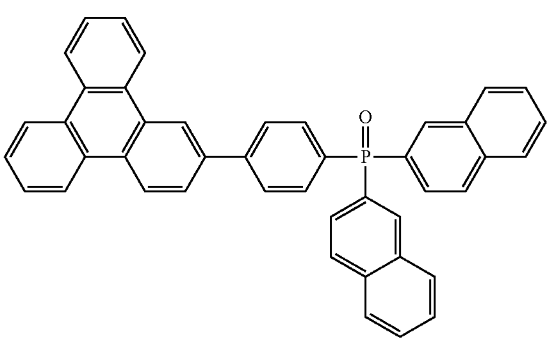
-continued
1-2-61
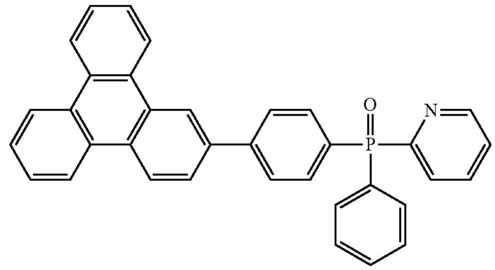
1-2-62
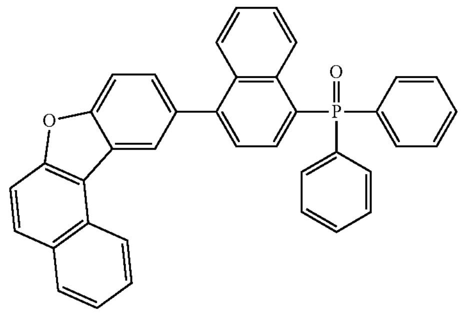
1-2-63
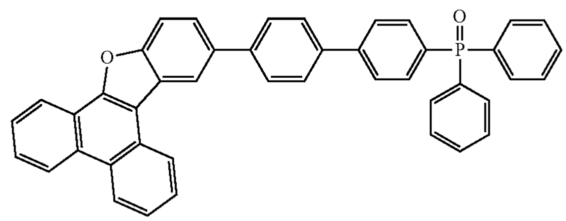
1-2-64
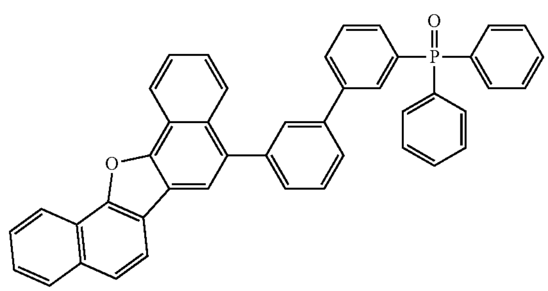
1-2-65
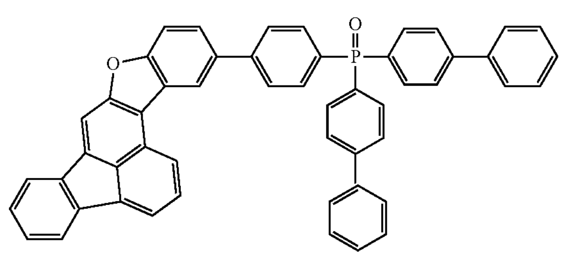

1-2-66
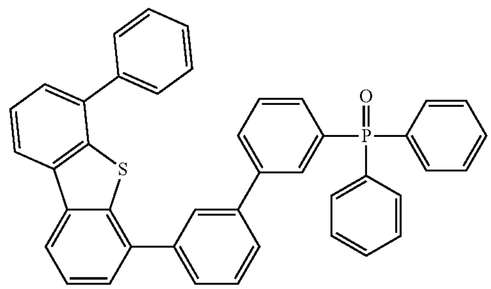
1-2-67
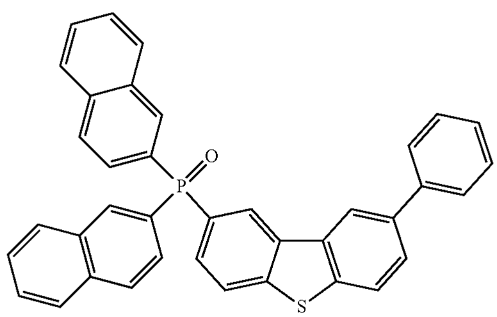
1-2-68
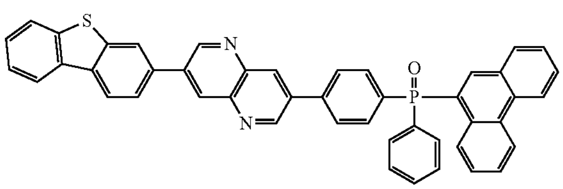
1-2-69
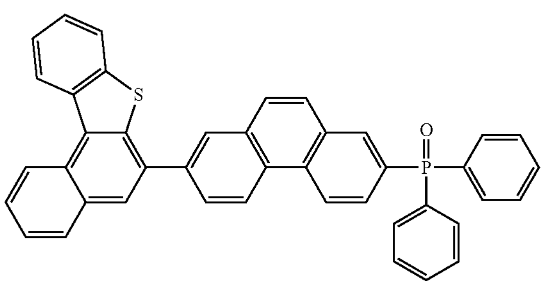
1-2-70
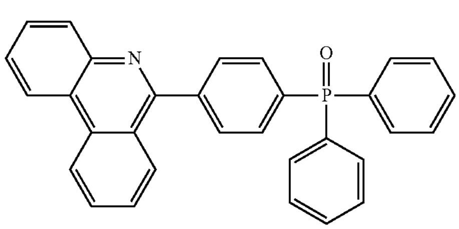
1-2-71
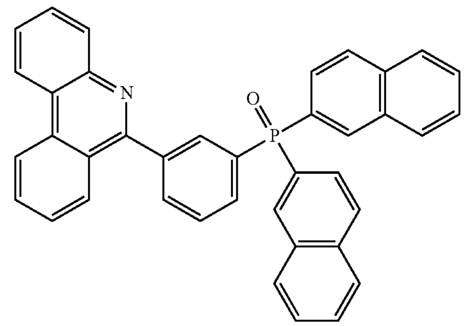
1-2-72
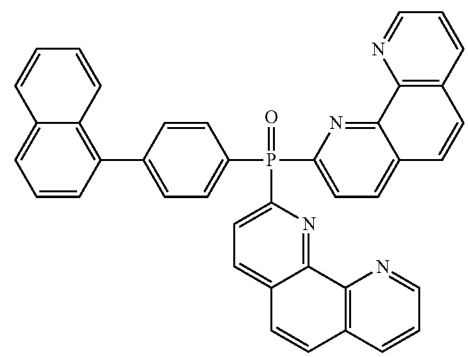
1-2-73
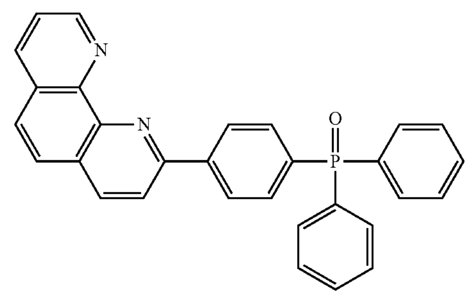
1-2-74
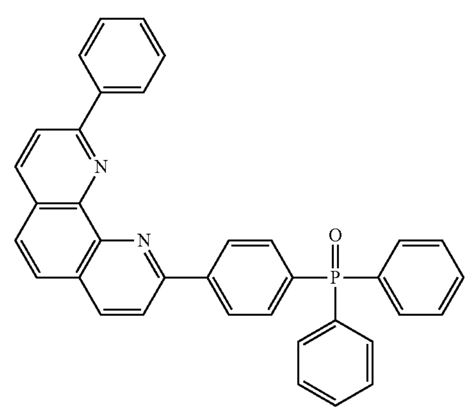

1-2-75
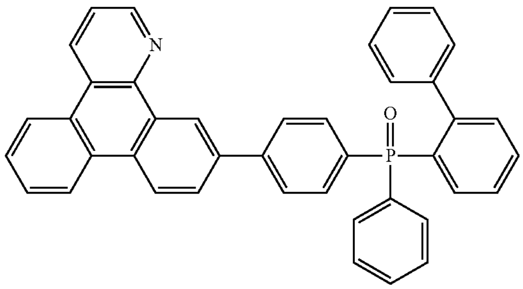
1-2-76
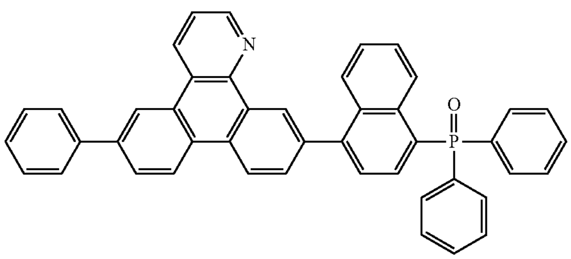
1-2-77
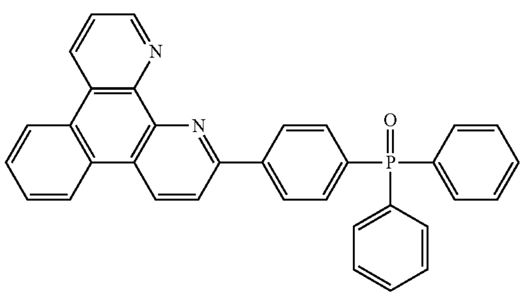
1-2-78
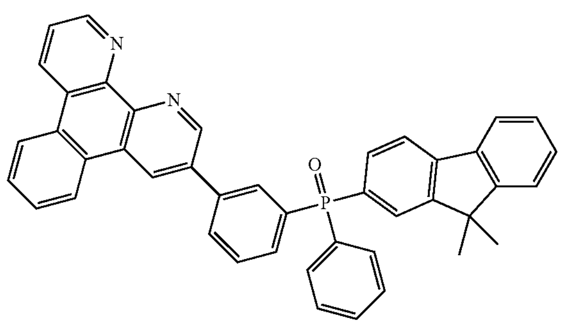
1-2-79
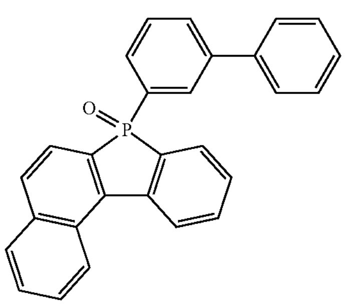
1-2-80
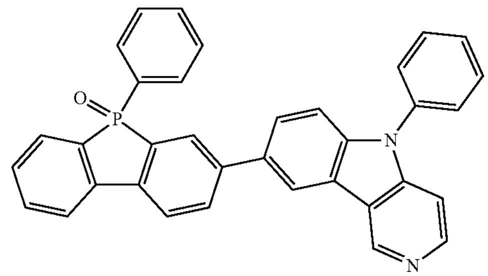
1-2-81
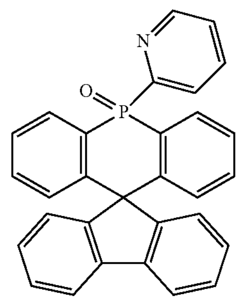
1-2-82
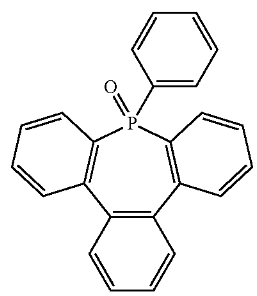
1-2-83
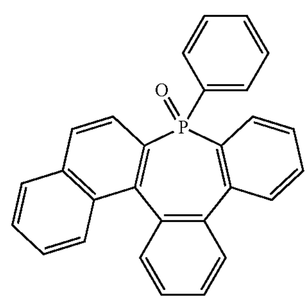
1-2-84
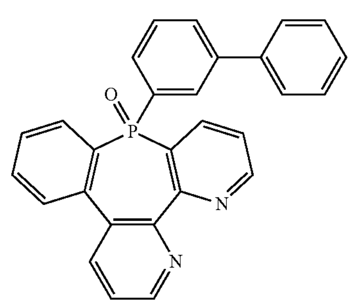

-continued
1-2-85
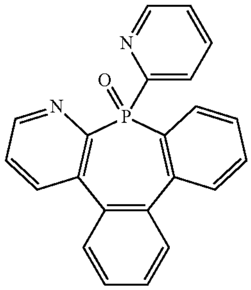
1-2-86
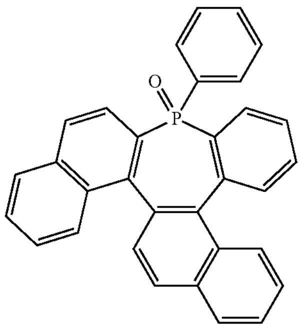
1-2-87
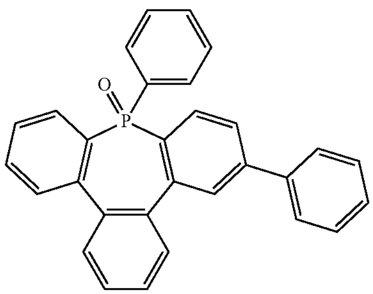
1-2-88
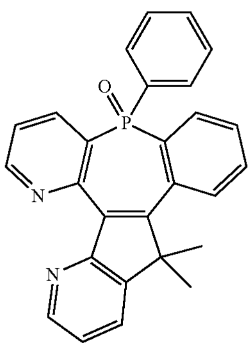
1-2-89
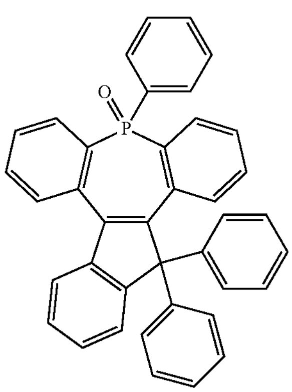
-continued
1-2-90
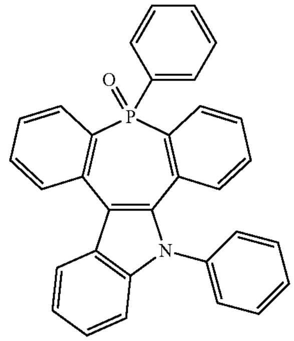
1-2-91
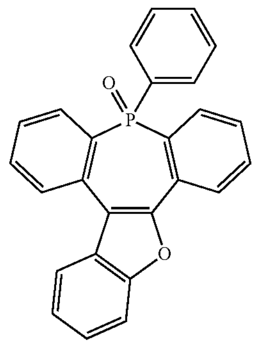
1-2-92
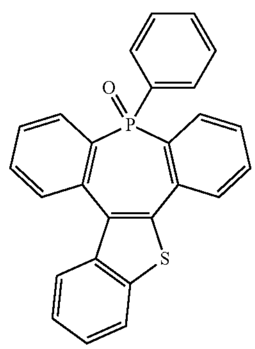
1-3-1
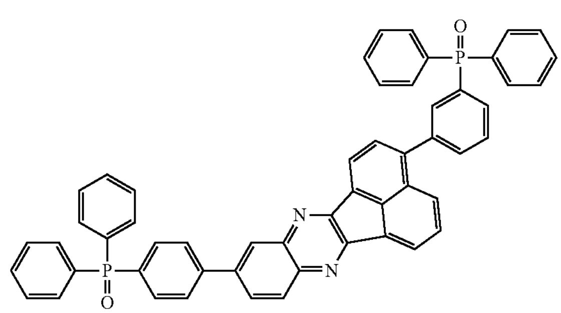

-continued
1-3-2
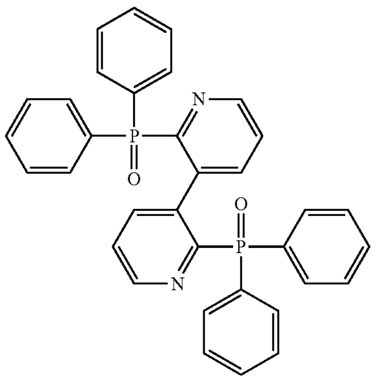
1-3-3
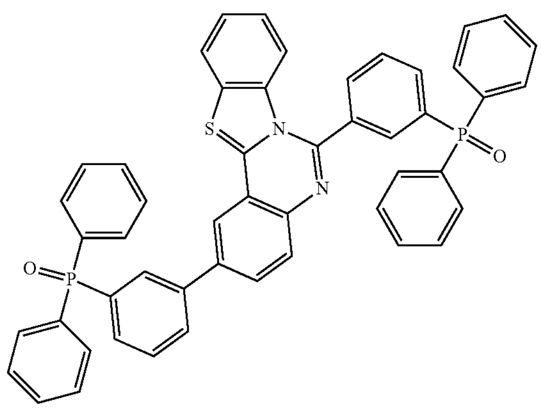
1-3-4
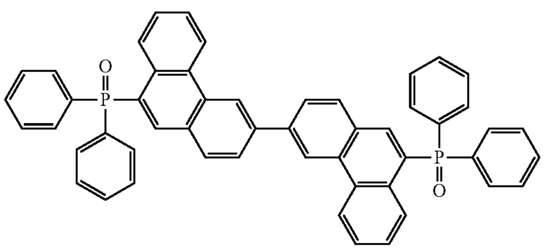
1-3-5
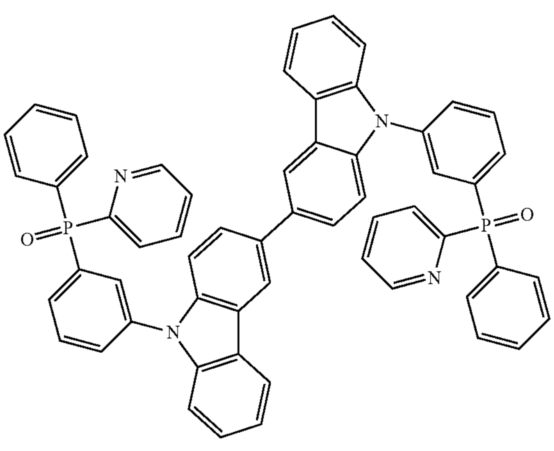
-continued
1-3-6
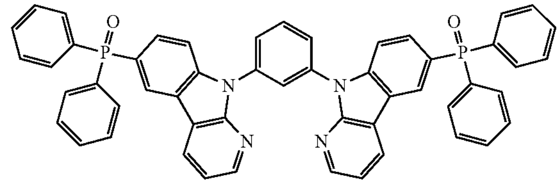
1-3-7
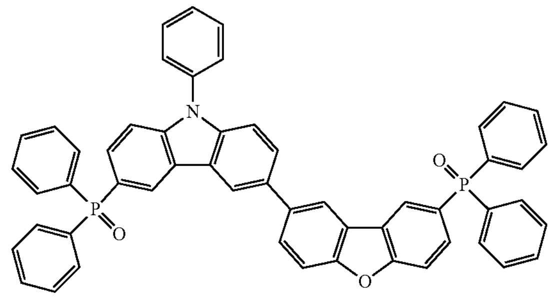
1-3-8
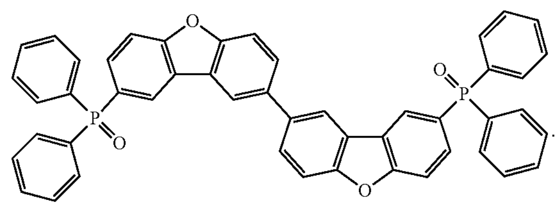
16. The light-emitting device of claim 1, wherein Formula 2-1 is Formula 2-1(a);
Formula 2-2 is one of Formulae 2-2(a) and 2-2(b);
Formula 2-3 is Formula 2-3(a);
Formula 2-4 is one of Formulae 2-4(a) to 2-4(b);
Formula 2-5 is one of Formulae 2-5(a) to 2-5(b); and
Formula 2-6 is one of Formulae 2-6(a) to 2-6(d):
Formula 2-1(a)
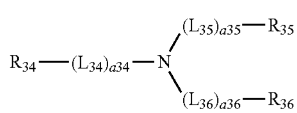
Formula 2-2(a)
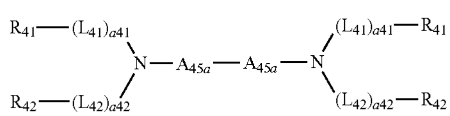
Formula 2-2(b)
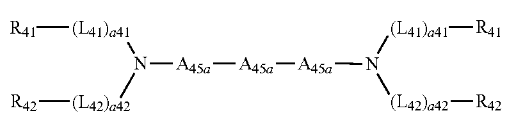

-continued
Formula 2-3(a)
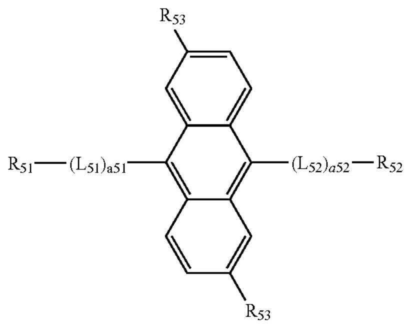
Formula 2-4-(a)
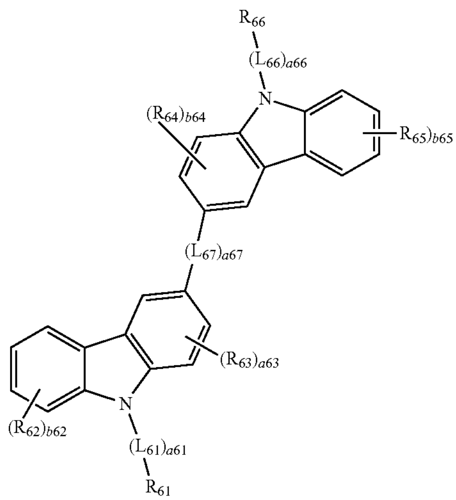
Formula 2-4(b)
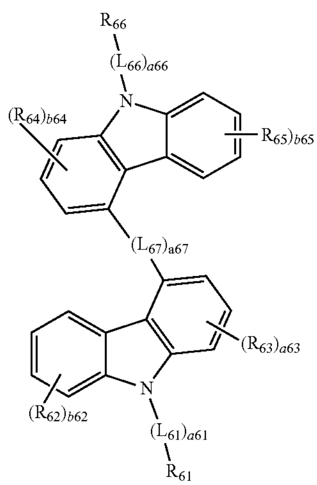
-continued
Formula 2-5(a)
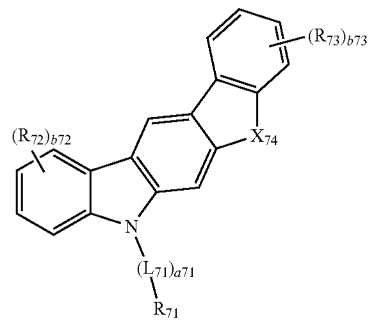
Formula 2-5(b)
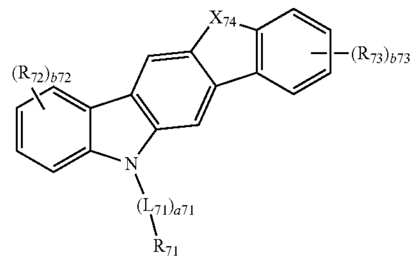
Formula 2-6(a)
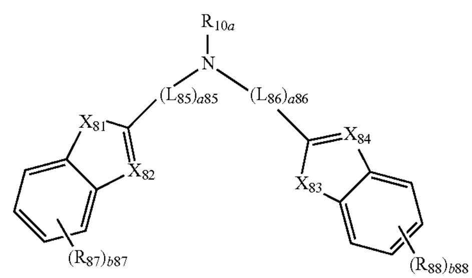
Rormula 2-6(b)
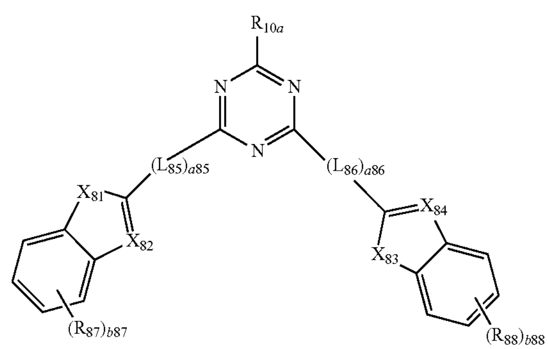
Formula 2-6(c)
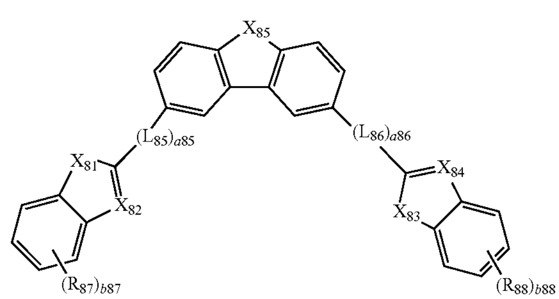

-continued

Formula 2-6(d)

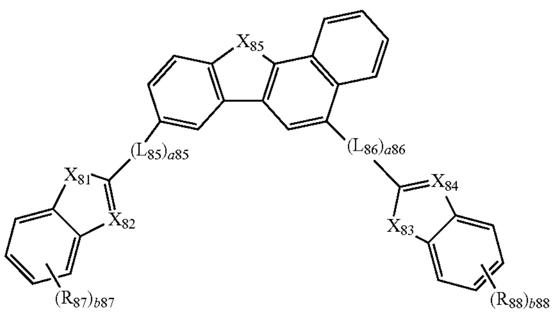

wherein, in Formulae 2-1(a), 2-2(a) to 2-2(b), 2-3(a), 2-4(a) to 2-4(b), 2-5(a) to 2-5(b), and 2-6(a) to 2-6(d), $A_{45a}$ and $A_{45b}$, have, independently from one another, the same meaning as $A_{45}$ in claim 1;

$X_{74}$, $X_{81}$ to $X_{84}$, $L_{34}$ to $L_{36}$, $L_{41}$ to $L_{42}$, $L_{51}$ to $L_{52}$, $L_{61}$, $L_{66}$, $L_{67}$, $L_{71}$, $L_{85}$, $L_{86}$, a34-a36, a41-a42, a51 to a52, a61, a66, a67, a71, a85, a86, $R_{10a}$, $R_{41}$ to $R_{42}$, $R_{51}$ to $R_{53}$, $R_{61}$ to $R_{66}$, $R_{71}$ to $R_{73}$, $R_{87}$, $R_{88}$, b62 to b65, b72 to b73, and b87 to b88 have, independently from one another, the same meaning as in claim 1, at least two of $R_{34}$ to $R_{36}$ are each, independently from one another, a group of a fluorenyl group, a carbazolyl group, or a benzimidazole group, each, independently from one another, unsubstituted or substituted with deuterium, —F, —Cl, —Br, —I, a hydroxyl group, a cyano group, a nitro group, a $C_1$-$C_{60}$ alkyl group, a $C_1$-$C_{60}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, a fluorenyl group, a carbazolyl group, a benzimidazole group, or any combination thereof, and the other group has the same meaning as $R_{31}$ in claim 1, $X_{85}$ is $C(R_{85a})(R_{85b})$, $Si(R_{85a})(R_{85b})$, $N(R_{85a})$, O, S, or Se, and $R_{85a}$ and $R_{85b}$ have, independently from one another, the same meaning as $R_{10a}$ in claim 1.

17. The light-emitting device of claim 1, wherein Formula 2-1 is one of Formulae 2-1-1 to 2-1-18;

Formula 2-2 is one of Formulae 2-2-1 to 2-2-9;
Formula 2-3 is one of Formulae 2-3-1 to 2-3-15;
Formula 2-4 is one of Formulae 2-4-1 to 2-4-33;
Formula 2-5 is one of Formulae 2-5-1 to 2-5-16; and
Formula 2-6 is one of Formulae 2-6-1 to 2-6-18:

2-1-1

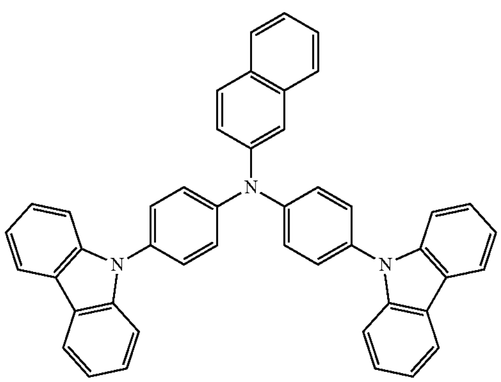

2-1-2

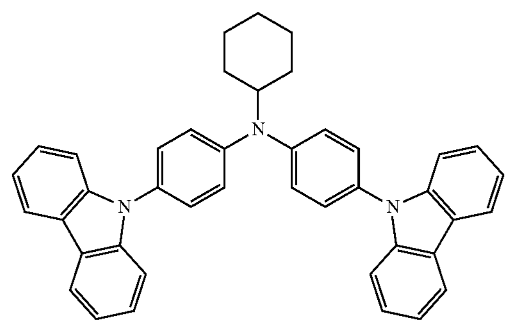

2-1-3

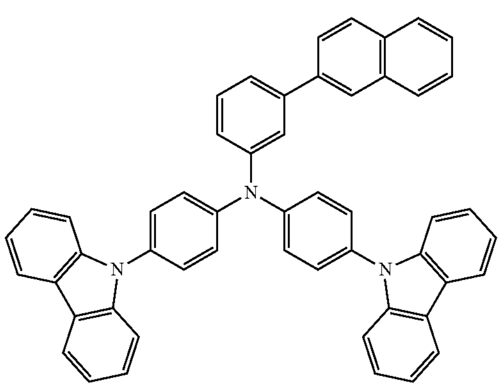

2-1-4

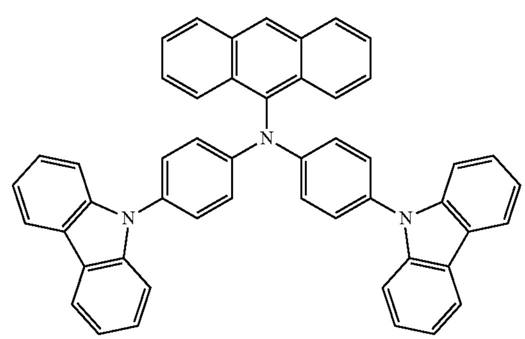

-continued
2-1-5
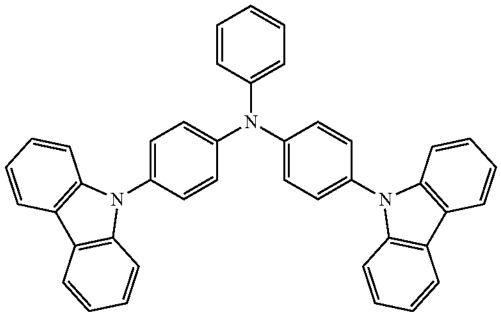
2-1-6
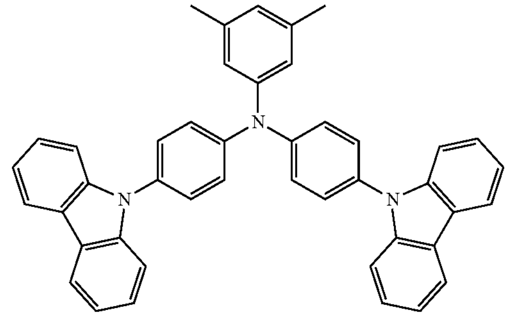
2-1-7
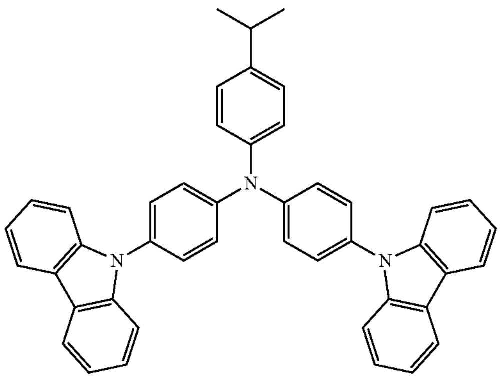
2-1-8
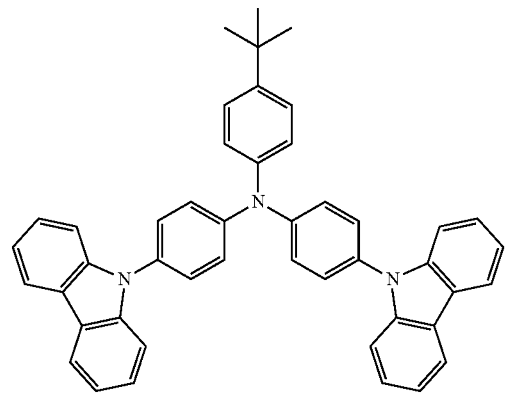
2-1-9
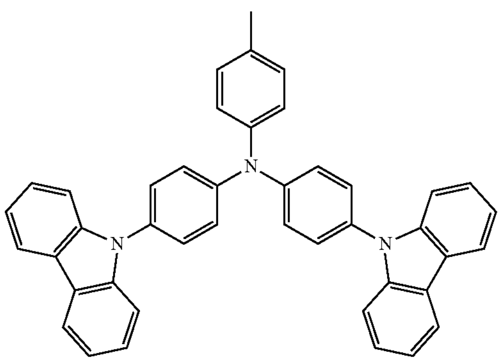
2-1-10
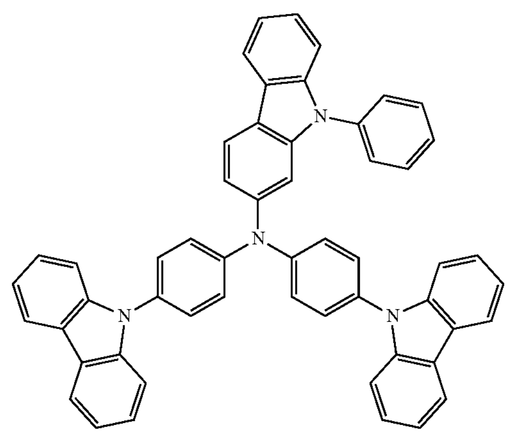
2-1-11
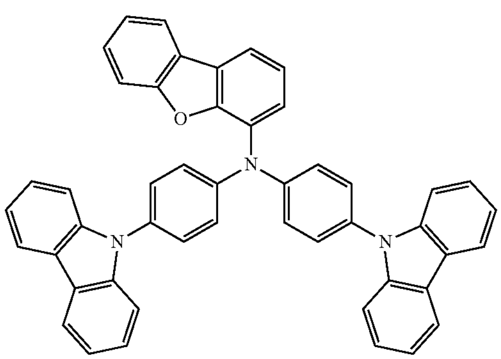
2-1-12
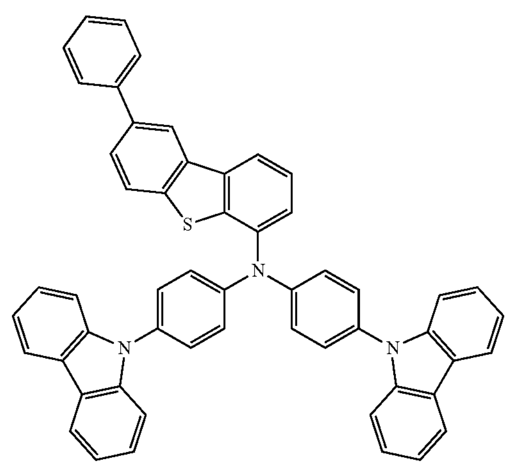

-continued
2-1-13
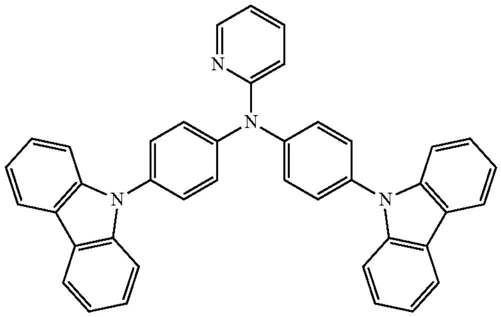
2-1-14
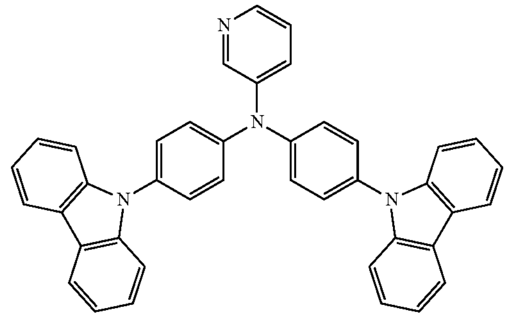
2-1-15
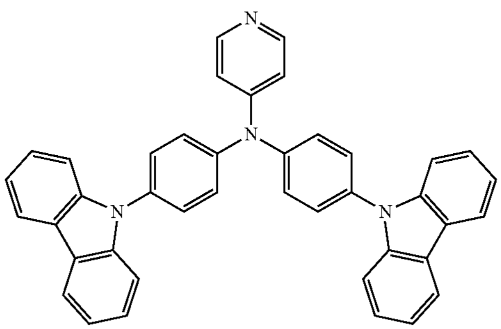
2-1-16
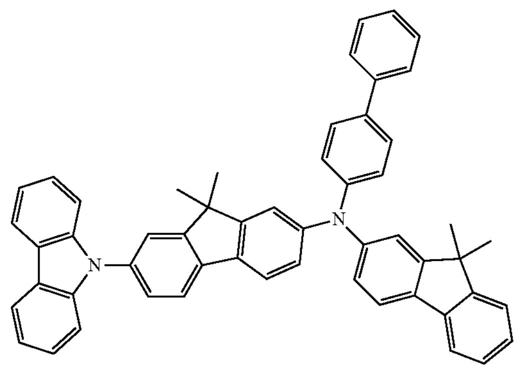
2-1-17
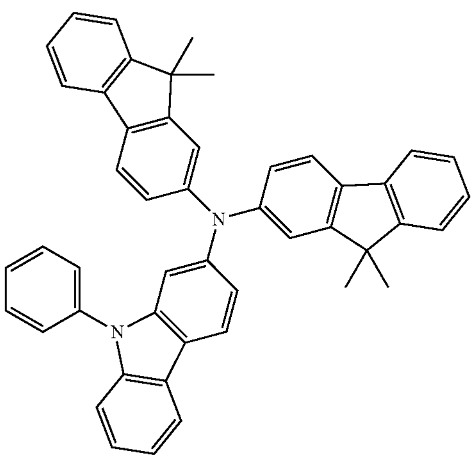
2-1-18
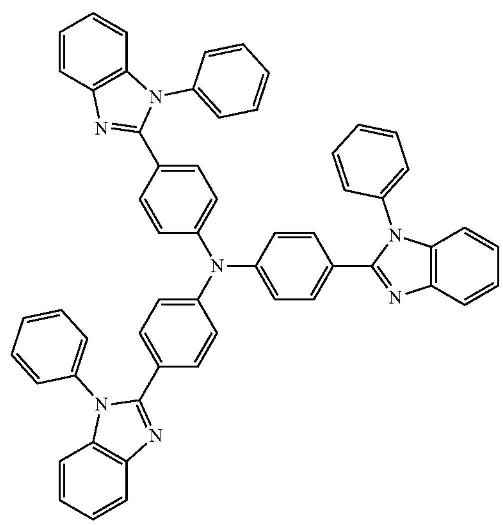
2-2-1
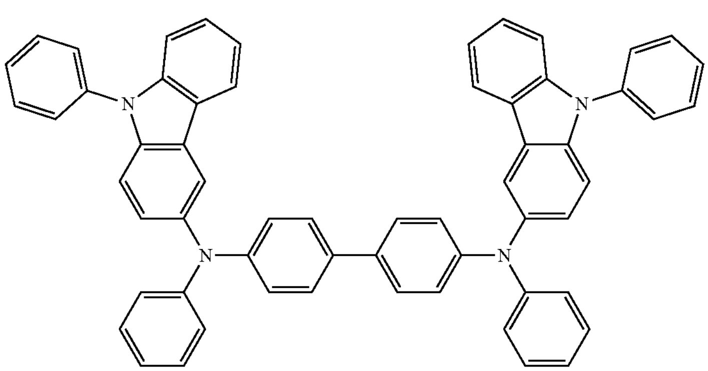

-continued
2-2-2
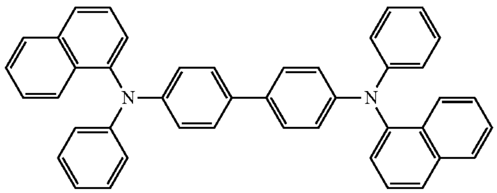
2-2-3
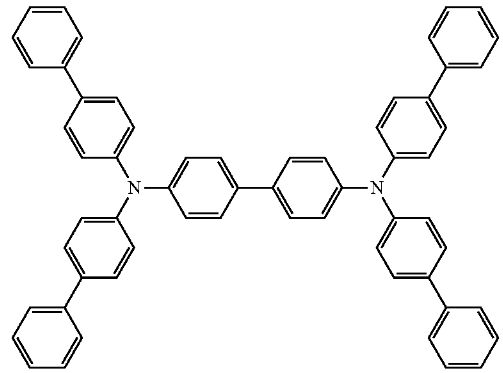
2-2-4
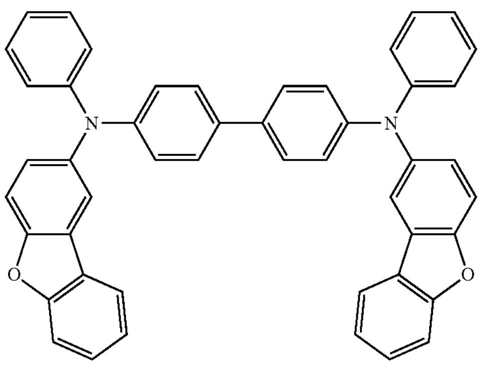
2-2-5
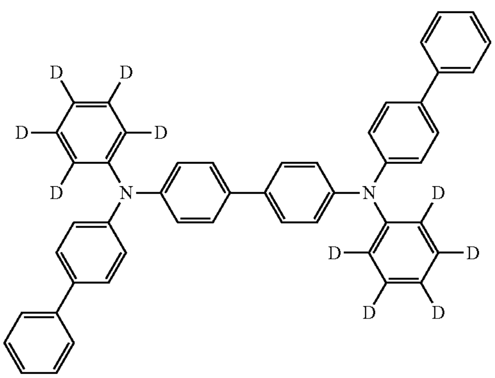
2-2-6
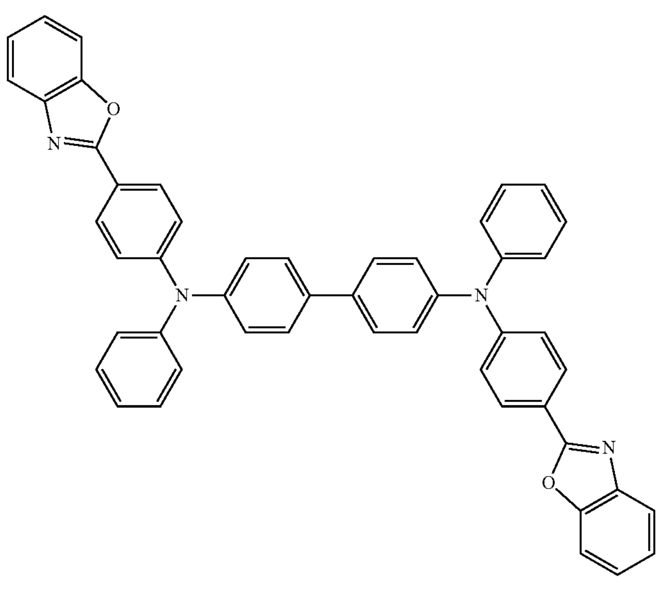

-continued
2-2-7
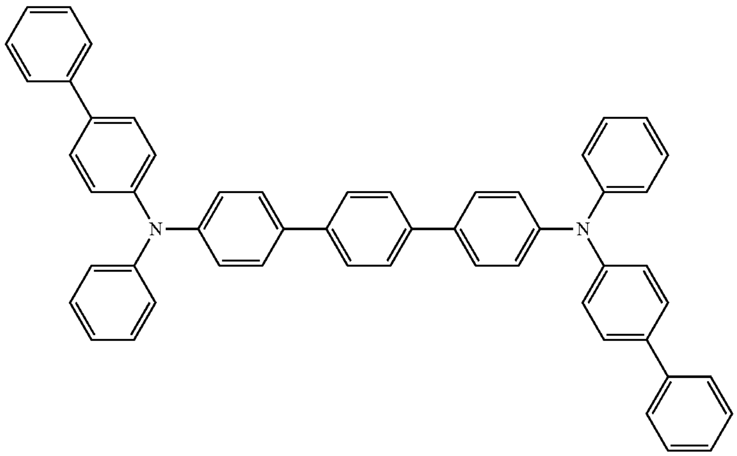
2-2-8
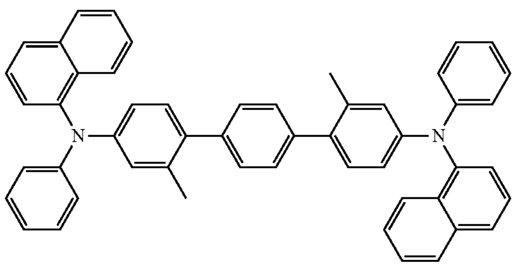
2-2-9
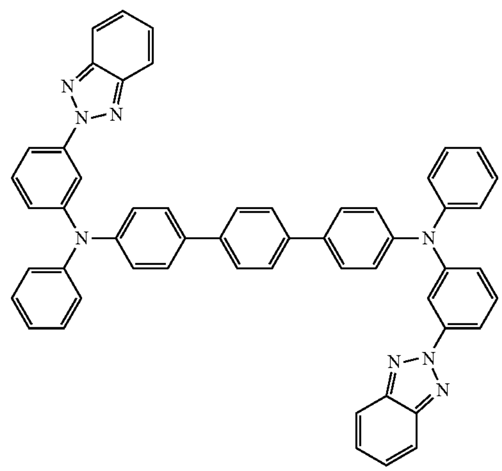
2-3-1
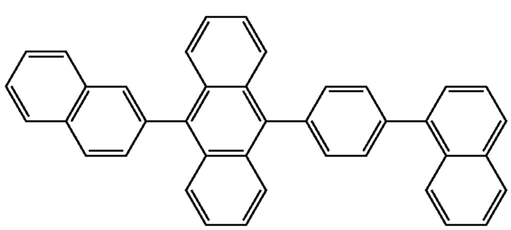
2-3-1
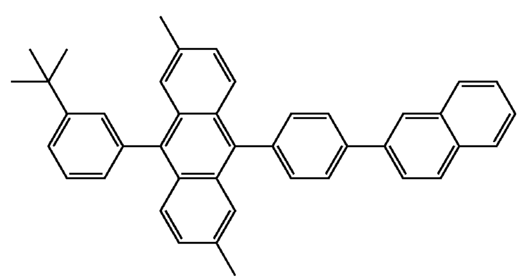
2-3-3
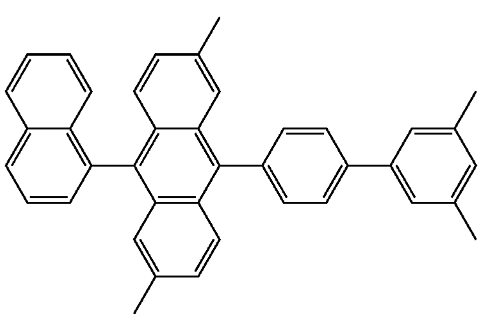
2-3-4
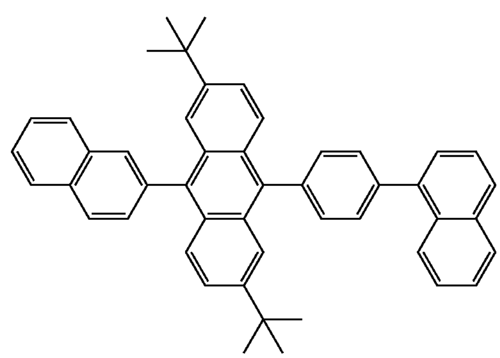

-continued
2-3-5
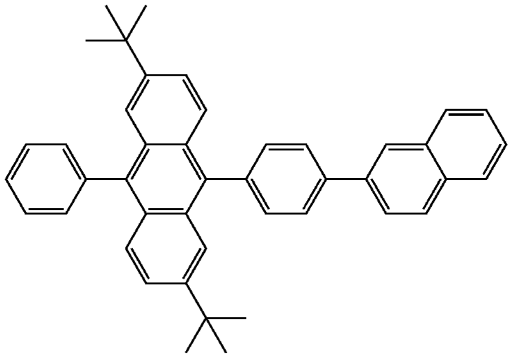
2-3-6
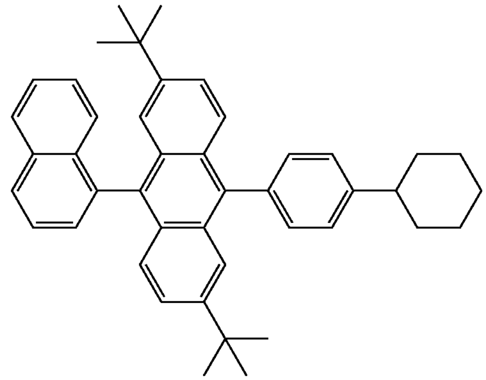
2-3-7
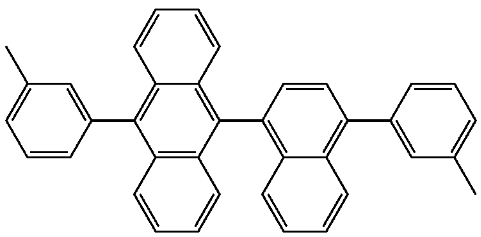
2-3-8
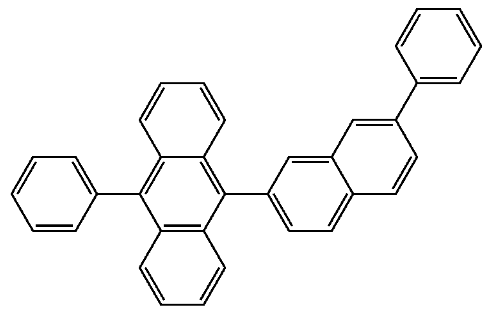
2-3-9
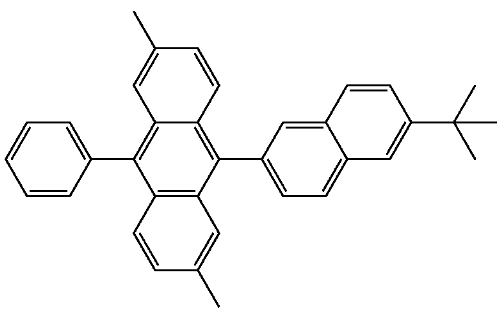
2-3-10
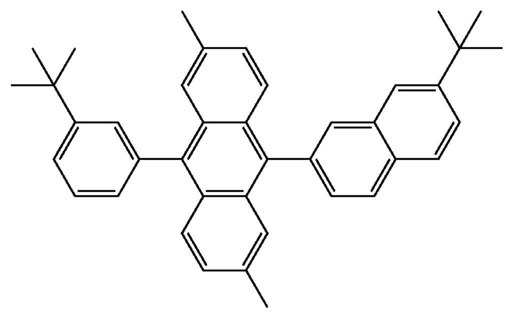
2-3-11
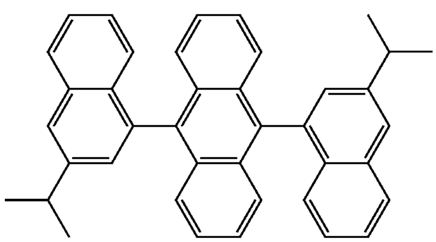
2-3-12
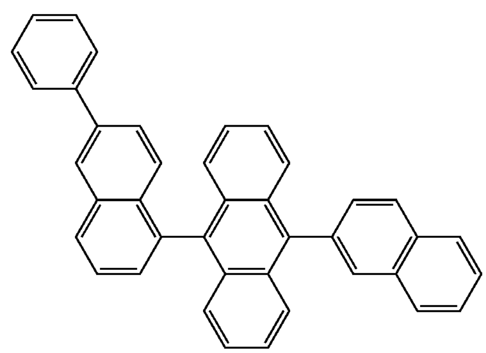
2-3-13
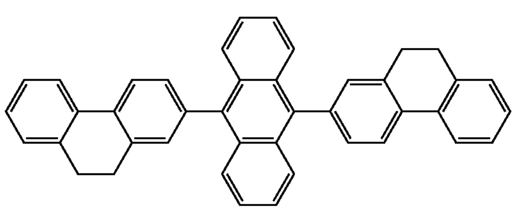
2-3-14
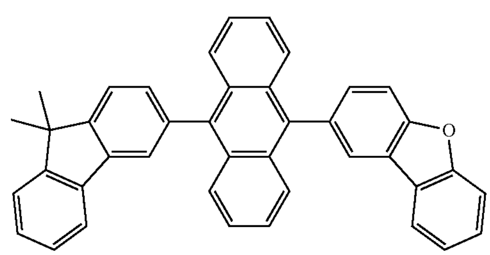

-continued
2-3-15
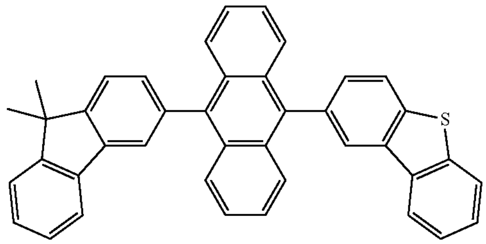
2-4-1
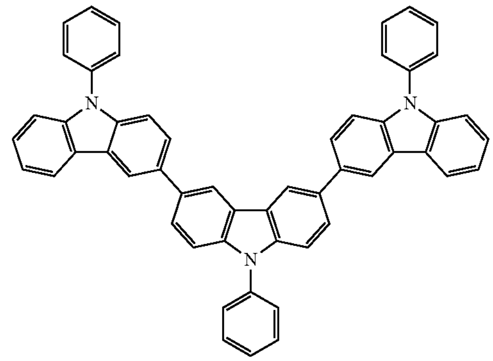
2-4-2
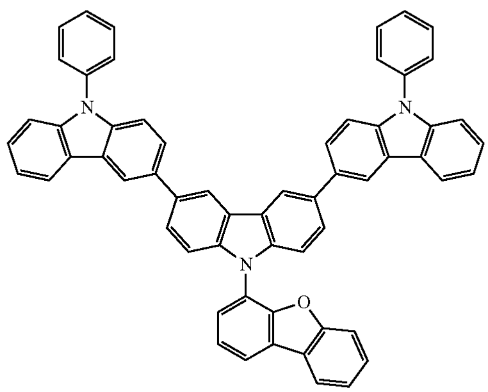
2-4-3
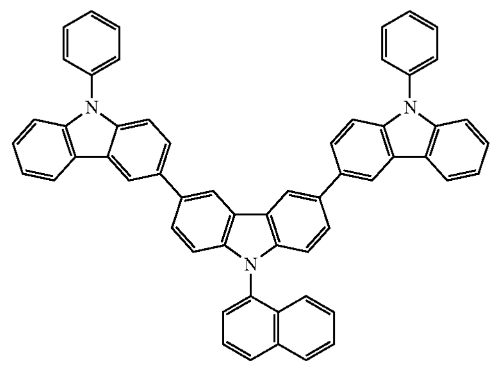
2-4-4
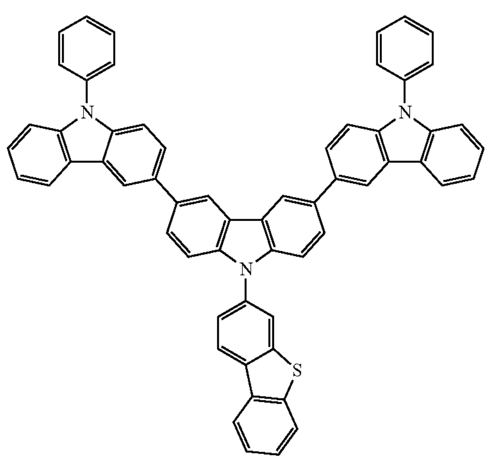
2-4-5
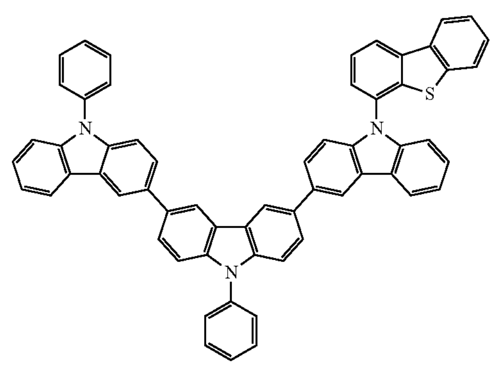

-continued
2-4-6
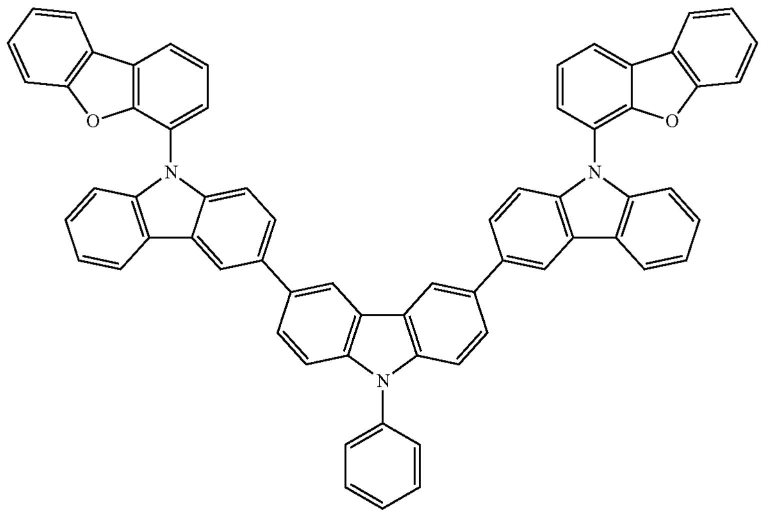
2-4-7
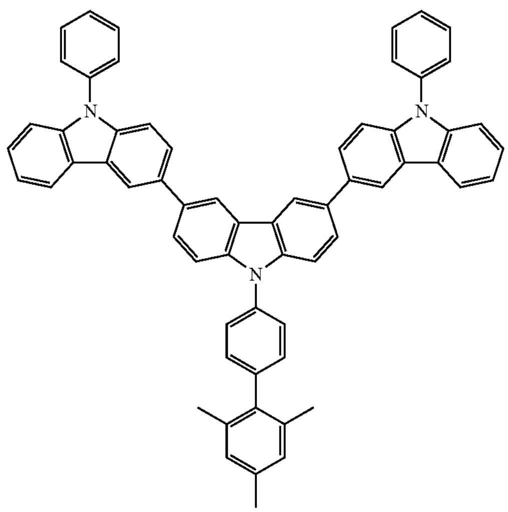
2-4-8
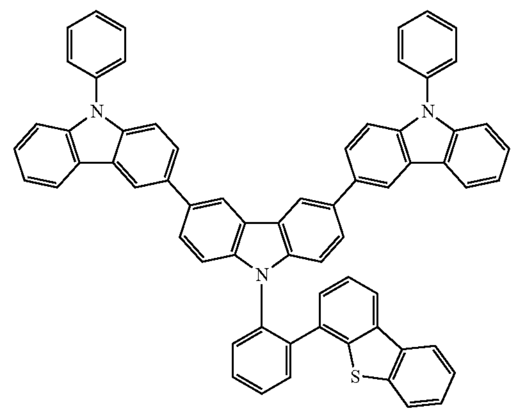
2-4-9
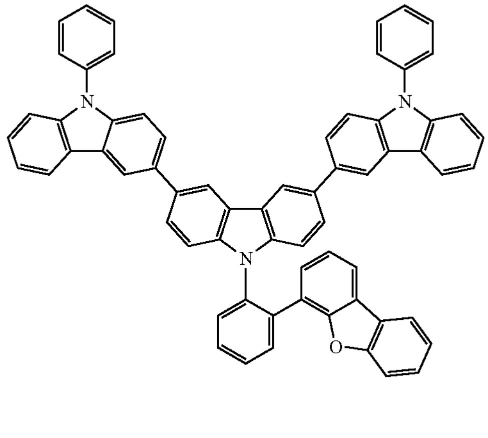
2-4-10
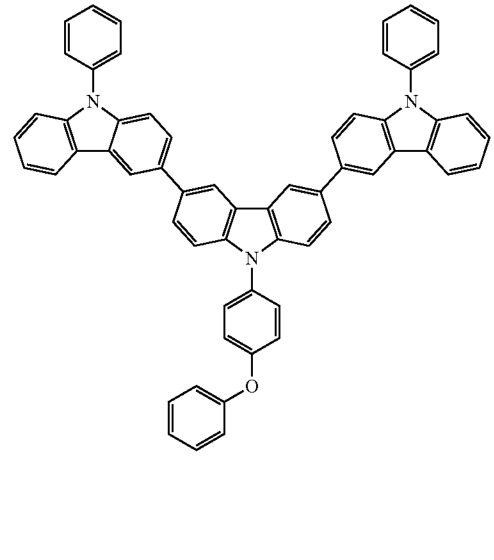

-continued
2-4-11
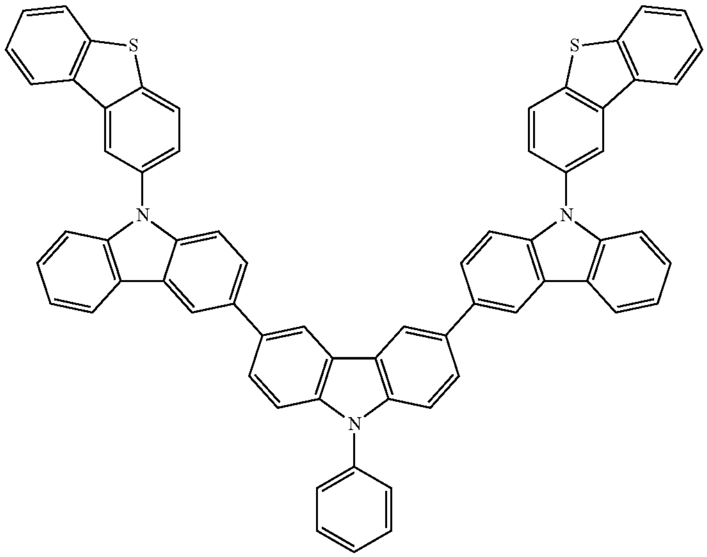
2-4-12
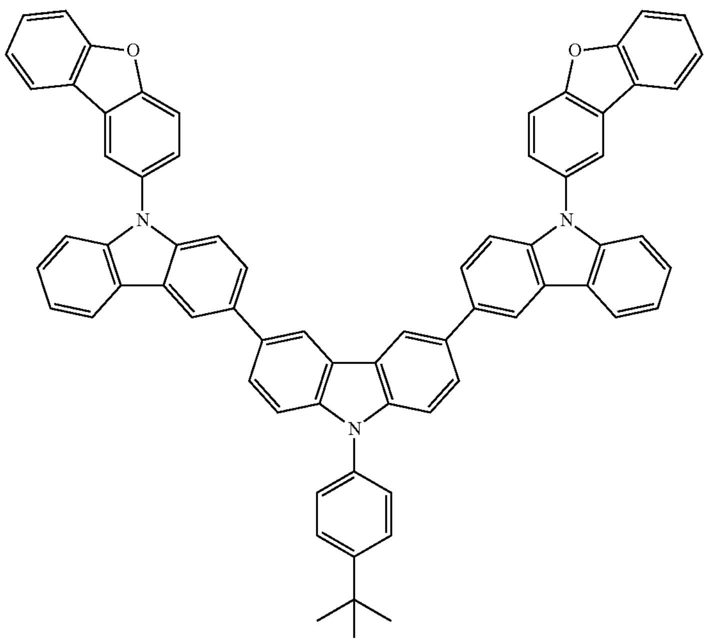
2-4-13
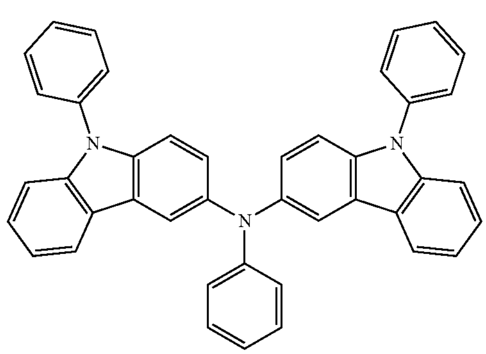
2-4-14
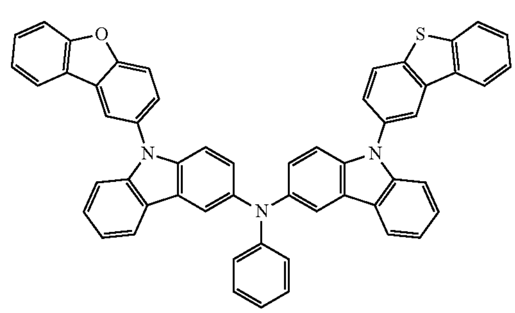

-continued
2-4-15
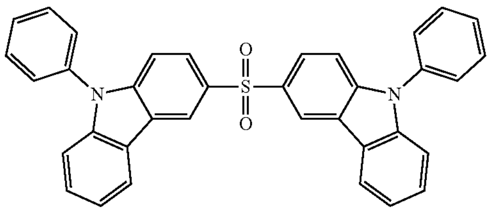
2-4-16
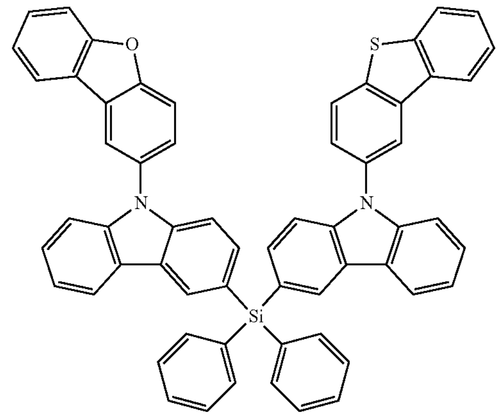
2-4-17
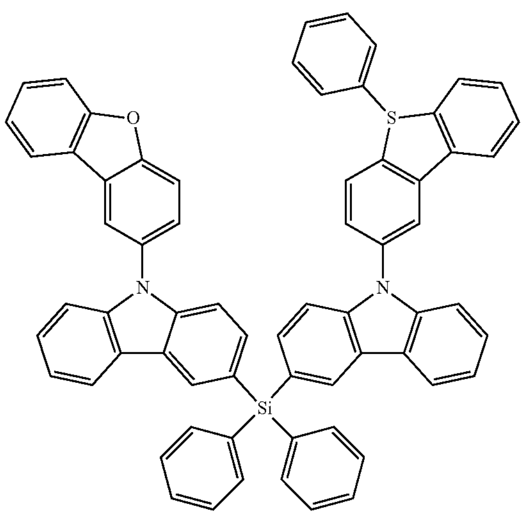
2-4-18
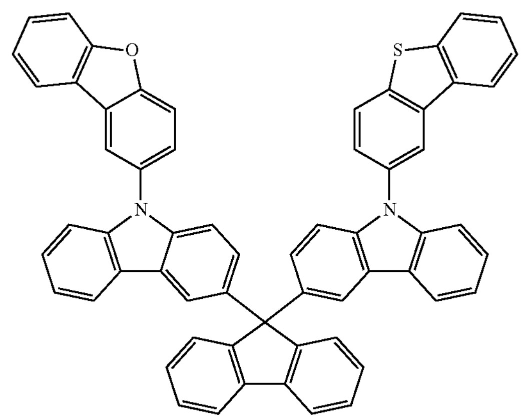
2-4-19
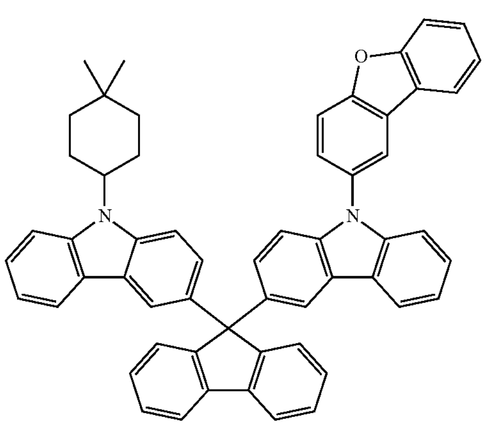
2-4-20
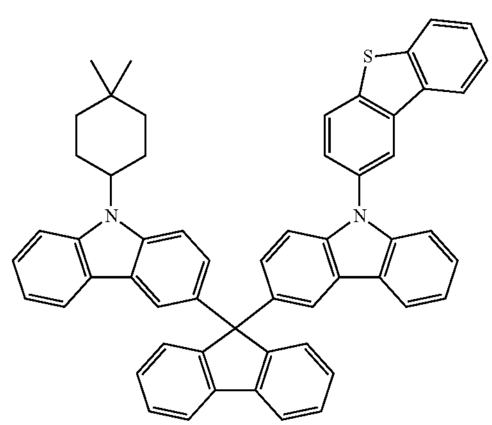

-continued
2-4-21
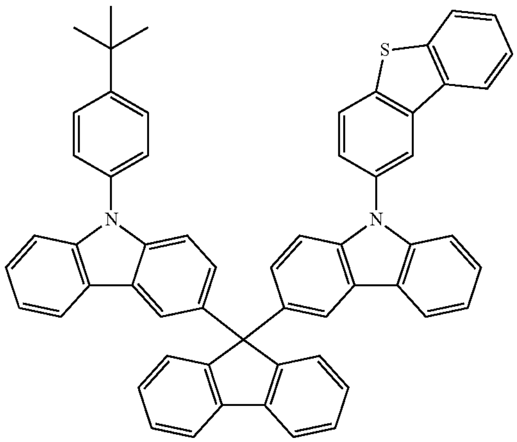
2-4-22
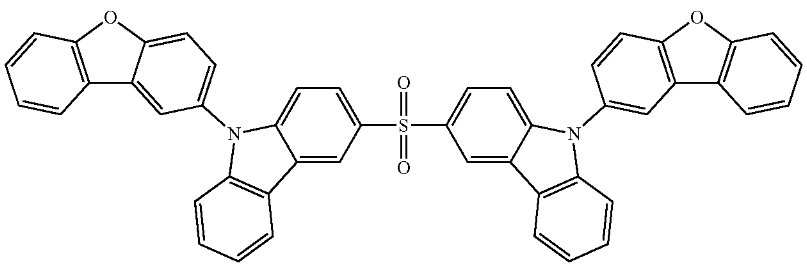
2-4-23
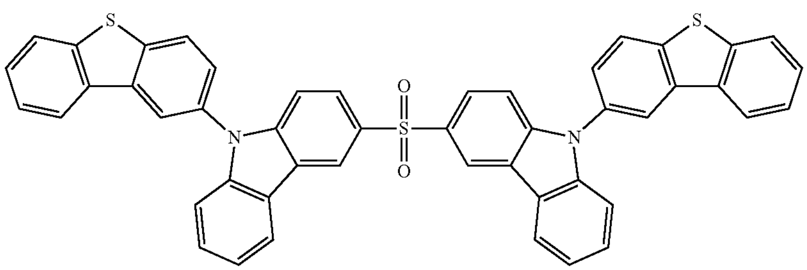
2-4-24
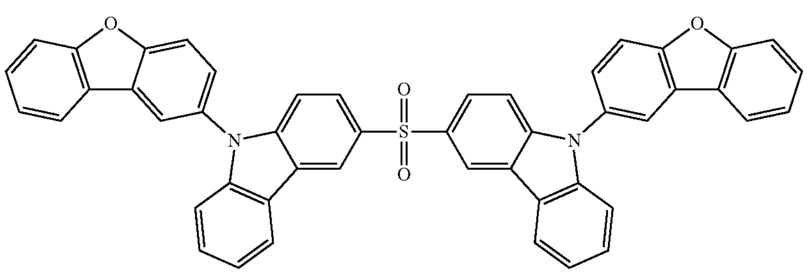
2-4-25
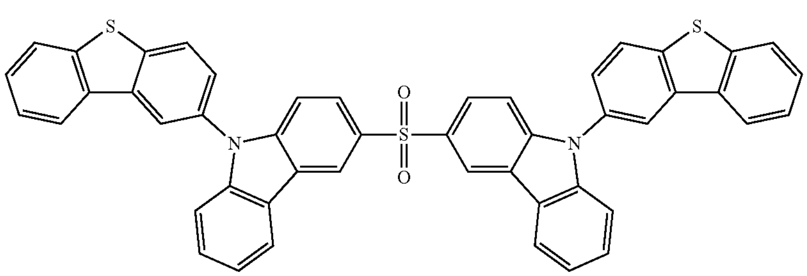

-continued
2-4-26
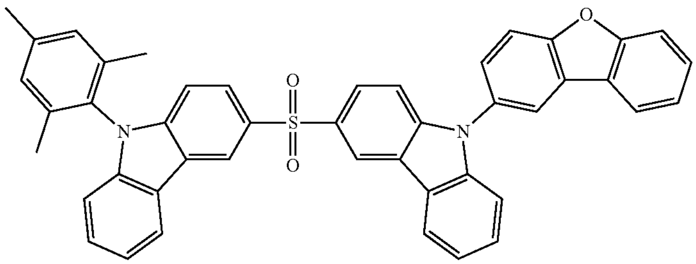
2-4-27
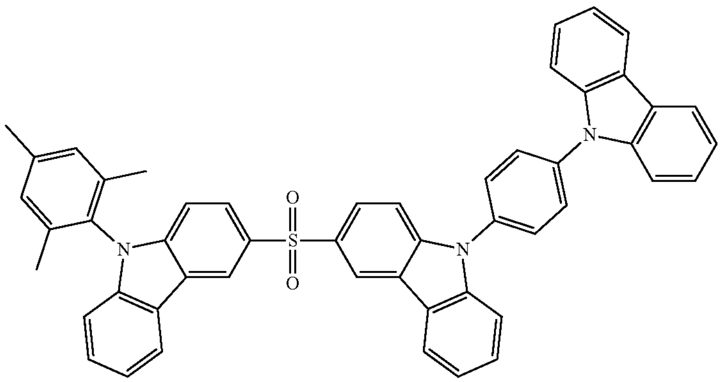
2-4-28
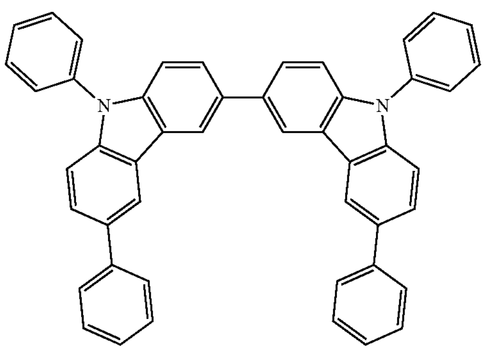
2-4-29
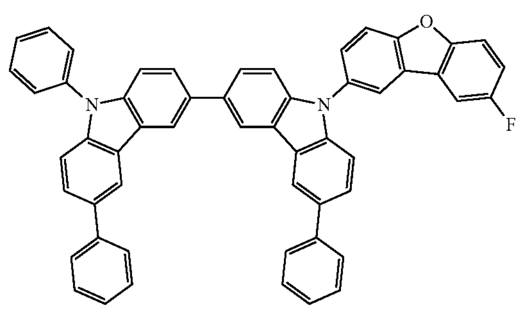
2-4-30
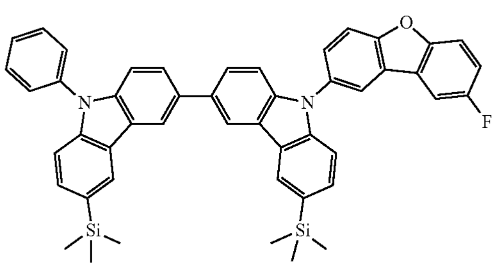
2-4-31
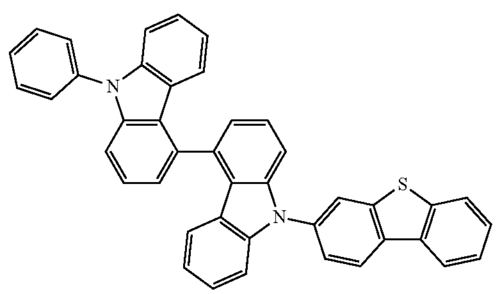

-continued
2-4-32
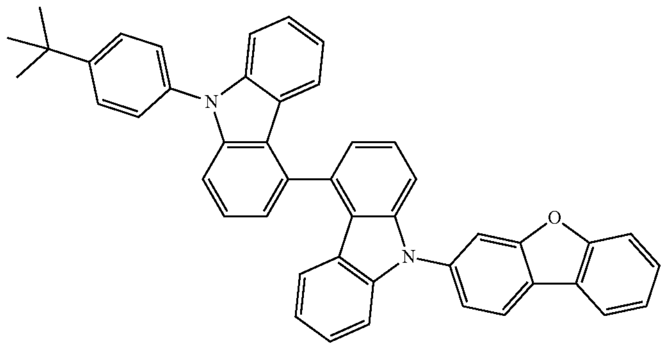
2-4-33
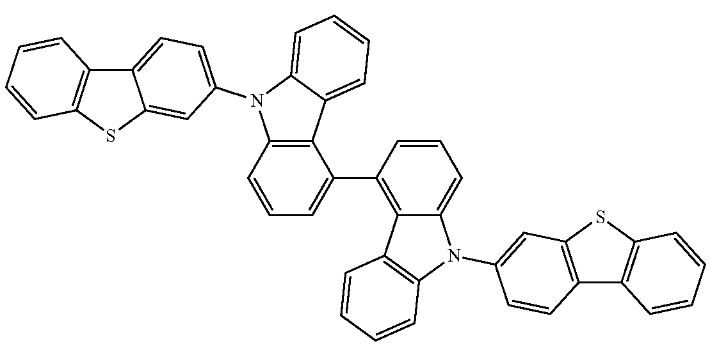
2-5-1
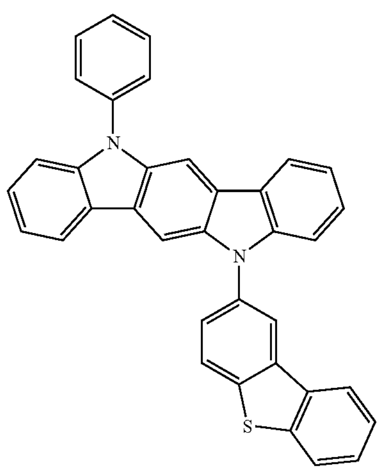
2-5-2
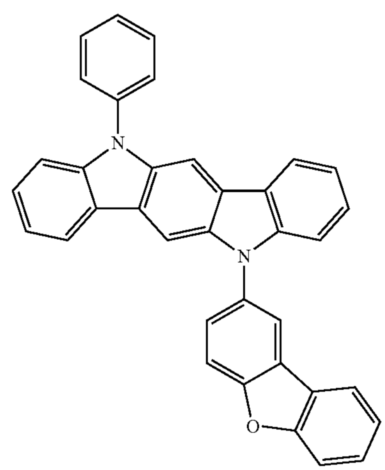

-continued
2-5-3
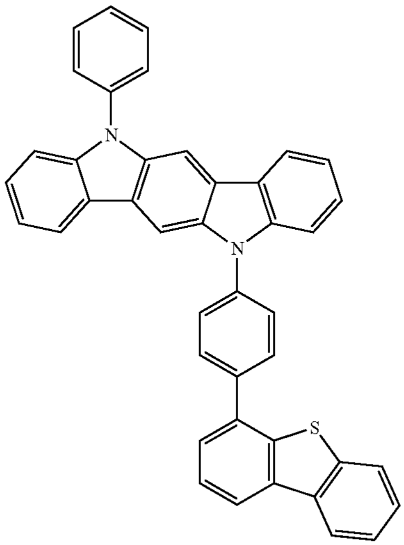
2-5-4
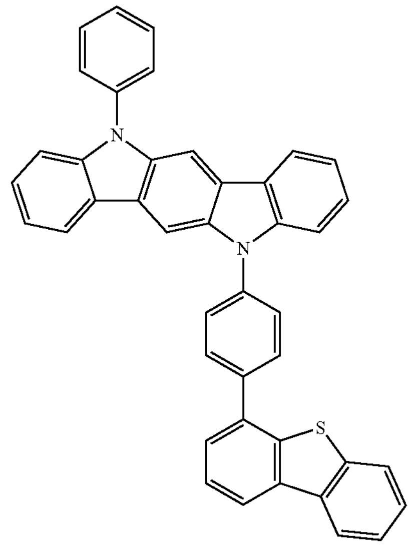
2-5-5
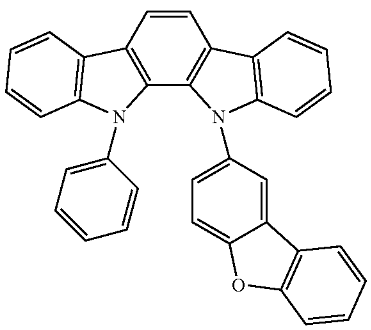
2-5-6
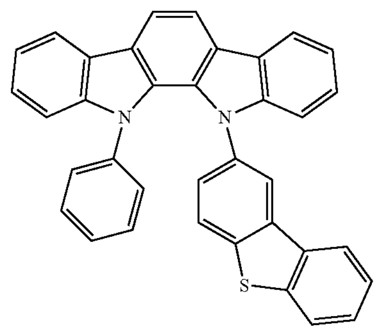
2-5-7
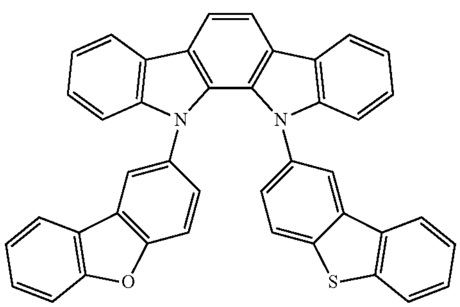
2-5-8
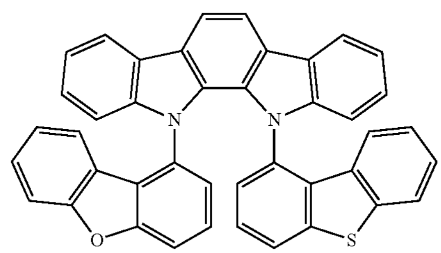
2-5-9
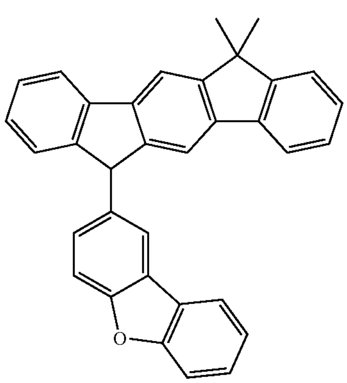
2-5-10
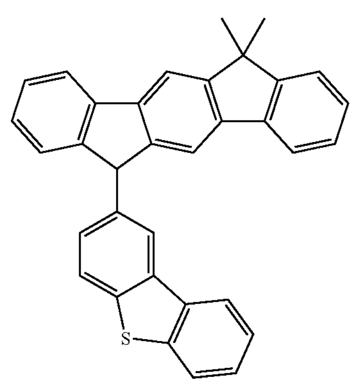

-continued
2-5-11
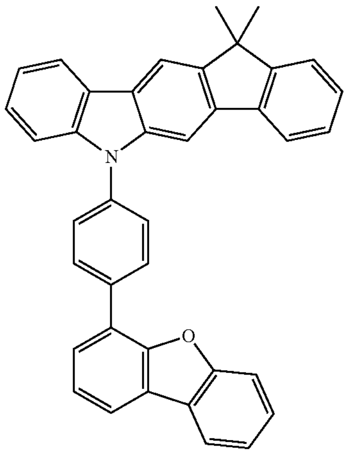
2-5-12
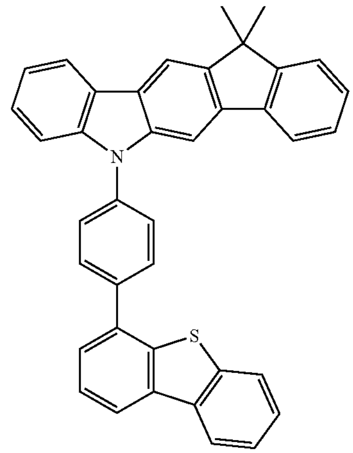
2-5-13
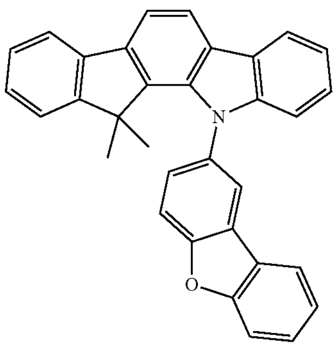
2-5-14
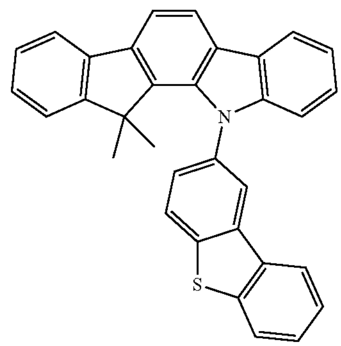
2-5-15
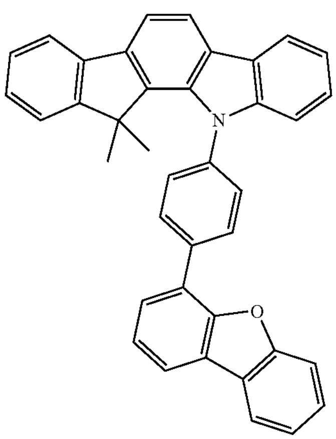
2-5-16
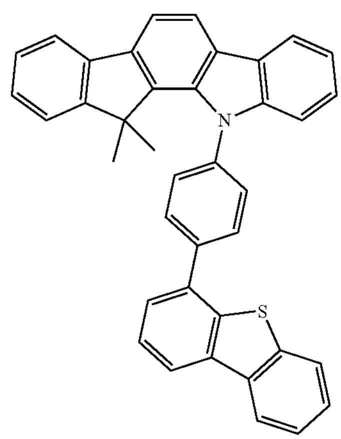
2-6-1
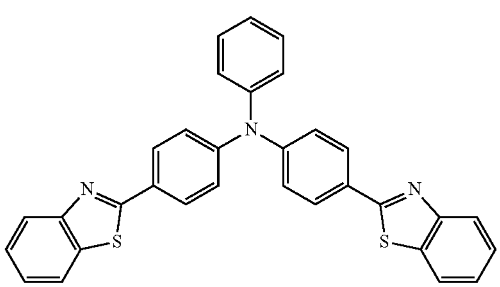
2-6-2
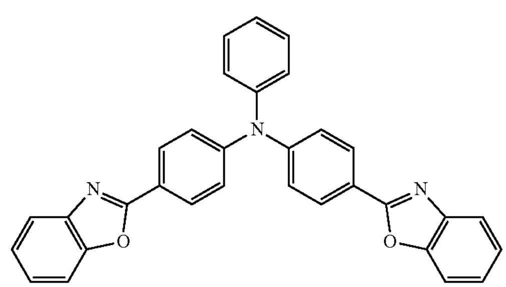

-continued
2-6-3
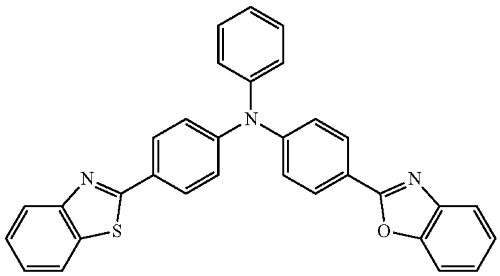
2-6-4
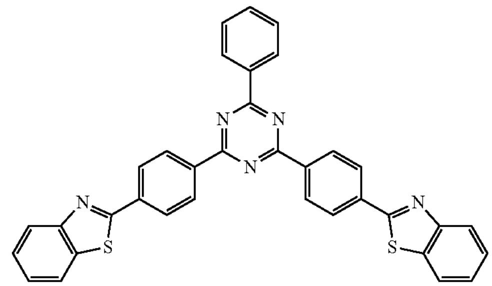
2-6-5
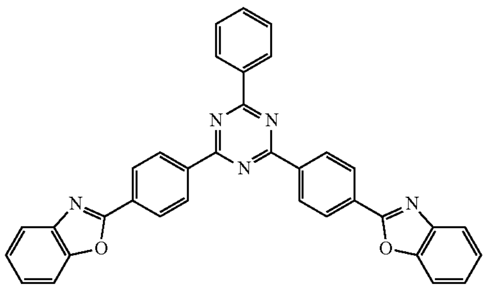
2-6-6
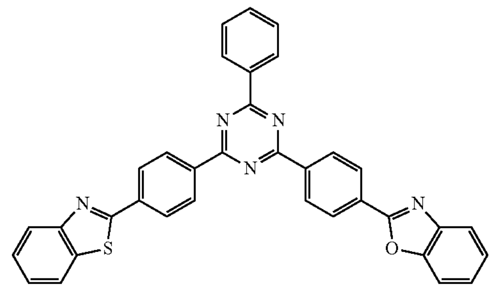
2-6-7
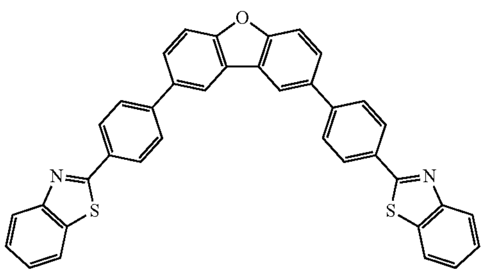
2-6-8
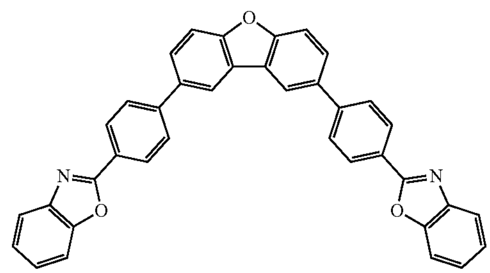
2-6-9
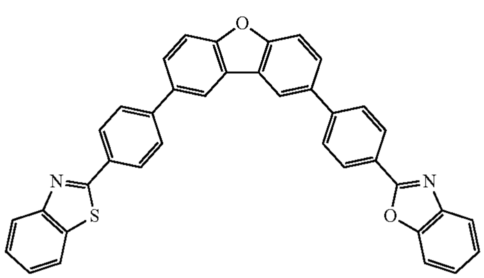
2-6-10
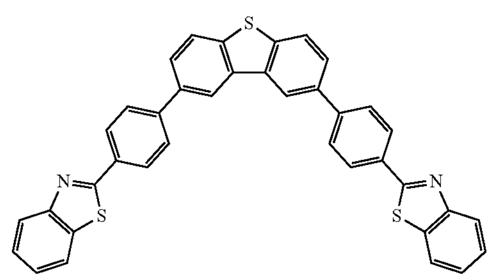
2-6-11
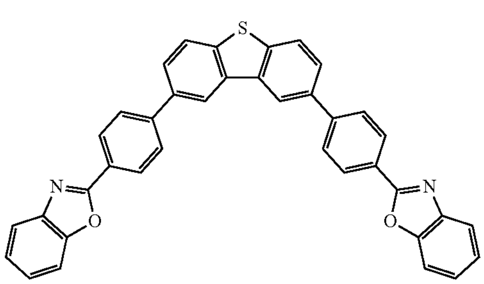
2-6-12
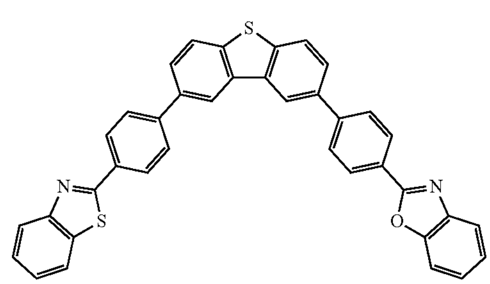

-continued 2-6-13

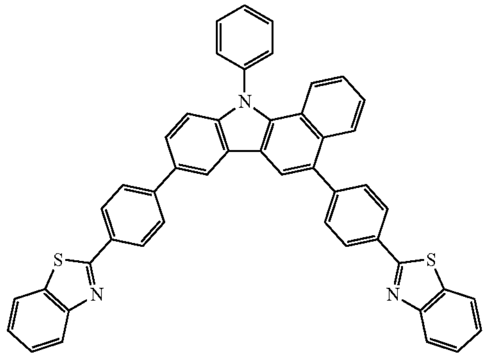

2-6-14

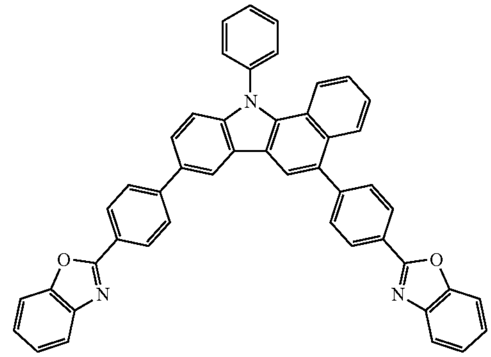

2-6-15

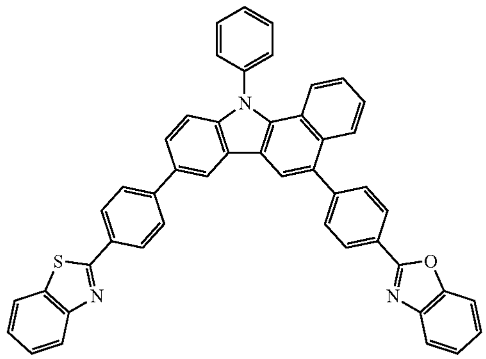

2-6-16

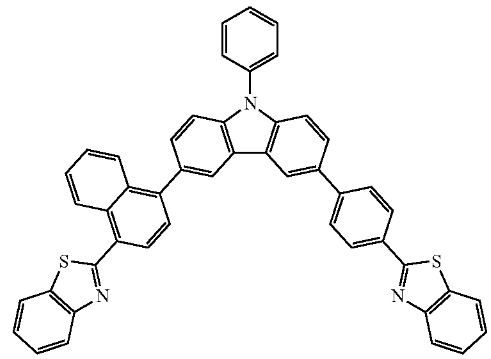

2-6-17

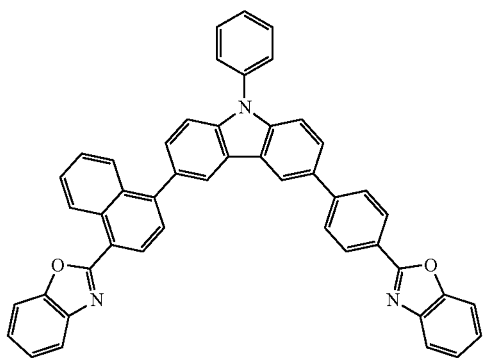

2-6-18

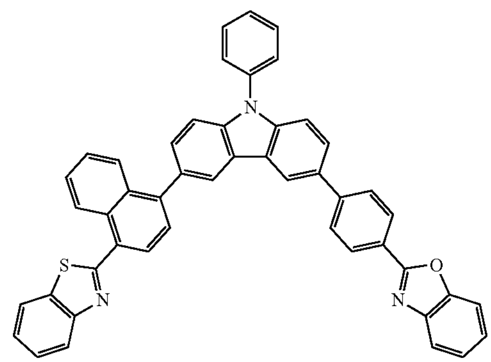

18. An electronic apparatus comprising the light-emitting device of claim 1.

19. The electronic apparatus of claim 18, further comprising a thin-film transistor, wherein the thin-film transistor comprises a source electrode and a drain electrode, and the first electrode of the light-emitting device is electrically connected to the source electrode or the drain electrode.

20. The electronic apparatus of claim 19, further comprising a color filter, a color conversion layer, a touch screen layer, a polarizing layer, or any combination thereof.

* * * * *